(12) United States Patent
Takeuchi et al.

(10) Patent No.: US 7,736,757 B2
(45) Date of Patent: Jun. 15, 2010

(54) LIGHT EMITTING MATERIAL AND ORGANIC LIGHT-EMITTING DEVICE

(75) Inventors: Masataka Takeuchi, Chiba (JP); Shuichi Naijo, Chiba (JP); Naoko Ito, Chiba (JP); Koro Shirane, Chiba (JP); Takashi Igarashi, Chiba (JP); Yoshiaki Takahashi, Chiba (JP); Motoaki Kamachi, Chiba (JP)

(73) Assignee: Showa Denko K.K., Tokyo (JP)

( * ) Notice: Subject to any disclaimer, the term of this patent is extended or adjusted under 35 U.S.C. 154(b) by 107 days.

(21) Appl. No.: 12/026,877

(22) Filed: Feb. 6, 2008

(65) Prior Publication Data

US 2008/0290793 A1 Nov. 27, 2008

Related U.S. Application Data

(62) Division of application No. 10/481,442, filed as application No. PCT/JP02/06139 on Jun. 20, 2002, now Pat. No. 7,396,598.

(60) Provisional application No. 60/301,844, filed on Jul. 2, 2001, provisional application No. 60/302,372, filed on Jul. 3, 2001, provisional application No. 60/317,115, filed on Sep. 6, 2001, provisional application No. 60/330,815, filed on Oct. 31, 2001, provisional application No. 60/337,157, filed on Dec. 10, 2001, provisional application No. 60/337,160, filed on Dec. 10, 2001, provisional application No. 60/337,161, filed on Dec. 10, 2001.

(30) Foreign Application Priority Data

| Jun. 20, 2001 | (JP) | ............................. 2001-186120 |
| Jun. 21, 2001 | (JP) | ............................. 2001-188183 |
| Aug. 9, 2001 | (JP) | ............................. 2001-241647 |
| Aug. 31, 2001 | (JP) | ............................. 2001-263525 |
| Oct. 2, 2001 | (JP) | ............................. 2001-306282 |
| Nov. 9, 2001 | (JP) | ............................. 2001-345136 |
| Nov. 15, 2001 | (JP) | ............................. 2001-350076 |
| Dec. 4, 2001 | (JP) | ............................. 2001-369529 |
| Mar. 22, 2002 | (JP) | ............................. 2002-080456 |
| Mar. 28, 2002 | (JP) | ............................. 2002-90590 |

(51) Int. Cl.
H01L 51/54 (2006.01)
C09K 11/06 (2006.01)

(52) U.S. Cl. .................. 428/690; 428/917; 313/504; 257/E51.033; 257/E51.044; 252/301.35; 526/241; 526/265; 528/9; 528/395

(58) Field of Classification Search .................. None
See application file for complete search history.

(56) References Cited

U.S. PATENT DOCUMENTS

| 6,545,159 | B2 | 4/2003 | Lee et al. |
| 6,869,693 | B2 | 3/2005 | Fryd et al. |
| 6,960,364 | B2 | 11/2005 | Suzuri et al. |
| 2001/0015432 | A1 | 8/2001 | Igarashi |
| 2001/0019782 | A1 | 9/2001 | Igarashi et al. |
| 2001/0030325 | A1 | 10/2001 | Epstein et al. |
| 2002/0027623 | A1* | 3/2002 | Doi et al. ...................... 349/69 |
| 2002/0028349 | A1 | 3/2002 | Seo |
| 2002/0034656 | A1 | 3/2002 | Thompson et al. |
| 2002/0122899 | A1 | 9/2002 | Doi et al. |
| 2002/0193532 | A1 | 12/2002 | Ikehira et al. |
| 2003/0091862 | A1 | 5/2003 | Tokito et al. |
| 2003/0186080 | A1 | 10/2003 | Kamatani et al. |
| 2004/0113124 | A1 | 6/2004 | Christou et al. |

FOREIGN PATENT DOCUMENTS

| EP | 0 612 772 A1 | 8/1994 |
| EP | 0 969 532 A2 | 1/2000 |
| EP | 1 138 746 A1 | 10/2001 |
| EP | 1 245 659 A1 | 10/2002 |
| JP | 8-157575 | 6/1996 |
| JP | 10-1665 | 1/1998 |
| JP | 2001/181616 A | 7/2001 |
| JP | 2001-181617 | 7/2001 |
| JP | 2001/247859 A | 9/2001 |
| JP | 2002-50483 | 2/2002 |
| JP | 2003/100462 A | 4/2003 |
| WO | WO 00-26323 A1 | 5/2000 |
| WO | WO 00-70655 A2 | 11/2000 |
| WO | WO 01-41512 A1 | 6/2001 |
| WO | WO 02-068435 A1 | 9/2002 |

OTHER PUBLICATIONS

Baldo, M.A., et al., "High-Efficiency Flourescent Organic Light-Emitting Devices Using a Phosphorescent Sensitizer", Nature, Macmillan Journals LTD. London, GB, vol. 403, No. 6771, Feb. 17, 2000, pp. 750-753 XP002183466.

Jun, C., et al.: "A Novel Organic Electroluminescent Device Using a New EU3+Polymer as Emitting Layer" Proceedings of The Spie, Spie, Bellingham, VA, US, vol. 4220, Nov. 8, 2000, pp. 255-259, XP008005362.

(Continued)

Primary Examiner—Marie R. Yamnitzky
(74) Attorney, Agent, or Firm—Sughrue Mion, PLLC

(57) ABSTRACT

A polymer light emitting material, wherein the material has a light emitting mechanism based on transition from an excited triplet state to a ground state or transition through an excited triplet state to a ground state of an electron energy level, and the material comprises a nonionic light emitting part which constitutes a part of the polymer or is bound to the polymer. The polymer light emitting material exhibits high light emission efficiency above 5%, which is the limit of external quantum efficiency of fluorescence and can be designed so as to have a large area and hence are suitable for mass production of organic light emitting devices.

8 Claims, 1 Drawing Sheet

OTHER PUBLICATIONS

Yang, M.J., et al.: "Use of Poly (9-Vinylcarbazole) as Host Material for Iridium Complexes in High-Efficiency Organic Light-Emitting Devices", Japanese Journal of Applied Physics, Publication Office Japanese Journal of Applied Physics, Tokyo, JP, vol. 39 No. 8A Part 2, Aug. 1, 2000, pp. L828-L829, XP001009235 ISSN: 0021-4922.

Yang M et al: "Monochromatic-Red-Light Emission of Novel Copolymers Containing Carbazole Units and Europium-Acrylate Complexes", Journal of Polymer Science, Polymer Chemistry Edition, John Wiley and Sons. New York, US, vol. 38, No. 18, Sep. 15, 2000, pp. 3405-3411, XP001086543 ISSN: 0887-624X.

International Search Report for PCT/JP02/06139 dated Feb. 14, 2003.

International Preliminary Examination Report for PCT/JP02/06139 dated May 6, 2003.

U.S. Appl. No. 60/238,974, filed Oct. 10, 2000.

* cited by examiner

LIGHT EMITTING MATERIAL AND ORGANIC LIGHT-EMITTING DEVICE

CROSS-REFERENCE TO THE RELATED APPLICATIONS

This is a divisional of application Ser. No. 10/481,442 filed Dec. 19, 2003, now U.S. Pat. No. 7,396,598 which is a National Stage Application filed under §371 of PCT Application No. PCT/JP02/06139 filed Jun. 20, 2002, which claims benefit of (1) Provisional Application No. 60/301,844 filed Jul. 2, 2001, (2) Provisional Application No. 60/302,372 filed Jul. 3, 2001, (3) Provisional Application No. 60/317,115 filed Sep. 6, 2001, (4) Provisional Application No. 60/330,815 filed Oct. 31, 2001, (5) Provisional Application No. 60/337,157 filed Dec. 10, 2001, (6) Provisional Application No. 60/337,160 filed Dec. 10, 2001, and (7) Provisional Application No. 60/337,161 filed Dec. 10, 2001. The entire disclosures of the prior applications, application Ser. Nos. 10/481,442, 60/301,844, 60/302,372, 60/317,115, 60/330,815, 60/337,157, 60/337,160 and 60/337,161 are considered part of the disclosure of the accompanying divisional application and are hereby incorporated by reference.

TECHNICAL FIELD

The present invention relates to an organic light-emitting device (OLED), especially for flat panel displays or backlights used therein, and the present invention relates to a light emitting material for OLED.

BACKGROUND ART

Since 1987 when C. W. Tang et al. of Kodak demonstrated high illumination light emission of an organic light emitting device (Appl. Phys. Lett., Vol., 51, page 913, 1987), development of materials for organic light emitting devices and improvement of device structure have been rapidly made. Recently, organic light emitting devices have gone into practical use firstly in displays for car audio sets, cellular phones and the like. Currently, to put such organic electroluminescent (EL) devices to a wider range of uses, development of materials for improving the light emission efficiency and durability, or development for applying them to full color displays are being actively made. In particular, on considering the use wide-spreading to the medium- or large-size panel or illumination, the high luminance must be more intensified by improving the light emission efficiency.

As such light emitting materials, metal complexes such as aluminum quinolinium complexes ($Alq_3$), which has good light emission efficiency so that light emission intensity is high, have been commonly used. For forming such low molecular weight materials into a light emitting layer of an organic light emitting device, vacuum deposition and the like techniques have been used. This has been considered to be a demerit in the production process of the organic light emitting devices. Nature, Vol. 397, page 121 (1999) discloses that π-electron conjugated polymers such as poly(paraphenylenevinylene) (PPV) and derivatives thereof (MEH-PPV) can serve as a light emitting material. These polymers have begun to be partially used is a backlight of a clock and the like. These polymer materials have not only a merit in production process because they can be formed into films by a casting method but also a merit in an increased durability as compared with low molecular weight light emitting materials. However, they have a demerit in that they have low light emission efficiency as compared with the low molecular weight light emitting materials.

In the light emitting materials as mentioned above, use is made of light emission from an excited singlet state, that is, fluorescence. According to the description at page 58 of Monthly Display, October 1998, Separate Volume "Organic EL Display", the upper limit of the internal quantum efficiency of light emission in an organic EL has been considered to be 25% from the ratio of an excited singlet state to an excited triplet state generated by electric excitation being 1:3.

On the contrary, by using an iridium complex emitted by phosphorescence from an excited triplet state, M. A. Baldo et al. indicated that it is possible to obtain an external quantum efficiency of 7.5% (this corresponding to an internal quantum efficiency of 37.5% assuming that the light out-coupling efficiency is 20%), which is higher than the external quantum efficiency of 5%, which has conventionally been considered to be the uppermost value (Appl. Phys. Lett., Vol. 75, page 4 (1999), WO00/70655). However, materials that stably emit phosphorescence at room temperature as the iridium complex as used in the prior art cited here are extremely rare so that freedom of selection of materials is narrow and they must be doped to a specified host compound when actually used. Therefore, the conventional materials have the disadvantage that selection of materials that satisfy the specification of a display is extremely difficult to make.

On the other hand, M. A. Baldo et al., also indicated that a relatively good light emission efficiency can be obtained by using an iridium complex as a sensitizer, transferring energy from an excited triplet state of the complex to an excited singlet state of a fluorescent dye, and finally emitting fluorescence from the excited singlet state of the fluorescent dye (Nature, Vol. 403, page 750 (2000)). This method has the advantage in that from a number of fluorescent dyes, one that is suitable for the purpose can be selected and used. However, this process has the great disadvantage in that it has low quantum efficiency of light emission in principle since it involves a spin-forbidden process of transferring energy from an excited triplet state of a sensitizer to an excited singlet state of a fluorescent dye.

Next, concerning the mass production method of panels, conventionally a vacuum deposition method has been used. However, the vacuum deposition method cannot be always suitable for mass production of panels having large areas since they have the problems in that they require a vacuum equipment and it becomes more difficult to forming an organic thin film so as to have a uniform thickness according as the film has a larger area.

In order to improve the disadvantage, a production method using a polymer light emitting material, that is, an ink jet method and a printing method have been developed as methods that facilitate the production of large area products. In particular, the printing method can continuously form a long film so that it is excellent in the production of large area products and in mass productivity.

As described above, in order to obtain an organic light emitting device having a high light emission efficiency and having a large area, a phosphorescent polymer material is required. As such phosphorescent polymer materials, polymers incorporating ruthenium complexes in the main chains or side chains of the polymers are known (Ng, P. K. et al., Polymer Preprints., Vol. 40(2), page 1212 (1999)). These compounds are ionic compounds and application of a voltage thereto causes electrochemical light emission due to the oxidation reduction reaction at the electrodes. The electrochemical light emission shows an extremely slow response in the order of minutes so that they are unsuitable for usual display panels.

In addition, there is a composition of poly(N-vinylcarbazole) mixed or dispersed with a low molecular weight phosphorescent compound, an iridium complex, although it cannot be said to be a polymer material in a strict sense (P. J. Djurovich et al., Polymer Preprints, Vol. 41(1), page 770 (2000)). However, there is a possibility that this material is poor in heat stability as compared with homogeneous polymer materials and tend to cause phase separation or segregation.

Japanese Patent Application Laid-open No. 2001-181616, Japanese Patent Application Laid-open No. 2001-181617, and Japanese Patent Application Laid-open No. 2001-247859 disclose organic light emitting materials composed of phosphorescent ortho-metallized palladium complex, ortho-metallized platinum complex and ortho-metallized iridium complex, respectively, and also refer to polymer compounds having these complex structures as repeating units. However, these publications fail to disclose specific exemplification of the structure and method of preparing polymers that are necessary for forming polymers by binding the complex structures as the repeating units disclosed in the publications and discloses no practically usable phosphorescent polymer compounds.

DISCLOSURE OF THE INVENTION

As described above, there has been no light emitting material for organic light emitting devices having an external quantum efficiency that exceeds 5%; which has been conventionally said to be the limit value of the external quantum efficiency of fluorescence. In addition, materials having high efficiencies of light emission have been demanded from the viewpoint of improvement in durability of the device since they have a small energy loss so that heat generation of the device can be prevented. Accordingly, an object of the present invention is to overcome the above-mentioned problems of the prior art and to provide an organic light emitting device having high luminance and high durability and a light emitting material for use therein.

As a result of extensive studies with a view to solving the above-mentioned problems, the inventors of the present invention have found that binding a light emitting substance to a polymer can give rise to light emission of high efficiency from an excited triplet state, thus achieving the present invention.

The expression "binding to a polymer" as used herein means that a light emitting substance is immobilized by some action of the polymer. The method of immobilization is not particularly limited and includes immobilization by chemical bonds or physical bonds, such as covalent bond, coordinate bond, formation of charge transfer complex, ion bond, van der Waals force, and host-guest bond, e.g., intercalation.

In the present invention, a part of the structure of light emitting substance may forms a part of the polymer whereto the light emitting substance is bound, or a part of the ligand of the complex being a light emitting substance may be incorporated into the polymer.

Also, the present inventors have found that a polymer light emitting material obtained by forming a polymerizable composition containing at least one light emitting compound into a film and then polymerizing it has good durability and good processability and that immobilizing the light emitting substance (light emitting part) with a polymer can give rise to light emission of high efficiency from an excited triplet state or light emission of high efficiency through an excited triplet state, thus achieving the present invention.

That is, the present invention relates to the following light emitting materials and light emitting devices.

[1] A polymer light emitting material, wherein the material has a light emitting mechanism based on transition from an excited triplet state to a ground state or transition through an excited triplet state to a ground state of an electron energy level, and the material comprises a nonionic light emitting part which constitutes a part of the polymer or is bound to the polymer.

[2] The polymer light emitting material according to [1], wherein the light emitting part is formed by binding a metal atom to at least one site of the polymer.

[3] The polymer light emitting material according to [2], wherein the metal atom is bound by one or more covalent bonds and/or one or more coordinate bonds.

[4] The polymer light emitting material according to [1], wherein the light emitting part is a metal complex structure having a metal atom or an organometallic structure having a metal atom.

[5] The polymer light emitting material according to [2] or [4], wherein the metal atom is a transition metal atom.

[6] The polymer light emitting material according to [5], wherein the transition metal atom is a transition metal atom belonging to the sixth period of the periodic table.

[7] The polymer light emitting material according to [6], wherein the transition metal atom is iridium.

[8] The polymer light emitting material according to [6], wherein the transition metal is platinum.

[9] The polymer light emitting material according to [2] or [4], wherein the metal atom is a rare earth metal atom.

[10] The polymer light emitting material according to any one of [1] to [9], wherein the light emitting part is formed by binding containing a coordinate bond formed by a metal atom and a nitrogen atom of the polymer.

[11] The polymer light emitting material according to [10], wherein the nitrogen atom of the polymer is a nitrogen atom of a pyridine skeleton and/or pyrimidine skeleton and/or quinoline skeleton on the side of the polymer.

[12] The polymer light emitting material according to [10], wherein the nitrogen atom of the polymer is a nitrogen atom of a phenylpyridine skeleton on the side of the polymer.

[13] The polymer light emitting material according to [10], wherein the nitrogen atom of the polymer is a nitrogen atom of a benzothienyl-pyridine skeleton on the side of the polymer.

[14] The polymer light emitting material according to [1], comprising a light emitting part that contains a phosphorescent moiety and a fluorescent moiety with fluorescence occurring from the fluorescent moiety through an excited triplet state of the phosphorescent moiety and an excited triplet state of the fluorescent moiety, wherein at least one of the phosphorescent moiety and the fluorescent moiety constitutes a part of the polymer or is bound to the polymer.

[15] The polymer light emitting material according to [1], wherein the material is obtained by polymerizing a polymerizable composition containing at least one light emitting compound.

[16] The polymer light emitting material according to [15], wherein the light emitting compound is a polymerizable light emitting compound.

[17] The polymer light emitting material according to [15], wherein the polymer obtained by polymerizing the composition has no crosslinking structure.

[18] The polymer light emitting material according to [16], wherein the at least one polymerizable light emitting compound is a crosslinking polymerizable light emitting compound having two or more polymerizable functional groups and the polymer after the polymerization is a crosslinked polymer.

[19] The polymer light emitting material according to any one of [15] to [18], wherein the polymerizable composition contains at least one polymerizable compound other than the light emitting compound.

[20] The polymer light emitting material according to [19], wherein the at least one polymerizable compound other than the light emitting compound is a polymerizable electron transporting compound.

[21] The polymer light emitting material according to [1,9], wherein at least one polymerizable compound other than the light emitting compound is a crosslinking polymerizable compound having two or more polymerizable functional groups.

[22] The polymer light emitting material according to [15], wherein a light emitting part of the polymer light emitting material is a metal complex structure having a metal atom or an organometallic structure having a metal atom.

[23] The polymer light emitting material according to [22], wherein the metal atom is a transition metal atom.

[24] The polymer light emitting material according to [22], wherein the metal atom is a rare earth metal atom.

[25] The polymer light emitting material according to any one of [22] to [24], wherein the light emitting part contains a nitrogen atom in a complex structure forming part or in an organometallic structure forming part.

[26] The polymer light emitting material according to [25], wherein the light emitting part has a pyridine skeleton, a pyrimidine skeleton and/or a quinoline skeleton in a complex structure forming part or in an organometallic structure forming part.

[27] The polymer light emitting material according to [16], wherein the polymerizable light emitting compound is a polymerizable compound represented by the formula (C-1) below:

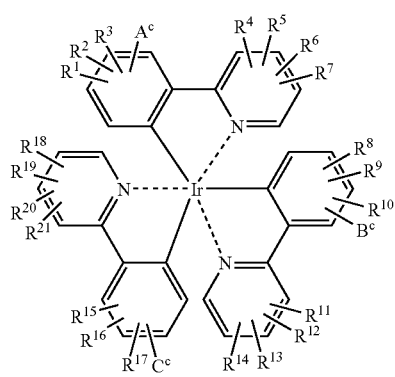

wherein at least one of $A^C$, $B^C$, and $C^C$ represents a substituent having a polymerizable functional group, and the remainder of $A^C$, $B^C$, and $C^C$ independently represent a hydrogen atom, a halogen atom, a nitro group, an amino group, a sulfonic acid group, a sulfonic acid ester group, or an organic group having 1 to 20 carbon atoms which may have one or more heteroatoms; and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[28] The polymer light emitting material according to [16], wherein the polymerizable light emitting compound is a polymerizable compound represented by the formula (D-1) below:

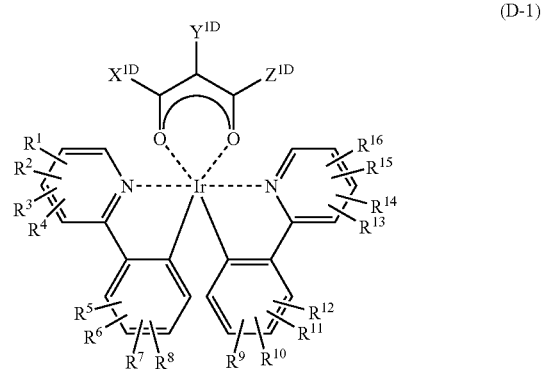

wherein at least one of $X^{1D}$, $Y^{1D}$, and $Z^{1D}$ represents a substituent having a polymerizable functional group, and the remainder of $X^{1D}$, $Y^{1D}$, and $Z^{1D}$ independently represent a hydrogen atom, or an organic group having 1 to 20 carbon atoms which may have one or more heteroatoms; and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[29] The polymer light emitting material according to [16], wherein the polymerizable light emitting compound is a polymerizable compound represented by the formula (E-1) below:

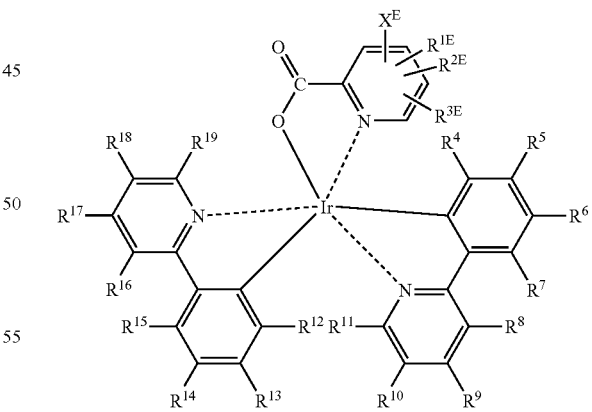

wherein $X^E$ represents a substituent having a polymerizable functional group; $R^{1E}$, $R^{2E}$ and $R^{3E}$ independently represents a hydrogen atom, a halogen atom, or an organic group having 1 to 20 carbon atoms; and $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[30] The polymer light emitting material according to [16], wherein the polymerizable light emitting compound is a polymerizable compound represented by the formula (F-1) below:

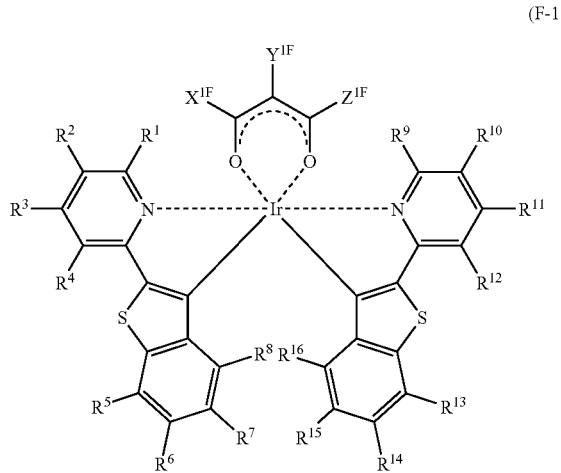

(F-1)

wherein at least one of $X^{1F}$, $Y^{1F}$ and $Z^{1F}$ represents a substituent having a polymerizable functional group, and the remainder of $X^{1F}$, $Y^{1F}$, and $Z^{1F}$ independently represent a hydrogen atom, a halogen atom, or an organic group having 1 to 20 carbon atoms which may have one or more heteroatoms; and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[31] The polymer light emitting material according to [16], wherein the polymerizable light emitting compound is a polymerizable compound represented by the formula (G-1) below:

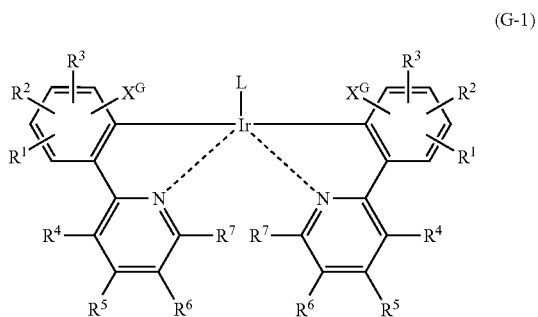

(G-1)

wherein L represents a monovalent anionic bidentate ligand; $X^G$ represents a substituent having a polymerizable functional group; and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[32] A light emitting composition comprising the polymer light emitting material according to any one of [1] to [31], and a carrier transporting polymer compound.

[33] The light emitting composition according to [32], wherein the carrier transporting polymer compound is a hole transporting polymer compound.

[34] The light emitting composition according to [32], wherein the carrier transporting polymer compound is an electron transporting polymer compound.

[35] A light emitting composition comprising the light emitting material according to any one of [1] to [31], and a carrier transporting low molecular weight compound.

[36] The light emitting composition according to [35], wherein the carrier transporting low molecular weight compound is a hole transporting low molecular weight compound.

[37] The light emitting composition according to [35], wherein the carrier transporting low molecular weight compound is an electron transporting low molecular weight compound.

[38] A layer containing a light emitting material for organic light emitting device, wherein a light emitting material is a polymer light emitting material described in [1].

[39] The layer containing a light-emitting material for organic light emitting device according to [38], obtained by forming into a film a polymer light emitting material described in [1].

[40] The layer containing a light emitting material for organic light emitting device according to [39], wherein the polymer light emitting material has no crosslinking structure.

[41] The layer containing a light emitting material for organic light emitting device according to [38], wherein the polymer light emitting material is obtained by forming a polymerizable composition containing at least one light emitting compound into a film and then polymerizing it.

[42] The layer containing a light emitting material for organic light emitting device according to [41], wherein the polymer light emitting material has no crosslinking structure.

[43] The layer containing a light emitting material for organic light emitting device according to [41], wherein the polymer light emitting material has a crosslinking structure.

[44] An organic light emitting device comprising the polymer light emitting material according to any one of [1] to [31].

[45] The organic light emitting device according to [44], comprising a light emitting layer comprising the polymer light emitting material described in any one of [1] to [31] having both sides or one side thereof an electron transporting layer of a coated type, and/or a hole transporting layer of a coated type.

Furthermore, the present invention relates to novel polymerizable compounds, production methods and polymers obtained by polymerizing the polymerizable compounds represented by [A1] to [A3], [B1] to [B2], [C1] to [C60], [D1] to [D38], [E1] to [E34], [F1] to [F38], and [G1] to [G26] below.

[A1] A polymerizable compound which is a metal complex having one or more ligands, wherein at least one ligand is a bidentate ligand having pyridine ring which may have one or more substituents, and at least one ligand including the bidentate ligand above has a polymerizable functional group.

[A2] The polymerizable compound according to [A1], wherein a metal of the metal complex is iridium.

[A3] The polymerizable compound according to [A1] or [A2], wherein the bidentate ligand having pyridine ring is phenylpyridine or benzothienylpyridine.

[B1] A polymerizable compound represented by the formula (B-1):

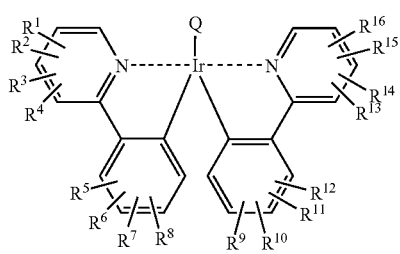

(B-1)

wherein Q represents a bidentate ligand having one or more polymerizable functional groups, and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[B2] A polymerizable compound represented by the formula (B-2):

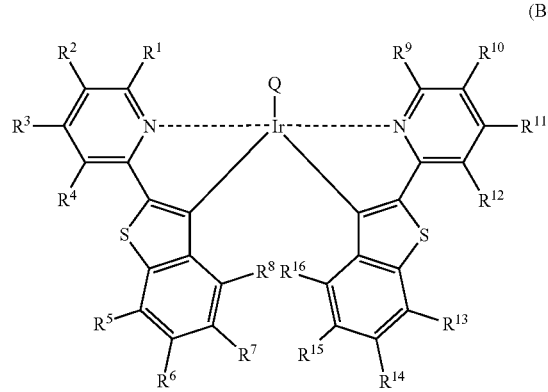

(B-2)

wherein Q represents a bidentate ligand having one or more polymerizable functional groups, and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C1] A polymerizable compound represented by the formula (C-1):

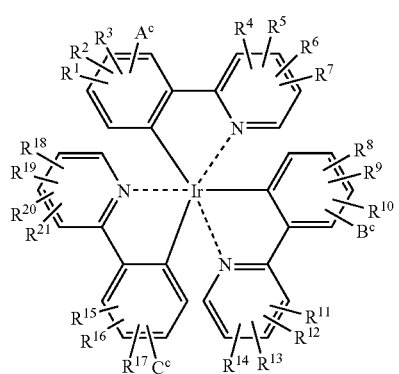

(C-1)

wherein at least one of $A^C$, $B^C$, and $C^C$ represents a substituent having a polymerizable functional group, and the remainder of $A^C$, $B^C$, and $C^C$ independently represent a hydrogen atom, a halogen atom, a nitro group, an amino group, a sulfonic acid group, a sulfonic acid ester group, or an organic group having 1 to 20 carbon atoms which may have one or more heteroatoms; and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C2] The polymerizable compound according to [C1] above, wherein at least one of $A^C$, $B^C$, and $C^C$ in the formula (C-1) is a substituent having an acrylate group or a methacrylate group.

[C3] The polymerizable compound according to [C2] above, wherein one of $A^C$, $B^C$, and $C^C$ in the formula (C-1) is a substituent having an acrylate group or a methacrylate group.

[C4] A polymerizable compound represented by the formula (C-2):

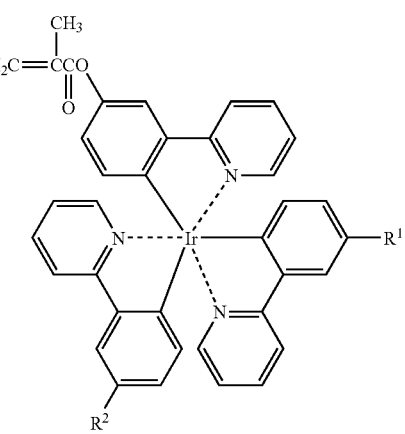

(C-2)

wherein $R^1$ and $R^2$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C5] The polymerizable compound according to [C4] above, wherein both $R^1$ and $R^2$ in the formula (C-2) are a hydrogen atom.

[C6] A polymerizable compound represented by the formula (C-3):

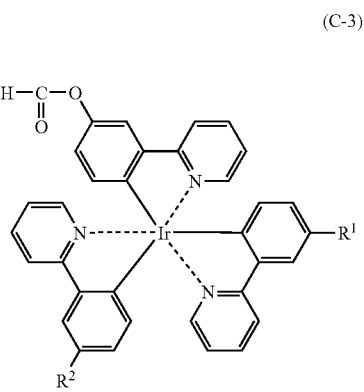

(C-3)

wherein $R^1$ and $R^2$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C7] The polymerizable compound according to [C6] above, wherein both $R^1$ and $R^2$ in the formula (C-3) are a hydrogen atom.

[C8] The polymerizable compound according to [C2] above, wherein two of $A^C$, $B^C$, and $C^C$ in the formula (C-1) are substituents having an acrylate group or a methacrylate group.

[C9] A polymerizable compound represented by the formula (C-4):

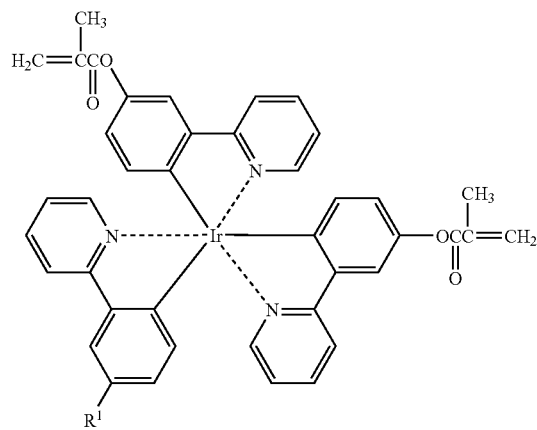

(C-4)

wherein $R^1$ represents a hydrogen atom, a halogen atom, a nitro group, an amino group, a sulfonic acid group, a sulfonic acid ester group, or an organic group having 1 to 20 carbon atoms which may have one or more heteroatoms.

[C10] The polymerizable compound according to [C9] above, wherein $R^1$ in the formula (C-4) is a hydrogen atom.

[C11] A polymerizable compound represented by the formula (C-5):

wherein $R^1$ represents a hydrogen atom, a halogen atom, a nitro group, an amino group, a sulfonic acid group, a sulfonic acid ester group, or an organic group having 1 to 20 carbon atoms which may have one or more heteroatoms.

[C12] The polymerizable compound according to [C11] above, wherein $R^1$ in the formula (C-5) is a hydrogen atom.

[C13] The polymerizable compound according to [C2] above, wherein all of $A^C$, $B^C$, and $C^C$ in the formula (C-1) are a substituent having an acrylate group or a methacrylate group.

[C14] A polymerizable compound represented by the formula (C-6):

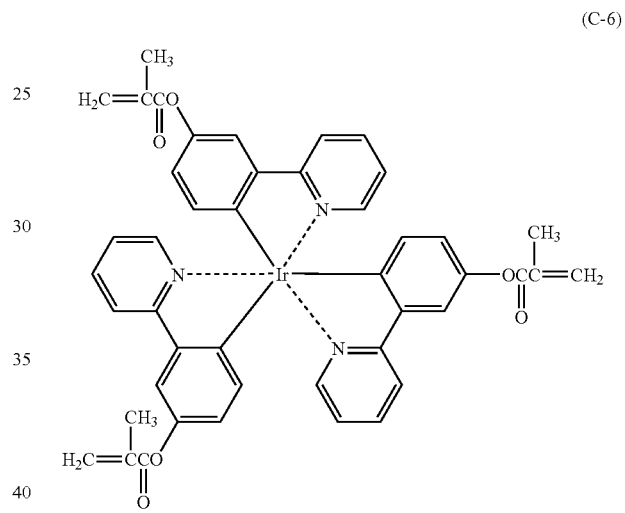

(C-6)

[C15] A polymerizable compound represented by the formula (C-7):

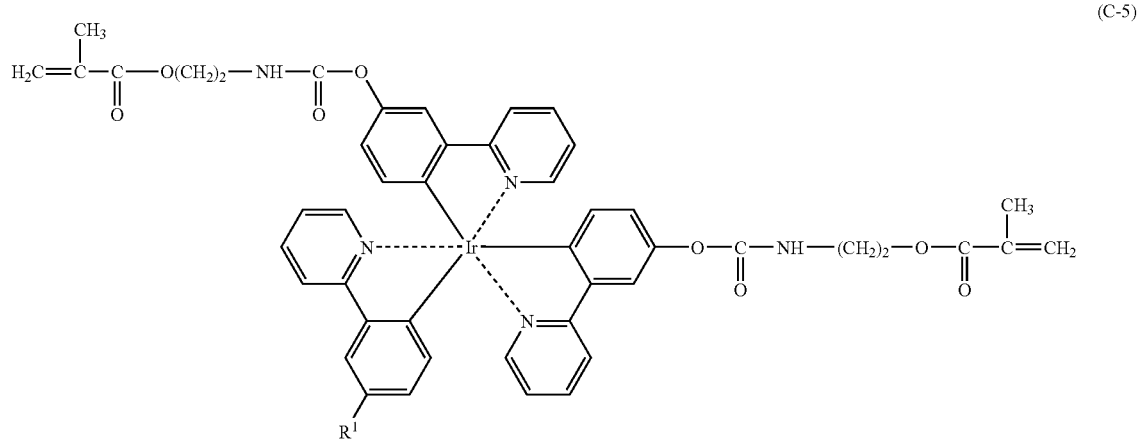

(C-5)

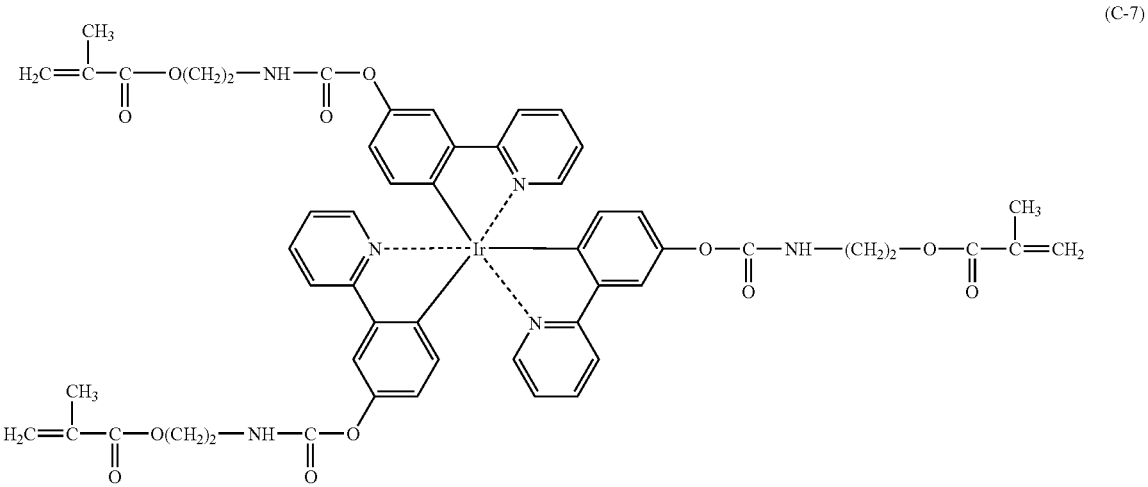

[C16] A polymer obtained by polymerizing the polymerizable compound represented by the formula (C-1):

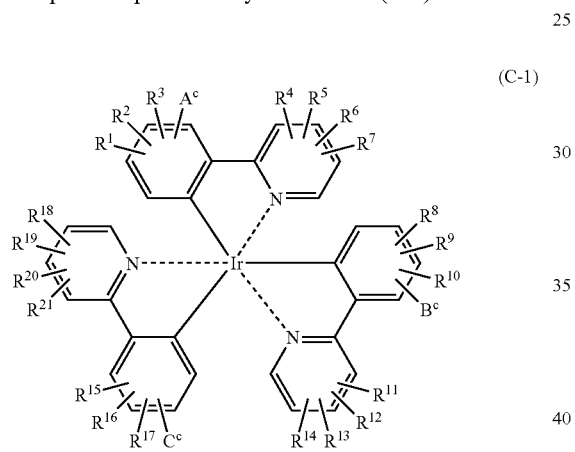

wherein at least one of $A^C$, $B^C$, and $C^C$ represents a substituent having a polymerizable functional group, and the remainder of $A^C$, $B^C$, and $C^C$ independently represent a hydrogen atom, a halogen atom, a nitro group, an amino group, a sulfonic acid group, a sulfonic acid ester group, or an organic group having 1 to 20 carbon atoms which may have one or more heteroatoms; and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C17] The polymer according to [C16] above, wherein at least one of $A^C$, $B^C$, and $C^C$ in the formula (C-1) is a substituent having an acrylate group or a methacrylate group.

[C18] The polymer according to [C17] above, wherein one of $A^C$, $B^C$, and $C^C$ in the formula (C-1) is a substituent having an acrylate group or a methacrylate group.

[C19] A polymer obtained by polymerizing the polymerizable compound represented by the formula (C-2):

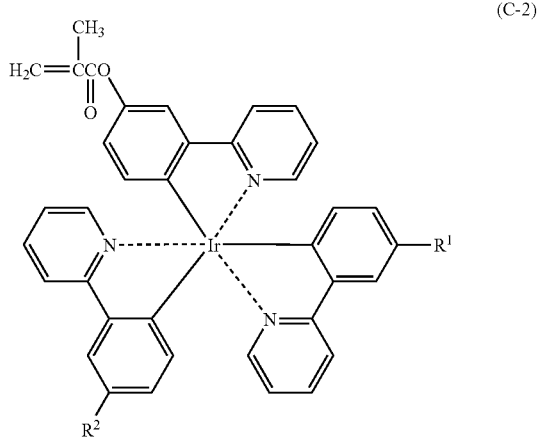

wherein $R^1$ and $R^2$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C20] The polymer according to [C19] above, wherein both $R^1$ and $R^2$ in the formula (C-2) are a hydrogen atom.

[C21] A polymer obtained by polymerizing the polymerizable compound represented by the formula (C-3):

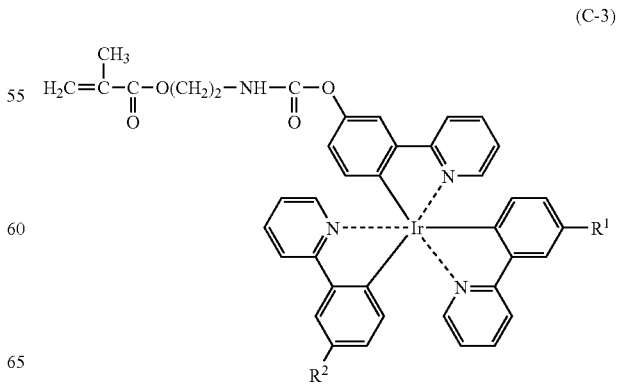

wherein R[1] and R[2] independently represent a hydrogen atom, a halogen atom, a nitro group, an amino group, a sulfonic acid group, a sulfonic acid ester group, or an organic group having 1 to 20 carbon atoms which may have one or more heteroatoms.

[C22] The polymer according to [C21] above, wherein both R[1] and R[2] in the formula (C-3) are a hydrogen atom.

[C23] The polymer according to [C17] above, wherein two of $A^C$, $B^C$, and $C^C$ in the formula (C-1) are substituents having an acrylate group or a methacrylate group.

[C24] A polymer obtained by polymerizing the polymerizable compound represented by the formula (C-4):

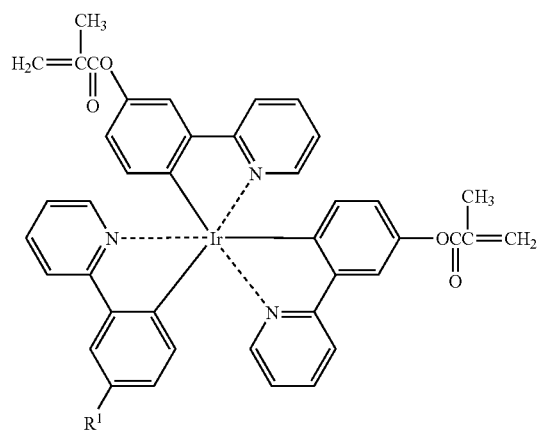

(C-4)

wherein R[1] represents a hydrogen atom, a halogen atom, a nitro group, an amino group, a sulfonic acid group, a sulfonic acid ester group, or an organic group having 1 to 20 carbon atoms which may have one or more heteroatoms.

[C25] The polymer according to [C24] above, wherein R[1] in the formula (C-4) is a hydrogen atom.

[C26] A polymer obtained by polymerizing the polymerizable compound represented by the formula (C-5):

wherein R[1] represents a hydrogen atom, a halogen atom, a nitro group, an amino group, a sulfonic acid group, a sulfonic acid ester group, or an organic group having 1 to 20 carbon atoms which may have one or more heteroatoms.

[C27] The polymer according to [C26] above, wherein R[1] in the formula (C-5) is a hydrogen atom.

[C28] The polymer according to [C17] above, wherein all of $A^C$, $B^C$, and $C^C$ in the formula (C-1) are a substituent having an acrylate group or a methacrylate group.

[C29] A polymer obtained by polymerizing the polymerizable compound represented by the formula (C-6):

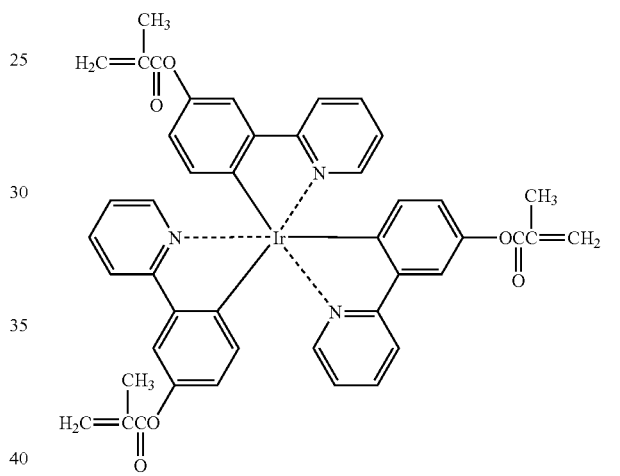

(C-6)

[C30] A polymer obtained by polymerizing the polymerizable compound represented by the formula (C-7):

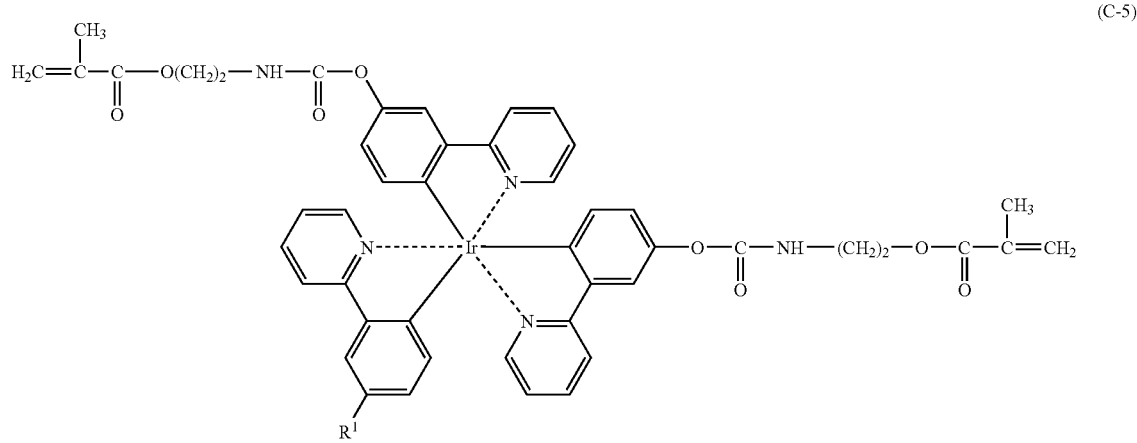

(C-5)

(C-7)

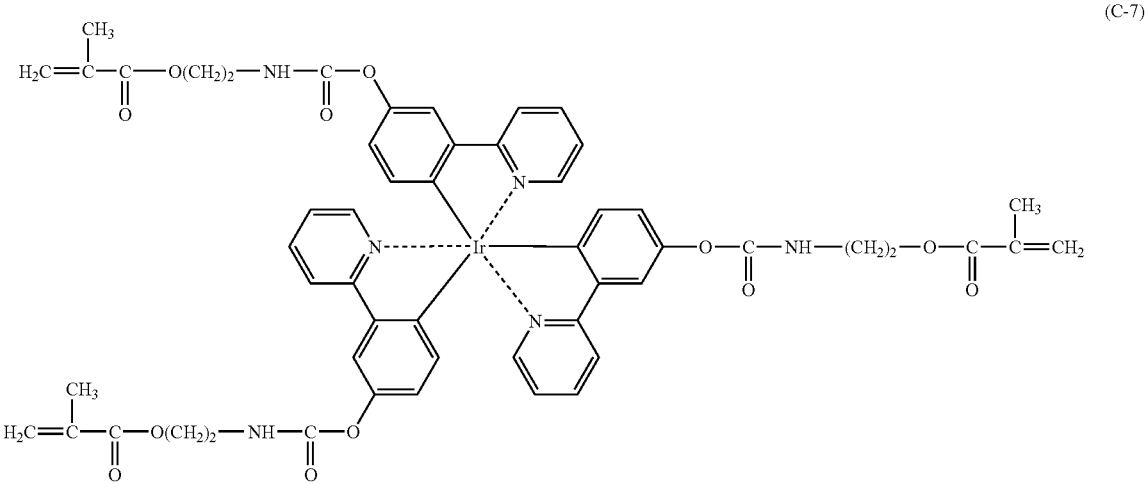

[C31] A copolymer comprising at least one of monomer units derived from the polymerizable compounds represented by any one of the formulae (C-1) to (C-7).

[C32] A method of producing a polymerizable compound containing a mononuclear iridium complex, comprising reacting a binuclear iridium complex represented by the formula (C-8) with a phenylpyridine derivative represented by the formula (C-9), and then reacting a reactive substituent of the reaction product with a compound having a polymerizable functional group;

(C-8)

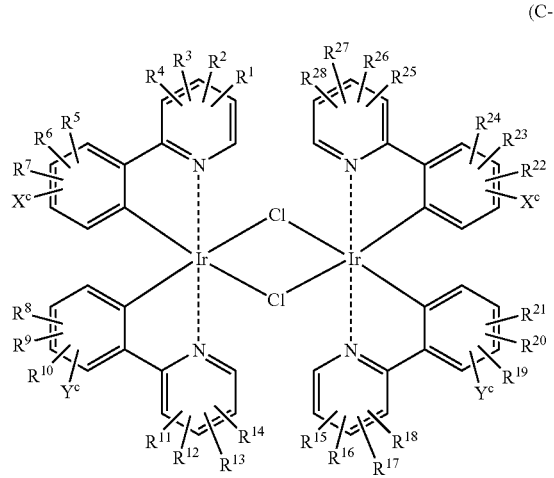

wherein $X^C$ and $Y^C$ independently represent a reactive substituent, or a hydrogen atom, a halogen atom, a nitro group, an amino group, a sulfonic acid group, a sulfonic acid ester group, or an organic group having 1 to 20 carbon atoms which may have one or more heteroatoms, and $R^1$ to $R^{28}$ independently represent a hydrogen atom, a halogen atom, a nitro group, an amino group, a sulfonic acid group, a sulfonic acid ester group, or an organic group having 1 to 20 carbon atoms which may have one or more heteroatoms;

(C-9)

wherein $Z^C$ represents a reactive substituent, or a hydrogen atom, a halogen atom, a nitro group, an amino group, a sulfonic acid group, a sulfonic acid ester group, or an organic group having 1 to 20 carbon atoms which may have one or more heteroatoms, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms, provided that at least one of $X^C$ and $Y^C$ in the formula (C-8) and $Z^C$ in the formula (C-9) is a reactive substituent.

[C33] The method of producing a polymerizable compound containing a mononuclear iridium complex according to [C32] above, wherein $X^C$ and $Y^C$ in the formula (C-8) independently represent a hydrogen atom, a halogen atom, a nitro group, an amino group, a sulfonic acid group, a sulfonic acid ester group, or an organic group having 1 to 20 carbon atoms which may have one or more heteroatoms, and $Z^C$ in the formula (C-9) represents a reactive substituent.

[C34] The method of producing a polymerizable compound containing a mononuclear iridium complex according to [C33] above, wherein $Z^C$ in the formula (C-9) represents a hydroxyl group.

[C35] The method of producing a polymerizable compound containing a mononuclear iridium complex according to [C34] above, wherein the compound having a polymerizable functional group is an acid halide.

[C36] The method of producing a polymerizable compound containing a mononuclear iridium complex according to

[C34] above, wherein the compound having a polymerizable functional group is an isocyanate compound.

[C37] The method of producing a polymerizable compound containing a mononuclear iridium complex according to [C32] above, wherein $X^C$ and $Y^C$ in the formula (C-8) independently represent a reactive substituent, and $Z^C$ in the formula (C-9) represents a hydrogen atom, a halogen atom, a nitro group, an amino group, a sulfonic acid group, a sulfonic acid ester group, or an organic group having 1 to 20 carbon atoms which may have one or more heteroatoms.

[C38] The method of producing a polymerizable compound containing a mononuclear iridium complex according to [C37] above, wherein $Z^C$ in the formula (C-9) represents a hydroxyl group.

[C39] The method of producing a polymerizable compound containing a mononuclear iridium complex according to [C38] above, wherein the compound having a polymerizable functional group is an acid halide.

[C40] The method of producing a polymerizable compound containing a mononuclear iridium complex according to [C37] above, wherein the compound having a polymerizable functional group is an isocyanate compound.

[C41] A method of producing a polymerizable compound containing an iridium complex part, comprising reacting an iridium complex represented by the formula (C-10) with a compound having polymerizable functional group in a predetermined molar ratio, and optionally reacting an unreacted reactive substituent, if any, of the obtained product with an unpolymerizable compound;

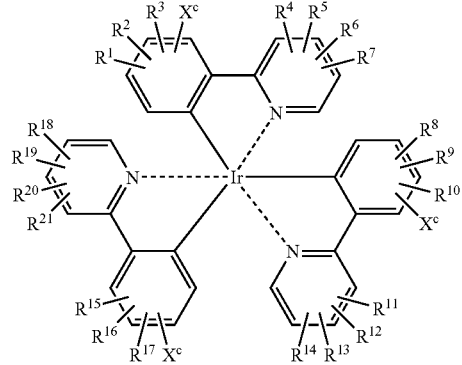

(C-10)

wherein $X^C$ represents a reactive substituent, and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C42] The method of producing a polymerizable compound containing an iridium complex part according to [C41] above, wherein the molar ratio of the iridium complex represented by the formula (C-10) to the compound having a polymerizable functional group is 1:(0.5 to 1.5).

[C43] The method of producing a polymerizable compound containing an iridium complex part according to [C42] above, wherein the reactive substituent in the formula (C-10) is a hydroxyl group.

[C44] The method of producing a polymerizable compound containing an iridium complex part according to [C43] above, wherein the compound having a polymerizable functional group is an acid halide.

[C45] The method of producing a polymerizable compound containing an iridium complex part according to [C43] above, wherein the compound having a polymerizable functional group is an isocyanate compound.

[C46] The method of producing a polymerizable compound containing an iridium complex part according to [C41] above, wherein the molar ratio of the iridium complex represented by the formula (C-10) to the compound having a polymerizable functional group is 1:(1.5 to 2.5).

[C47] The method of producing a polymerizable compound containing an iridium complex part according to [C46] above, wherein the reactive substituent in the formula (C-10) is a hydroxyl group.

[C48] The method of producing a polymerizable compound containing an iridium complex part according to [C47] above, wherein the compound having a polymerizable functional group is an acid halide.

[C49] The method of producing a polymerizable compound containing an iridium complex part according to [C47] above, wherein the compound having a polymerizable functional group is an isocyanate compound.

[C50] The method of producing a polymerizable compound containing an iridium complex part according to [C41] above, wherein the molar ratio of the iridium complex represented by the formula (C-10) to the compound having a polymerizable functional group is 1:(2.5 or more).

[C51] The method of producing a polymerizable compound containing an iridium complex part according to [C50] above, wherein the reactive substituent in the formula (C-10) is a hydroxyl group.

[C52] The method of producing a polymerizable compound containing an iridium complex part according to [C51] above, wherein the compound having a polymerizable functional group is an acid halide.

[C53] The method of producing a polymerizable compound containing an iridium complex part according to [C51] above, wherein the compound having a polymerizable functional group is an isocyanate compound.

[C54] A compound represented by the formula (C-11):

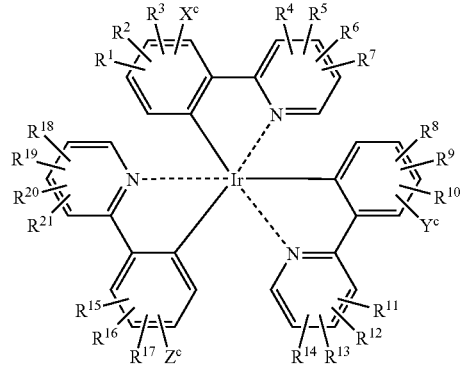

(C-11)

wherein at least one of $X^C$, $Y^C$, and $Z^C$ represents a hydroxyl group, and the remainder of $X^C$, $Y^C$, and $Z^C$ independently represent a hydrogen atom, a halogen atom, a nitro group, an amino group, a sulfonic acid group, a sulfonic acid ester group, or an organic group having 1 to 20 carbon atoms which may have one or more heteroatoms; and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[C55] The compound according to [C54] above, wherein one of $X^C$, $Y^C$, and $Z^C$ in the formula (C-11) is a hydroxyl group.

[C56] A compound represented by the formula (C-12):

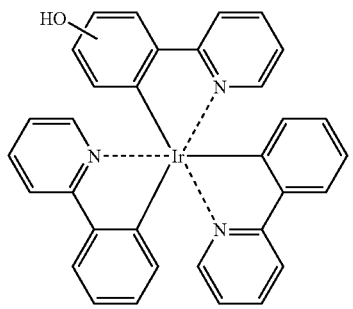

(C-12)

[C57] The compound according to [C54] above, wherein two of $X^C$, $Y^C$, and $Z^C$ in the formula (C-11) are a hydroxyl group.

[C58] A compound represented by the formula (C-13):

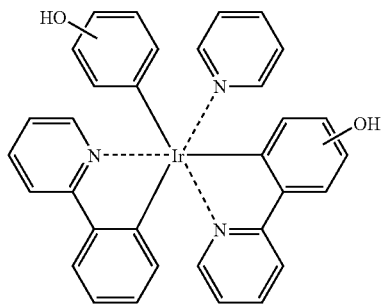

(C-13)

[C59] The compound according to [C54] above, wherein all of $X^C$, $Y^C$, and $Z^C$ in the formula (C-11) are a hydroxyl group.

[C60] A compound represented by the formula (C-14):

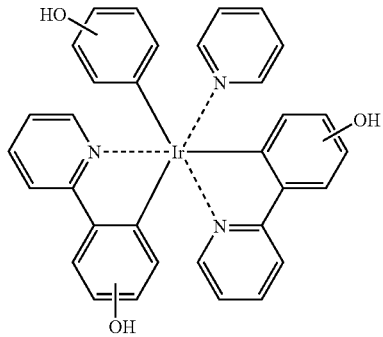

(C-14)

[D1] A polymerizable compound represented by the formula (D-1):

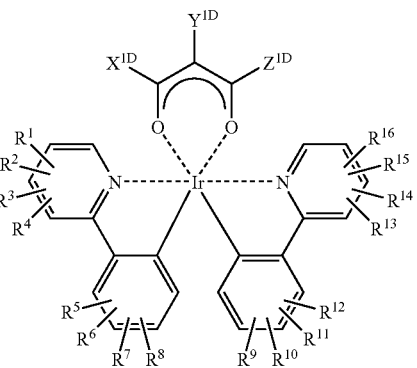

(D-1)

wherein at least one of $X^{1D}$, $Y^{1D}$, and $Z^{1D}$ represents a substituent having a polymerizable functional group, and the remainder of $X^{1D}$, $Y^{1D}$, and $Z^{1D}$ independently represent a hydrogen atom, or an organic group having 1 to 20 carbon atoms which may have one or more heteroatoms, and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[D2] The polymerizable compound according to [D1] above, wherein one of $X^{1D}$ or $Z^{1D}$ in the formula (D-1) is a substituent having a polymerizable functional group.

[D3] A polymerizable compound represented by the formula (D-2):

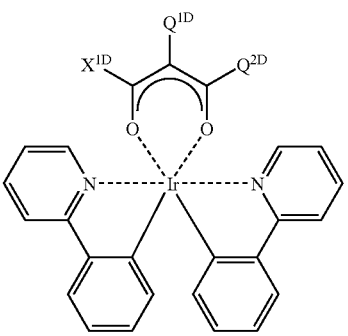

(D-2)

wherein $X^{1D}$ represents a substituent having a polymerizable functional group, and $Q^{1D}$ and $Q^{2D}$ independently represent a hydrogen atom, or an organic group having 1 to 20 carbon atoms which may have one or more heteroatoms.

[D4] The polymerizable compound according to any one of [D1] to [D3] above, wherein the polymerizable functional group is a group having a carbon-carbon double bond.

[D5] A polymerizable compound represented by the formula (D-3):

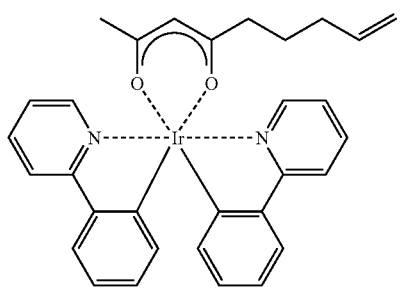

(D-3)

[D6] The polymerizable compound according to any one of [D1] to [D3] above, wherein the polymerizable functional group is a styryl group.

[D7] A polymerizable compound represented by the formula (D-4):

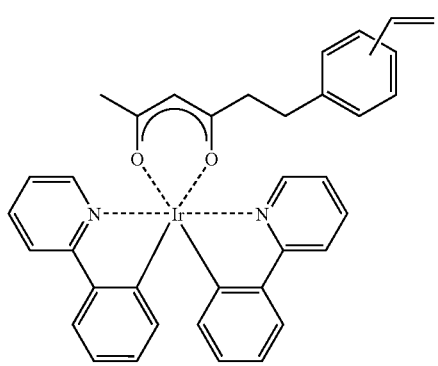

(D-4)

[D8] The polymerizable compound according to any one of [D1] to [D3] above, wherein the polymerizable functional group is an acrylate group or a methacrylate group.

[D9] A polymerizable compound represented by the formula (D-5):

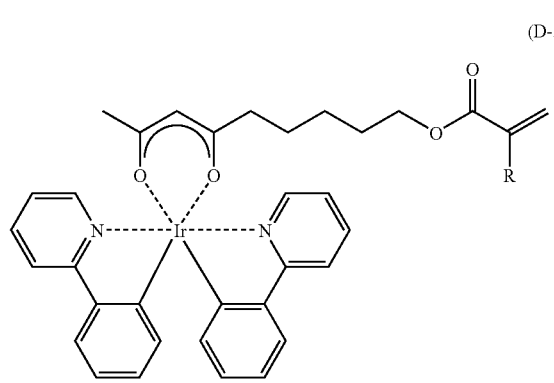

(D-5)

wherein R represents a hydrogen atom or a methyl group.

[D10] A polymerizable compound represented by the formula (D-6):

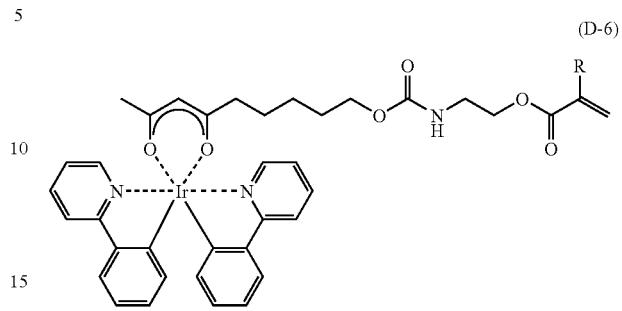

(D-6)

wherein R represents a hydrogen atom or a methyl group.

[D7] A polymerizable compound represented by the formula (D-7):

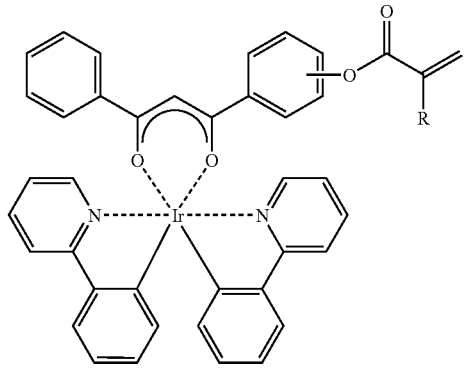

(D-7)

wherein R represents a hydrogen atom or a methyl group.

[D12] A polymerizable compound represented by the formula (D-8):

(D-8)

wherein R represents a hydrogen atom or a methyl group.

[D13] A polymerizable compound represented by the formula (D-9):

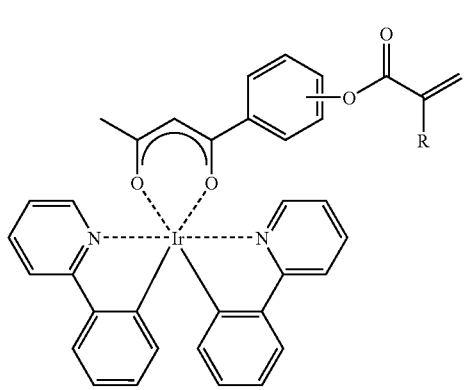

(D-9)

wherein R represents a hydrogen atom or a methyl group.

[D14] A polymerizable compound represented by the formula (D-10):

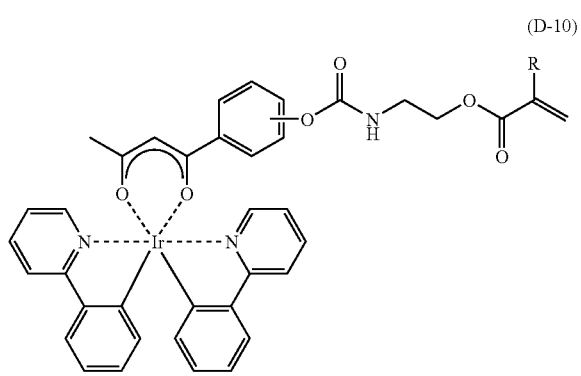

(D-10)

wherein R represents a hydrogen atom or a methyl group.

[D15] A polymerizable compound represented by the formula (D-11):

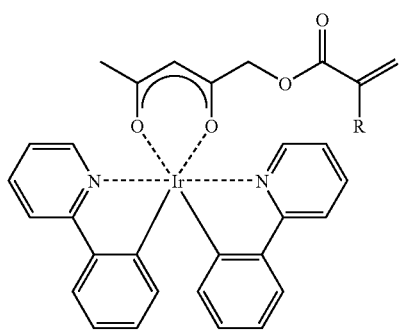

(D-11)

wherein R represents a hydrogen atom or a methyl group.

[D16] A polymerizable compound represented by the formula (D-12):

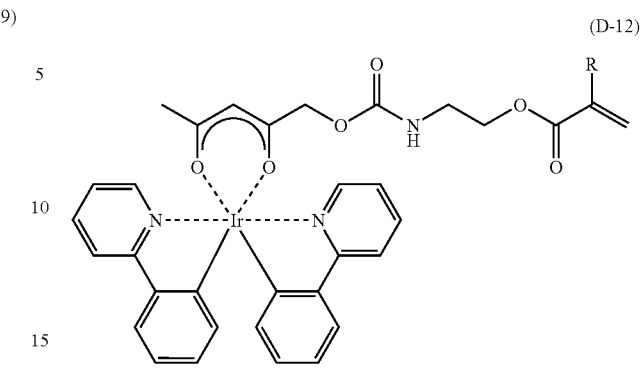

(D-12)

wherein R represents a hydrogen atom or a methyl group.

[D17] A polymerizable compound represented by the formula (D-13):

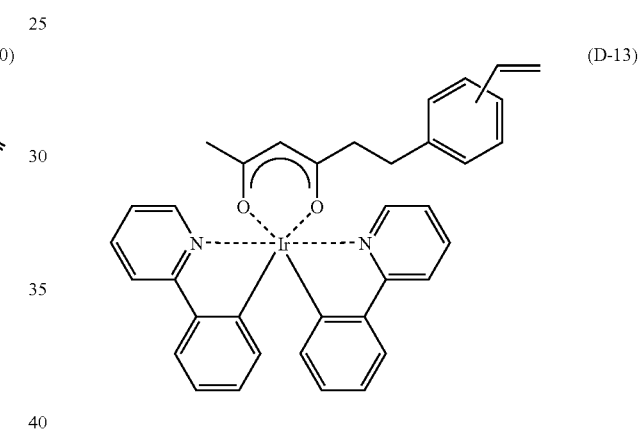

(D-13)

[D18] The polymerizable compound according to [D1] above, wherein $Y^{1D}$ in the formula (D-1) is a substituent having a polymerizable functional group.

[D19] A polymerizable compound represented by the formula (D-14):

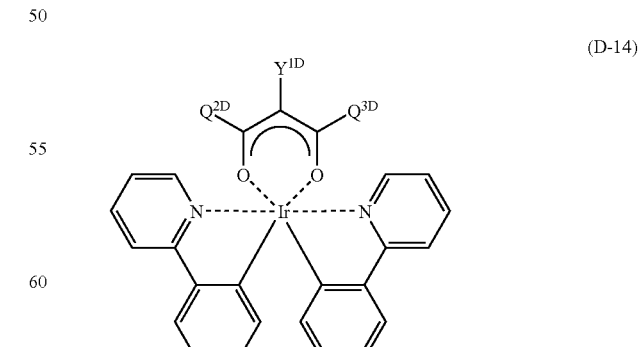

(D-14)

wherein $Y^{1D}$ represents a substituent having a polymerizable functional group, and $Q^{2D}$ and $Q^{3D}$ independently represent a hydrogen atom, or an organic group having 1 to 20 carbon atoms which may have one or more heteroatoms.

[D20] The polymerizable compound according to [D18] or [D19] above, wherein the polymerizable functional group is a group having a carbon-carbon double bond.

[D21] The polymerizable compound according to [D18] or [D19] above, wherein the polymerizable functional group is a styryl group.

[D22] The polymerizable compound according to [D18] or [D19] above, wherein the polymerizable functional group is an acrylate group or a methacrylate group.

[D23] A polymerizable compound represented by the formula (D-15):

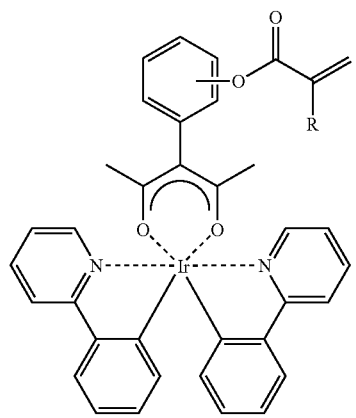

(D-15)

wherein R represents a hydrogen atom or a methyl group.

[D24] A polymerizable compound represented by the formula (D-16):

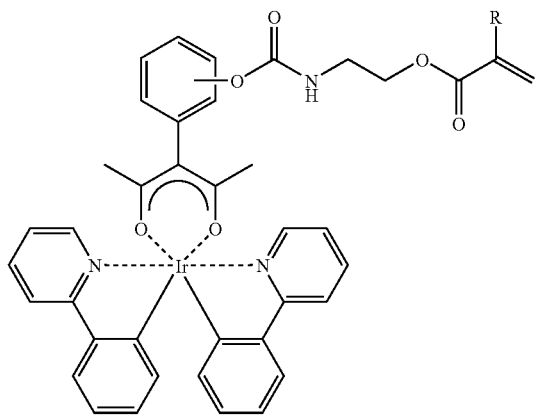

(D-16)

wherein R represents a hydrogen atom or a methyl group.

[D25] A method of producing a polymerizable compound containing a mononuclear iridium complex part, comprising reacting a binuclear iridium complex represented by the formula (D-17) with a compound having a polymerizable functional group represented by the formula (D-18) below:

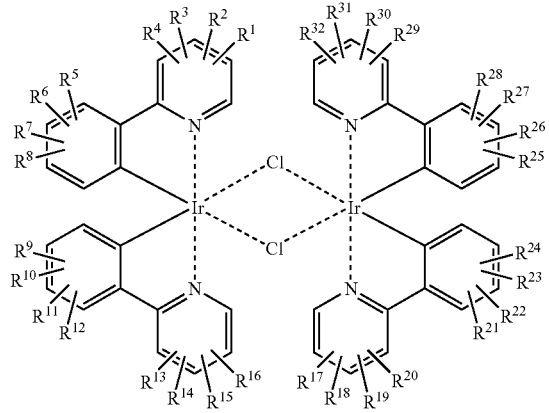

(D-17)

wherein $R^1$ to $R^{32}$ independently represent a hydrogen atom, a halogen atom, a nitro group, an amino group, a sulfonic acid group, a sulfonic acid ester group, or an organic group having 1 to 20 carbon atoms which may have one or more heteroatoms;

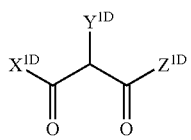

(D-18)

wherein at least one of $X^{1D}$, $Y^{1D}$, and $Z^{1D}$ represents a substituent having a polymerizable functional group, and the remainder of $X^{1D}$, $Y^{1D}$, and $Z^{1D}$ independently represent a hydrogen atom, or an organic group having 1 to 20 carbon atoms which may have one or more heteroatoms.

[D26] The method of producing a polymerizable compound containing a mononuclear iridium complex part according to [D25] above, wherein $X^{1D}$ or $Z^{1D}$ in the formula (D-18) is a substituent having a polymerizable functional group.

[D27] The method of producing a polymerizable compound containing a mononuclear iridium complex part according to [D25] above, wherein $Y^{1D}$ in the formula (D-18) is a substituent having a polymerizable functional group.

[D28] A method of producing a polymerizable compound containing a mononuclear iridium complex part, comprising reacting a binuclear iridium complex represented by the formula (D-17) with a compound having a polymerizable functional group represented by the formula (D-19) below and then reacting a reactive substituent of the obtained mononuclear iridium complex with a compound having a polymerizable functional group:

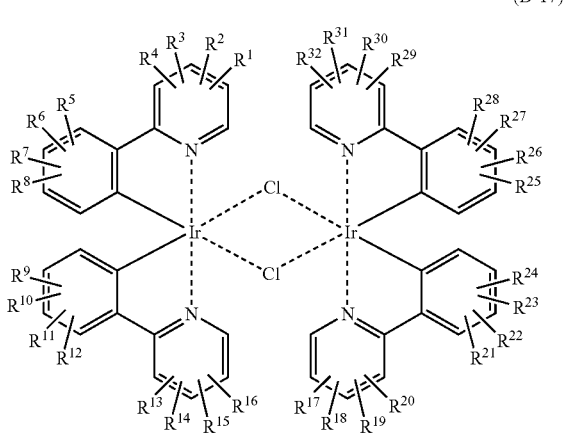

(D-17)

wherein $R^1$ to $R^{32}$ independently represent a hydrogen atom, a halogen atom, a nitro group, an amino group, a sulfonic acid group, a sulfonic acid ester group, or an organic group having 1 to 20 carbon atoms which may have one or more heteroatoms;

(D-19)

wherein at least one of $X^{2D}$, $Y^{2D}$, and $Z^{2D}$ represents a substituent having a polymerizable functional group, and the remainder of $X^{2D}$, $Y^{2D}$, and $Z^{2D}$ independently represent a hydrogen atom, or an organic group having 1 to 20 carbon atoms which may have one or more heteroatoms.

[D29] The method of producing a polymerizable compound containing a mononuclear iridium complex part according to [D28] above, wherein $X^{2D}$ or $Z^{2D}$ in the formula (D-19) is a substituent having a hydroxyl group.

[D30] The method of producing a polymerizable compound containing a mononuclear iridium complex part according to [D28] above, wherein $Y^{2D}$ in the formula (D-19) is a substituent having a hydroxyl group.

[D31] A compound represented by the formula (D-20):

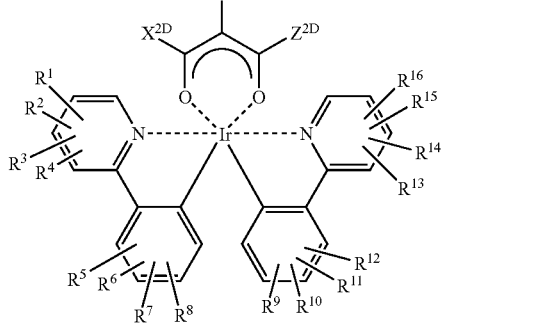

(D-20)

wherein at least one of $X^{2D}$, $Y^{2D}$, and $Z^{2D}$ represents a substituent having a hydroxyl group, and the remainder of $X^{2D}$, $Y^{2D}$, and $Z^{2D}$ independently represent a hydrogen atom, or an organic group having 1 to 20 carbon atoms which may have one or more heteroatoms; and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[D32] The compound according to [D31] above, wherein $X^{2D}$ or $Z^{2D}$ in the formula (D-20) is a substituent having a hydroxyl group.

[D33] A compound represented by the formula (D-21):

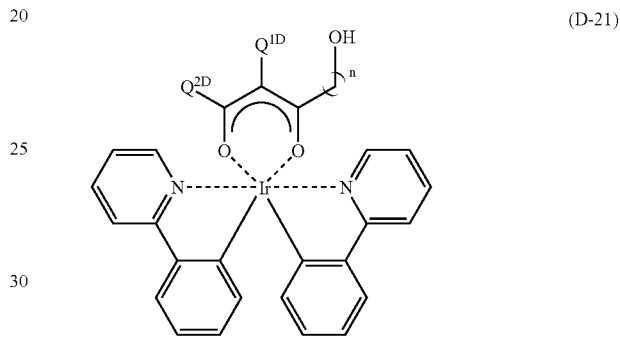

(D-21)

wherein n is 0 or an integer of 1 to 20, and $Q^{1D}$ and $Q^{2D}$ independently represent a hydrogen atom, or an organic group having 1 to 20 carbon atoms which may have one or more heteroatoms.

[D34] A compound represented by the formula (D-22):

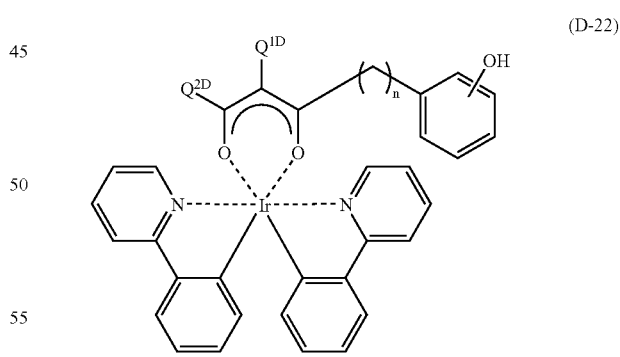

(D-22)

wherein n is 0 or an integer of 1 to 20, and $Q^{1D}$ and $Q^{2D}$ independently represent a hydrogen atom, or an organic group having 1 to 20 carbon atoms which may have one or more heteroatoms.

[D35] The compound according to [D31] above, wherein $Y^{2D}$ in the formula (D-20) is a substituent having a hydroxyl group.

[D36] A compound represented by the formula (D-23):

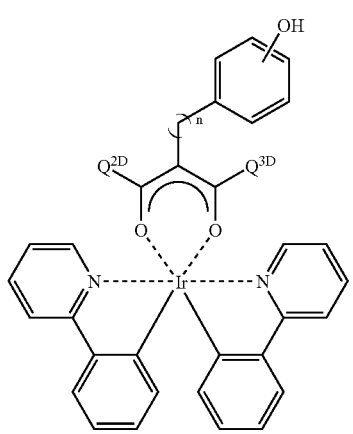

(D-23)

wherein n is 0 or an integer of 1 to 20, and $Q^{2D}$ and $Q^{3D}$ independently represent a hydrogen atom, or an organic group having 1 to 20 carbon atoms which may have one or more heteroatoms.

[D37] A polymer of the polymerizable compound according to any one of [D1] to [D24] above.

[D38] A polymer obtained by polymerizing a composition containing at least one of the polymerizable compounds according to [D1] to [D24] above.

[E1] A polymerizable compound represented by the formula (E-1):

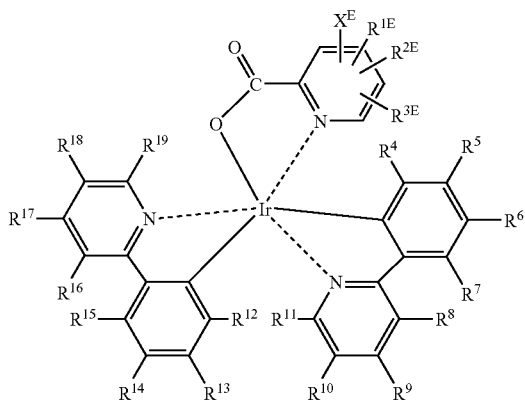

(E-1)

wherein $X^E$ represents a substituent having a polymerizable functional group; $R^{1E}$, $R^{2E}$ and $R^{3E}$ independently represent a hydrogen atom, a halogen atom, or an organic group having 1 to 20 carbon atoms which may have one or more heteroatoms; and $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[E2] The polymerizable compound according to [E1] above, wherein the polymerizable functional group of $X^E$ in the formula (E-1) is a group having a carbon-carbon double bond.

[E3] A polymerizable compound represented by the formula (E-2):

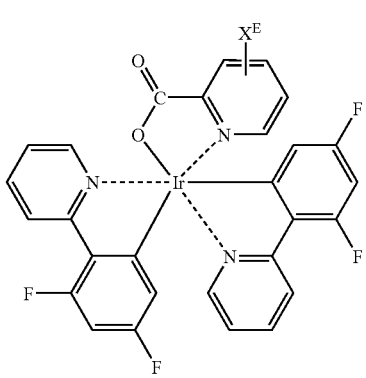

(E-2)

wherein $X^E$ represents a substituent having a polymerizable functional group.

[E4] The polymerizable compound according to [E1] or [E3] above, wherein the polymerizable functional group is an acryloyloxy group or a methacryloyloxy group.

[E5] The polymerizable compound according to [E1] or [E3] above, wherein the polymerizable functional group of $X^E$ in the formula (E-1) or (E-2) is a methacryloyloxy group.

[E6] A polymerizable compound represented by the formula (E-3):

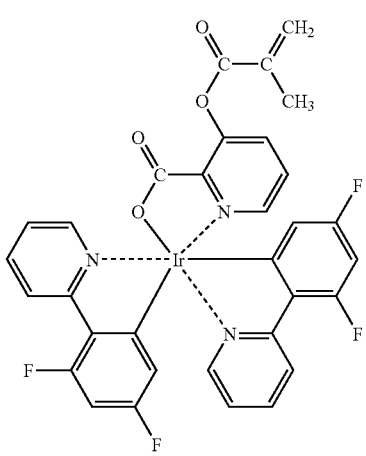

(E-3)

[E7] The polymerizable compound according to [E1] or [E3] above, wherein the polymerizable functional group of $X^E$ in the formula (E-1) or (E-2) is a methacryloyloxymethyl group.

[E8] A polymerizable compound represented by the formula (E-4):

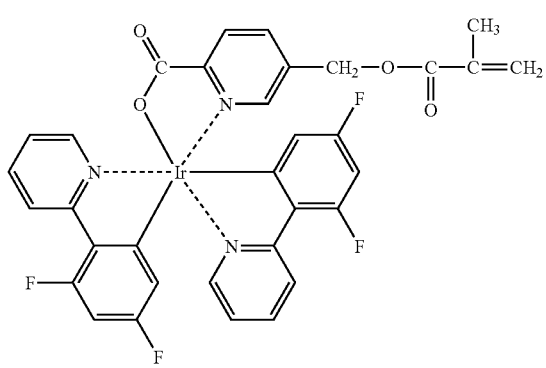

(E-4)

[E9] The polymerizable compound according to [E1] or [E3] above, wherein the polymerizable functional group of $X^E$ in the formula (E-1) or (E-2) is a methacryloyloxyethyl-carbamoyloxymethyl group.

[E10] A polymerizable compound represented by the formula (E-5):

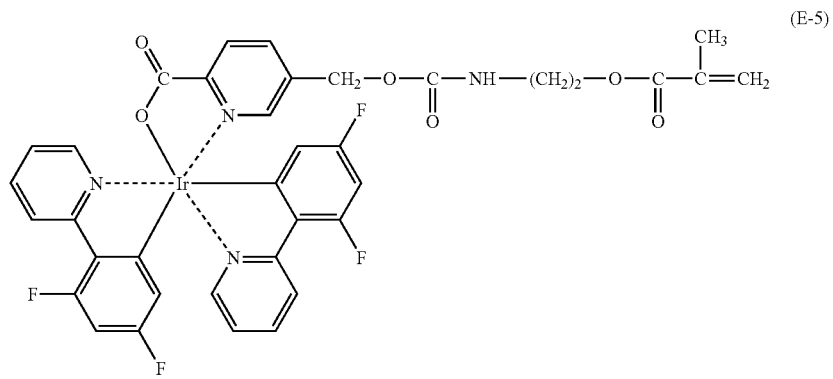

(E-5)

[E11] The polymerizable compound according to [E1] or [E3] above, wherein the polymerizable functional group of $X^E$ in the formula (E-1) or (E-2) is a methacryloyloxyethyloxycarbonyl group.

[E12] A polymerizable compound represented by the formula (E-6):

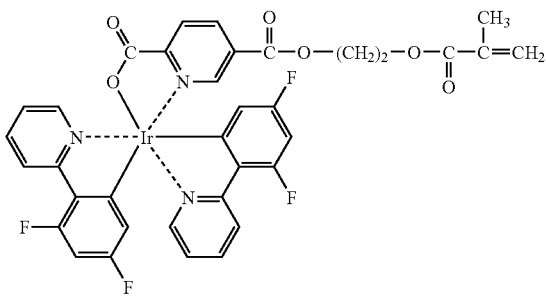

(E-6)

[E13] The polymerizable compound according to [E1] or [E3] above, wherein the polymerizable functional group is a styryl group.

[E14] The polymerizable compound according to [E1] or [E3] above, wherein the polymerizable functional group of $X^E$ in the formula (E-1) or (E-2) is a vinylbenzyloxy group.

[E15] A polymerizable compound represented by the formula (E-7):

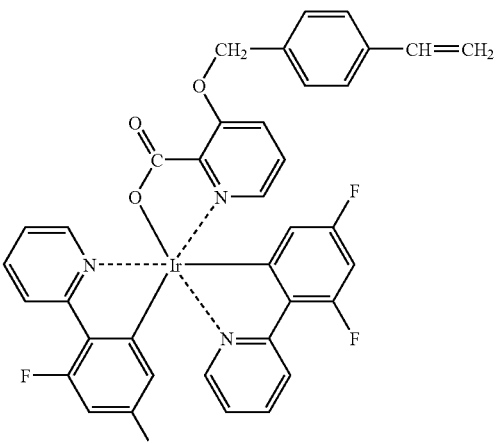

(E-7)

[E16] A polymerizable compound represented by the formula (E-8):

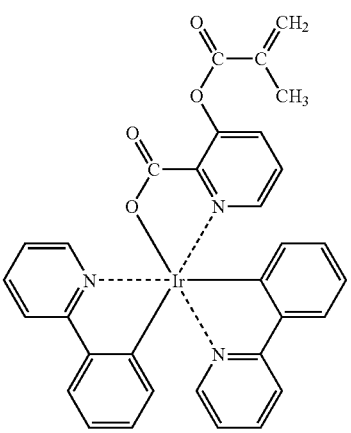

(E-8)

[E17] A method of producing a polymerizable compound containing a mononuclear iridium complex part, comprising reacting a binuclear iridium complex represented by the formula (E-9) with a picolinic acid derivative represented by the formula (E-10) and then reacting the obtained reaction product with a compound having both a polymerizable functional group and a functional group capable of reacting with and bonding the reactive substituent $Y^E$ derived from a compound represented by the formula (E-10) below:

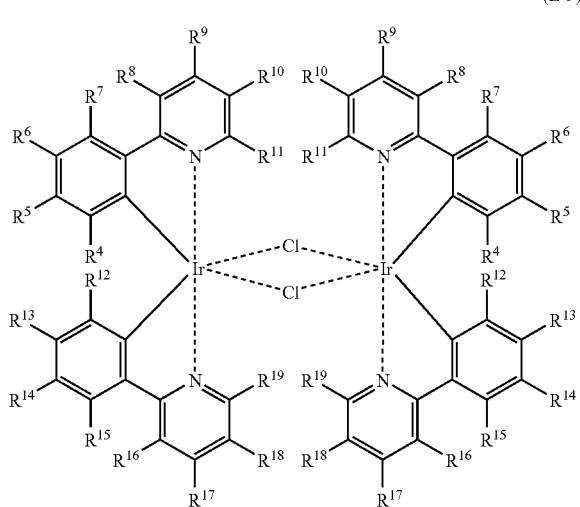

(E-9)

wherein $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms;

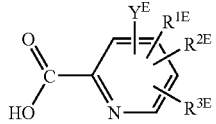

(E-10)

wherein $Y^E$ represents a reactive substituent; and $R^{1E}$, $R^{2E}$ and $R^{3E}$ independently represent a hydrogen atom, a halogen atom, or an organic group having 1 to 20 carbon atoms which may have one or more heteroatoms.

[E18] The method of producing a polymerizable compound containing a mononuclear iridium complex part according to [E17] above, wherein $Y^E$ in the formula (E-10) is a group having an active hydrogen.

[E19] The method of producing a polymerizable compound containing a mononuclear iridium complex part according to [E17] above, wherein $Y^E$ in the formula (E-10) is a hydroxyl group or a hydroxymethyl group.

[E20] The method of producing a polymerizable compound containing a mononuclear iridium complex part according to [E19] above, wherein the compound having both a polymerizable functional group and a functional group capable of reacting with and bonding the reactive substituent yE is an acid chloride compound having a polymerizable functional group.

[E21] The method of producing a polymerizable compound containing a mononuclear iridium complex part according to [E19] above, wherein the compound having both a polymerizable functional group and a functional group capable of reacting with and bonding the reactive substituent yE is an alkyl halide compound having a polymerizable functional group.

[E22] The method of producing a polymerizable compound containing a mononuclear iridium complex part according to [E18] or [E19] above, wherein the compound having both a polymerizable functional group and a functional group capable of reacting with and bonding the reactive substituent yE is an isocyanate compound having a polymerizable functional group.

[E23] The method of producing a polymerizable compound containing a mononuclear iridium complex part according to [E17] above, wherein $Y^E$ in the formula (E-10) is a carboxyl group.

[E24] The method of producing a polymerizable compound containing a mononuclear iridium complex part according to [E23] above, wherein the compound having both a polymerizable functional group and a functional group capable of reacting with and bonding the reactive substituent yE is a compound having a hydroxyl group and a polymerizable functional group.

[E25] A method of producing a polymerizable compound containing a mononuclear iridium complex part, comprising reacting a binuclear iridium complex represented by the formula (E-9) and a picolinic acid derivative represented by the formula (E-11):

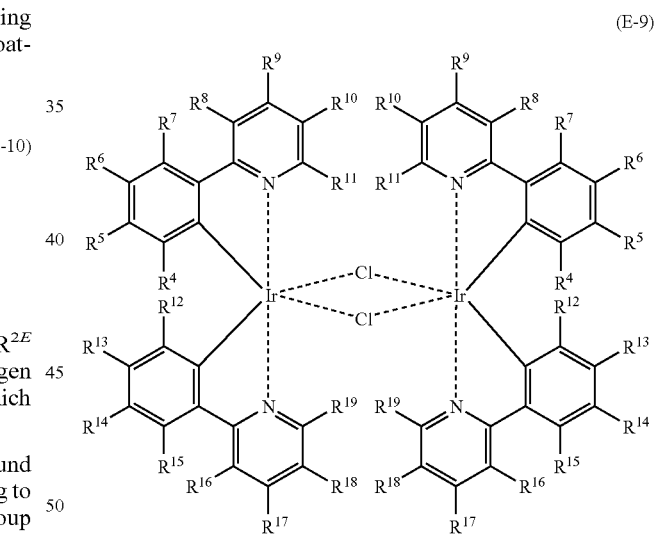

(E-9)

wherein $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms;

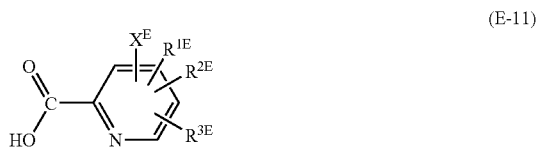

(E-11)

wherein $X^E$ represents a substituent having a polymerizable functional group, and $R^{1E}$, $R^{2E}$ and $R^{3E}$ independently represent a hydrogen atom, a halogen atom, or an organic group having 1 to 20 carbon atoms which may have one or more heteroatoms.

[E26] The method of producing a polymerizable compound containing a mononuclear iridium complex part according to [E25] above, wherein $X^E$ in the formula (E-11) is any one member selected from the group consisting of a methacryloyloxy group, a methacryloyloxymethyl group, a methacryloyloxyethylcarbamoyloxymethyl group, a methacryloyloxyethyloxycarbonyl group, and a vinylbenzyloxy group.

[E27] A compound represented by the formula (E-12):

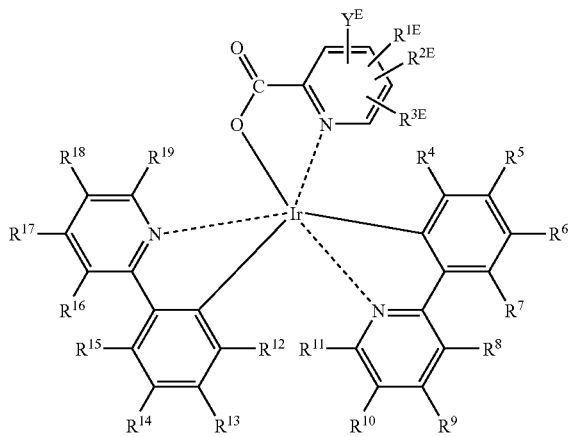

(E-12)

wherein $Y^E$ represents a reactive substituent, $R^{1E}$, $R^{2E}$ and $R^{3E}$ independently represent a hydrogen atom, a halogen atom, or an organic group having 1 to 20 carbon atoms which may have one or more heteroatoms, and $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[E28] The compound according to [E27] above, wherein $Y^E$ in the formula (E-12) is a hydroxyl group.

[E29] A compound represented by the formula (E-13):

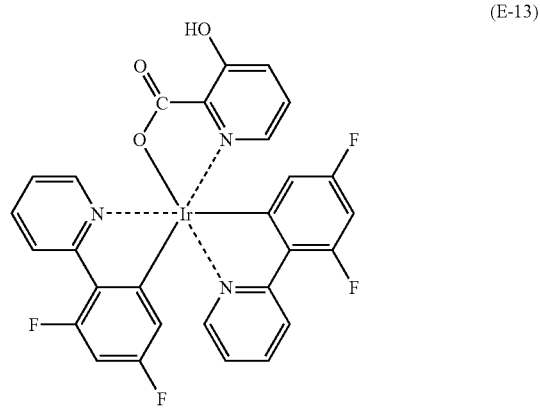

(E-13)

[E30] A compound represented by the formula (E-14):

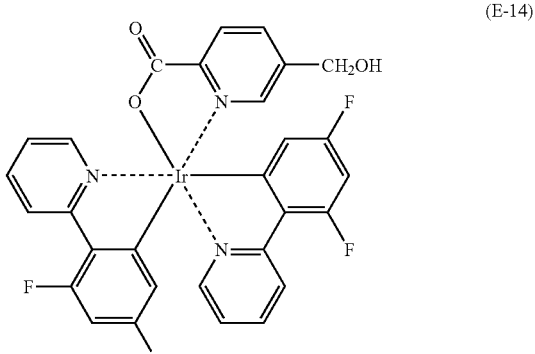

(E-14)

[E31] A compound represented by the formula (E-15):

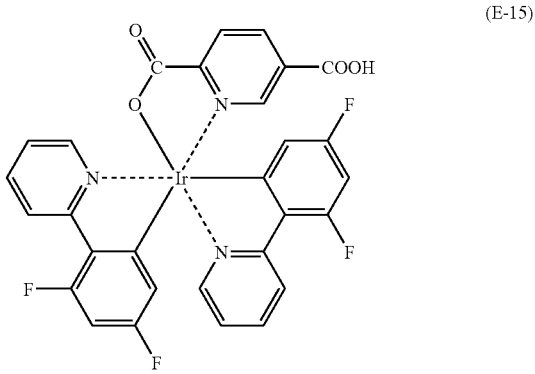

(E-15)

[E32] A polymerizable composition containing the polymerizable compound according to any one of [E1] to [E16] above.

[E33] A polymer of the polymerizable compound according to any one of [E1] to [E16].

[E34] A polymer obtained by polymerizing the polymerizable composition according to [E32] above.

[F1] A polymerizable compound represented by the formula (F-1):

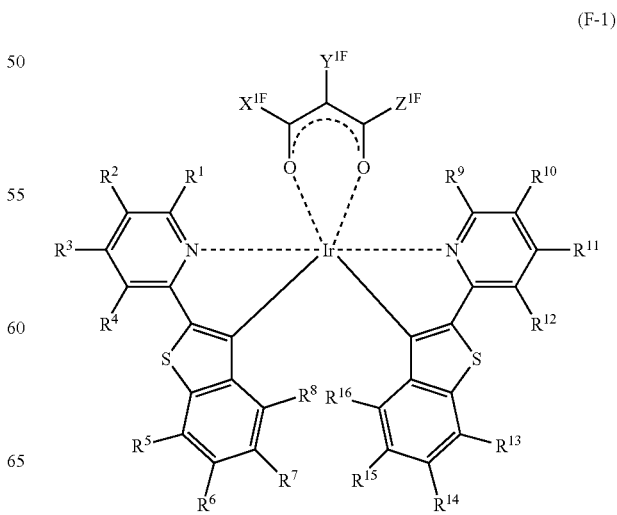

(F-1)

wherein at least one of $X^{1F}$, $Y^{1F}$, and $Z^{1F}$ represents a substituent having a polymerizable functional group, and the remainder of $X^{1F}$, $Y^{1F}$, and $Z^{1F}$ independently represent a hydrogen atom, a halogen atom, or an organic group having 1 to 20 carbon atoms which may have one or more heteroatoms; and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[F2] The polymerizable compound according to [F1] above, wherein either one of $X^{1F}$ and $Z^{1F}$ is a substituent having a polymerizable functional group.

[F3] A polymerizable compound respresented by the formula (F-2)

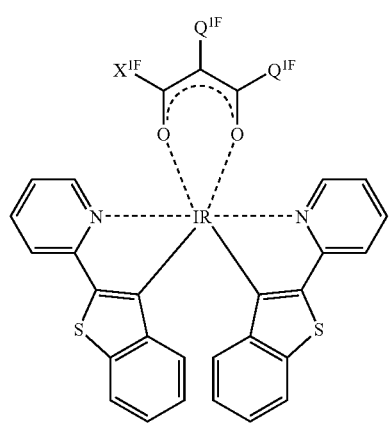

(F-2)

wherein $X^{1F}$ represents a substituent having a polymerizable functional group, and $Q^{1F}$ and $Q^{2F}$, independently represent a hydrogen atom, a halogen atom, or an organic group having 1 to 20 carbon atoms which may have one or more heteroatoms.

[F4] The polymerizable compound according to any one of [F1] to [F3] above, wherein the polymerizable functional group is a group having a carbon-carbon double bond.

[F5] A polymerizable compound represented by the formula (F-3):

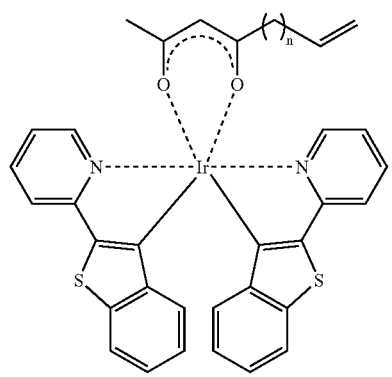

(F-3)

wherein n is 0 or an integer of 1 to 20.

[F6] The polymerizable compound according to any one of [F1] to [F3] above, wherein the polymerizable functional group is a styryl group.

[F7] A polymerizable compound represented by the formula (F-4):

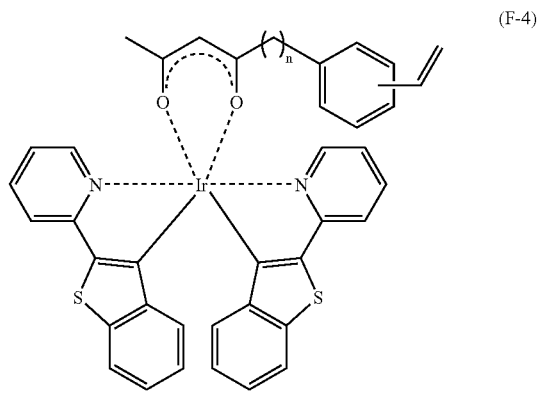

(F-4)

wherein n is 0 or an integer of 1 to 20.

[F8] A polymerizable compound represented by the formula (F-5):

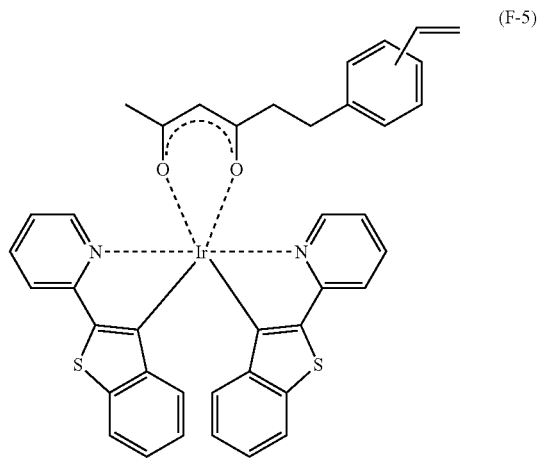

(F-5)

[F9] The polymerizable compound according to any one of [F1] to [F3] above, wherein the polymerizable functional group is an alkenoyloxy group.

[F10] A polymerizable compound represented by the formula (F-6):

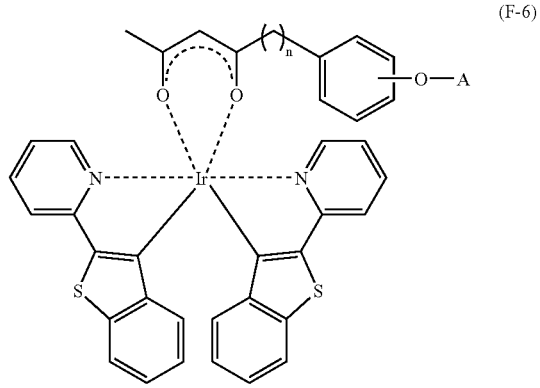

(F-6)

wherein n is 0 or an integer of 1 to 20, and A represents an organic group having 3 to 20 carbon atoms that has an acryloyl group, a methacryloyl group, an acryloyloxy group, or a methacryloyloxy group.

[F11] A polymerizable compound represented by the formula (F-7):

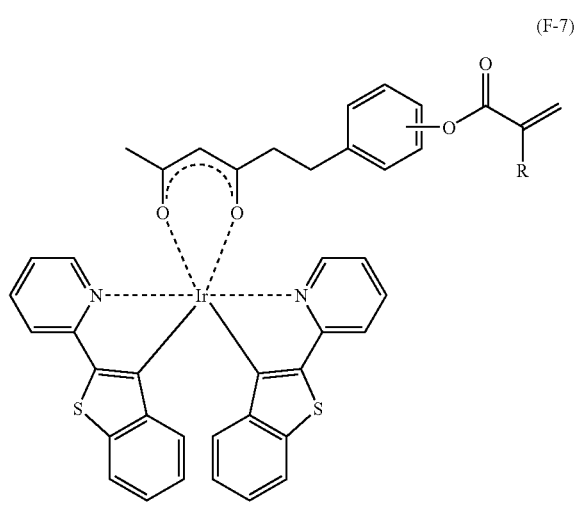

wherein R represents a hydrogen atom or a methyl group.

[F12] A polymerizable compound represented by the formula (F-8):

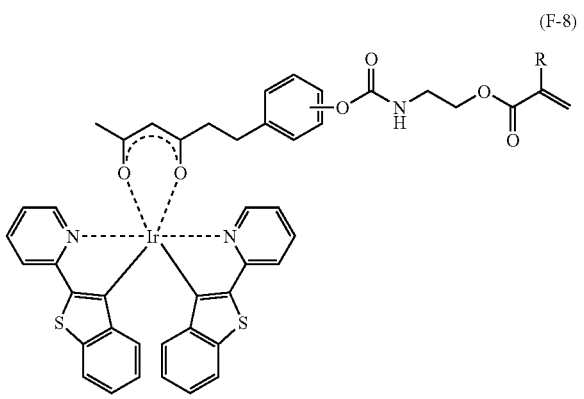

wherein R represents a hydrogen atom or a methyl group.

[F13] A polymerizable compound represented by the formula (F-9):

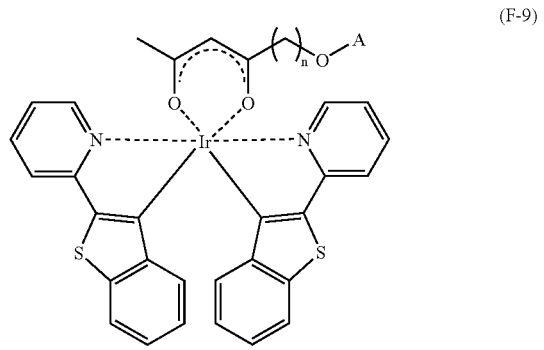

wherein n is 0 or an integer of 1 to 20, and A represents an organic group having 3 to 20 carbon atoms that has an acryloyl group, a methacryloyl group, an acryloyloxy group, or a methacryloyloxy group.

[F14] A polymerizable compound represented by the formula (F-10):

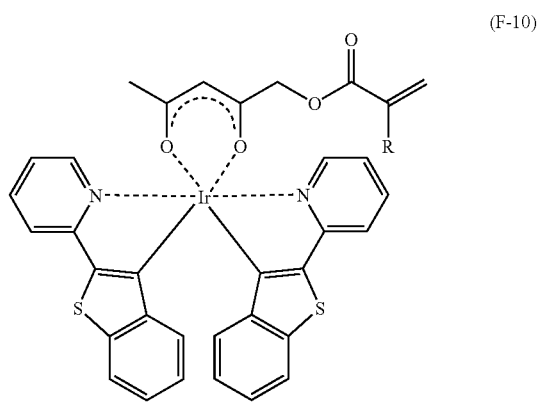

wherein R represents a hydrogen atom or a methyl group.

[F15] A polymerizable compound represented by the formula (F-11):

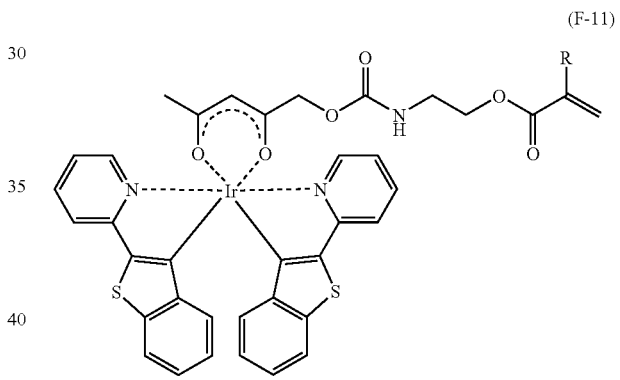

wherein R represents a hydrogen atom or a methyl group.

[F16] The polymerizable compound according to [F1], wherein $Y^{1F}$ in the formula (F-1) is a substituent having a polymerizable functional group.

[F17] A polymerizable compound represented by the formula (F-12):

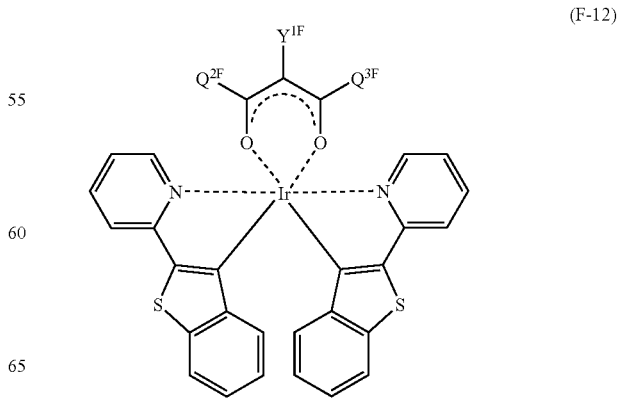

wherein $Y^{1F}$ represents a substituent having a polymerizable functional group, and $Q^{2F}$ and $Q^{3F}$ independently represent a hydrogen atom, a halogen atom, or an organic group having 1 to 20 carbon atoms which may have one or more heteroatoms.

[F18] The polymerizable compound according to [F16] or [F17] above, wherein the polymerizable functional group is a group having a carbon-carbon double bond.

[F19] The polymerizable compound according to [F16] or [F17] above, wherein the polymerizable functional group is a styryl group.

[F20] The polymerizable compound according to [F16] or [F17] above, wherein the polymerizable functional group is an alkenoyloxy group.

[F21] A polymerizable compound represented by the formula (F-13):

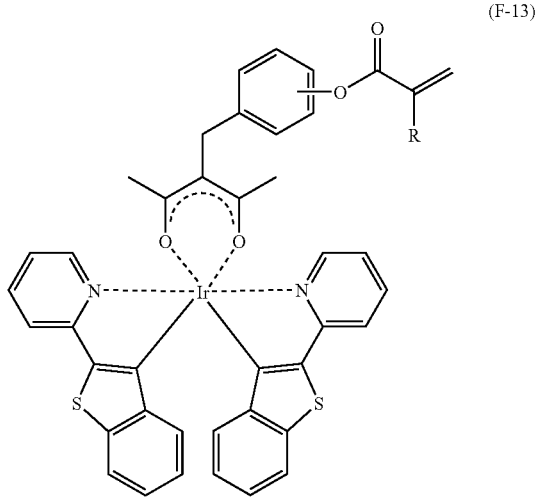

(F-13)

wherein R represents a hydrogen atom or a methyl group.

[F22] A polymerizable compound represented by the formula (F-14):

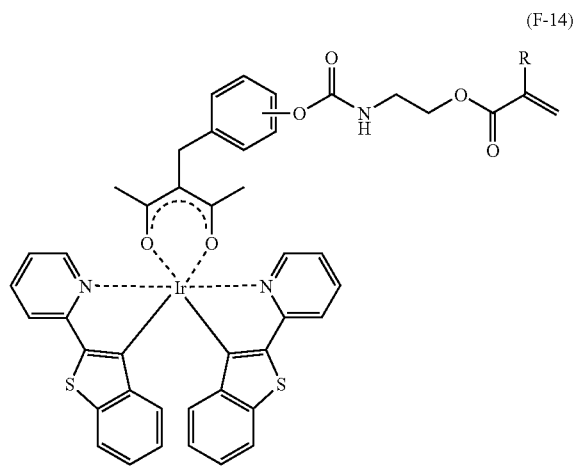

(F-14)

wherein R represents a hydrogen atom or a methyl group.

[F23] A method of producing a polymerizable compound containing a mononuclear iridium complex part, comprising reacting a binuclear iridium complex represented by the formula (F-15) below with a compound having a polymerizable functional group represented by the formula (F-16) below:

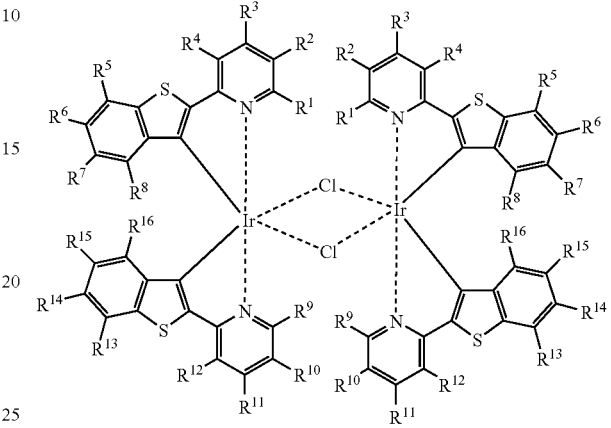

(F-15)

wherein $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms;

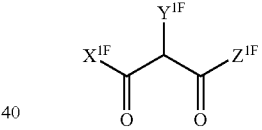

(F-16)

wherein at least one of $X^{1F}$, $Y^{1F}$, and $Z^{1F}$ represents a substituent having a polymerizable functional group, and the remainder of $X^{1F}$, $Y^{1F}$, and $Z^{1F}$ independently represent a hydrogen atom, a halogen atom or an organic group having 1 to 20 carbon atoms which may have one or more heteroatoms.

[F24] The method of producing a polymerizable compound containing a mononuclear iridium complex part according to [F23] above, wherein $X^{1F}$ or $Z^{1F}$ in the formula (F-16) is a substituent having a polymerizable functional group.

[F25] The method of producing a polymerizable compound containing a mononuclear iridium complex part according to [F23] above, wherein $Y^{1F}$ in the formula (F-16) is a substituent having a polymerizable functional group.

[F26] A method of producing a polymerizable compound containing a mononuclear iridium complex part, comprising reacting a binuclear iridium complex represented by the formula (F-15) with a compound having a reactive substituent represented by the formula (F-17) below, and then reacting a reactive substituent of the obtained mononuclear iridium complex with a compound having both a polymerizable functional group and a functional group capable of reacting with and bonding to a reactive functional substituent derived from the compound of the formula (F-17) (at least one of $X^{2F}$, $Y^{2F}$, and $Z^{2F}$):

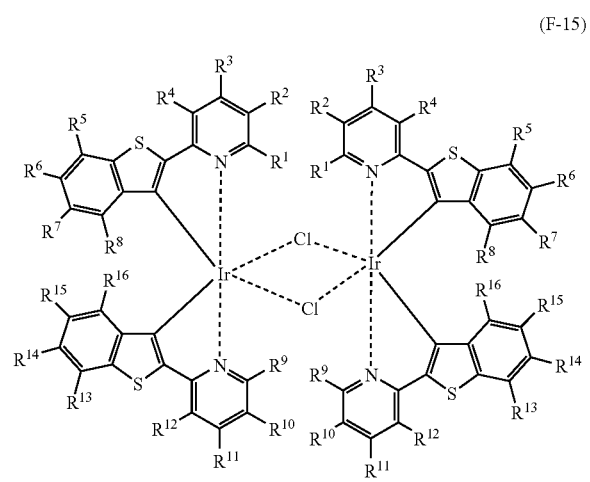

(F-15)

wherein $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

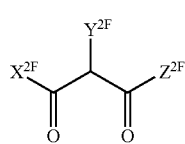

(F-17)

wherein at least one of $X^{2F}$, $Y^{2F}$, and $Z^{2F}$ represents a reactive substituent, and the remainder of $X^{2F}$, $Y^{2F}$, and $Z^{2F}$ independently represent a hydrogen atom, a halogen atom or an organic group having 1 to 20 carbon atoms which may have one or more heteroatoms.

[F27] The method of producing a polymerizable compound containing a mononuclear iridium complex part according to [F26] above, wherein $X^E$, $Y^E$ or $Z^E$ in the formula (F-17) is a substituent having an active hydrogen.

[F28] The method of producing a polymerizable compound containing a mononuclear iridium complex part according to [F26] above, wherein $X^{2F}$ or $Z^{2F}$ in the formula (F-17) is a substituent having a hydroxyl group.

[F29] The method of producing a polymerizable compound containing a mononuclear iridium complex part according to [F26] above, wherein $Y^{2F}$ in the formula (F-17) is a substituent having a hydroxyl group.

[F30] A compound represented by the formula (F-18):

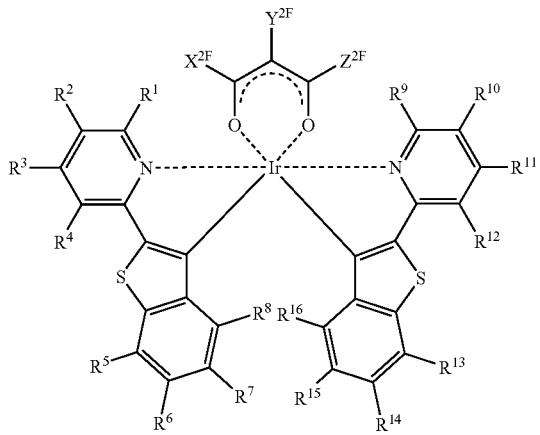

(F-18)

wherein at least one of $X^{2F}$, $Y^{2F}$, and $Z^{2F}$ represents a substituent having a hydroxyl group, and the remainder of $X^{2F}$, $Y^{2F}$, and $Z^{2F}$ independently represent a hydrogen atom, a halogen atom or an organic group having 1 to 20 carbon atoms which may have one or more heteroatoms; and $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[F31] The compound according to [F30] above, wherein $X^{2F}$ or $Z^{2F}$ in the formula (F-18) is a substituent having a hydroxyl group.

[F32] A compound represented by the formula (F-19):

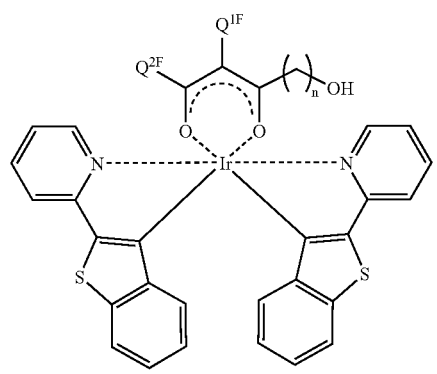

(F-19)

wherein is 0 or an integer of 1 to 20, and $Q^{1F}$ and $Q^{2F}$ independently represent a hydrogen atom, a halogen atom, oran organic group having 1 to 20 carbon atoms which may have one or more heteroatoms.

[F33] A compound represented by the formula (F-20):

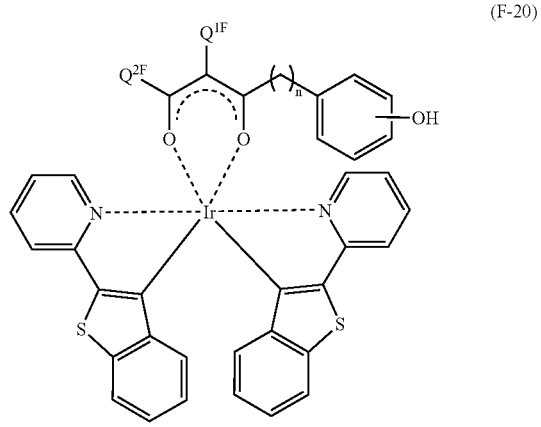

wherein is 0 or an integer of 1 to 20, and $Q^{1F}$ and $Q^{2F}$ independently represent a hydrogen atom, a halogen atom, or an organic group having 1 to 20 carbon atoms which may have one or more heteroatoms.

[F34] The compound according to [E30] above, wherein $Y^{2F}$ in the formula (E-18) is a substituent having a hydroxyl group.

[F35] A compound represented by the formula (F-21):

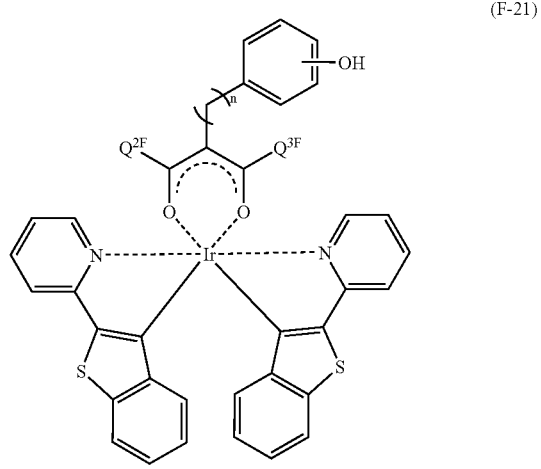

wherein n is 0 or an integer of 1 to 20, and $Q^{2F}$ and $Q^{3F}$ independently represent a hydrogen atom, a halogen atom, or an organic group having 1 to 20 carbon atoms which may have one or more heteroatoms.

[F36] A polymer of the polymerizable compound according to any one of [F1] to [F22] above.

[F37] A polymer obtained by polymerizing a polymerizable composition containing at least one of the polymerizable compounds according to [F1] to [F22] above.

[F38] A polymerizable composition containing at least one of the polymerizable compounds according to [F1] to [F22] above.

[G1] A polymerizable compound represented by the formula (G-1):

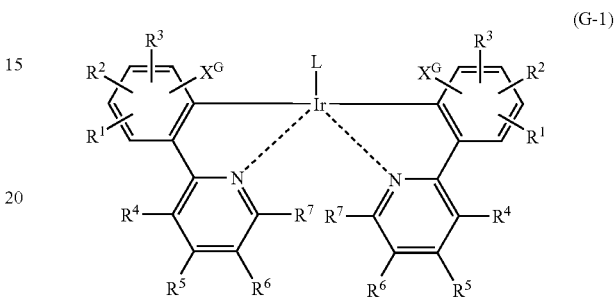

wherein L represents a monovalent anionic bidentate ligand, $X^G$ represents a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G2] A polymerizable compound represented by the formula (G-2):

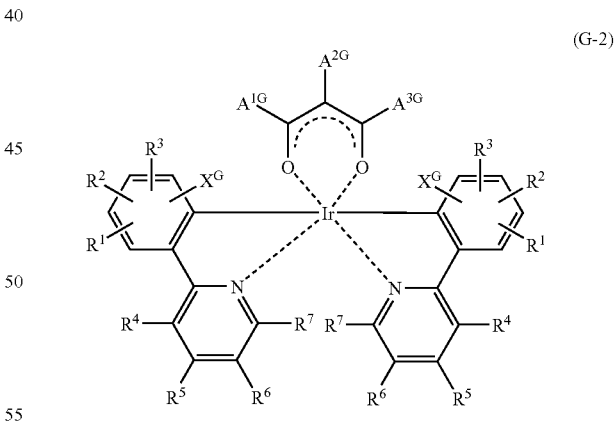

wherein $A^{1G}$, $A^{2G}$, and $A^{3G}$ independently represent a hydrogen atom, a halogen atom or an organic group having 1 to 20 carbon atoms which may have one or more heteroatoms; $X^G$ represents a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G3] The polymerizable compound according to [G1] or [G2] above, wherein the polymerizable functional group of XG in the formula (G-1) or (G-2) is a group having a carbon-carbon double bond.

[G4] The polymerizable compound according to [G1] or [G2] above, wherein $X^G$ in the formula (G-1) or (G-2) is any one of a methacryloyloxy group, a methacryloyloxyethylcarbamoyloxy group, and a vinylbenzyloxy group.

[G5] A polymerizable compound represented by the formula (G-3):

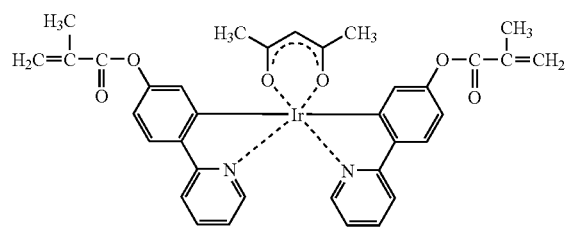

(G-3)

[G6] A polymerizable compound represented by the formula (G-4):

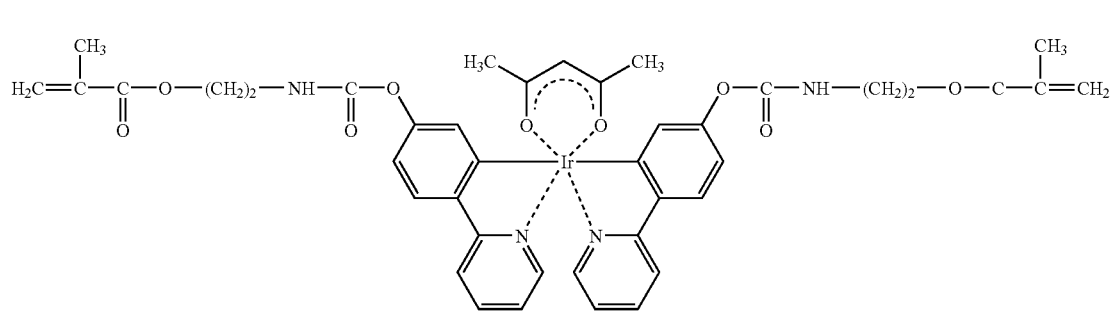

(G-4)

[G7] A polymerizable compound represented by the formula (G-5):

capable of reacting with and binding to the substituent yG having a reactive functional group in the compound represented by the formula (G-6):

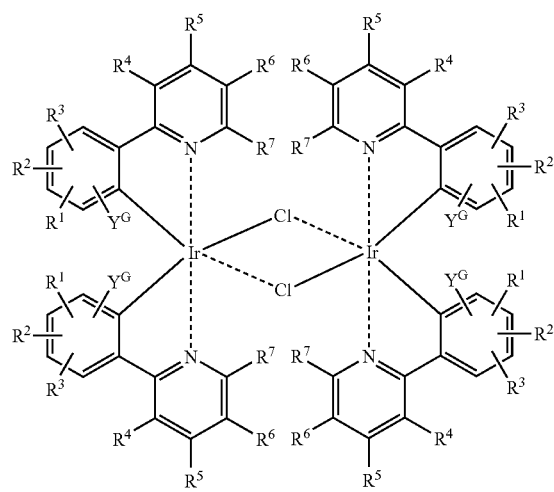

(G-6)

wherein $Y^G$ is a substituent having a reactive functional group, and $R^1$ to $R^7$ independently represent a hydrogen atom, (G-5)

[G8] A method of producing a polymerizable compound containing a mononuclear iridium complex part, comprising reacting a binuclear iridium complex represented by the formula (G-6) with a monovalent anionic bidentate ligand L, and then reacting the reaction product with a compound having both a polymerizable functional group and a functional group a halogen atom, a nitro group, an amino group, a sulfonic acid group, a sulfonic acid ester group, or an organic group having 1 to 20 carbon atoms which may have one or more heteroatoms.

[G9] The method of producing a polymerizable compound containing a mononuclear iridium complex part according to

[G8] above, wherein $Y^G$ in the formula (G-6) is a group having an active hydrogen.

[G10] The method of producing a polymerizable compound containing a mononuclear iridium complex part according to [G8] above, wherein $Y^G$ in the formula (G-6) is a substituent having a hydroxyl group.

[G11] The method of producing a polymerizable compound containing a mononuclear iridium complex part according to [G10] above, wherein the compound having both a polymerizable functional group and a functional group capable of reacting with and binding to the substituent $Y^G$ having a reactive group derived from the compound represented by the formula (G-6) is an acid halide compound having a polymerizable functional group or an alkyl halide compound having a polymerizable functional group.

[G12] The method of producing a polymerizable compound containing a mononuclear iridium complex part according to [G9] or [G10] above, wherein the compound having both a polymerizable functional group and a functional group capable of reacting with and binding to the substituent $Y^G$ having a reactive group derived from the compound represented by the formula (G-6) is an isocyanate compound having a polymerizable functional group.

[G13] A method of producing a polymerizable compound containing a mononuclear iridium complex part, comprising reacting a binuclear iridium complex represented by the formula (G-7) below with a monovalent anionic bidentate ligand L:

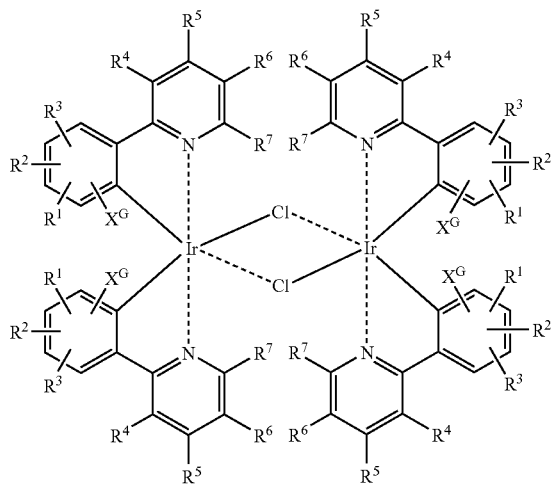

(G-7)

wherein $X^G$ is a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G14] A method of producing a polymerizable compound containing a mononuclear iridium complex part according to [G13] above, wherein $X^G$ in the formula (G-7) is any one of a methacryloyloxy group, a methacryloyloxyethylcarbamoyloxy group, and a vinylbenzyloxy group.

[G15] A binuclear iridium complex represented by the formula (G-6):

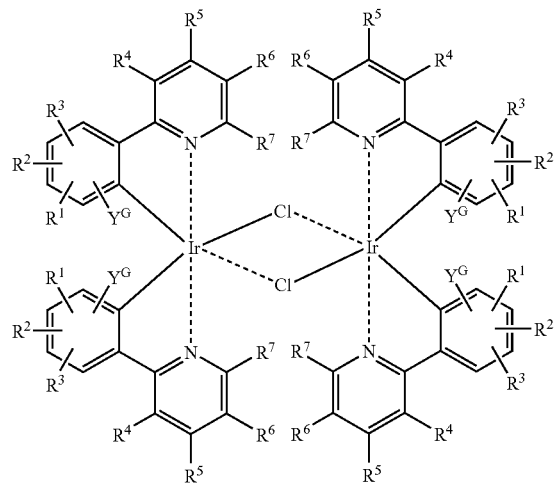

(G-6)

wherein $Y^G$ is a substituent having a reactive functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G16] The binuclear iridium complex according to [G15], wherein $Y^G$ in the formula (G-6) is a hydroxyl group.

[G17] A binuclear iridium complex represented by the formula (G-8):

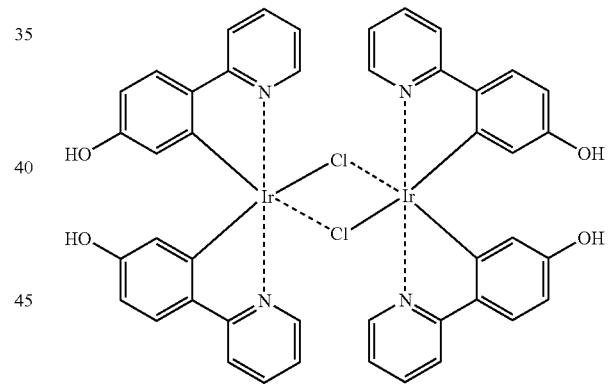

(G-8)

[G18] A compound represented by the formula (G-9):

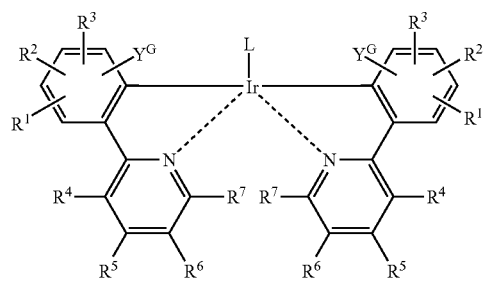

(G-9)

wherein L represents a monovalent anionic bidentate ligand, $Y^G$ represents a substituent having a reactive functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G19] A compound represented by the formula (G-10):

(G-10)

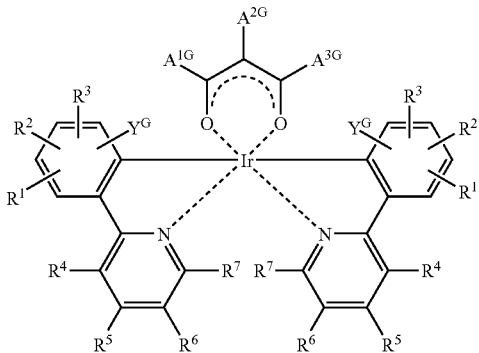

wherein $A^{1G}$, $A^{2G}$, and $A^{3G}$ independently represent a hydrogen atom, a halogen atom or an organic group having 1 to 20 carbon atoms which may have one or more heteroatoms, $Y^G$ represents a substituent having a reactive functional group, and $R^1$ to $R^{17}$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G20] The compound according to [G18] or [G19] above, wherein $Y^G$ in the formula (G-9) or (G-10) is a hydroxyl group.

[G21] A compound represented by the formula (G-11):

(G-11)

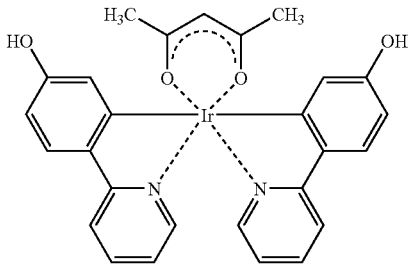

[G22] A binuclear iridium complex represented by the formula (G-7):

(G-7)

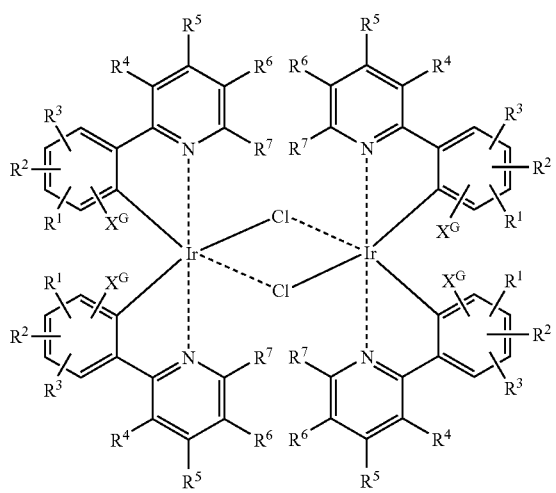

wherein $X^G$ represents a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

[G23] The binuclear iridium complex according to [G22] above, wherein $X^G$ in the formula (G-7) is any one of a methacryloyloxy group, a methacryloyloxyethylcarbamoyloxy group, and a vinylbenzyloxy group.

[G24] A composition containing the polymerizable compound according to any one of [G1] to [G7] above.

[G25] A polymer of the polymerizable compound according to any one of [G1] to [G7] above.

[G26] A polymer obtained by polymerizing a composition containing the polymerizable compound according to any one of [G1] to [G7].

MODE OF THE INVENTION

Figure 1:
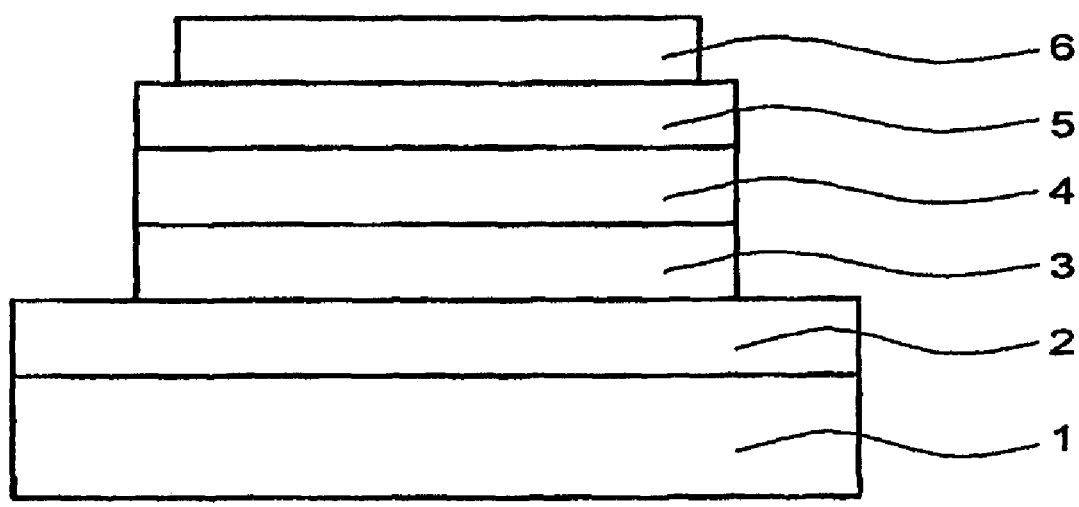
FIG. 1 is a cross-sectional view showing an example of an organic light emitting device of the present invention.

Hereinafter, modes of the present invention will be described with reference to the attached drawing.

FIG. 1 is a cross-sectional view showing an example of the construction of the organic light emitting device of the present invention, which includes a hole transport layer 3, a light emitting layer 4 and an electron transport layer 5 provided in the order cited between an anode 2 provided on a transparent substrate 1 and a cathode 6. The construction of the organic light emitting device is not limited to the example shown in FIG. 1 and may be one that has provided between the anode and the cathode in the order cited either (1) a hole transport layer/a light emitting layer or (2) a light emitting layer/an electron transport layer. Alternatively, the construction of the organic light emitting device of the present invention may have only one layer from any one of (3) a layer containing a hole transporting material, a light emitting material and an electron transporting material, (4) a layer containing a hole transporting material and a light emitting material, (5) a layer containing a light emitting material and an electron transporting material, and (6) a layer containing only a light emitting material. Furthermore, although the light emitting layer shown in FIG. 1 consists of one layer, it may consist of two or more laminated layers.

In the present invention, the light emitting part means a part having a molecular structure that emits light from an excited triplet state, i.e., a phosphorescent emissive part, or a part having a molecular structure that emits light through an excited triplet state (hereinafter, referred to as a "part emits light through an excited triplet state"). The light emitting parts are characterized by constituting a part of a polymer or being bonded to a polymer. The part that emits light through an excited triplet state refers to a system that consists of two constituent parts in which energy transfer occurs from an excited triplet state of the constituent part corresponding to the phosphorescent emissive, the first organic compound to an excited triplet state of the fluorescent emissive, the second organic compound, followed by fluorescent emission through the constituent part corresponding to the second organic compound, as disclosed in Japanese Patent Application Laid-open No. 2002-050483.

In the case where the organic light emitting device of the present invention contains the part that emits through an excited triplet state as described above, it is preferred that at least one of the phosphorescent emissive part and the fluorescent emissive part constitutes a part of a polymer or is bonded to a polymer. In this case, the phosphorescent emissive part and/or fluorescent emissive part that constitutes a part of a polymer or is bonded to a polymer may form the main chain of the polymer or a side chain of the polymer (which means a pendant group formed by a functional group or the like pending from the main chain but may also be a long chain branch).

The quantum efficiency of the phosphorescent emissive part in an excited triplet state is preferably 0.1 or more, more preferably 0.3 or more and particularly preferably 0.5 or more. The compound having high quantum efficiency in an excited triplet state that can be used for the phosphorescent emissive part includes, for example, a metal complex and an organometallic compound. Specific examples of the metal complex and the organometallic compound include transition metal complexes such as iridium complexes and platinum complexes, organometallic compounds containing a transition metal such as organometallic iridium compounds and organometallic platinum compounds and derivatives thereof. These complexes are preferred in that they have relatively stable excited triplet states even at room temperatures. Further, they are preferred since they can be readily obtained by coordinating a polymer having a functional group capable of being coordinated to a transition metal atom as will be described later. Other compounds having high quantum efficiencies in an excited triplet state that can be used for the phosphorescent emissive part may be selected from the compounds described in, for example, "Handbook of Photochemistry, Second Edition (Steven L. Murov, et al., Marcel Dekker Inc., 1993).

The transition metals used for the above-mentioned transition metal complexes and organometallic compounds containing a transition metal include elements from Atomic No. 21, Sc, to Atomic No. 30, Zn in the first transient element series, from Atomic No. 39, Y to Atomic No. 48, Cd in the second transient element series, and from Atomic No. 72, Hf to Atomic No. 80, Hg, in the third transient element series of the periodic table.

Other specific examples of the metal complex and the organometallic compound that emit through an excited triplet state include rare earth metal complexes and organometallic compounds containing a rare earth metal. The rare earth metals used for the rare earth metal complexes and the organometallic compounds containing a rare earth metal include elements from Atomic No. 57, La, to Atomic No. 71, Lu, in the periodic table.

In the present invention, the light emitting material means a light emitting substance itself. In the present invention, the light emitting part is a metal complex or the like, which is bonded to a polymer. That is, a light emitting substance is a polymer-in-itself, which is also a light emitting material. However, for the sake of explanation, the light emitting part bonded to a polymer is in some cases referred to as a light emitting substance. In a broader sense, the term light emitting material is used inclusive of those substances that constitute a light emitting layer containing a light emitting substance, a binder, a hole transporting material and an electron transporting material.

In the present invention, the light emitting part is nonionic. This is because if the light emissive part is ionic, application of a voltage to the light emitting layer containing the light emitting part results in the occurrence of electrochemical luminescence, which has a response speed as slow as an order of minutes, so that it is not suitable for applications to displays.

In the present invention, the expression "the light emitting part constitutes a part of a polymer" means that the structure of a light emitting part constitutes at least one repeating unit of a polymer. In the case where the polymer concerned is a copolymer, that expression means that at least one constituent monomer has the structure of a light emitting part. The light emitting part may constitute the main chain of a polymer or a side chain (a pendant group or the like).

The expression "the light emitting part is bonded to a polymer" means that it is only required that the light emitting part is bonded to the polymer compound regardless of the degree and form of bonding. Specific method of this bonding may include a method of incorporating the light emitting part as a main chain of the polymer, a method of bonding the light emitting part to the polymer as a side chain (including a pendant group) and the like. However, the present invention is not limited thereto. In the case of the transition metal complexes and rare earth metal complexes, mention may be made of a method of incorporating at least one of the ligands that constitute the complex into the main chain of the polymer, a method of bonding at least one of ligands that constitute the complex into a side chain of the polymer and the like.

Examples of the ligand used for the above-mentioned transition metal complexes and rare earth metal complexes include acetylacetonato, 2,2'-bipyridine, 4,4'-dimethyl-2',2-bipyridine, 1,10-phenanthroline, 2-phenylpyridine, porphyrin, phtalocyanine, pyrimidine, quinoline, 2-benzothienylpyridine and/or derivatives thereof. However, the present invention is by no means limited thereto. One kind or plural kinds of ligands may be coordinated for a single complex. The above-mentioned complex compounds that can be used include a binuclear complex or a polynuclear complex or a double complex form composed of two or more kinds of complexes.

In the present invention, the metal atom that serves as a central metal of the metal complex structure used in the light emitting part is bound to at least one site of a polymer. The method of achieving this is not particularly limited and includes various formations including complex formation through coordinate bonds, complex formation through charge transfer, covalent bonds, ionic bonds, and the like. In this case, the method of bonding ligands to a polymer to form a complex of a light emitting substance is preferred since it can immobilize the ligands to the polymer with a reduced change in the state of electron of the light emitting substance. On this occasion, the method of binding ligands to a polymer to form a complex is particularly preferred since it is easy to design and synthesize the material. In the case where the metal atom that serves as the central metal is ion, a method of rendering the light emitting part neutral is adopted for the reasons described above. This method includes, for example, a method of forming an organometallic compound having a coordinate bond together with a covalent bond sufficient for neutralizing the valence of the metal ion. However, the present invention is by no means limited thereto.

The polymer that immobilizes the metal atom in the present invention is not particularly limited. For example, polymers having bound to the main chain or side chain thereof a heterocyclic compound having capability of coordination, such as pyridine group, bipyridyl group, pyrimidine group, quinoline group, a phenylpyridine group or benzothienylpyridine group may be used. Specific examples of such a polymer include polymers containing ligands in the main chain and/or derivatives thereof, such as poly(pyridinediyl), poly(bipyridinediyl), poly(quinolinediyl), poly(phenylpyridinediyl) and poly(benzothienylpyridinediyl), polymers having ligands in the side chain thereof and/or derivatives thereof, such as poly(vinylpyridine), poly((meth)acrylpyridine), poly(vinylquinoline), poly(vinylphenylpyridine) and poly(vinylbenzothienylpyridine), and/or polymers having combined the above-mentioned structures, and the like.

The polymer that can be used in the present invention may be a copolymer of a monomer unit having a light emitting part that constitutes a part thereof or is bound thereto and a monomer unit having no light emitting part. Examples of the monomer unit having no light emitting part include alkyl (meth) acrylates such as methyl acrylate and methyl methacrylate, styrene and derivatives thereof. However, the present invention is not limited thereto.

The use of the copolymer containing a monomer unit having no light emitting part as described above as a light emitting layer of an organic light emitting device improves the processability of it and provides flexibility to the film after film formation. This is extremely advantageous in fabricating a flexible light emitting device using a polymer film substrate.

The polymer used in the present invention has a degree of polymerization of preferably from 5 to 10,000 and more preferably from 10 to 5,000.

Since the molecular weight of the polymer depends on the molecular weight and degree of polymerization of the constituent monomer or monomers, it is generally difficult to determine a suitable range of molecular weight of the polymer used in the present invention. However, usually, the molecular weight of the polymer used in the present invention has a weight average molecular weight of preferably from 1,000 to 2,000,000 and more preferably from 5,000 to 1,000,000, independently of the above-mentioned degree of polymerization.

Here, the method of measuring molecular weight includes the methods described in "Koubunshi-Kagaku no Kiso (Basis of Polymer Chemistry)" (Tokyo Kagaku Dojin, 1978), that is, a GPC method (gel permeation chromatography), a method using osmotic pressure, a light scattering method, an ultracentrifugation method and so forth.

In the organic light emitting device of the present invention, light emission occurs by the following mechanism. That is, electric excitation generates 25% of the lowest excited singlet state and 75% of the lowest excited triplet state. In the case of using a transition metal complex or a rare earth metal complex as a light emitting substance, the intersystem crossing from the lowest excited singlet state to the lowest excited triplet state tends to occur due to the heavy atom effect, so that the ratio of the lowest excited triplet state increases to more than 75%. In the case of the transition metal complex, which emits phosphorescence from the lowest excited triplet state, there exists nonradiative transition together with radiative transition that emits phosphorescence. On the other hand, in the case of the rare earth metal complex, the excitation energy of the lowest excited triplet state of the ligand is transferred to the central metal ion and light emission occurs from the excitation level of the central metal ion. On this occasion, too, there exists nonradiative transition together with radiative transition that causes light emission. These nonradiative transitions cannot be prevented from occurring unless low temperature as low as the temperature of liquid nitrogen is used. Usually, light emission of the above-mentioned compounds at room temperature is extremely weak.

However, in the organic light emitting device of the present invention, immobilization of the light emitting substance to the polymer on the level of molecules inhibits the vibration of molecules so that loss of excited energy in the form of vibration of molecules is prevented. Generally, the excited triplet states are deactivated with oxygen. However, in the organic light emitting device of the present invention, confinement of the light emitting substance in the polymer makes it possible to prevent the invasion of oxygen.

The polymer light emitting material of the present invention can be prepared by polymerizing a polymerizable composition containing at least one light emitting compound. The polymerizable composition as used herein means a composition that contains a polymerizable compound having at least one polymerizable functional group such as a (meth)acrylic group, a vinyl group, a styryl group, an isocyanate group, or a thiocyanate group.

When the number of polymerizable functional groups in the polymerizable compound is 1, the polymer after the polymerization has no crosslinked structure. When the number of polymerizable functional groups in the polymerizable compound is 2 or more, the polymer after the polymerization has a crosslinked structure. Since the crosslinked polymer is excellent in thermal stability, it is preferable that at least one of the polymerizable compounds to be used is a crosslinkable compound having two or more polymerizable functional groups.

In the present invention, the polymerizable compound in the polymerizable composition used for the polymer light emitting material may be a light emitting compound having a polymerizable functional group, an electron transporting compound having a polymerizable functional group, a hole transporting compound having a polymerizable functional group, or mixtures of these with other polymerizable compounds. It is preferred that the light emitting compound used in the present invention is a light emitting compound having the above-mentioned polymerizable functional group. In the case where the polymerizable composition used for the polymer light emitting material of the present invention contains a polymerizable compound other than the light emitting compound having a polymerizable functional group, the polymer light emitting material of the present invention serves as a copolymer of the light emitting compound and other polymerizable compound.

The light emitting part includes conjugated structures such as a stilbene structure, transition metal complexes and the like. From the viewpoints of stability, freedom in design and the like, metal complex structures are preferred.

The light emitting layer of the organic light emitting device of the present invention, which is a layer containing a light emitting substance bound to a polymer as a light emitting material, may contain other light emitting material, a hole transporting material, an electron transporting material and so forth.

Specifically, in order to further increase the carrier transportability of the phosphorescent emissive polymer compound of the present invention, the organic light emitting device of the present invention may use a composition containing the polymer compound of the present invention and a carrier transporting compound as a light emitting material.

That is, a hole transporting compound and an electron transporting compound may be mixed with the phosphorescent emissive polymer compound of the present invention. When the phosphorescent emissive polymer compound of the present invention is hole transporting, it is preferred to mix an electron transporting compound therewith. On the contrary, when the phosphorescent emissive polymer compound of the present invention is an electron transporting, it is preferred to mix a hole transporting compound therewith. On this occasion, the hole transporting and the electron transporting compound may each be a low molecular weight compound or a polymer.

As the low molecular weight hole transporting compound to be blended in the phosphorescent polymer compound of the present invention, known hole transporting materials including triphenylamine derivatives such as TPD (N,N'-diphenyl-N,N'-(3-methylphenyl)-1,1'-biphenyl-4,4'-diamine), α-NPD (4,41-bis[N-(1-naphthyl)-N-phenylamino]biphenyl), and m-MTDATA (4,4',4''-tris(3-methylphenylphenylamino)triphenylamine) and carbazole derivatives such as CBP (4,4'-N,N'-dicarbazole-biphenyl) may be used. However, the present invention is not limited thereto.

The polymer hole transporting compound to be blended in the phosphorescent emissive polymer compound of the present invention include in addition to poly(N-vinylcarbazole), polymer compounds obtained by polymerizing monomers composed of the above-mentioned low molecular weight hole transporting compound, such as TPD, α-NPD, m-MTDATA, or CPD, to which a polymerizable functional group such as a vinyl group, a styryl group, an acrylate group, or a methacrylate group has been introduced, polymer compounds having a triphenylamine skeleton as disclosed in Japanese Patent Application Laid-open No. 8-157575 and so forth. However, the present invention is by no means limited thereto.

On the other hand, as the low molecular weight electron transporting compound to be blended in the phosphorescent polymer compound of the present invention, quinolinol derivative metal complexes such as Alq$_3$ (trisaluminum quinolinol), oxadiazole derivatives such as PBD (2-biphenyl-4-yl-5-(4-tert-butylphenyl)-1,3,4-oxadiazole) and OXD-7 (1,3-bis[5-(p-tert-butylphenyl)-1,3,4-oxadiazol-2-yl]benzene, triazole derivatives such as TAZ (3-biphenyl-4-yl-5-(4-tert-butylphenyl)-4-phenyl-4H-1,2,4-triazole), imidazole derivatives, triazine derivatives and so forth may be used. However, the present invention is by no means limited thereto.

The polymer electron transporting compound to be blended in the phosphorescent polymer compound of the present invention include in addition to the poly PBD (compound obtained by polymerizing a monomer composed of the PBD described above having introduced therein a vinyl group) as disclosed in Japanese Patent Application Laid-open No. 10-1665, compounds obtained by polymerizing monomers composed of the low molecular weight electron transporting compound such as the above-mentioned Alq$_3$, OXD-7, or TAZ to which a polymerizable functional group, such as a vinyl group, a styryl group, an acrylate group or a methacrylate group, has been introduced. However, the present invention is by no means limited thereto.

The blending ratio of the low molecular weight hole transporting compound and/or electron transporting compound to be blended with the phosphorescent emissive polymer compound of the present invention is preferably from 0 to 100 mass %, more preferably from 10 to 70 mass %, and particularly preferably from 20 to 50 mass % based on the phosphorescent emissive polymer compound of the present invention. Further, the blending ratio of the high molecular weight hole transporting compound and/or electron transporting compound to be blended with the phosphorescent emissive compound of the present invention is preferably from 0 to 200 mass %, more preferably from 20 to 150 mass %, and particularly preferably from 40 to 100 mass % based on the phosphorescent emissive compound of the present invention.

For improving the physical properties and the like of the film obtained by film formation, a composition obtained by blending the phosphorescent emissive polymer compound or composition of the present invention with a polymer compound that does not participate in the light emission characteristics may also be used as a light emitting material. For example, to impart flexibility to the obtained film, PMMA (poly(methyl methacrylate)), polycarbonate, polystyrene and the like may be blended. However, the present invention is by no means limited thereto.

The blending ratio of the polymer compound that does not participate in the light emission characteristics to be blended with the phosphorescent emissive polymer compound of the present invention is preferably from 0 to 40 mass %, more preferably from 0 to 20 mass % and particularly preferably from 0 to 10 mass %.

Specific examples of the polymerizable light emitting compound used in the present invention include metal complexes having introduced therein polymerizable functional groups as represented by the following formulae (C-1), (D-1), (E-1), (F-1) and (G-1), respectively.

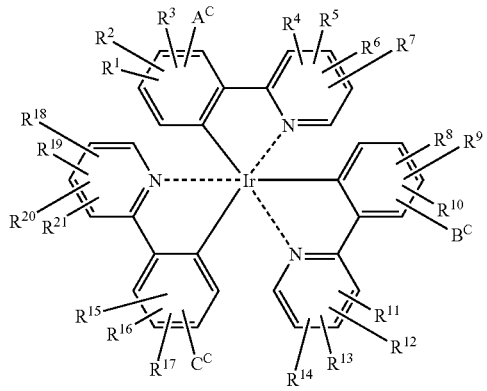

(C-1)

In the formula (C-1), at least one of $A^C$, $B^C$, and $C^C$ represents a substituent having a polymerizable functional group, and the remainder of $A^C$, $B^C$, and $C^C$ independently represent a hydrogen atom, a halogen atom, a nitro group, an amino group, a sulfonic acid group, a sulfonic acid ester group, or an organic group having 1 to 20 carbon atoms which may have one or more heteroatoms. $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

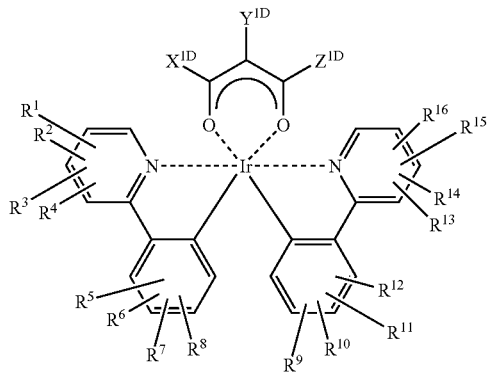

(D-1)

In the formula (D-1), at least one of $X^{1D}$, $Y^{1D}$, and $Z^{1D}$ represents a substituent having a polymerizable functional group, and the remainder of $X^{1D}$, $Y^{1D}$, and $Z^{1D}$ independently represent a hydrogen atom, or an organic group having 1 to 20 carbon atoms which may have one or more heteroatoms. $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

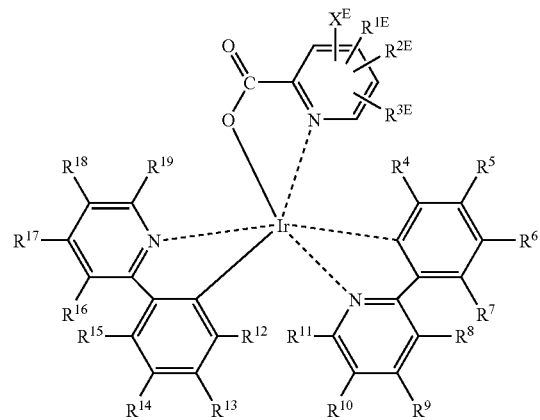

(E-1)

In the formula (E-1), $X^E$ represents a substituent having a polymerizable functional group. $R^{1E}$, $R^{2E}$ and $R^{3E}$ independently represent a hydrogen atom, a halogen atom, or an organic group having 1 to 20 carbon atoms which may have one or more heteroatoms. $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms.

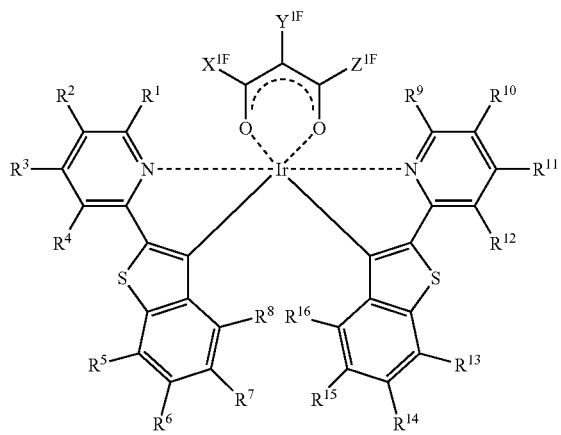

(F-1)

In the formula (F-1), at least one of $X^{1F}$, $Y^{1F}$, and $Z^{1F}$ represents a substituent having a polymerizable functional group, and the remainder of $X^{1F}$, $Y^{1F}$, and $Z^{1F}$ independently represent a hydrogen atom, a halogen atom, or an organic group having 1 to 20 carbon atoms which may have one or more heteroatoms. $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

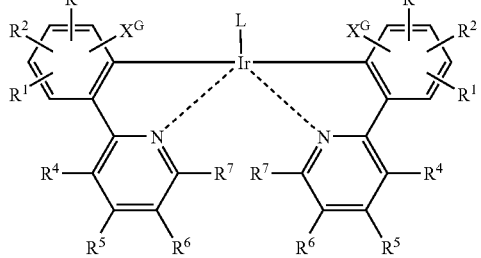

(G-1)

In the formula (D-1), L represents a monovalent anionic bidentate ligand, $X^G$ represents a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

Hereinafter, the polymerizable compounds of the formulae (C-1) to (G-1) will be described in detail.

Polymerizable Compound (C-1)

The substituent having a polymerizable functional group represented by $A^C$, $B^C$ and $C^C$ in the formula (C-1) includes substituents having a vinyl group, an acrylate group, a methacrylate group, a urethane (meth)acrylate group such as a methacryloyloxyethylcarbamate group, a styryl group and its derivatives, a vinyl amide group and its derivative, respectively. Among these polymerizable functional groups, an acrylate group, a methacrylate group and a urethane (meth) acrylate group are preferred from the viewpoint of polymerizability. The position to which these substituents are bonded may be any one of the 2-, 3-, 4- and 5-positions of the phenyl group of the phenylpyridine ligand.

In the formulae (C-1) to (C-5) and (C-8) to (C-11), the expression "organic group having 1 to 20 carbon atoms which may have one or more heteroatoms" is not particularly limited as far as it is not detrimental to the purpose of the present invention. Preferred examples of such organic group include an alkyl group, an alkoxy group, an alkoxyalkyl group, an aryl group, an aryloxy group, an aralkyl group or an aralkoxy group having 1 to 20 carbon atoms and halogen-substituted derivatives thereof.

The substituents having no polymerizable functional group represented by $A^C$, $B^C$ and $C^C$, and $R^1$ to $R^{21}$ in the formula (C-1) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, and the like organic groups. These organic groups may contain substituents such as a halogen atom, a nitro group, and an amino group.

Next, examples of the synthesis methods for the polymerizable compounds of formula (C-1) will be presented below. However, the present invention is by no means limited thereto.

A first synthesis method is a method of producing a polymerizable compound containing a mononuclear iridium complex part by reacting a binuclear iridium complex represented by the formula (C-8) with a phenylpyridine derivative represented by the formula (C-9) to obtain a mononuclear iridium complex having a reactive substituent as an intermediate, and then reacting the reactive substituent of the intermediate with a compound having a polymerizable functional group.

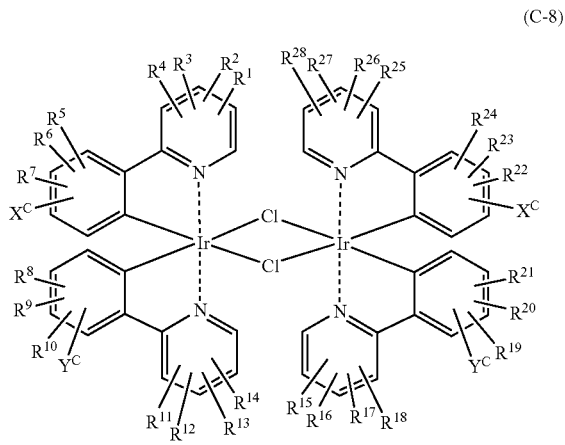

(C-8)

wherein $X^C$ and $Y^C$ independently represent a reactive substituent, or a hydrogen atom, a halogen atom, a nitro group, an amino group, a sulfonic acid group, a sulfonic acid ester group, or an organic group having 1 to 20 carbon atoms which may have one or more heteroatoms, and $R^1$ to $R^{28}$ independently represent a hydrogen atom, a halogen atom, a nitro group, an amino group, a sulfonic acid group, a sulfonic acid ester group, or an organic group having 1 to 20 carbon atoms which may have one or more heteroatoms.

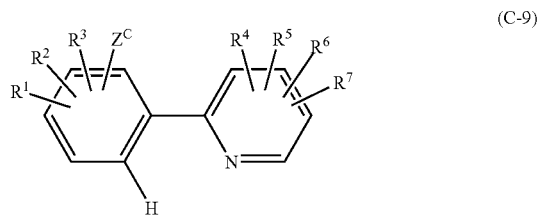

(C-9)

wherein $Z^C$ represents a reactive substituent, or a hydrogen atom, a halogen atom, a nitro group, an amino group, a sulfonic acid group, a sulfonic acid ester group, or an organic group having 1 to 20 carbon atoms which may have one or more heteroatoms, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms, provided that at least one of $X^C$ and $Y^C$ in the formula (C-8) and $Z^C$ in the formula (C-9) is a reactive substituent.

The binuclear iridium complex of the formula (C-8) can be synthesized by the known method (S. Lamansky et al., Inorganic Chemistry, 40, 1704 (2001)). Examples of $R^1$ to $R^{28}$ in the formula (C-8) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, and the like organic groups. These organic groups may contain substituents such as a halogen atom, a nitro group, and an amino group.

At least one of $X^C$ and $Y^C$ in the formula (C-8) and $Z^C$ in the formula (C-9) is a reactive substance, for example, a hydroxy group. However, the present invention is by no means limited thereto. Further, the reactive substituent may be protected with a protective group. In this case, the reaction is performed by using the complex or compound having a protected reactive substituent as it is to obtain a mononuclear iridium complex, which then is subjected to deprotection to obtain a mononuclear iridium complex having a reactive substituent as an intermediate. Thereafter, the reactive substituent of the intermediate and a compound having a polymerizable functional group are reacted to obtain a polymerizable compound containing a mononuclear iridium complex part. From the functional groups for the reactive substituents are excluded the above-mentioned polymerizable functional groups.

Examples of $R^1$ to $R^7$ in the compound of the formula (C-9) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, and the like organic groups. These organic groups may contain substituents such as a halogen atom, a nitro group, and an amino group.

The polymerizable functional group in the compound having a polymerizable functional group to be reacted with the above-mentioned intermediate includes, for example, substituents having a vinyl group, an acrylate group, a methacrylate group, a urethane (meth)acrylate group such as a methacryloyloxyethylcarbamate group, a styryl group and its derivatives, a vinyl amide group and its derivative, respectively. Among these polymerizable functional groups, an acrylate group, a methacrylate group and a urethane (meth) acrylate group are preferred from the viewpoint of polymerizability.

In the first synthesis method, when Xc and Yc in the binuclear iridium complex of the formula (C-8) are nonreactive substituents and $Z^C$ in the phenylpyridine derivative of the formula (C-9) is a reactive substituent, a mononuclear iridium complex having a single reactive substituent is obtained as an intermediate by the reaction and further reaction of the intermediate with a compound having a polymerizable functional group can give rise to a monofunctional polymerizable compound containing a mononuclear iridium complex part. Further, when $X^C$ and $Y^C$ in the binuclear iridium complex of the formula (C-8) are reactive substituents and $Z^C$ in the phenylpyridine derivative of the formula (C-9) is a nonreactive substituent, a mononuclear iridium complex having two reactive substituents is obtained as an intermediate by these reactions and further reaction of the intermediate with a compound having a polymerizable functional group can give rise to a bifunctional polymerizable compound containing a mononuclear iridium complex part.

A second synthesis method for the polymerizable compound of formula (C-1) is a method of producing a polymerizable compound containing an iridium complex part having a predetermined number of polymerizable functional groups by reacting the iridium complex of the formula (C-10) as an intermediate with a compound having a polymerizable functional group in a predetermined molar ratio.

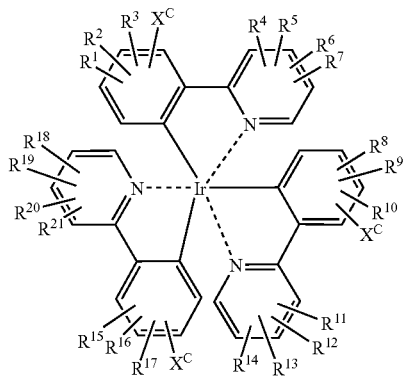

(C-10)

wherein $X^C$ represents a reactive substituent, and $R^1$ to $R^{21}$ independently represent a hydrogen atom, a halogen atom, a nitro group, an amino group, a sulfonic acid group, a sulfonic acid ester group, or an organic group having 1 to 20 carbon atoms which may have one or more heteroatoms.

The reactive substituent $X^C$ in the iridium complex of the formula (C-10) includes, for example, a hydroxyl group and an amino group. However, the present invention is by no means limited thereto. On the other hand, the compound having a polymerizable functional group to be reacted with the iridium complex of the formula (C-10) includes, for example, a polymerizable acid halide and a polymerizable isocyanate. However, the present invention is by no means limited thereto.

Next, the use of the second synthetic method in producing polymerizable acid halides and/or polymerizable isocyanates will be described in detail.

In the case where the molar ratio of the iridium complex of the formula (C-10) to the polymerizable acid halide and/or polymerizable isocyanate is close to 1:1, for example, 1:(0.5 to 1.5), a mixture composed mainly of a monofunctional polymerizable compound can be obtained. Purification of the product affords the monofunctional polymerizable compound. On the other hand, in the case where this molar ratio is close to 1:2, for example, 1:(1.5 to 2.5), a mixture composed mainly of a bifunctional polymerizable compound can be obtained. Purification of the product affords the bifunctional polymerizable compound. Further, in the case where the molar ratio is close to 1:3, for example, 1:(2.5 or more), a mixture composed mainly of a trifunctional polymerizable compound can be obtained. Purification of the product affords the trifunctional polymerizable compound. However, when the above-mentioned molar ratio is 1:(3 or more), purification for removing mono- and bifunctional polymerizable compounds is not always necessary. In the case where mono- and bifunctional polymerizable compounds are synthesized, a polymerizable acid halide is reacted in a predetermined molar ratio and then a reaction for rendering the residual reactive substituent remaining in the product nonreactive is performed. In the case where the reactive substituent is a hydroxyl group, examples of the unpolymerizable compound used for this purpose include alkyl halides, carboxylic acids, carboxylic acid halides, sulfonic acid halides, chloroformates, isocyanates and the like. However, the present invention is by no means limited thereto.

Examples of the polymerizable acid halide used in the second synthetic method include acrylic acid chloride, methacrylic acid chloride and the like. Examples of the unpolymerizable acid halide include propionic acid chloride, acetic acid chloride and the like. Examples of the polymerizable isocyanate include methacryloyl isocyanate, methacryloyloxyethyl isocyanate and the like. Unpolymerizable isocyanate includes, for example, hexyl isocyanate, benzyl isocyanate and the like.

Still another synthetic method for the polymerizable compound of formula (C-1) includes, for example, a method of producing a monofunctional polymerizable compound containing an iridium complex part by reacting iridium (III) bis(2-phenylpyridinato)acetylacetonato complex with the phenylpyridine derivative of the formula (C-9) having a reactive substituent and then introducing to the product a polymerizable substituent.

The polymer and copolymer of the present invention has a degree of polymerization of preferably from 3 to 5,000.

Polymerizable Compound (D-1)

In the substituent having a polymerizable functional group represented by $X^{1D}$, $Y^{1D}$ and $Z^{1D}$ in the formula (D-1), a polymerizable functional group may be any of a radical polymerizable group, a cation polymerizable group, an anion polymerizable group, an addition polymerizable group, and a condensation polymerizable group. Among these, a radical polymerizable functional group is preferred. Examples of the polymerizable functional group include a vinyl group, an allyl group, an alkenyl group, an acrylate group, a methacrylate group, a urethane (meth)acrylate group such as methacryloyloxyethyl carbamate, a styryl group and derivatives thereof, a vinyl amide group and derivatives thereof. Among the polymerizable functional groups, an acrylate group, a methacrylate group and a urethane (meth)acrylate group are preferred from the viewpoint of polymerizability.

In the formulae (D-1), (D-2), (D-14) and (D-17) to (D-23), the expression "organic group having 1 to carbon atoms which may have one or more heteroatoms" is not particularly limited as far as it is not detrimental to the purpose of the present invention. Preferred examples of such organic group include an alkyl group, an alkoxy group, an alkoxyalkyl group, an aryl group, an aryloxy group, an aralkyl group or an aralkoxy group having 1 to 20 carbon atoms and halogen-substituted derivatives thereof.

In the formulae (D-1), (D-2), (D-14) and (D-18) to (D-23), examples of the substituents having no polymerizable functional group represented by $Q^{1D}$, $Q^{2D}$ and $Q^{3D}$ out of $X^{1D}$, $Y^{1D}$ and $Z^{1D}$, and $Q^{1D}$ to $Q^{3D}$ include a hydrogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, an aryl group, and the like organic groups.

In the formulae (D-1), (D-17) and (D-20), examples of $R^1$ to $R^{16}$ and $R^{17}$ to $R^{32}$ in each formula include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, an aryl group, and the like organic groups. These organic groups may contain substituents such as a halogen atom, a nitro group, and an amino group.

Next, examples of the synthetic method for the polymerizable compound of formula (D-1) will be described. However, the present invention is by no means limited thereto.

A first synthetic method is a method of producing a polymerizable compound containing a mononuclear iridium complex part by reacting a binuclear iridium complex represented by the formula (D-17) with a compound having a polymerizable functional group represented by the formula: (D-18) below.

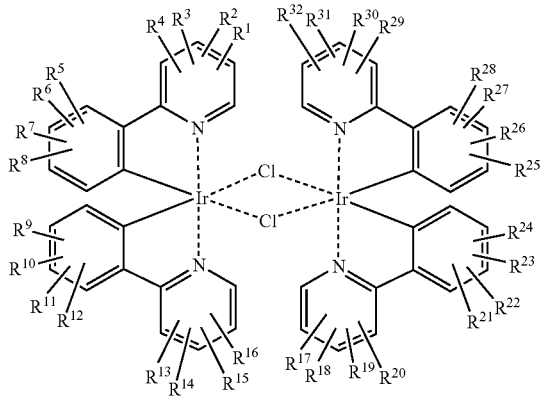

(D-17)

wherein $R^1$ to $R^{32}$ independently represent a hydrogen atom, a halogen atom, a nitro group, an amino group, a sulfonic acid group, a sulfonic acid ester group, or an organic group having 1 to 20 carbon atoms which may have one or more heteroatoms.

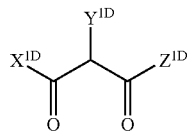

(D-18)

wherein at least one of $X^{1D}$, $Y^{1D}$, and $Z^{1D}$ represents a substituent having a polymerizable functional group, and the remainder of $X^{1D}$, $Y^{1D}$, and $Z^{1D}$ independently represent a hydrogen atom, or an organic group having 1 to 20 carbon atoms which may have one or more heteroatoms.

The binuclear iridium complex of the formula (D-17) can be synthesized by the known method (S. Lamansky et al., Inorganic Chemistry, 40, 1704 (2001)). Examples of $R^1$ to $R^{32}$ in the formula (D-17) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, and the like organic groups. These organic groups may contain substituents such as a halogen atom, a nitro group, and an amino group.

At least one of the substituents $X^{1D}$, $Y^{1D}$ and $Z^{1D}$ of the compound of the formula (D-18) is a substituent having polymerizable functional group and means the same group as explained on the formula (D-1). The substituent having no polymerizable functional groups out of the substituents represented by the substituents $X^{1D}$, $Y^{1D}$ and $Z^{1D}$ of the compound of the formula (D-18) are the same as the formula (D-1).

A second synthesis method for the polymerizable compound of formula (D-1) is a method of producing a polymerizable compound containing a mononuclear iridium complex part by reacting a binuclear iridium complex represented by the formula (D-17) with a compound having a reactive substituent represented by the formula (D-19) below to obtain a mononuclear iridium complex having a reactive substituent as an intermediate, and then reacting the reactive substituent of the obtained mononuclear iridium complex with a compound having a polymerizable functional group.

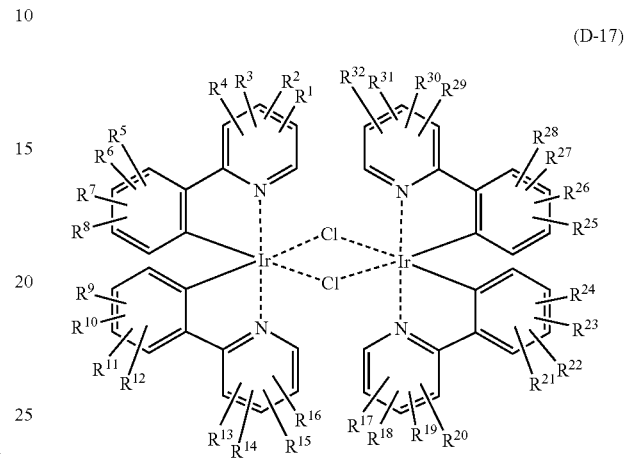

(D-17)

wherein $R^1$ to $R^{32}$ independently represent a hydrogen atom, a halogen atom, a nitro group, an amino group, a sulfonic acid group, a sulfonic acid ester group, or an organic group having 1 to 20 carbon atoms which may have one or more heteroatoms.

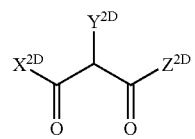

(D-19)

wherein at least one of $X^{2D}$, $Y^{2D}$, and $Z^{2D}$ represents a reactive substituent, and the remainder of $X^{2D}$, $Y^{2D}$, and $Z^{2D}$ independently represent a hydrogen atom, or an organic group having 1 to 20 carbon atoms which may have one or more heteroatoms.

At least one of the substituents $X^{2D}$, $Y^{2D}$ and $Z^{2D}$ of the compound of the formula (D-19) is a reactive substituent having a functional group, for example, a hydroxyl group. Examples of the functional group may include a hydroxyl group, an amino group and a carboxyl group. However, the present invention is by no means limited thereto. The reactive substituent having a functional group includes a hydroxyl group, a hydroxyalkyl group, a hydroxyphenyl group and the like.

Further, the reactive substituent may be protected with a protective group. In this case, the reaction is performed by using the complex or compound having a protected reactive substituent, as it is to obtain a mononuclear iridium complex, which then is subjected to deprotection to obtain a mononuclear iridium complex having a reactive substituent as an intermediate. Thereafter, the reactive substituent of the intermediate and a compound having a polymerizable functional group are reacted to obtain a polymerizable compound containing a mononuclear iridium complex part. From the functional groups for the reactive substituents are excluded the above-mentioned polymerizable functional groups.

Examples of the substituents having no polymerizable functional group represented by $X^{2D}$, $Y^{2D}$ and $Z^{2D}$ in the formula (D-19) include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, an aryl group, and the like organic groups. These organic groups may have a substituent such as a halogen atom.

The compound having a polymerizable functional group to be reacted with the mononuclear iridium complex having a reactive substituent obtained by the reaction between the binuclear iridium complex and the compound of the formula (D-19) having a reactive substituent must have in addition to the polymerizable group a functional group having a group reactive with the reactive substituents $X^{2D}$, $Y^{2D}$ and $Y^{3D}$ in the formula (D-19). In the case of the second synthesis method for the polymerizable compounds according to the present invention, $R^1$ to $R^{32}$ in the formula (D-17) must be selected so as to be groups that do not react with the compound having a polymerizable functional group to be reacted with the above-mentioned mononuclear iridium complex.

Examples of the compound having a polymerizable functional group to be reacted with the above-mentioned mononuclear iridium complex include polymerizable acid chlorides and polymerizable isocyanates. However, the present invention is by no means limited thereto. The polymerizable functional group may be any of a radical polymerizable group, a cation polymerizable group, an anion polymerizable group, an addition polymerizable group, and a condensation polymerizable group. Among these, a radical polymerizable functional group is preferred. Examples of the polymerizable functional group include a vinyl group, an allyl group, an alkenyl group, an acrylate group, a methacrylate group, a urethane (meth)acrylate group such as methacryloyloxyethyl carbamate, a styryl group and derivatives thereof, a vinyl amide group and derivatives thereof. Among the polymerizable functional groups, an acrylate group, a methacrylate group and a urethane (meth)acrylate group are preferred from the viewpoint of polymerizability. Specifically, examples of the polymerizable acid chloride include acrylic acid chloride, methacrylic acid chloride and the like. Examples of the polymerizable isocyanate include methacryloyl isocyanate and methacryloyloxyethyl isocyanate and the like.

The chemical formulae such as the formula (D-1) representing the compounds of the present invention represent metal complex structures, in which O—C—C—C—O indicates resonant structures. Of course they include chemically acceptable structures.

Polymerizable Compound (E-1)

The substituent having a polymerizable functional group represented by $X^E$ in the formula (E-1) is preferably a substituent having a carbon-carbon double bond as a polymerizable functional group, examples of which include substituents having a vinyl group, an acryloyloxy group, a methacryloyloxy group, a urethane (meth)acryloyloxy group, such as a methacryloyloxyethylcarbamate group, a styryl group and its derivatives, and a vinyl amide group and its derivative, respectively. Among these polymerizable functional groups, an acryloyloxy group, a methacryloyloxy group, a urethane (meth) acryloyloxy group, and a styryl group are preferred from the viewpoint of polymerizability. The position to which these substituents are bonded may be any one of the 3-, 4-, 5- and 6-positions of the picolinic acid ligand.

In the formulae (E-1), and (E-9) to (E-12), the expression "organic group having 1 to 20 carbon atoms which may have one or more heteroatoms" is not particularly limited as far as it is not detrimental to the purpose of the present invention. Preferred examples of such organic group include an alkyl group, an alkoxy group, an alkoxyalkyl group, an aryl group, an aryloxy group, an aralkyl group or an aralkoxy group having 1 to 20 carbon atoms and halogen-substituted derivatives thereof.

Examples of $R^{1E}$, $R^{2E}$ and $R^{3E}$ in the formulae (E-1) include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These substituents may further have a substituent such as a halogen atom.

Examples of $R^4$ to $R^{19}$ in the formula (E-1) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may further have substituents such as a halogen atom, a nitro group, and an amino group. Among these, a hydrogen atom, a halogen atom and alkyl groups having 1 to 20 carbon atoms are preferred.

Next, examples of the synthesis methods for the polymerizable compound of the formula (E-1) will be presented below. However, the present invention is by no means limited thereto.

A first synthesis method for the polymerizable compound of the formula (E-1) is a method of producing a polymerizable compound containing a mononuclear iridium complex part by reacting a binuclear iridium complex represented by the formula (E-9) with a picolinic acid derivative represented by the formula (E-10) to obtain a mononuclear iridium complex having a reactive substituent as an intermediate, and then reacting the reactive substituent of the intermediate with a compound having a polymerizable functional group.

(E-9)

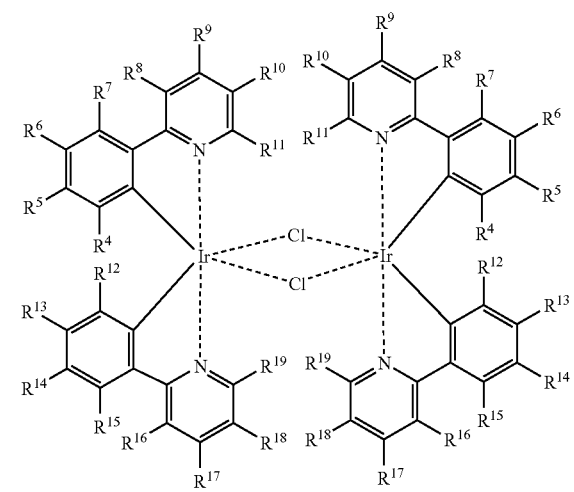

wherein $R^4$ to $R^{19}$ independently represent a hydrogen atom, a halogen atom, a nitro group, an amino group, a sulfonic acid group, a sulfonic acid ester group, or an organic group having 1 to 20 carbon atoms which may have one or more heteroatoms.

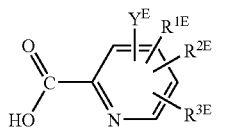

(E-10)

wherein $Y^E$ represents a reactive substituent. $R^{1E}$, $R^{2E}$ and $R^{3E}$ independently represent a hydrogen atom, a halogen atom, or an organic group having 1 to 20 carbon atoms which may have one or more heteroatoms.

The binuclear iridium complex of the formula (E-9) can be synthesized by the known method (S. Lamansky et al., Inorganic Chemistry, 40, 1704 (2001)) Examples of $R^4$ to $R^{19}$ in the formula (E-9) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may contain substituents such as a halogen atom, a nitro group, and an amino group. Among these, a hydrogen atom, a halogen atom and alkyl groups having 1 to 20 carbon atoms are preferred.

The $Y^E$ in the formula (E-10) is a reactive substituent, examples of which include groups having an active hydrogen such as a hydroxymethyl group, a hydroxyl group, a mercapto group and an amino group, respectively, and a carboxyl group. However, the present invention is by no means limited thereto. Further, the reactive substituent may be protected with a protective group. In this case, the reaction is performed as it is, i.e., in a state where the reactive substituent is protected with a protecting group to obtain a mononuclear iridium complex, which then is subjected to deprotection to obtain a mononuclear iridium complex having a reactive substituent as an intermediate. Thereafter, the reactive substituent of the intermediate and a compound having a polymerizable functional group are reacted to obtain a polymerizable compound containing a mononuclear iridium complex part. From the functional groups for the reactive substituents are to be excluded the above-mentioned polymerizable functional groups.

Examples of $R^{1E}$, $R^{2E}$ and $R^{3E}$ in the formula (E-10) include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may further contain substituents such as a halogen atom. Among these, a hydrogen atom, a halogen atom and alkyl groups having 1 to 20 carbon atoms are preferred.

The compound having a polymerizable functional group to be reacted with the mononuclear iridium complex having a reactive substituent (intermediate) obtained by the reaction between the binuclear iridium complex of the formula (E-9) and the compound of the formula (E-10) having a reactive substituent must have in addition to the polymerizable group a functional group having a group reactive with the reactive substituent yE in the formula (E-10). Examples of such a functional group include an isocyanato group and a carboxyl group when the reactive substituent $Y^E$ is a hydroxymethyl group or a hydroxyl group, or an isocyanato group and an acid chloride (R—COCl) group when the reactive substituent $Y^E$ is a mercapto group or an amino group. On the other hand, $R^4$ to $R^{19}$ in the formula (E-9) must be selected from groups that do not react with the compound having a polymerizable functional group to be reacted with the above-mentioned mononuclear iridium complex.

The polymerizable functional group in the compound having a polymerizable functional group to be reacted with the above-mentioned intermediate is preferably a group having a carbon-carbon double bond as a polymerizable functional group, examples of which include a vinyl group, an acryloyloxy group, a methacryloyloxy group, a urethane (meth)acryloyloxy group, such as a methacryloyloxyethylcarbamate group, a styryl group and its derivatives, a vinyl amide group and its derivative, respectively. Among these polymerizable functional groups, an acryloyloxy group, a methacryloyloxy group, a urethane (meth) acryloyloxy group, and a styryl group are preferred from the viewpoint of polymerizability.

The second synthesis method for the polymerizable compound of the formula (E-1) is a method of directly producing a polymerizable compound containing a mononuclear iridium complex part by reacting a binuclear iridium complex of the formula (E-9) with a picolinic acid derivative of the formula (E-11):

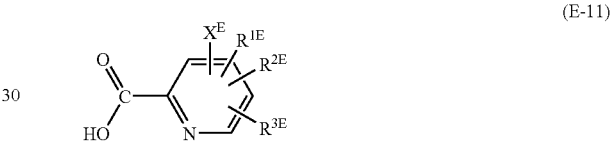

(E-11)

wherein $X^E$ represents a substituent having a polymerizable functional group, and $R^{1E}$, $R^{2E}$ and $R^{3E}$ independently represent a hydrogen atom, a halogen atom, a nitro group, an amino group, a sulfonic acid group, a sulfonic acid ester group, or an organic group having 1 to 20 carbon atoms which may have one or more heteroatoms.

The $X^E$ in the formula (E-11), which is a substituent having a polymerizable functional group, is preferably a substituent having a carbon-carbon double bond as a polymerizable functional group. Examples thereof include a methacryloyloxy group, a methacryloyloxyethylcarbamoyloxy group, a methacryloyloxyethylcarbamoyloxymethyl group, a vinylbenzyloxy group, a methacryloyloxyethyloxycarbonyl group and the like. However, the present invention is by no means limited thereto.

Examples of $R^{1E}$, $R^{2E}$ and $R^{3E}$ in the formula (E-11) include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may further contain substituents such as a halogen atom.

Polymerizable Compound (F-1)

In the substituent having a polymerizable functional group represented by $X^{1F}$, $Y^{1F}$ and $Z^{1F}$ in the formula (F-1), a polymerizable functional group may be any of a radical polymerizable group, a cation polymerizable group, an anion polymerizable group, an addition polymerizable group, and a condensation polymerizable group. Among these, a radical polymerizable functional group is preferred. Examples of the polymerizable functional group include those groups having a vinyl group, an allyl group, an alkenyl group, an alkenoyloxy group such as an acryloyloxy group and a methacryloyloxy group, a urethane (meth) acryloyloxy group such as a methacryloyloxyethylcarbamate group, a styryl group and its derivatives, a vinyl amide group and its derivatives, respectively. Among these polymerizable functional groups, an acryloyloxy group, a methacryloyloxy group, a urethane (meth)acryloyloxy group, and a styryl group are preferred from the viewpoint of polymerizability.

In the formulae (F-1), (F-2), (F-12), and (F-15) to (F-21), the "organic group having 1 to 20 carbon atoms which may have one or more heteroatoms" is not particularly limited as far as it is not detrimental to the purpose of the present invention and may have a heteroatom such as an oxygen atom, a nitrogen atom, a sulfur atom or a halogen atom. Preferred examples of such an organic group include an alkyl group, an alkoxy group, an alkoxyalkyl group, an aryl group, an aryloxy group, an aralkyl group or an aralkoxy group having 1 to 20 carbon atoms and halogen-substituted derivatives thereof.

Examples of the substituents having no polymerizable functional group represented by $Q^{1F}$, $Q^{2F}$ and $Q^{3F}$ out of $X^{1F}$, $Y^{1F}$ and $Z^{1F}$ in the formulae (F-1), (F-2), (F-12), and (F-15) to (F-21), include a hydrogen atom, a halogen atom, alkyl groups such as methyl, ethyl, propyl, isopropyl, butyl, isobutyl, tert-butyl, amyl, and hexyl, an aralkyl group, alkoxy groups such as methoxy, ethoxy, propoxy, isobutoxy, and tert-butoxy, an acetoxy group, an ester group such as propoxycarbonyl, an aryl group, and the like organic groups. Among these, a hydrogen atom, a halogen atom, and alkyl groups having 1 to 20 carbon atoms are preferred.

The $R^1$ to $R^{16}$ in the formulae (F-1), (F-15) and (F-18) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, an aralkyl group, alkoxy groups such as methoxy, ethoxy, propoxy, isobutoxy, and tert-butoxy, an acetoxy group, an ester group such as propoxycarbonyl, an aryl group, and the like organic groups, provided that they fall in the range as defined above. These organic groups may further have substituents such as a halogen atom, a nitro group, and an amino group. Among these, a hydrogen atom, a halogen atom, and alkyl groups having 1 to 20 carbon atoms are preferred.

"A"s in the formula (F-6) and (F-9) are organic groups having 3 to 20 carbon atoms, containing an acryloyl group, a methacryloyl group, an acryloyloxy group or a methacryloyloxy group. The organic groups may have a heteroatom such as an oxygen atom, a nitrogen atom, a sulfur atom, or a halogen atom as far as it is not detrimental to the purpose of the present invention. Preferred examples of such an organic group include an alkyl group, an aryl group and an aralkyl group. Further, these groups may contain an isocyanate bond.

Next, examples of the synthesis methods for the polymerizable compound in the formula (F-1) will be presented below. However, the present invention is by no means limited thereto.

A first synthesis method is a method of producing a polymerizable compound containing a mononuclear iridium complex part by reacting a binuclear iridium complex represented by the formula (F-15) with a compound having a polymerizable functional group represented by the formula (F-16):

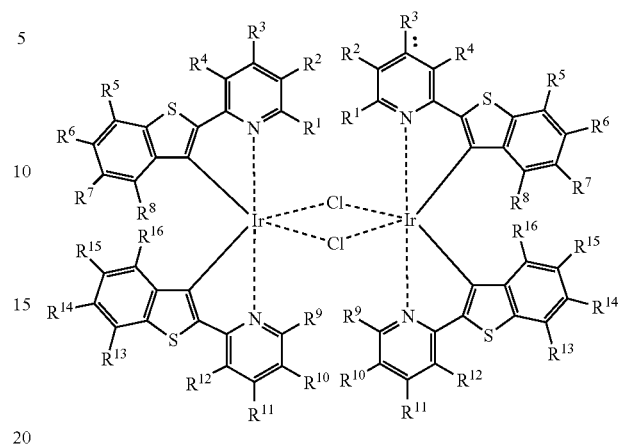

wherein $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

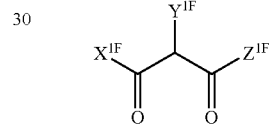

wherein at least one of $X^{1F}$, $Y^{1F}$, and $Z^{1F}$ represents a substituent having a polymerizable functional group, and the remainder of $X^{1F}$, $Y^{1F}$, and $Z^{1F}$ independently represent a hydrogen atom, a halogen atom or an organic group having 1 to 20 carbon atoms which may have one or more heteroatoms.

The binuclear iridium complex of the formula (F-15) can be synthesized by the known method (S. Lamansky et al., Inorganic Chemistry, 40, 1704 (2001)). Examples of $R^1$ to $R^{16}$ in the formula (F-15) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, an aralkyl group such as a benzyl group, alkoxy groups such as methoxy, ethoxy, propoxy, isobutoxy, and tert-butoxy, an acetoxy group, an ester group such as propoxycarbonyl, and the like organic groups. These organic groups may further contain substituents such as a halogen atom, a nitro group, and an amino group. Among these, a hydrogen atom, a halogen atom, and alkyl groups having 1 to 20 carbon atoms are preferred.

At least one of the substituents $X^{1F}$, $Y^{1F}$ and $Z^{1F}$ of the compound of the formula (F-16) is a substituent having polymerizable functional group and has the same meaning as explained on the formula (F-1). The substituent having no polymerizable functional group represented by the substituents $X^{1F}$, $Y^{1F}$ and $Z^{1F}$ of the compound of the formula (F-16) are the same as in the case of the formula (F-1).

A second synthesis method for the polymerizable compound of formula (F-1) is a method of producing a polymerizable compound containing a mononuclear iridium complex part by reacting a binuclear iridium complex represented by the formula (F-15) with a compound having a reactive substituent represented by the formula (F-17) to obtain a mononuclear iridium complex having a reactive substituent as an intermediate, and then reacting the reactive substituent of the intermediate with a compound having a polymerizable functional group:

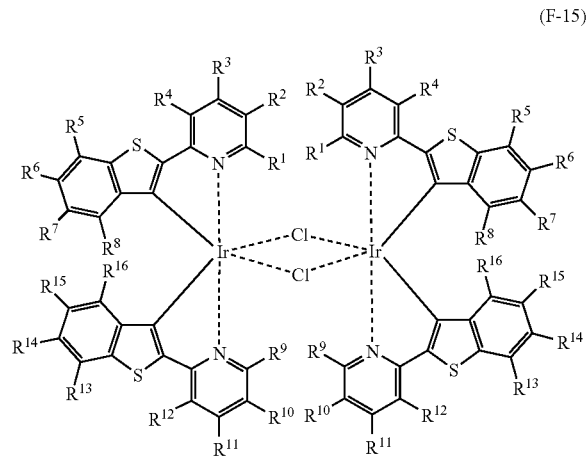

(F-15)

wherein $R^1$ to $R^{16}$ independently represent a hydrogen atom, a halogen atom, a nitro group, an amino group, a sulfonic acid group, a sulfonic acid ester group, or an organic group having 1 to 20 carbon atoms which may have one or more heteroatoms.

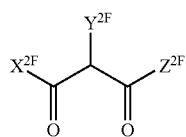

(F-17)

wherein at least one of $X^{2F}$, $Y^{2F}$, and $Z^{2F}$ represents a reactive substituent, and the remainder of $X^{2F}$, $Y^{2F}$, and $Z^{2F}$ independently represent a hydrogen atom, a halogen atom or an organic group having 1 to 20 carbon atoms which may have one or more heteroatoms.

At least one of the substituents $X^{2F}$, $Y^{2F}$ and $Z^{2F}$ of the formula (F-17) is a reactive substituent having a functional group, for example, a hydroxyl group. Examples of the functional group may include an active hydrogen, such as a hydroxyl group, a mercapto group, and an amino group, and a carboxyl group. However, the present invention is by no means limited thereto. Examples of the reactive substituent having a functional group include a hydroxyl group, a hydroxyalkyl group, a hydroxyphenyl group, a mercapto group, an amino group and the like.

Further, the reactive substituent may be protected with a protective group. In this case, the reaction is performed as it is, i.e., in a state where the reactive substituent is protected with a protective group to obtain a mononuclear iridium complex, which then is subjected to deprotection to obtain a mononuclear iridium complex having a reactive substituent as an intermediate. Thereafter, the reactive substituent of the intermediate and a compound having a polymerizable functional group are reacted to obtain a polymerizable compound containing a mononuclear iridium complex part. From the functional groups for the reactive substituents are to be excluded the above-mentioned polymerizable functional groups.

The substituents out of the substituents $X^{2F}$, $Y^{2F}$ and $Z^{2F}$ of the compound of the formula (F-19) other than the reactive substituents include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an acetoxy group, an ester group such as propoxycarbonyl, an aryl group, and the like organic groups. These substituents may further have a substituent such as a halogen atom.

The compound having a polymerizable functional group to be reacted with the mononuclear iridium complex having a reactive substituent obtained by the reaction between the binuclear iridium complex and the compound of the formula (F-17) having a reactive substituent must have in addition to the polymerizable group a functional group having a group reactive with the reactive substituent $X^{2F}$, $Y^{2F}$, and $Z^{2F}$ in the formula (F-17). Examples of such a functional group include an isocyanato group and a carboxyl group when the reactive substituents $X^{2F}$, $Y^{2F}$ or $Z^{2F}$ are groups that contain a hydroxyl group, such as a hydroxymethyl group or a hydroxyl group, or an isocyanato group and an acid chloride (R—COCl) group when the reactive substituents $X^{2F}$, $Y^{2F}$ or $Z^{2F}$ are groups that contain a mercapto group or an amino group, or a hydroxyl group when the reactive substituents $X^{2F}$, $Y^{2F}$ or $Z^{2F}$ are groups that contain a carboxyl group.

In the case of the second synthesis method for the polymerizable compound of formula (F-1), $R^1$ to $R^{16}$ in the formula (F-15) must be selected from groups that do not react with the compound having a polymerizable functional group to be reacted with the above-mentioned mononuclear iridium complex.

Examples of the compound having a polymerizable functional group to be reacted with the above-mentioned mononuclear iridium complex include polymerizable acid chlorides and polymerizable isocyanates. However, the present invention is by no means limited thereto. In these compounds, the polymerizable functional group may be any of a radical polymerizable group, a cation polymerizable group, an anion polymerizable group, an addition polymerizable group, and a condensation polymerizable group. Among these, a radical polymerizable functional group is preferred. The polymerizable functional group is preferably a group having a carbon-carbon double bond. Examples thereof include a vinyl group, an allyl group, an alkenyl group, an alkenoyloxy group such as an acryloyloxy group and a methacryloyloxy group, a urethane (meth) acryloyloxy group such as a methacryloyloxyethylcarbamate group, a styryl group and its derivatives, a vinyl amide group and derivatives thereof. Among these polymerizable functional groups, an acryloyloxy group, a methacryloyloxy group, and a urethane (meth)acryloyloxy group are preferred from the viewpoint of polymerizability. Specifically, examples of the polymerizable acid chloride include acrylic acid chloride, methacrylic acid chloride and the like. Examples of the polymerizable isocyanate include methacryloyl isocyanate, methacryloyloxyethyl isocyanate and the like.

The chemical formulae such as the formula (F-1) representing the compounds of the present invention represent metal complex structures, in which O—C—C—O indicates a resonant structure. Of course they include chemically acceptable structures.

Polymerizable Compound (G-1)

The monovalent anionic bidentate ligand represented by L in the formula (G-1) is a monovalent anion compound obtainable by eliminating one hydrogen atom from a compound having in the molecule a nonionic coordination site such as a pyridine ring, a carbonyl group, or an imine group, and a site that can become a monovalent anionic coordination site upon elimination of one hydrogen ion, such as a phenyl group, a hydroxyl group, or a carboxyl group, or from a compound having a conjugate structure having two coordination sites that can become a monovalent anionic group as a whole upon elimination of one hydrogen ion, such as a β-diketone. Among these compounds, preferred are compounds that can form a 5-membered or 6-membered ring structure including the iridium atom when the compound is coordinated to one iridium atom at the two coordination sites thereof. Examples of such preferred compounds include monovalent anionic compounds derived from 2-phenylpyridine, β-diketone, picolinic acid, N-alkylsalicylimine, 8-hydroxyquinoline, and derivatives thereof by eliminating one hydrogen ion. Among these bidentate ligands, monovalent anionic compounds derived from β-diketone, picolinic acid and N-alkylsalicylimine by elimination of one hydrogen atom are preferred from the viewpoint of light emission characteristics.

In the substituent having a polymerizable functional group represented by $X^G$ in the formula (G-1), the polymerizable functional group may be any one of a radical polymerizable substituent, a cation polymerizable substituent, an anion polymerizable substituent, an addition polymerizable substituent, and a condensation polymerizable substituent Among these, a radical polymerizable functional group is preferred. The polymerizable functional group is preferably a group having a carbon-carbon double bond. Examples thereof include a vinyl group, an allyl group, an alkenyl group, alkenoyloxy groups such as an acryloyloxy group and a methacryloyloxy group, a urethane (meth)acryloyloxy group such as methacryloyloxyethyl carbamate, a styryl group and derivatives thereof, a vinyl amide group and derivatives thereof. Among the polymerizable functional groups, an acryloyloxy group, a methacryloyloxy group, a urethane (meth)acrylate and a styryl group are preferred from the viewpoint of polymerizability. Specifically, examples of the substituent having a polymerizable functional group include a methacryloyloxy group, a methacryloyloxyethylcarbamoyloxy group, and a vinylbenzyloxy group. However, the present invention is by no means limited thereto. The position to which these substituents are bonded may be any one of the 3-, 4-, 5- and 6-positions of the phenyl group of the phenylpyridine ligand.

In the formulae (G-1), (G-2), (G-6), (G-7), (G-9) and (G-10), the "organic group having 1 to 20 carbon atoms which may have one or more heteroatoms" in each formula is not particularly limited as far as it is not detrimental to the purpose of the present invention. Preferred examples of such organic group include an alkyl group, an alkoxy group, an alkoxyalkyl group, an aryl group, an aryloxy group, an aralkyl group, an aralkoxy group having 1 to 20 carbon atoms and halogen-substituted derivatives thereof.

Examples of the $R^1$ to $R^7$ in the formula (G-1) include a hydrogen atom, a halogen atom, a nitro group, an amino group, a sulfonic acid group, a sulfonic acid ester group such as methyl sulfonate, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may further have substituents such as a halogen atom, a nitro group, and an amino group. Among these, a hydrogen atom, a halogen atom and alkyl groups having 1 to 20 carbon atoms are preferred. It should be noted that although in the formula (G-1), the two sets of $R^1$ to $R^7$ bonded to two phenylpyridine groups are explained to be the same, they may be different for different phenylpyridine skeletons.

Among the compounds of the formula (G-1), those compounds in which the monovalent anionic bidentate ligand represented by L is a compound derived from β-diketone by elimination of one hydrogen ion is indicated by the formula (G-2).

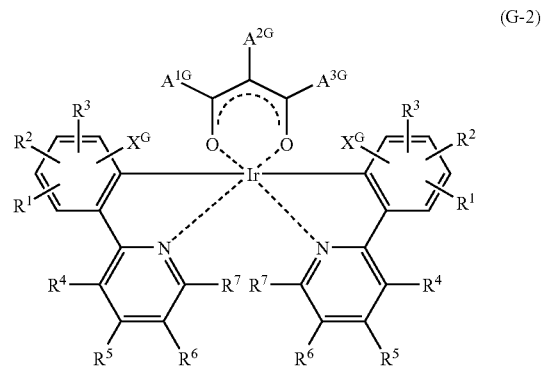

(G-2)

wherein $A^{1G}$, $A^{2G}$, and $A^{3G}$ independently represent a hydrogen atom, a halogen atom or an organic group having 1 to 20 carbon atoms which may have one or more heteroatoms. $X^G$ represents a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

Examples of the $A^{1G}$, $A^{2G}$, and $A^{3G}$ in the formula (G-2) include a hydrogen atom, a halogen atom, alkyl groups such as methyl, ethyl, propyl, isopropyl, butyl, isobutyl, tert-butyl, amyl, and hexyl, alkoxy groups such as methoxy, ethoxy, propoxy, isobutoxy, and tert-butoxy, an aralkyl group, an acetoxy group, an ester group such as propoxycarbonyl, and the like organic groups. These organic groups may further have substituents such as a halogen atom.

In the formula (G-2), the substituent having a polymerizable functional group, represented by $X^G$ and $R^1$ to $R^7$ have the same meanings as those in the formula (G-1).

The chemical formulae such as the formula (G-1) representing the compounds of the present invention represent metal complex structures, and O—C—C—C—O in the chemical formulae such as the formula (G-2) indicates a resonant structure. Of course they include chemically acceptable structures.

Next, examples of the synthesis methods for the polymerizable compound of formula (G-1) will be presented below. However, the present invention is by no means limited thereto.

A first synthesis method for the polymerizable compounds is a method of producing a polymerizable compound containing a mononuclear iridium complex part by reacting a binuclear iridium complex having a reactive substituent represented by the formula (G-6) with a compound that can become a monovalent anionic bidentate ligand upon elimination of one hydrogen ion to form a mononuclear iridium complex having a reactive substituent as an intermediate, and then reacting the reactive substituent of the intermediate with a compound having a polymerizable functional group:

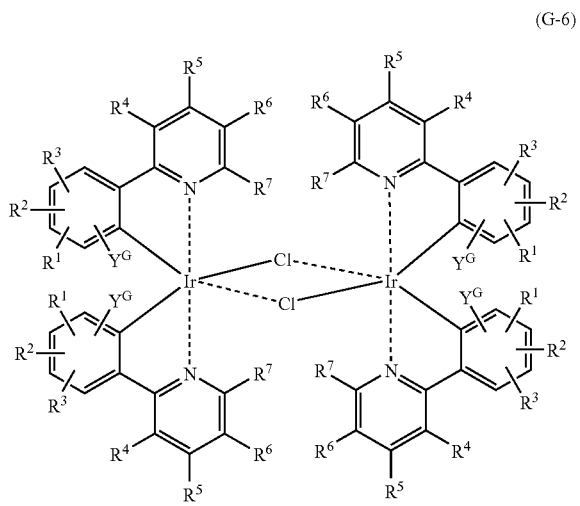

(G-6)

wherein $Y^G$ is a substituent having a reactive functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

The binuclear iridium complex of the formula (G-6) can be synthesized by the known method (S. Lamansky et al., Inorganic Chemistry, 40, 1704 (2001)).

The $Y^G$ in the formula (G-6) is a substituent having a reactive functional group, examples of which include a hydroxyl group, a mercapto group, an amino group, and a carboxyl group. However, the present invention is by no means limited thereto. The substituent $Y^G$ having a reactive functional group may be the above-mentioned functional group by itself or a substituent having a functional group such as a hydroxymethyl group. The reactive functional group of $Y^G$ may be protected with a protective group. In this case, the reaction is performed by using the complex or compound having a protected reactive substituent as it is to obtain a mononuclear iridium complex having a monovalent anionic bidentate ligand L, which then is subjected to deprotection to obtain a mononuclear iridium complex having a substituent $Y^G$ containing a reactive functional group as an intermediate. A further reaction between the reactive substituent of the intermediate and a compound having a polymerizable functional group gives rise to a polymerizable compound containing a mononuclear iridium complex part. From the functional groups for the reactive substituents are to be excluded the above-mentioned polymerizable functional groups.

In the formula (G-6), $R^1$ to $R^7$ have the same meanings as those in the formula (G-1). As in the formula (G-1), the four sets of $R^1$ to $R^7$ bonded to four phenylpyridine skeletons may be different for different phenylpyridine skeletons.

Examples of the compound that can become a monovalent anionic bidentate ligand upon elimination of one hydrogen ion include 2-phenylpyridine, β-diketone, picolinic acid, N-alkylsalicylimine, 8-hydroxyquinoline, and derivatives thereof. However, the present invention is by no means limited thereto.

The compound having a polymerizable functional group to be reacted with the mononuclear iridium complex having a substituent $Y^G$ containing a reactive functional group obtained by the reaction between the binuclear iridium complex having a substituent containing a reactive functional group of the formula (G-6) and the compound that can become a monovalent anionic bidentate ligand upon elimination of one hydrogen ion must have in addition to the polymerizable group a functional group to be reacted with a substituent $Y^G$ having a reactive functional group in the formula (G-6). The $R^1$ to $R^7$ in the formula (G-6) must be selected from groups that do not react with the compound having a polymerizable functional group to be reacted with the above-mentioned mononuclear iridium complex.

Examples of the compound having a polymerizable functional group to be reacted with the above-mentioned intermediate include polymerizable acid chlorides, polymerizable alkyl halides, and polymerizable isocyanates. However, the present invention is by no means limited thereto. The polymerizable functional group may be any one of a radical polymerizable group, a cation polymerizable group, an anion polymerizable group, an addition polymerizable group, and a condensation polymerizable group. Among these, a radical polymerizable functional group is preferred. The polymerizable functional group is preferably a group having a carbon-carbon double bond. Examples thereof include a vinyl group, an allyl group, an alkenyl group, alkenoyloxy groups such as an acryloyloxy group and a methacryloyloxy group, a urethane (meth) acryloyloxy group such as methacryloyloxyethyl carbamate, a styryl group and derivatives thereof, a vinyl amide group and derivatives thereof. Among the polymerizable functional groups, an acryloyloxy group, a methacryloyloxy group, a urethane (meth) acryloyloxy group, and a styryl group are preferred from the viewpoint of polymerizability. Specifically, examples of the polymerizable acid chloride include acrylic acid chloride, methacrylic acid chloride and the like. Examples of the polymerizable alkyl halide include vinylbenzyl chloride. Examples of the polymerizable isocyanate include methacryloyl isocyanate and methacryloyloxyethyl isocyanate.

A second synthesis method for the polymerizable compound of the formula (G-1) is a method of directly producing a polymerizable compound containing a mononuclear iridium complex part by reacting a binuclear iridium complex represented by the formula (G-7) having a polymerizable functional group with a compound that can become a monovalent anionic bidentate ligand upon elimination of one hydrogen ion:

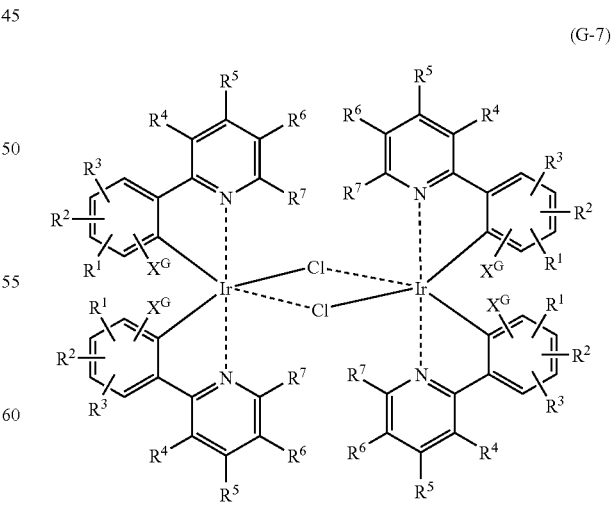

(G-7)

wherein $X^G$ is a substituent having a polymerizable functional group, and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

In the formula (G-7), the substituent having a polymerizable functional group represented by $X^G$ has the same meaning as in the formula (G-1). $R^1$ to $R^7$ have the same meanings as those in the formula (G-1).

Examples of the compound that can become a monovalent anionic bidentate ligand upon elimination of one hydrogen ion include 2-phenylpyridine, β-diketone, picolinic acid, N-alkylsalicylimine, 8-hydroxyquinoline, and derivatives thereof. However, the present invention is by no means limited thereto.

The composition containing a polymerizable light emitting compound for use in the polymer light emitting material of the present invention may contain an electron transporting compound for forming an electron transport layer. As the electron transporting compound, known electron transporting material, such as quinolinol derivative metal complexes, oxadiazole derivatives, and triazole derivatives may be used. However, the present invention is by no means limited thereto. The electron transporting materials may be used singly or in admixture with other electron transporting materials.

The electron transporting compound contained in the composition containing a polymerizable light emitting compound used for the polymer light emitting material of the present invention may be a electron transporting material that is polymerizable. The use of electron transporting compound being polymerizable is more preferable, since the freedom in selecting the composition containing a polymerizable light emitting compound for use in the polymer light emitting material of the present invention is increased.

Examples of the polymerizable electron transporting compound include those compounds composed of the above-mentioned known electron transporting compounds such as quinolinol derivative metal complex such as $Alq_3$ (trisquinolinol aluminum), oxadiazole derivatives, and triazole derivatives to which at least one polymerizable functional group, such as a (meth) acrylic group, a vinyl group, a styryl group, an isocyanate group, or a thiocyanate group, is bonded. Specific examples thereof include bisquinolinol methacryloyloxy quinolinol aluminum, quinolinol bismethacryloyloxy quinolinol aluminum, methacryloyloxy oxadiazole, styryl oxadiazole, bisstyryl oxadiazole and the like. In the case of the polymerizable electron transporting compound, crosslinking polymerizable electron transporting compounds such as quinolinol bismethacryloyloxy quinolinol aluminum and bisstyryl oxadiazole are preferred.

The composition containing a polymerizable light emitting compound for use in the polymer light emitting material of the present invention may contain other polymerizable compounds. The existence of other polymerizable compounds in the composition is preferable since such increases the freedom in selecting the composition.

Other polymerizable compounds are not particularly limited as far as they do not inhibit light emission of the polymer light emitting material of the present invention. Examples thereof include methyl methacrylate, ethyl acrylate, ethylene glycol dimethacrylate, propylene glycol diacrylate, trimethylolpropane triacrylate, styrene, stilbene and the like. In the case of other polymerizable compounds, crosslinking compounds such as ethylene glycol dimethacrylate, propylene glycol diacrylate, trimethylolpropane triacrylate and stilbene are preferred.

The polymerizable composition for use in the polymer light emitting material of the present invention may contain a polymerization initiator. Any polymerization initiator may be used without particular limitations as far as it can initiate the polymerization of the above-mentioned polymerizable functional groups. Depending on the mechanism of polymerization of the polymerizable functional group, a radical polymerization initiator, a cation polymerization initiator, an anion polymerization initiator and the like can be used. A radical polymerization initiator is preferred. Further, classifying the polymerization initiators by the mechanism of their activation, a thermal polymerization initiator and an optical polymerization initiator can be used. The optical polymerization initiator as used herein refers to those that initiate polymerization by actinic rays such as visible light, ultraviolet ray, electron beam, and gamma ray.

Examples of the thermal radical polymerization initiator include azo compounds such as 2,2'-azobisisobutyronitrile (AIBN) and 2,2'-azobisisovaleronitrile, ketone peroxides such as methyl ethyl ketone peroxide, methyl isobutyl ketone peroxide, and cyclohexanone peroxide, diacyl peroxides such as benzoyl peroxide, decanoyl peroxide, and lauroyl peroxide, dialkyl peroxides such as dicumyl peroxide, t-butyl cumyl peroxide, and di-t-butyl peroxide, peroxy ketals such as 1,1-bis(t-hexyl-peroxy)-3,3,5-trimethylcyclohexane, 1,1-di-t-butylperoxy-cyclohexane, and 2,2-(di-t-butylperoxy)butane, alkyl peroxy esters such as t-butyl peroxypivalate, t-butyl peroxy-2-ethylhexanoate, t-butyl peroxyisobutyrate, di-t-butyl peroxyhexahydroterephthalate, di-t-butyl peroxyazelate, t-butyl peroxy-3,5,5-trimethylhexanoate, t-butyl peroxyacetate, t-butyl peroxybenzoate, di-t-butyl peroxytrimethyladipate, t-butyl peroxy-2-ethylhexanoate, t-hexyl peroxy-2-ethylhexanoate, percarbonates such as diisopropyl peroxydicarbonate, di-sec-butyl peroxydicarbonate, and t-butyl peroxyisopropylcarbonate, and the like.

Examples of the optical radical polymerization initiator include acetophenone, acetophenone derivatives such as 2,2-dimethoxy-2-phenylacetophenone, diethoxyacetophenone, 1-hydroxycyclohexylphenylketone, 2-methyl-1-[4-(methylthio)phenyl]-2-morpholino-1-propanone, 2-benzyl-2-dimethylamino-1-(4-morpholinophenyl)-1-butanone, and 2-hydroxy-2-methyl-1-phenylpropan-1-one, benzophenone, benzophenone derivatives such as 4,4'-bis(dimethylamino)benzophenone, and 4-trimethylsilylbenzophenone, 4-benzoyl-4'-methyldiphenyl sulfide, benzoin, benzoin derivatives such as benzoin ethyl ether, benzoin propyl ether, benzoin isobutyl ether, and benzoin isopropyl ether, methyl phenyl glyoxylate, benzoin dimethyl ketal, 2,4,6-trimethylbenzoyldiphenylphosphine oxide, and so forth.

The use amount of the polymerization initiators is in a range of from 0.001 to 5 mass % and preferably from 0.01 to 1 mass %, based on the weight of the polymerizable composition of the present invention.

The polymerizable composition containing at least one light emitting compound of the present invention can be formed in a form of a film on a layer that serves as a base by a coating method. The layer that serves as a base may vary depending on the construction of the organic light emitting device. In the case of the device shown in FIG. 1, the hole transporting layer 3 serves as a base layer, and in Examples 19 to 22, an ITO anode serves as a base layer. Upon coating the polymerizable composition containing at least one light emitting compound of the present invention on a base layer, the composition may also be coated after diluting it with a solvent. The dilution with a solvent can decrease the viscosity of the composition so that the film thickness can be reduced. The solvent used can be removed by a treatment such as heating or reduction in pressure before, during or after the polymerization.

Although it is not generally limited, the thickness of the light emitting layer composed of the polymer light emitting material of the present invention is preferably from 1 nm to 10 µm and more preferably from 5 nm to 1 µm.

A layer containing a light emitting material for organic light emitting device of the present invention can be prepared by forming (for example, by coating) a composition containing a polymer light emitting material into a form of a film on a layer that serves as a base for an organic EL device, or by forming a polymerizable composition containing at least one light emitting compound into a form of a film on a layer that serves as a base for an organic EL device and then polymerizing it to form a polymer.

The layer containing a light emitting material for organic light emitting device as used herein means (1) a layer containing only a light emitting material, (2) a layer containing a hole transporting material, a light emitting material and an electron transporting material, (3) a layer containing a hole transporting material and a light emitting material, or (4) a layer containing a light emitting material and an electron transporting material.

When a polymer light emitting material has a crosslinked structure, it is difficult that the polymer obtained by polymerizing is formed into a film under normal conditions. In the case where the crosslinkable compound having two or more polymerizable functional groups is homopolymerized by a solution polymerization method, the crosslinked polymer precipitates in the solvent as insoluble matter. Therefore, the crosslinked polymer in film form can be produced by dissolving a polymerizable light emitting compound into a solvent or other liquid monomers, forming it into a film by printing methods such as a spin coating method, dip coating and ink jet printing method, screen printing method and micro gravure method, and then polymerizing it.

In the case of copolymerizing of the crosslinkable compound with a large amount of monofunctional monomers, copolymer having a solubility to the solvent can be obtained and be coated on a substrate of an organic light emitting device in liquid state. In this case, the monofunctional monomer must be used in large excess to an amount of the crosslinkable compound.

In the organic light emitting device of the present invention, formation of a hole transport layer and an electron transport layer on the both sides or one side of the light emitting layer can further improve the light emission efficiency and/or durability of the device.

As the hole transport material for forming a hole transport layer, known hole transport materials such as triphenylamine derivatives, e.g., TPD (N,N'-diphenyl-N,N'-(3-methylphenyl)-1,1'-biphenyl-4,4'-diamine), α-NPD (4,4'-bis[N-(1-naphthyl)-N-phenylamino]biphenyl), and m-MTDATA (4,4',4"-tris(3-methylphenylphenylamino)triphenylamine), and polyvinylcarbazole may be used. These hole transporting materials may be used singly or in admixture with or laminated on other hole transporting materials. The thickness of the hole transport layer also depends on the electroconductivity of the hole transport layer so that it cannot be generally limited. However, it is preferably from 10 nm to 10 µm and more preferably from 10 nm to 1 µm.

As the electron transporting material for forming an electron transport layer, known electron transporting material, such as quinolinol derivatives metal complexes, e.g., $Alq_3$ (trisquinolinol aluminum), oxadiazole derivatives, and triazole derivatives may be used. However, the present invention is by no means limited thereto. The electron transporting materials may be used singly or in admixture with or laminated on other electron transporting materials. The thickness of the electron transport layer also depends on the electroconductivity of the electron transport layer so that it cannot be generally limited. However, it is preferably from 10 nm to 10 µm and more preferably from 10 nm to 1 µm.

The light emitting material, hole transport material and electron transport material used in the above-mentioned light emitting layer can be used singly for forming each layer. In addition, the polymer material may be used as a binder for forming each layer. Examples of the polymer material used for this purpose include polymethyl methacrylate, polycarbonate, polyester, polysulfone, polyphenylene oxide and the like. However, the present invention is by no means limited thereto.

The light emitting material, hole transporting material and electron transporting material used in the above-mentioned light emitting layer can be formed into a film by using various methods such as a resistance heating vapor deposition method, an electron beam vapor deposition method, a sputtering method, a coating method, a solution coating method, and a printing method and the present invention is not particularly limited thereto. In the case of low molecular weight compounds, mainly resistance heating vapor deposition and electron beam vapor deposition are frequently used. In the case of polymer materials, mainly a casting method and a solution casting method are frequently used.

As the anode material of the organic light emitting device of the present invention, known transparent electroconductive materials such as ITO (indium tin oxide), tin oxide, zinc oxide, electroconductive polymers, e.g., polythiophene, polypyrrole and polyaniline can be used. However, the present invention is not particularly limited thereto. The surface resistance of the electrode made of such a transparent electroconductive material is preferably 1 to 50Ω/□ (ohm/square). Such an anode material can be formed into a film by various methods such as an electron bean vapor deposition method, a sputtering method, a chemical reaction method, and a coating method. However, the present invention is not particularly limited thereto. The thickness of the anode is preferably from 50 to 300 nm.

For the purpose of relaxation of the injection barrier wall, a buffer layer may be inserted between the anode and a hole transport layer or between the anode and an organic layer laminated adjacent to the anode. For the buffer layer, known materials such as copper phthalocyanine and polyethylene dioxythiophene may be used. However, the present invention is not particularly limited thereto.

As the cathode material of the organic light emitting device of the present invention, known cathode materials, for example, Al, Mg—Ag alloys, alkaline earth metals such as Ca, alloys of Al and an alkaline metal, such as Al—Ca, and the like may be used. However, the present invention is not particularly limited thereto. As the method of forming a film of these cathode materials, a resistance heating vapor deposition method, an electron beam vapor deposition method, a sputtering method, an ion plating method and the like can be used. However, the present invention is not particularly limited thereto. The thickness of the cathode is preferably from 10 nm to 1 µm and more preferably from 50 to 500 nm.

For the purpose of improving the efficiency of electron injection, an insulating layer having a thickness of 0.1 to 10 nm may be inserted between the cathode and an electron transport layer or between the cathode and an organic layer laminated adjacent to the cathode. For the insulating layer, known cathode materials such as lithium fluoride, magnesium fluoride, magnesium oxide, and alumina may be used. However, the present invention is not particularly limited thereto.

Furthermore, in order to prevent holes to pass through the light emitting layer and allow holes to efficiently recombine with electrons within the light emitting layer, a hole blocking layer may be provided adjacent to the cathode side of the light emitting layer. For forming such a hole blocking layer, known materials such as triazole derivatives and oxadiazole derivatives may be used. However, the present invention is not particularly limited thereto.

As the substrate of the organic light emitting device of the present invention, an insulating substrate transparent to the emission wavelength of the light emitting material may be used. As such, known materials such as transparent plastics including PET (polyethylene terephthalate) and polycarbonate as well as glass may be used. However, the present invention is not particularly limited thereto.

The organic light emitting device of the present invention can constitute a matrix-type or segment-type pixels by a known method. Also, it can be used as a backlight without forming pixels.

However, the present invention is not particularly limited thereto.

BEST MODE FOR CARRYING OUT THE INVENTION

Hereinafter, the present invention will be described in more detail by referring to typical examples. However, the examples are merely exemplary for the purpose of explanation and the present invention should by no means be limited thereto.

<Measurement Apparatus, Etc.>

1) $^1$H-NMR
   JNM EX270 manufactured by JEOL, Ltd.
   270 MHz
   Solvent: chloroform-$d_1$ or dimethyl sulfoxide-$d_6$ 2) GPC Measurement (Measurement of Molecular Weight)
   Column: Shodex KF-G+KF804L+KF802+KF801
   Eluent: Tetrahydrofuran (THF)
   Temperature: 40° C.
   Detector: RI (Shodex RI-71)

3) Elementary Analysis Equipment
   Model CHNS-932, manufactured by LECO

4) ICP Elementary Analysis
   ICPS 8000, manufactured by Shimadzu Corporation

<Reagents>

Unless otherwise indicated specifically, commercially available preparation (reagent grade) was used without purification.

EXAMPLE 1

Synthesis of Polymerizable Compound Ir(3-MA-PPy) (3-PrCO-PPy)$_2$ (1) 2-(3-Methoxyphenyl)pyridine (3-MeO-PPy) was synthesized by a conventional method.

That is, as shown in the reaction scheme below, (3-methoxyphenyl)magnesium bromide was synthesized from 22.4 g (120 mmol) of 3-bromoanisole with 3.4 g of magnesium in dry tetrahydrofuran (THF) in an argon stream by a conventional manner. This was slowly added to a dry THF solution of 15.8 g (100 mmol) of 2-bromopyridine and 1.8 g of (1,2-bis(diphenylphosphino)ethane)dichloronickel (II) (Ni(dppe)Cl$_2$) and the mixture was stirred at 50° C. for 1 hour. After adding 250 ml of 5% hydrochloric acid aqueous solution to the reaction mixture, the reaction mixture was extracted with chloroform to obtain a target substance and the organic layer was distilled under reduced pressure. 17.4 g (93.9 mmol) of 2-(3-methoxyphenyl)pyridine (3-MeO-PPy) was obtained as a colorless transparent liquid. Identification was performed by CHN elementary analysis and $^1$H-NMR.

$^1$H-NMR (CDCl$_{31}$ ppm): δ 8.68 (d, 1H), 7.72 (m, 2H), 7.59 (s, 1H), 7.54 (d, 1H), 7.37 (t, 1H), 7.22 (d, 1H), 6.97 (d, 1H), 3.89 (s, 3H).

Elementary analysis Calcd: C, 77.81; H, 5.99; N, 7.56. Found: C, 77.44; H, 6.01; N, 7.53.

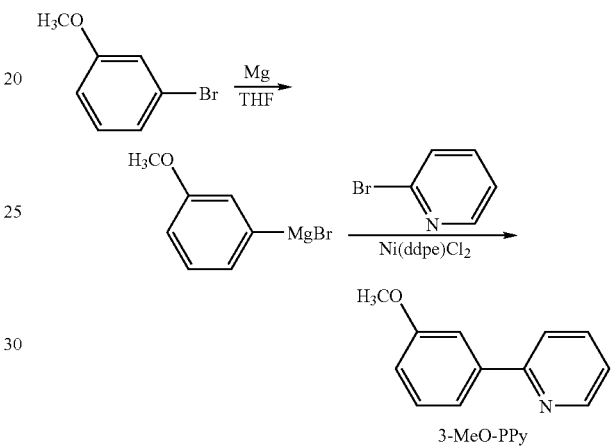

(2) Then, 3-MeO-PPy thus obtained and tris(acetylacetonato)iridium (III) (Ir(acac)$_3$) were allowed to react at a high temperature as shown in the reaction scheme below to synthesize tris[2-(3-methoxyphenyl)pyridine]iridium (III) (Ir(3-MeO-PPy)$_3$).

That is, 5.00 g (27.0 mmol) of 3-MeO-PPy and 2.0 g (4.1 mmol) of Ir(acac)$_3$ were allowed to react in 200 ml of glycerol at 250° C. for 9 hours and purified using column chromatography to obtain 0.400 g (0.54 mmol) of Ir(3-MeO-PPy)$_3$ as yellow powder.

Repeating the above-mentioned operation 8 times afforded 3.20 g (4.32 mmol) in total of Ir(3-MeO-PPy)$_3$.

Identification of the product was performed by $^1$H-NMR and CHN elementary analysis.

$^1$H-NMR (CDCl$_3$, ppm): δ 7.82 (d, 3H), 7.56 (t, 3H), 7.53 (s, 3H), 7.25 (d, 3H), 6.84 (t, 3H), 6.67 (d, 3H), 6.60 (d, 3H), 3.80 (s, 9H).

Elementary analysis Calcd: C, 58.05; H, 4.06; N, 5.64. Found: C, 57.60; H, 4.17; N, 5.57.

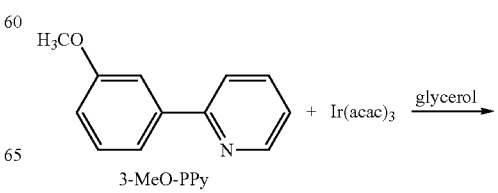

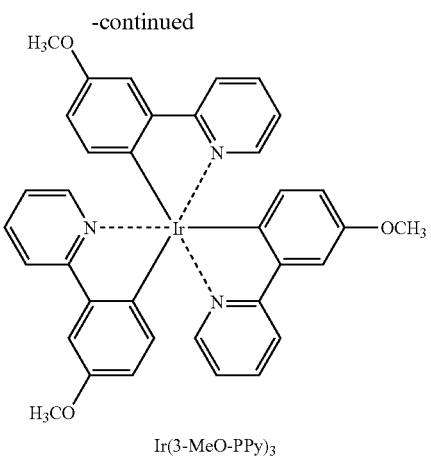

Ir(3-MeO-PPy)$_3$ (3) The Ir(3-MeO-PPy)$_3$ thus obtained was subjected to hydrolysis in an aqueous solution of hydrochloric acid by a conventional method to convert the methoxy groups to hydroxyl groups to obtain [2-(3-hydroxyphenyl)pyridine]iridium (III) (Ir(3-HO-PPy)$_3$) as powder as shown in the reaction scheme below.

(4) Ir(3-HO-PPy)$_3$ was allowed to react with methacryloyl chloride in a molar ratio of 1:1 by the reaction scheme below to esterify a part of the hydroxyl groups thereof, thereby synthesizing a complex composed mainly of Ir(3-MA-PPy)(3-HO-PPy)$_2$. Then, the remaining hydroxyl groups were allowed to react with propionyl chloride (PrCOCl) to obtain a complex composed mainly of Ir(3-MA-PPy)(3-PrCO-PPy)$_2$.

That is, after charging 32 ml of dry THF, 2.81 g (4 mmol) of Ir(3-HO-PPy)$_3$ and 2.40 g (23.6 mmol) of triethylamine as a base in a reactor, a solution of 0.424 g (4 mmol) of methacryloyl chloride in 16 ml of dry THF was dripped over 30 minutes and the mixture was stirred at 20° C. for 5 hours. To this reaction mixture, a solution of 1.48 g (16 mmol) of propionyl chloride in 16 ml of dry THF was dripped over 30 minutes, followed by reaction of the resulting mixture at 20° C. for 5 hours to esterify the remaining hydroxyl groups to react. Then triethylamine hydrochloride was filtered off. The solvent in the filtrate was evaporated to dryness and the solid component was purified by recrystallization from chloroform/methanol mixed solvent 2 times to afford 2.305 g (2.60 mmol) of the objective compound Ir(3-MA-PPy)(3-PrCO-PPy)$_2$ as powder. Identification of the product was performed by $^1$H-NMR and CHN elementary analysis.

$^1$H-NMR (CDCl$_3$, ppm): δ 7.82 (m, 3H), 7.56 (m, 6H), 7.26 (m, 3H), 6.84 (m, 3H), 6.67 (m, 3H), 6.61 (m, 3H), 6.35 (s, 1H), 5.74 (s, 1H), 2.67 (q, 4H), 2.08 (s, 3H), 1.42 (t, 6H).

Elementary analysis Calcd: C, 58.49; H, 4.11; N, 4.76. Found: C, 58.13; H, 4.10; N, 4.72.

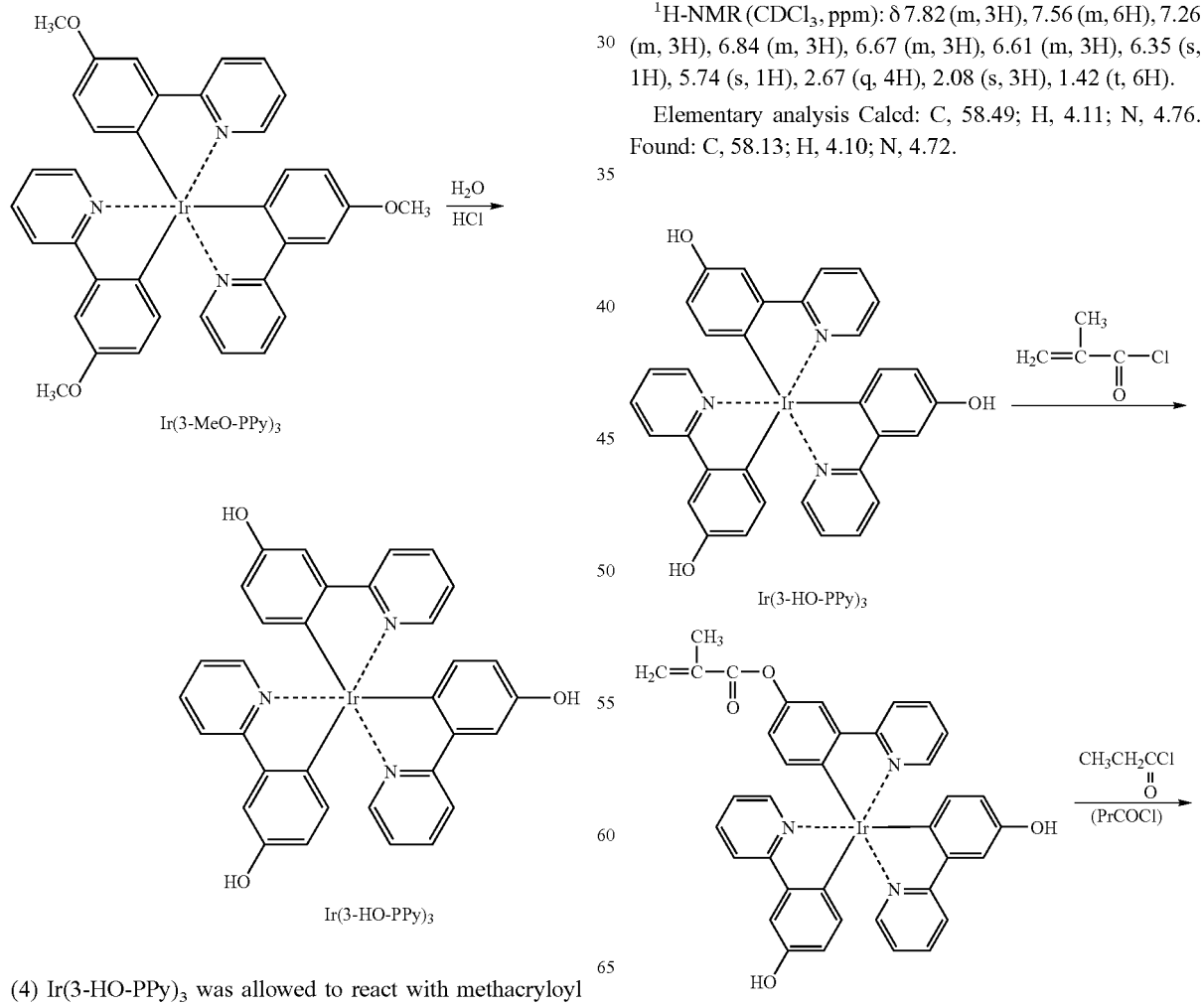

-continued

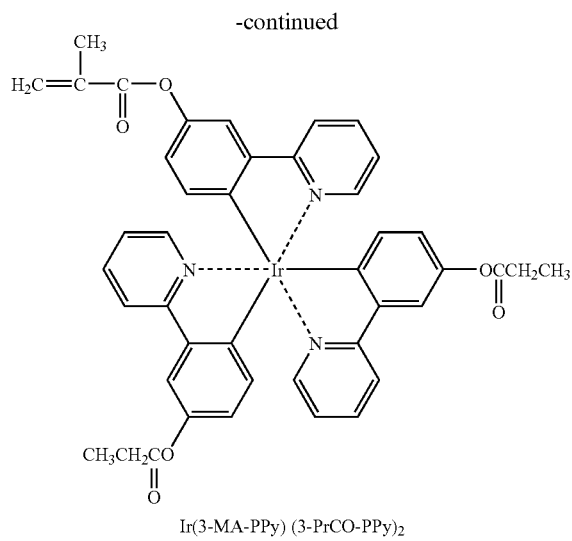

Ir(3-MA-PPy) (3-PrCO-PPy)$_2$

EXAMPLE 2

Synthesis of Ir(3-MA-PPy)(3-PrCO-PPy)$_2$ Polymer

In a reactor were charged 2.22 g (2.5 mmol) of Ir(3-MA-PPy)(3-PrCO-PPy)$_2$ complex synthesized in Example 1, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 1.85 g of the objective Ir(3-MA-PPy)(3-PrCO-PPy)$_2$ polymer as powder. The elementary analysis of C, H, N and Ir of the obtained polymer indicated that the polymer had the same composition as Ir (3-MA-PPy) (3-PrCO-PPy)$_2$. The weight average molecular weight of the polymer was 8,000 in terms of polystyrene (by GPC measurement using HFIP (hexafluoroisopropanol) as an eluent).

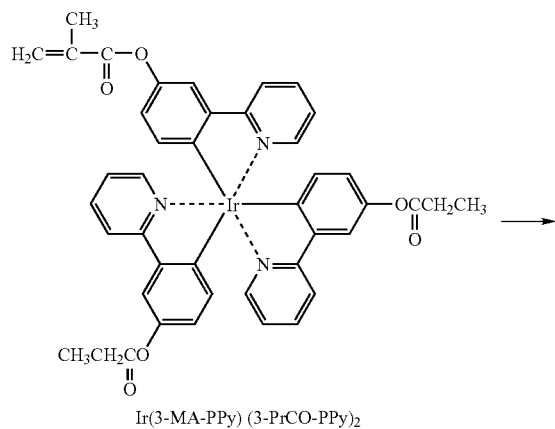

Ir(3-MA-PPy) (3-PrCO-PPy)$_2$

⟶

-continued

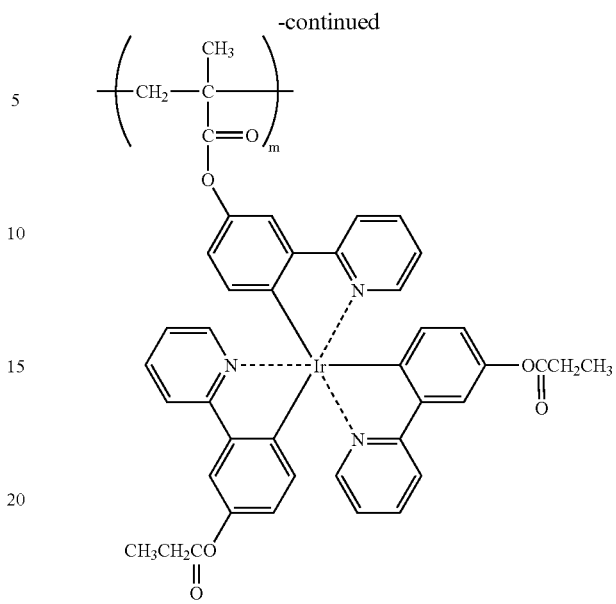

EXAMPLE 3

Synthesis of Polymerizable Compound Ir(3-MOI-PPy)(3-PrCO-PPy)$_2$

A monomer intermediate Ir(3-HO-PPy)$_3$ synthesized in the same manner as in Example 1 was allowed to react with 2-methacryloyloxyethyl isocyanate (Trade name "Karenz MOI", manufactured by Showa Denko K. K., hereinafter sometimes referred to as "MOI") in a ratio of 1:1 (molar ratio) and then the remaining hydroxyl groups were allowed to react with PrCOCl to obtain a complex composed mainly of Ir(3-MOI-PPy) (3-PrCO-PPy)$_2$.

That is, in a reactor were charged 32 ml of dry THF, 2.81 g (4 mmol) of Ir(3-HO-PPy)$_3$, and 0.636 g (4 mmol) of MOI, and after addition of a catalyst amount of dibutyltin (IV) dilaurate, the mixture was allowed to react at 20° C. for 5 hours. To this reaction mixture was added 2.400 g (24.5 mmol) of triethylamine as a base. Thereafter, a solution of 1.48 g (16 mmol) of propionyl chloride in 16 ml of dry THF was dripped over 30 minutes, followed by reaction at 20° C. for 5 hours to react the remaining hydroxyl groups. Then triethylamine hydrochloride was filtered off. The solvent in the filtrate was evaporated to dryness and the solid component was purified by performing recrystallization from chloroform/methanol mixed solvent 2 times to afford 2.62 g (2.70 mmol) of the objective compound Ir(3-MOI-PPy)(3-PrCO-PPy)$_2$ as powder. Identification of the product was performed by $^1$H-NMR and CHN elementary analysis.

$^1$H-NMR (CDCl$_3$, ppm): δ 7.82 (m, 3H), 7.56 (m, 6H), 7.26 (m, 3H), 6.84 (m, 3H), 6.67 (m, 3H), 6.61 (m, 3H), 6.14 (s, 1H), 5.61 (s, 1H), 5.23 (br, 1H), 4.29 (t, 2H), 3.58 (m, 2H), 2.66 (q, 4H), 1.95 (s, 3H), 1.41 (t, 6H).

Elementary analysis Calcd: C, 56.95; H, 4.26; N, 5.78. Found: C, 56.58; H, 4.25; N, 5.72.

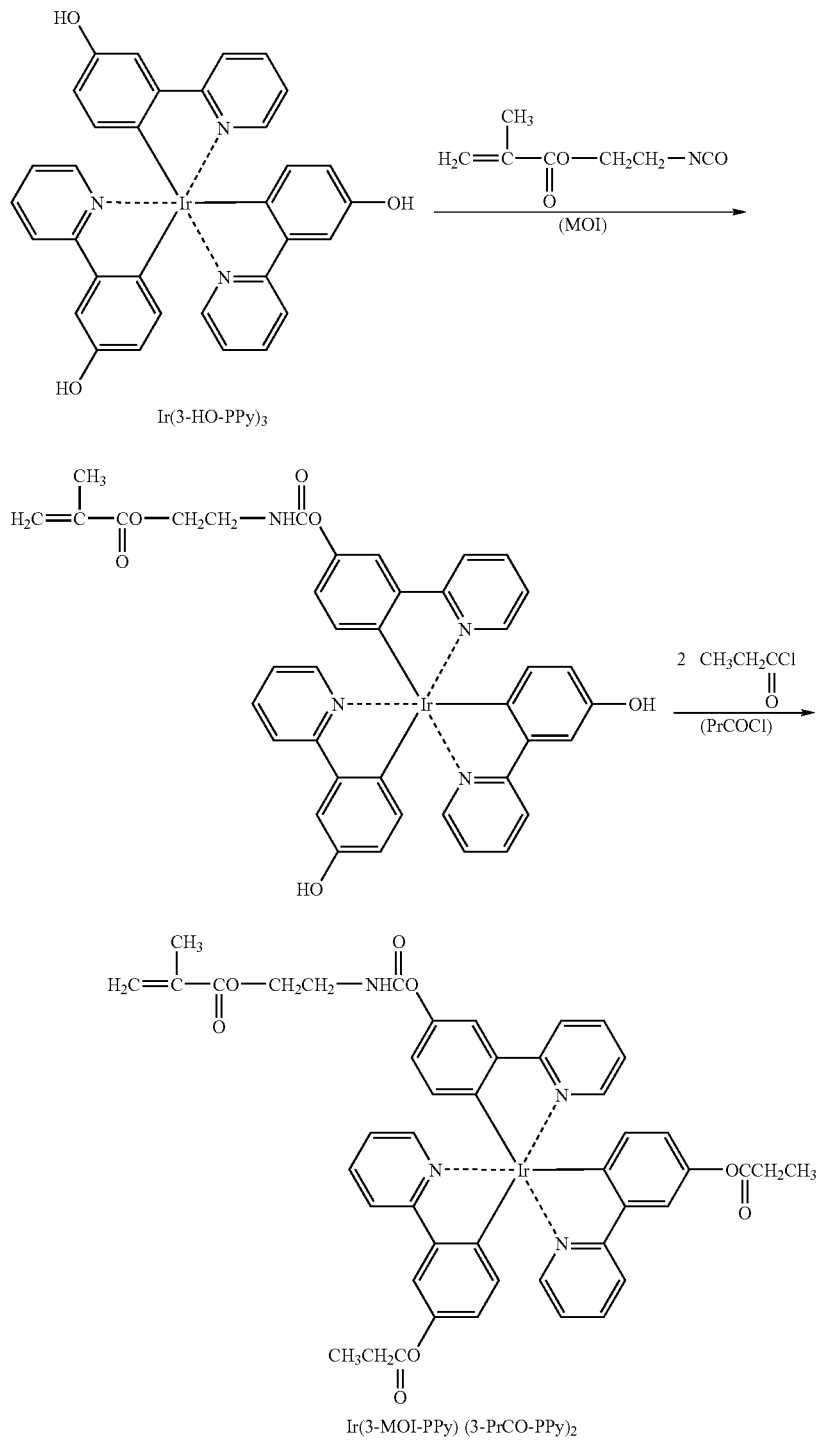

EXAMPLE 4

Synthesis of Ir(3-MOI-PPy)(3-PrCO-PPy)$_2$ polymer

In a reactor were charged 2.43 g (2.5 mmol) of Ir(3-MOI-PPy) (3-PrCO-PPy)$_2$ complex synthesized in Example 1, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below).

After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 2.05 g of the objective Ir(3-MOI-PPy)(3-PrCO-PPy)$_2$ polymer as powder. The elementary analysis of C, H, N and Ir of the obtained polymer indicated that the polymer had substantially the same composition as Ir(3-MOI-PPy) (3-PrCO-PPy)$_2$. The weight average molecular weight of the polymer was 18,000 in terms of polystyrene (by GPC measurement using HFIP (hexafluoroisopropanol) as an eluent).

Then, 0.625 g (4 mmol) of the HPPy polymer and 0.099 g (0.2 mmol) of Ir(acac)$_3$ were dissolved in m-cresol and allowed to react at 250° C. for 10 hours. Further, to this solution was added 0.062 g (0.4 mmol) of 2-phenylpyridine (PPy) and the mixture was allowed to react at 250° C. for 10 hours. After completion of the reaction, the reaction mixture was dripped into acetone to perform reprecipitation and the

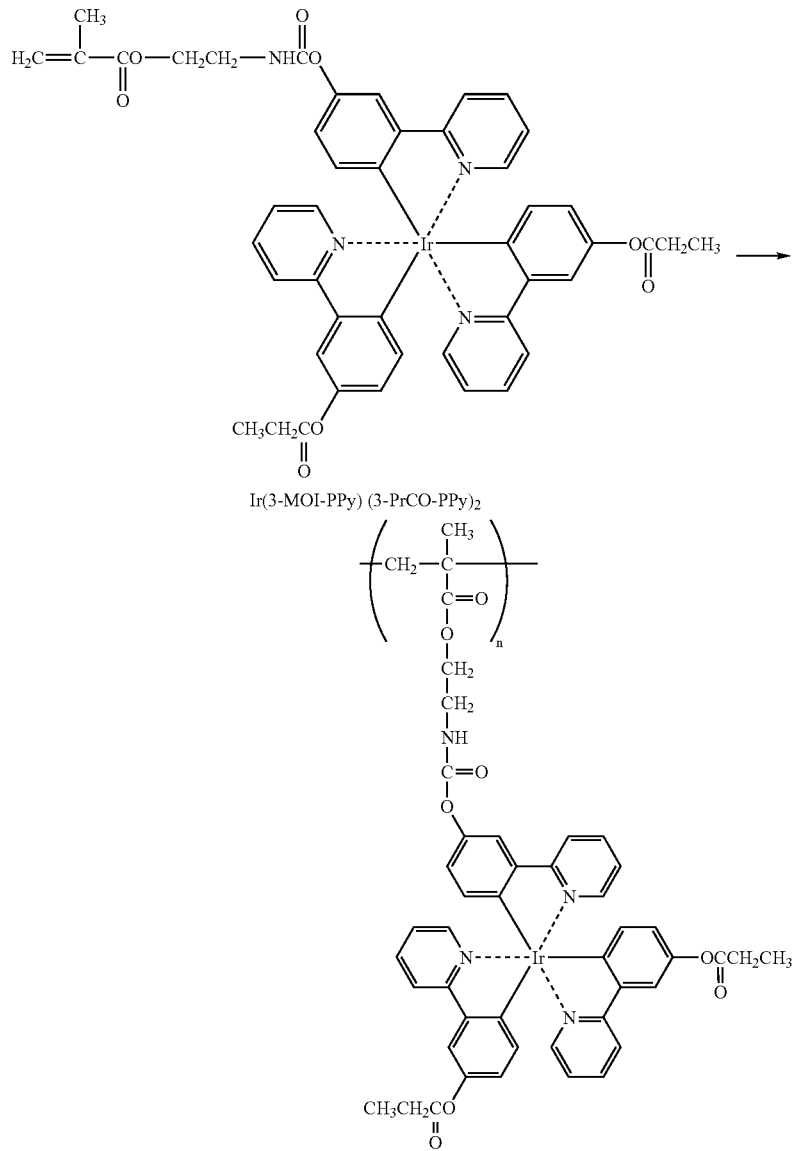

EXAMPLE 5

Synthesis of (HPPy) Polymer Ir/PPy Complex

As shown in Reaction Scheme below, 1.98 g (5.00 mmol) of 5-bromo-2-(4-bromo-3-hexylphenyl)pyridine (HPPyBr$_2$) was polymerized in 10 ml of N,N-dimethylformamide (DMF) with bis(cyclooctadine)nickel(0) (Ni(COD)$_2$), cyclooctadiene (COD) and 2,2'-bipyridine as catalysts by a conventional method to synthesize hexylphenylpyridine polymer (HPPy polymer).

obtained polymer was recovered by filtration. A procedure of reprecipitation by dripping a DMF solution of the recovered polymer into acetone was further repeated 2 times to purify the polymer, which was then recovered and dried in vacuum to afford 0.564 g of the objective (HPPy) Polymer Ir/PPy complex as powder. The elementary analysis of C, H, N and Ir of the obtained polymer supported the presumed structure of the polymer. The weight average molecular weight of the polymer was 23,000 in terms of polystyrene (by GPC measurement using HFIP (hexafluoroisopropanol) as an eluent).

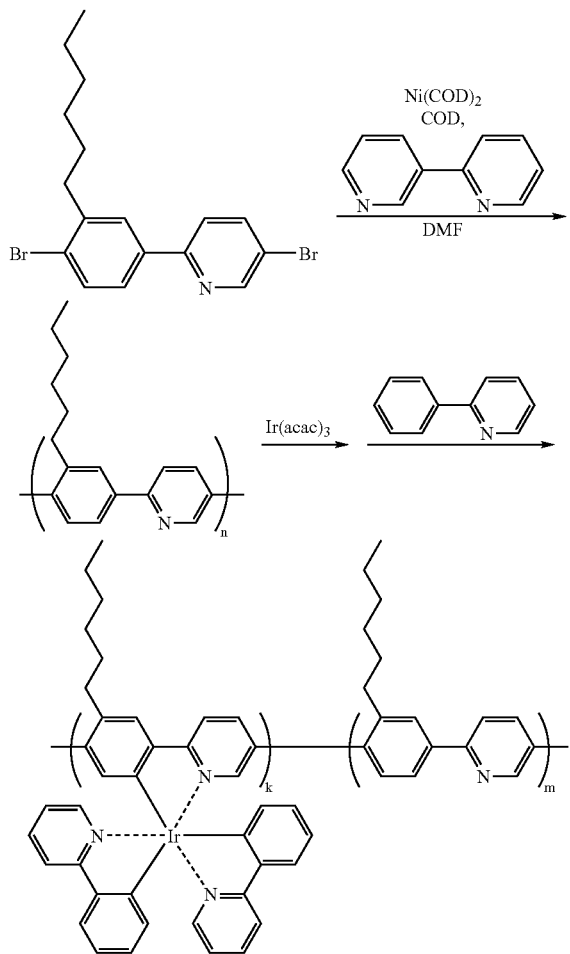

EXAMPLE 6 TO 8

Fabrication and Evaluation of Organic Light Emitting Devices

5 Mass % hexafluoroisopropanol (HFIP) solutions of three phosphorescent polymers synthesized in Examples 2, 4 and 5, i.e., Ir(3-MA-PPy)(3-PrCO-PPy)$_2$ polymer, Ir (3-MOI-PPy)(3-PrCO-PPy)$_2$ polymer, and (HPPy) polymer Ir/PPy complex, respectively, were each coated in a size of 5 mm×5 mm by a spin coating method on an ITO anode (ITO-coated glass substrate) on which polyethylenedioxythiophene (PEDOT, manufactured by Bayer AG) had been preliminarily coated to a thickness of 500 Angstroms and dried by heating at 80° C. in vacuum for 10 hours to form phosphorescent polymer layer having a thickness of about 1,000 Angstroms on the PEDOT/ITO anode for each polymer.

On the three types of (two for each) phosphorescent polymer/PEDOT/ITO electrodes, a layer of PBD (2-(4-biphenylyl)-5-(4-tert-butylphenyl)-1,3,4-oxadiazole) was formed as an electron transport layer to a thickness of about 500 Angstroms by vacuum deposition. Subsequently, on the electron transport layer was formed a layer of Ag/Mg in atomic ratio of 1/10 to a thickness of about 1,000 Angstroms to fabricate 6 (two for each polymer) organic light emitting devices. To these devices attached lead wires under argon atmosphere in a glove box and the devices were sealed in a glass tube under argon atmosphere and used for evaluation of luminescence.

The luminance of the devices was measured by using a luminance meter BM-8, manufactured by Topcon Corporation while applying a voltage to the organic light emitting device using a programmable direct voltage/current source TR6143, manufactured by Advantest Corporation.

When the DC voltage was applied, luminescence starting voltage, initial luminance at a voltage of 10 V and luminance after 240 hours' consecutive luminescence with a fixed voltage of 10 V were obtained as shown in Table 1 (as an average of the two devices for each polymer).

COMPARATIVE EXAMPLES 1 AND 2

Fabrication and Evaluation of Organic Light Emitting Devices

Four (two for each polymer) of organic light emitting devices were fabricated in the same manner as in Example 6, 7 and 8 except that 5 mass % chloroform solutions of intermediate complex Ir(3-MeO-PPy)$_3$ synthesized in Example 1 and PMMA (poly(methyl methacrylate)) in place of the 5 mass % HFIP solutions of the three phosphorescent polymers used in Examples 6, 7 and 8 in proportions shown in Table 2. When a DC voltage was applied to the fabricated devices in the same manner as in Examples 6, 7 and 8, luminescence starting voltage was 10 V and 11 V, respectively. Initial luminance at a voltage of 12 V, and luminance after 240 hours' consecutive luminescence with a fixed voltage of 12 V were as shown in Table 2 (as an average of the two devices for each polymer).

TABLE 1

| Example | Phosphorescent Polymer | Luminescence Starting Voltage (V) | 10 V Luminance (Cd/m²) Initial | 10 V Luminance (Cd/m²) After 240 Hours |
|---|---|---|---|---|
| 6 | Ir(3-MA-PPy) (3-PrCO-PPy)$_2$ Polymer | 5 | 1280 | 1180 |
| 7 | Ir(3-MOI-PPy) (3-PrCO-PPy)$_2$ Polymer | 6 | 1450 | 1250 |
| 8 | (HPPy) Polymer Ir/PPy Complex | 3 | 730 | 680 |

TABLE 2

| Comparative Example | Complex (Ir(3-MeO-PPy)$_3$)/PMMA (Mass Ratio) | Luminescence Starting Voltage (V) | 12 V Luminance (Cd/m$^2$) | |
|---|---|---|---|---|
| | | | Initial | After 240 Hours |
| 1 | 1/5 | 10 | 150 | 70 |
| 2 | 1/2 | 11 | 120 | 50 |

EXAMPLE 9

Fabrication and Evaluation of an Organic Light Emitting Device Using a Light Emitting Composition Composed of a Phosphorescent Polymer Compound and a Hole Transporting Polymer Compound 3 mass % chloroform solution of the phosphorescent polymer synthesized in Example 4, i.e., Ir(3-MOI-PPy) (3-PrCO-PPy)$_2$ polymer and poly(N-vinylcarbazole) was prepared. The solution contained the polymers in a ratio of 70 mass % of the Ir(3-MOI-PPy)(3-PrCO-PPy)$_2$ polymer to 30 mass % of the poly(N-vinylcarbazole). Two organic light emitting devices were fabricated in the same manner as in Examples 6, 7 and 8 except that this solution was used in place of the 5 mass % HFIP solutions of the three phosphorescent polymer used in Examples 6, 7 and 8. When a DC voltage was applied to the fabricated devices in the same manner as in Examples 6, 7 and 8, the luminescence starting voltage was 5 V and the luminance at 12 V was 1,860 cd/m$^2$, and the luminance after 240 hours' consecutive luminescence at a fixed voltage of 12 V was 1,690 cd/r$^2$ (as an average of the two devices for each polymer).

EXAMPLE 10

Fabrication and Evaluation of an Organic Light Emitting Device Using a Light Emitting Composition Composed of a Phosphorescent Polymer Compound and an Electron Transporting Low Molecular Weight Compound 4 mass % chloroform solution of the phosphorescent polymer synthesized in Example 4, i.e., Ir(3-MOI-PPy) (3-PrCO-PPy)$_2$ polymer and PBD was prepared. The solution contained the polymers in a ratio of 70 mass % of the Ir(3-MOI-PPy) (3-PrCO-PPy)$_2$ polymer to 30 mass % of the PBD. This solution was coated in a size of 5 mm×5 mm by a spin coating method on an ITO anode (ITO-coated glass substrate) on which polyethylenedioxythiophene (PEDOT, manufactured by Bayer AG) had been preliminarily coated to a thickness of 500 Angstroms and dried by heating at 80° C. in vacuum for 10 hours to form phosphorescent polymer composition layer having a thickness of about 1,000 Angstroms on the PEDOT/ITO anode. Subsequently, on each the phosphorescent polymer composition layer was formed a film of Ag/Mg (weight ratio: 9/1) as a cathode to a thickness of about 1,000 Angstroms to fabricate two organic light emitting devices. To these devices were attached lead wires in an argon atmosphere in a glove box and the devices were sealed in a glass tube in an argon atmosphere and used for evaluation of luminescence. When a DC voltage was applied to the fabricated devices in the same manner as in Examples 6, 7 and 8, the luminescence starting voltage was 6 V and the luminance at 12 V was 1,580 cd/m$^2$, and the luminance after 240 hours' consecutive luminescence at a fixed voltage of 12 V was 1,340 cd/m$^2$ (as an average of the two devices for each polymer).

EXAMPLE 11

Fabrication and Evaluation of an Organic Light Emitting Device Using a Light Emitting Composition Composed of a Phosphorescent Polymer Compound and an Electron Transporting Polymer Compound 3 mass % chloroform solution of the phosphorescent polymer synthesized in Example 4, i.e., Ir(3-MOI-PPy) (3-PrCO-PPy)$_2$ polymer and the poly PBD synthesized by the method disclosed in Japanese Patent Application Laid-open No. 10-1665 was prepared. The solution contained the polymers in a ratio of 70 mass % of the Ir(3-MOI-PPy)(3-PrCO-PPy)$_2$ polymer to 30 mass % of the poly PBD. Two organic light emitting devices were fabricated in the same manner as in Example 10 except that this solution was used in place of the 5 mass % chloroform solution of the phosphorescent polymer and PBD used in Example 10. When a DC voltage was applied to the fabricated devices in the same manner as in Examples 6, 7 and 8, the luminescence starting voltage was 5 V and the luminance at 12 V was 1,710 cd/r$^2$, and the luminance after 240 hours' consecutive luminescence at a fixed voltage of 12 V was 1,580 cd/m$^2$ (as an average of the two devices for each polymer).

EXAMPLE 12

Synthesis of Polymerizable Light Emitting Compound Ir(3-MA-PPy)$_3$

In the same manner as in the synthesis described in Example 1, Ir(3-MeO-PPy)$_3$ was subjected to hydrolysis of methoxy groups in an aqueous solution of hydrochloric acid to convert them into hydroxyl groups to obtain tris(3-hydroxyphenylpyridine) iridium (III) (Ir(3-HO-PPy)$_3$) as powder (cf. Reaction Scheme below).

Then, Ir(3-HO-PPy)$_3$ was allowed to react with methacryloyl chloride in a molar ratio of 1:3 to esterify all the hydroxyl groups thereof to synthesize an Ir(3-MA-PPy)$_3$ complex.

That is, in a reactor were charged 32 ml of dry THF, 2.81 g (4 mmol) of Ir(3-HO-PPy) 3 and 2.40 g (23.6 mmol) of triethylamine as a base and a solution of 1.293 g (12.2 mmol) of methacryloyl chloride in 32 ml of dry THF was dripped over 90 minutes to perform reaction at 20° C. for 5 hours. The precipitated triethylamine hydrochloride was filtered off and the solvent in the filtrate was evaporated to dryness. The obtained solid component was purified by performing recrystallization from a mixed solvent of hexafluoroisopropanol/methanol two times to obtain 2.805 g (3.08 μmol) of the objective trifunctional Ir(3-MA-PPy)$_3$ as powder. Identification of the product was performed by $^1$H-NMR and CHN elementary analysis.

$^1$H-NMR (CDCl$_3$, ppm): δ 7.82 (d, 3H), 7.58 (t, 3H), 7.55 (s, 3H), 7.26 (d, 3H), 6.86 (t, 3H), 6.67 (d, 3H), 6.63 (d, 3H), 6.36 (s, 3H), 5.74 (s, 3H), 2.09 (s, 9H).

Elementary analysis Calcd: C, 59.59; H, 4.00; N, 4.63. Found: C, 59.21; H, 3.98; N, 4.58.

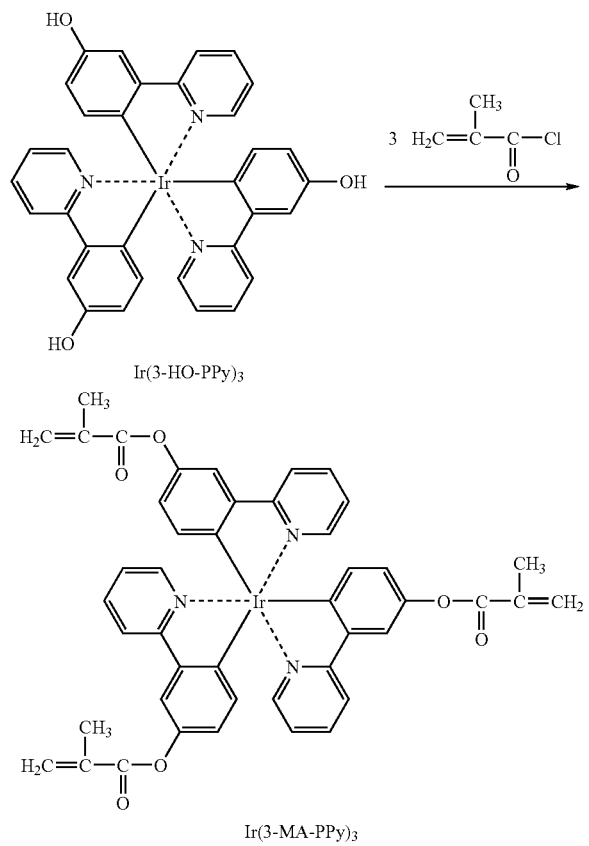

EXAMPLE 13

Synthesis of Polymerizable Light Emitting Compound Ir(3-MOI-PPy)$_2$(3-PrCO-PPy)

The monomer intermediate Ir(3-HO-PPy)$_3$ synthesized in the same manner as in Example 1 was allowed to react with 2-methacryloyloxyethyl isocyanate (Trade name "Karenz MOI", manufactured by Showa Denko K. K., hereinafter sometimes referred to as "MOI") in a ratio of 1:3 (by mole) and the remaining OH group was allowed to react with propionyl chloride (PrCOCl) to obtain an Ir (3-MOI-PPy)$_2$ (3-PrCO-PPy) complex.

That is, in a reactor were charged 48 ml of dry THF and 2.81 g (4 mmol) of Ir(3-HO-PPy)$_3$ and 1.272 g (8 mmol) of MOI and a catalyst amount of dibutyltin (IV) dilaurate was added thereto, and the mixture was allowed to react at 20° C. for 5 hours. After adding 2.400 g (24.5 mmol) of triethylamine as a base to the reaction mixture, a solution of 0.74 g (8.0 mmol) of PrCOCl in 8 ml of dry THF was dripped over 30 minutes and the mixture was allowed to react at 20° C. for additional 5 hours to esterify the remaining hydroxyl groups. The precipitated triethylamine hydrochloride was filtered off and the solvent in the filtrate was evaporated to dryness. The obtained solid component was purified by performing recrystallization from a mixed solvent of chloroform/methanol two times to obtain 2.75 g (2.57 mmol) of the objective Ir(3-MOI-PPy)$_2$(3-PrCO-PPy) as powder. Identification of the product was performed by 1H-NMR and CHN elementary analysis.

$^1$H-NMR (CDCl$_{31}$ ppm): δ 7.81 (m, 3H), 7.54 (m, 6H), 7.26 (m, 3H), 6.86 (m, 3H), 6.68 (m, 3H), 6.59 (m, 3H), 6.13 (s, 2H), 5.60 (s, 2H), 5.22 (br, 2H), 4.27 (t, 4H), 3.57 (m, 4H), 2.67 (q, 2H), 1.95 (s, 6H), 1.41 (t, 3H).

Elementary analysis Calcd: C, 56.17; H, 4.34; N, 6.55. Found: C, 55.86; H, 4.37; N, 6.51.

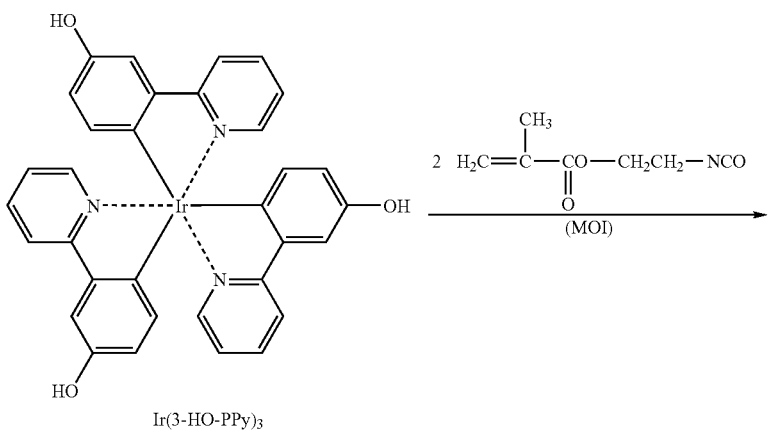

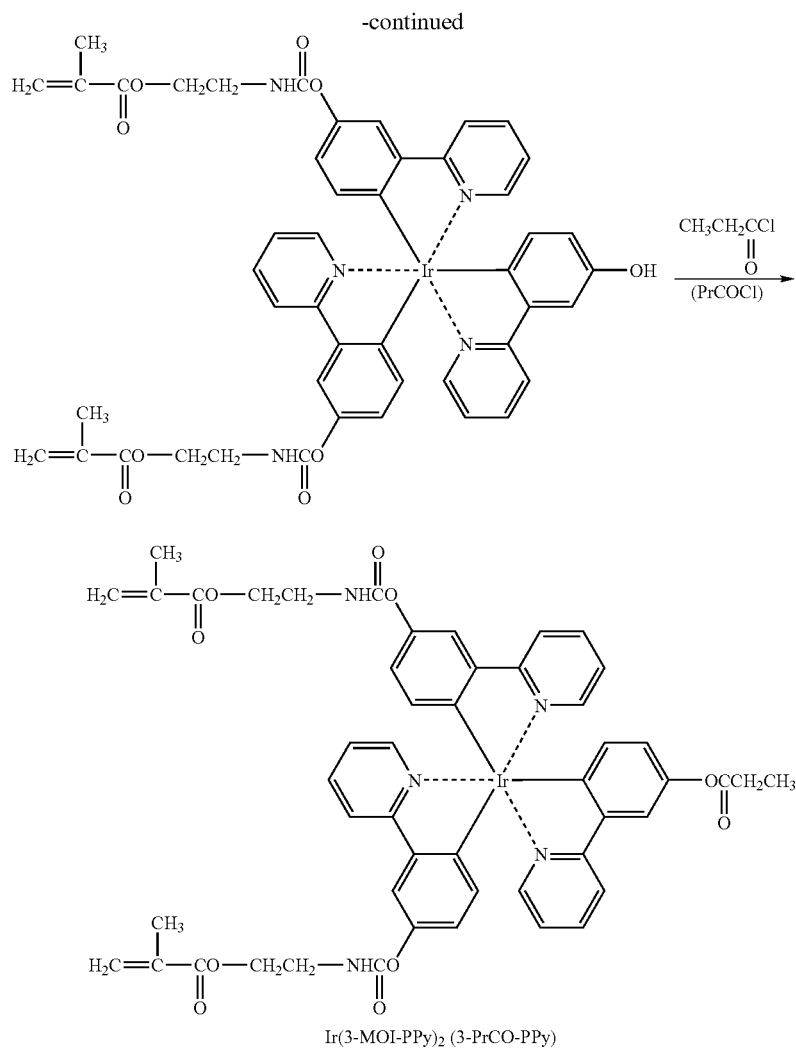

Ir(3-MOI-PPy)₂ (3-PrCO-PPy)

EXAMPLES 14 TO 19

Fabrication and Evaluation of Organic Light Emitting Devices Using Polymerizable Compositions 10 Mass % chloroform solutions of combinations of the four phosphorescent polymerizable compounds synthesized in Examples 1, 3, 12 and 13, i.e., monofunctional Ir(3-MA-PPy) (3-PrCO-PPy)₂, monofunctional Ir(3-MOI-PPy) (3-PrCO-PPy)₂, trifunctional (3-MOI-PPy)₃, and bifunctional (3-MOI-PPy)₂(3-PrCO-PPy), respectively as shown in Table 3 were prepared. After addition of AIBN (azobisbutyronitrile) as a polymerization initiator in an amount of 2 mass parts per 100 mass parts of the total amount of the monomers, each of the solutions was coated in an area of a size of 5 mm×5 mm by a spin coating method on an ITO anode (ITO-coated glass substrate) on which polyethylenedioxythiophene (PEDOT, manufactured by Bayer AG) had been preliminarily coated to a thickness of 500 Angstroms. This was dried by heating at 60° C. for 2 hours to polymerize and cure each monomer and further dried at 80° C. under reduced pressure for 8 hours to form phosphorescent polymer layer having a thickness of about 1,000 Angstroms on the PEDOT/ITO anode for each combination.

On each of the six types of (total twelve) phosphorescent polymer/PEDOT/ITO electrodes, a layer of TAZ (3-(4-biphenylyl)-4-phenyl-5-(4-tert-butylphenyl)-1,2,4-triazole) was formed as an electron transport layer to a thickness of about 500 Angstroms by vacuum deposition. Subsequently, on the electron transport layer was formed a layer of Ag/Mg (mass ratio: 9/1) as a cathode to a thickness of about 1,000 Angstroms to fabricate 6 (two for each polymer) organic light emitting devices. To these devices were attached lead wires in an argon atmosphere in a glove box and the devices were sealed in a glass tube in an argon atmosphere and used for evaluation of luminescence.

The luminance of the devices was measured by using a luminance meter BM-8, manufactured by Topcon Corporation while applying a voltage to the organic light emitting device using a programmable direct voltage/current source TR6143, manufactured by Advantest Corporation.

When the DC voltage was applied, luminescence starting voltage, initial luminance at 10 V and luminance after 240 hours' consecutive luminescence with a fixed voltage of 10 V were obtained as shown in Table 3 (as an average of the two devices for each polymer system).

TABLE 3

| Example | Monomers of Phosphorescent Polymer (Molar Ratio) | Polymer | Luminesence Starting Voltage (V) | 10 V Luminance (Cd/m$^2$) Initial | 10 V Luminance (Cd/m$^2$) After 240 Hours | Scheme |
|---|---|---|---|---|---|---|
| 14 | Ir(3-MA-PPy)(3-PrCO-PPy)$_2$ | Not cross-linked | 4 | 1560 | 1150 | (A) |
| 15 | Ir(3-MA-PPy)$_3$ | Cross-linked | 6 | 1430 | 1350 | — |
| 16 | Ir(3-MA-PPy)(3-PrCO-PPy)$_2$/Ir(3-MA-PPy)$_3$(1/1) | Cross-linked | 5 | 1580 | 1420 | (B) |
| 17 | Ir(3-MOI-PPy)(3-PrCO-PPy)$_2$ | Not cross-linked | 6 | 1600 | 1280 | (C) |
| 18 | Ir(3-MOI-PPy)$_2$(3-PrCO-PPy)$_2$ | Cross-linked | 5 | 1510 | 1380 | — |
| 19 | IR(3-MOI-PPy)(3-PrCO-PPy)/Ir(3-MOI-PPy)$_2$(3-PrCO-PPy)(1/1) | Cross-linked | 5 | 1600 | 1450 | (D) |

Scheme A

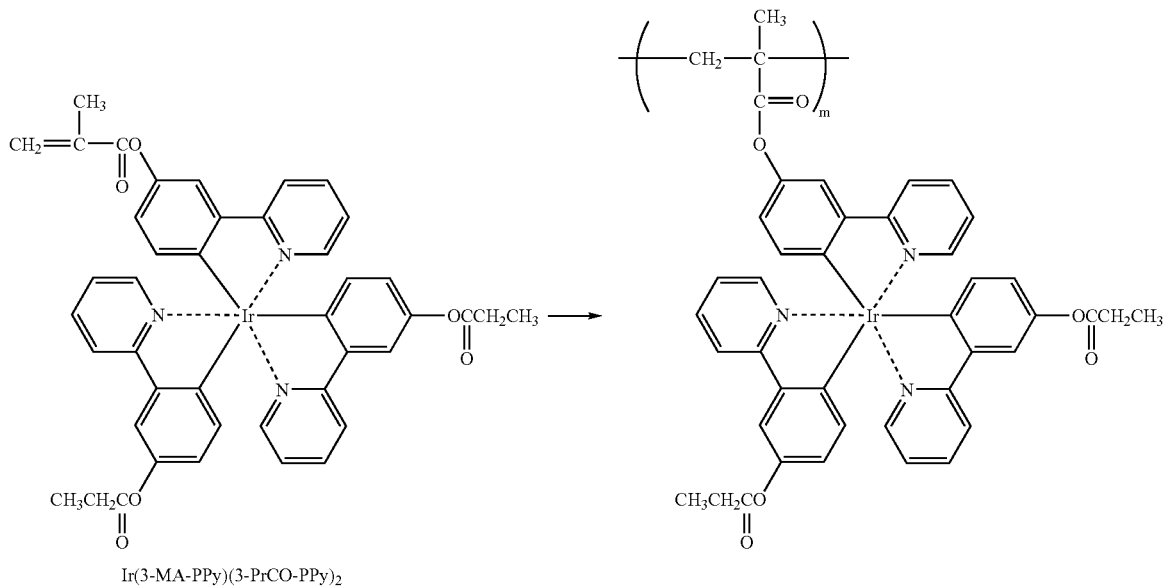

Scheme B

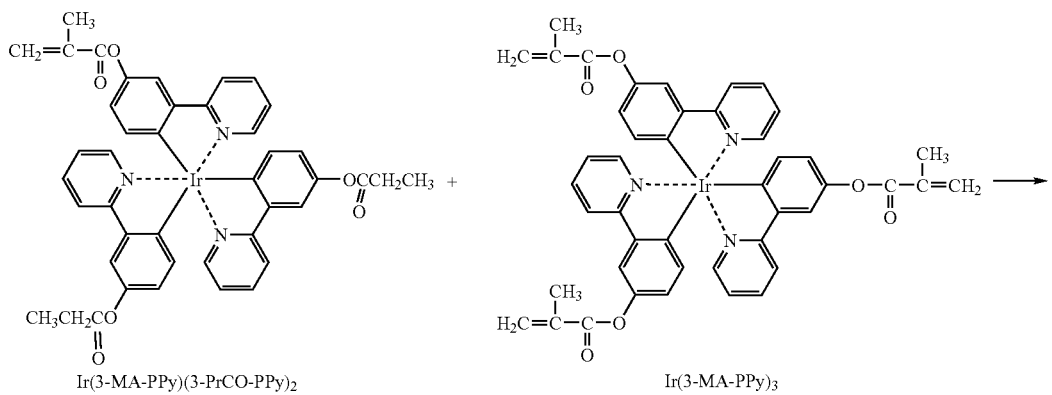

TABLE 3-continued
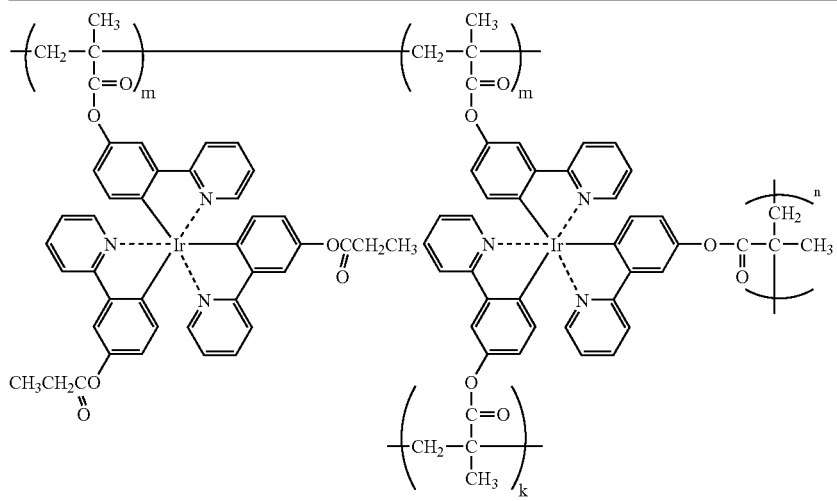
Scheme C
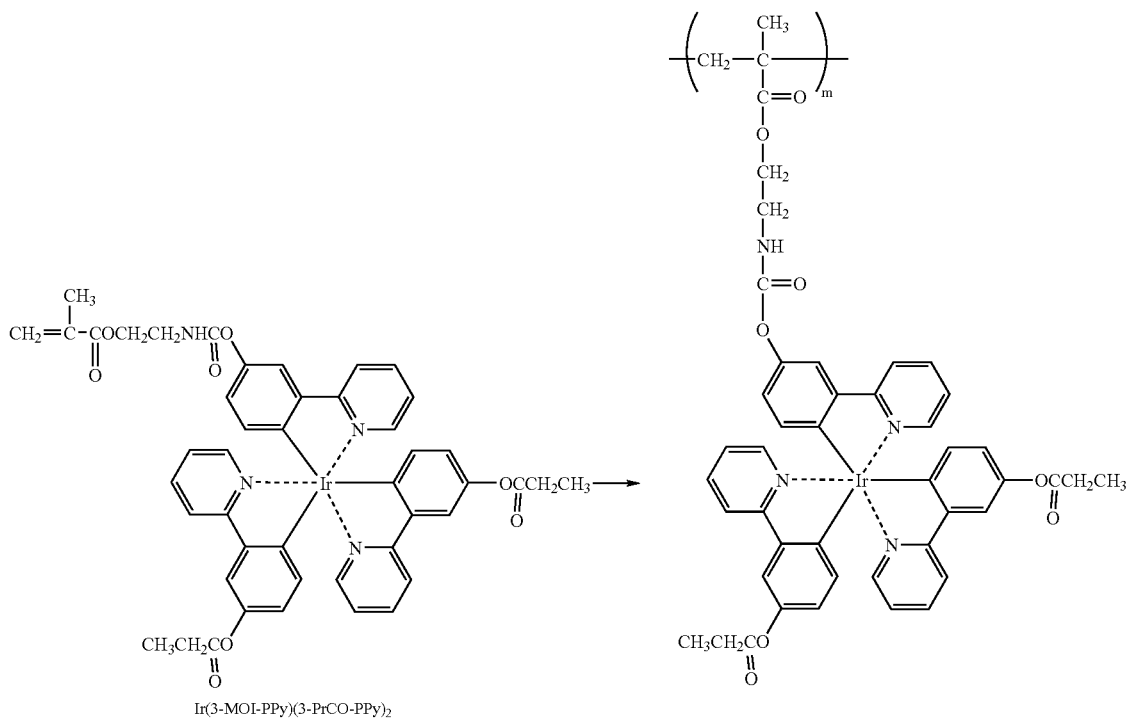
Scheme D
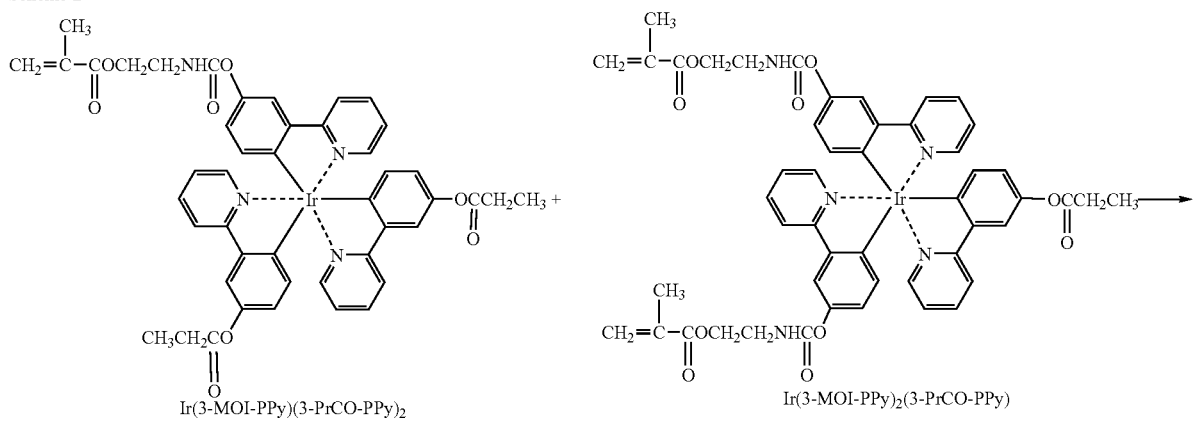

TABLE 3-continued

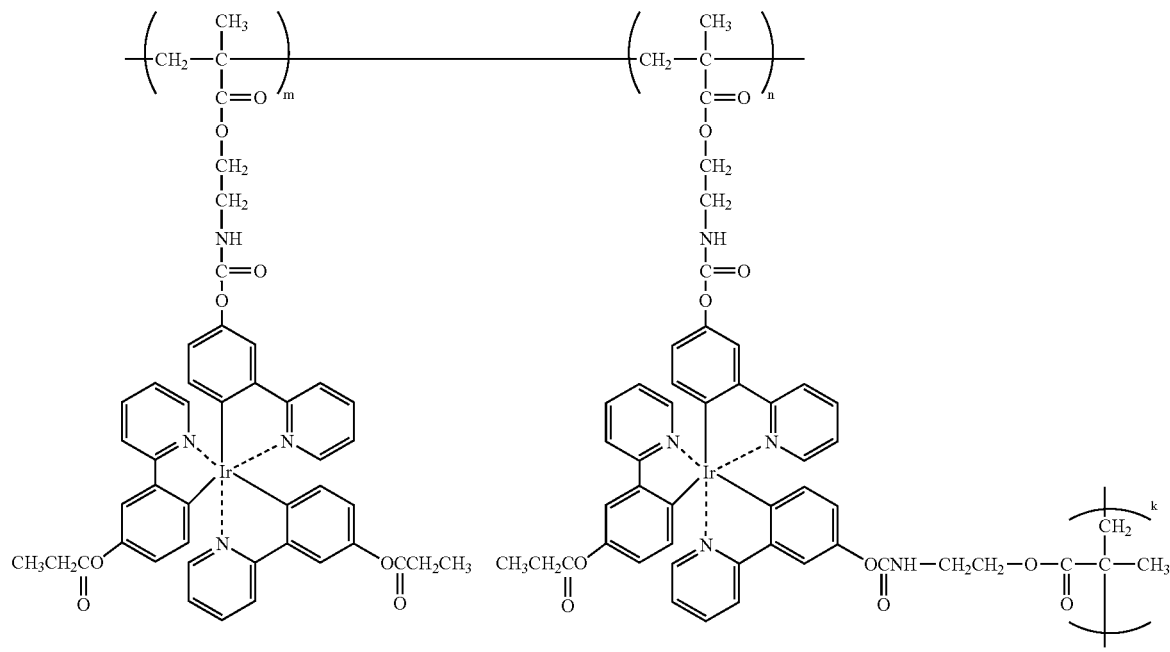

EXAMPLES 20 TO 23 AND COMPARATIVE EXAMPLE 3

Fabrication and Evaluation of Organic Light Emitting Devices Using Polymerizable Compositions Phenylpyridine (PPy) and tris(acetylacetonato) iridium (III) (Ir(acac)$_3$) were allowed to react at 300° C. by a conventional method to synthesize a phosphorescent compound tris (phenylpyridine)iridium (III) (Ir(PPy)$_3$).

Electron transporting compound-added polymerizable luminescent compound compositions as 10 mass % chloroform solutions were prepared by combining the phosphorescent polymerizable compounds synthesized in Examples 1 and 12, i.e., monofunctional Ir(3-MA-PPy)(3-PrCO-PPy)$_2$ and trifunctional (3-MOI-PPy)$_3$, respectively, and a bifunctional electron transporting compound: bisstyryl oxadiazole (BSODA), and a comparative electron transporting compound: oxadiazole (ODA) as shown in Table 4 were prepared. After addition of AIBN (azobisbutyronitrile) as a polymerization initiator in an amount of 2 mass parts per 100 mass parts of the total amount of the monomers, each of the solutions was coated in an area of a size of 5 mm×5 mm by a spin coating method on an ITO anode (ITO-coated glass substrate) on which polyethylenedioxythiophene (PEDOT, manufactured by Bayer AG) had been preliminarily coated to a thickness of 500 Angstroms. This was dried by heating at 60° C. for 2 hours to polymerize and cure each monomer and further dried at 80° C. under reduced pressure for 8 hours to form phosphorescent polymer layer having a thickness of about 1,000 Angstroms on the PEDOT/ITO anode for each combination.

On each of the five types of (total ten) phosphorescent polymer/PEDOT/ITO electrodes, a layer of Ag/Mg (mass ratio: 9/1) as a cathode was formed to a thickness of about 1,000 Angstroms to fabricate five types of (two for each type) organic light emitting devices. To these devices were attached lead wires in an argon atmosphere in a glove box and the devices were sealed in a glass tube in an argon atmosphere and evaluated for light emitting properties in the same manner as in Examples 14 to 19.

TABLE 4

| | Phosphorescent Compound/Electron Transporting Compound (molar ratio) | Polymer | Luminescence Starting Voltage (V) | 10 V Luminance (Cd/m$^2$) Initial | 10 V Luminance (Cd/m$^2$) After 240 Hours |
|---|---|---|---|---|---|
| Example 20 | Ir(PPy)$_3$/BSODA (1/1) | Crosslinked | 6 | 1660 | 1120 |
| Example 21 | Ir(3-MA-PPy)(3-PrCO-PPy)$_2$/BSODA(1/1) | Crosslinked | 7 | 1480 | 1210 |
| Example 22 | Ir(3-MA-PPy)$_3$/ODA(1/1) | Crosslinked | 5 | 1380 | 1320 |
| Example 23 | Ir(3-MA-PPy)(3-PrCO-PPy)$_2$/ODA (1/1) | Not crosslinked | 5 | 1510 | 1080 |
| Comparative Example 3 | Ir(PPy)$_3$/ODA (1/1) | Non-polymerized | 5 | 1680 | 880 |

EXAMPLE 25

Synthesis of a Polymerizable Compound
Ir(MA-PPy)(PPy)$_2$ (1) The methoxy group of 3-MeO-PPy synthesized in the same manner as in Example 1 was hydrolyzed by a conventional method.

That is, as shown in Reaction Scheme below, 16.0 g (86.4 mmol) of 3-MeO-PPy was dissolved in concentrated hydrochloric acid and stirred in a sealed vessel at 130° C. for 4 hours. After completion of the reaction, the reaction mixture was neutralized with an aqueous solution of sodium hydrogen carbonate and the objective compound was extracted with chloroform. Crystallization of the extract from a chloroform/hexane solution afforded 10.4 g (60.7 mmol) of 2-(3-hydroxyphenyl)pyridine (3-HO-PPy) as colorless crystal. Identification was performed by $^1$H-NMR and elementary analysis of C, H and N.

$^1$H-NMR (CDCl$_{31}$ ppm): δ 8.66 (d, 1H), 7.76 (t, 1H), 7.67 (d, 1H), 7.56 (s, 1H), 7.40 (d, 1H), 7.30 (t, 1H), 7.26 (t, 1H), 6.88 (d, 1H), 2.08 (br, 1H).

Elementary analysis Calcd: C, 77.17; H, 5.30; N, 8.18. Found: C, 76.81; H, 5.37; N, 8.11.

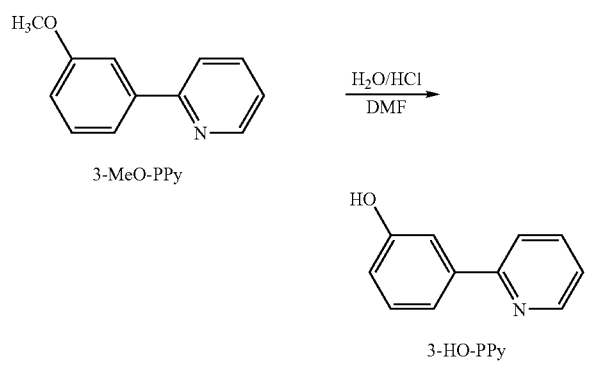

(2) The hydroxyl group of 3-HO-PPy was protected by tert-butyldimethylsilyl chloride (TBDMS-Cl) by a conventional method.

That is, as shown in the Reaction Scheme below, a solution of 8.6 g (50.2 mmol) of 3-HO-PPy, 10.2 g of imidazole and 11.3 g (75.0 mmol) of tert-butyldimethylchlorosilane in 200 ml of N,N-dimethylformamide was allowed to react at room temperature for 4 hours. Purification of the reaction mixture using a silica gel column afforded 13.0 g (45.5 mmol) of 2-(3-tert-butyldimethylsilyloxyphenyl) pyridine (3-SiO-PPy) as a colorless transparent liquid. Identification was performed by elementary analysis of C, H and N and $^1$H-NMR.

$^1$H-NMR (CDCl$_{31}$ ppm): δ 8.68 (d, 1H), 7.74 (t, 1H), 7.68 (d, 1H), 7.58 (d, 1H), 7.48 (s, 1H), 7.32 (t, 1H), 7.22 (t, 1H), 6.89 (d, 1H), 1.01 (s, 9H), 0.24 (s, 6H).

Elementary analysis Calcd: C, 71.53; H, 8.12; N, 4.91. Found: C, 71.08; H, 8.14; N, 4.88.

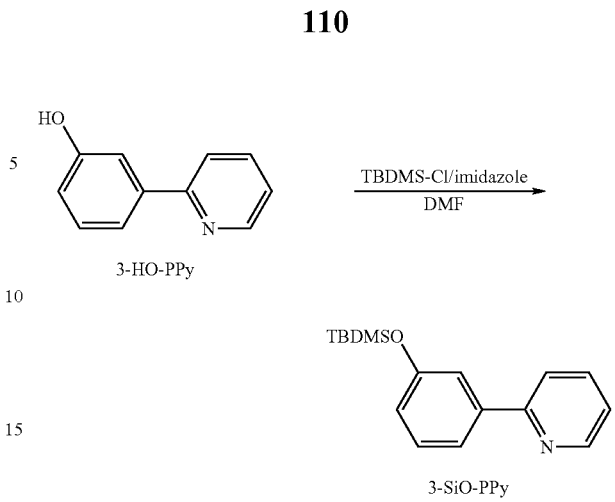

(3) The 3-SiO-PPy was allowed to react with di(μ-chloro)tetrakis(2-phenylpyridine)diiridium (III) ([Ir(PPy)$_2$Cl]$_2$) synthesized by a conventional method in the presence of silver (I) trifluoromethanesulfonate (AgCF$_3$SO$_3$).

That is, as shown in the Reaction Scheme below, 2.70 g of AgCF$_3$SO$_3$ was added to a suspension of 5.71 g (20.0 mmol) of SiO-PPy and 5.37 g (5.0 mmol) of [Ir(PPy)$_2$Cl]$_2$ in dry toluene and refluxed for 6 hours. Purification of the reaction mixture using a silica gel column and then distilling off the solvent afforded 2.53 g (3.2 mmol) of (2-(3-tert-butyldimethylsilyloxyphenyl)pyridine) bis(2-phenylpyridine) iridium (III) (Ir(PPy)$_2$(3-SiO-PPy-)) as yellow powder. Identification was performed by elementary analysis of C, H and N and $^1$H-NMR.

$^1$H-NMR (CDCl$_3$, ppm): δ 7.86 (d, 2H), 7.78 (d, 1H), 7.64 (d, 2H), 7.55 (m, 6H), 7.16 (s, 1H), 6.85 (m, 9H), 6.60 (d, 1H), 6.45 (d, 1H).

Elementary analysis Calcd: C, 59.67; H, 4.88; N, 5.35. Found: C, 59.53; H, 4.89; N, 5.34.

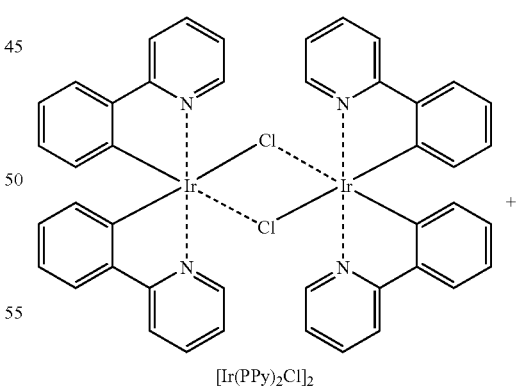

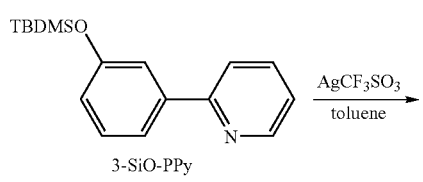

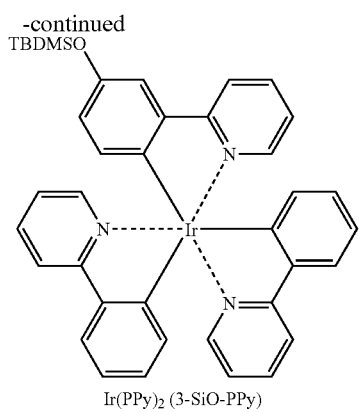

Ir(PPy)₂ (3-SiO-PPy)

(4) The silyl group of Ir(PPy)₂(3-SiO-PPy) was hydrolyzed by a conventional method.

That is, as shown in the Reaction Scheme below, 5.1 ml of a 1 M THF solution of tetra-n-butylammonium fluoride (TBAF) was added to a THF solution of 2.00 g (2.55 mmol) of Ir(PPy)₂(3-SiO-PPy) and the mixture was allowed to react at room temperature for 30 minutes. Purification of the reaction mixture using a silica gel column and then distilling off the solvent afforded 1.69 g (2.52 mmol) of (2-(3-hydroxyphenyl)pyridine) bis(2-phenylpyridine) iridium (III) (Ir (PPy)₂(3-HO-PPy)). Identification was performed by elementary analysis of C, H and N and ¹H-NMR.

¹H-NMR (CDCl₃, ppm): δ 7.87 (d, 2H), 7.78 (d, 1H), 7.6 (m, 9H), 6.85 (m, 10H), 6.63 (d, 1H), 4.23 (s, 1H).

Elementary analysis Calcd: C, 59.09; H, 3.61; N, 6.26. Found: C, 58.64; H, 3.74; N, 6.17.

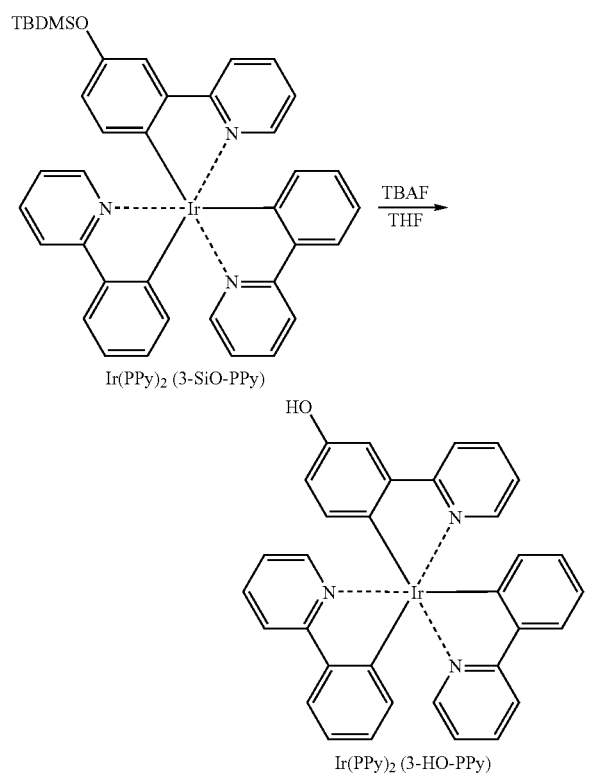

(5) As shown in the Reaction Scheme below, 0.25 g (2.4 mmol) of methacryloyl chloride was added to a solution of 1.34 g (2.0 mmol) of Ir(PPy)₂(3-HO-PPy) and 0.81 g (8.0 mmol) of triethylamine as a base in dry THF under argon stream and the mixture was allowed to react at 20° C. for 5 hours. Triethylamine hydrochloride was filtered from the reaction mixture and purification of the filtrate using a silica gel column followed by distilling of the solvent afforded 1.28 g (1.73 mmol) of (2-(3-methacryloyloxyphenyl)pyridine) bis (2-phenylpyridine) iridium (III) (Ir(3-MA-PPy)(PPy)₂). Identification was performed by elementary analysis of C, H and N and ¹H-NMR.

¹H-NMR (CDCl₃, ppm): δ 7.87 (d, 2H), 7.78 (d, 1H), 7.6 (m, 8H), 7.40 (s, 1H), 6.8 (m, 10H), 6.59 (d, 1H), 6.35 (s, 1H), 5.74 (s, 1H), 2.08 (s, 3H).

Elementary analysis Calcd: C, 60.15; H, 3.82; N, 5.69. Found: C, 59.85; H, 3.86; N, 5.66.

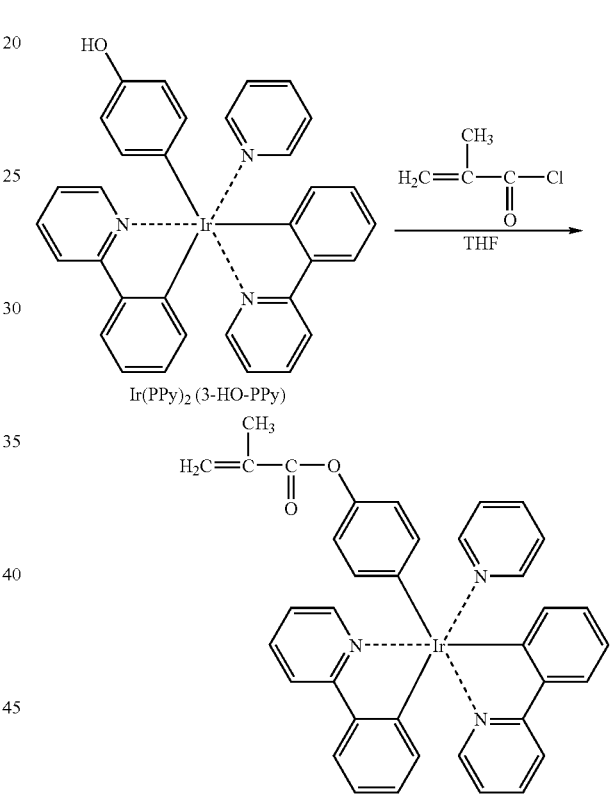

EXAMPLE 26

Synthesis of a Polymerizable Compound Ir(3-MOI-PPy)(PPy)₂

As shown in the Reaction Scheme below, 0.37 g (2.38 mmol) of 2-methacryloyloxyethyl isocyanate (Trade name "Karenz MOI", manufactured by Showa Denko K. K., hereinafter sometimes referred to as "MOI") was added to a solution of 1.34 g (2.0 mmol) of Ir(PPy)₂(3-HO-PPy) synthesized in the same manner as in Example 25, 9 mg of 2,6-di-tert-butyl-4-methylphenol (BHT), and 13 mg of dibutyltin (IV) dilaurate (DBTL) in dry THF under argon stream and the mixture was allowed to react at 50° C. for 1 hour. Purification of the reaction mixture using a silica gel column followed by distilling off the solvent afforded 1.48 g (1.79 mmol) of (2-(3-((2-methacryloyloxyethyl)carbamoyloxy)phenyl)pyridine) bis(2-phenylpyridine) iridium (III) (Ir(PPy)$_2$ (3-MOI-PPy)). Identification was performed by elementary analysis of C, H and N and $^1$H-NMR.

$^1$H-NMR (CDCl$_3$, ppm): δ 7.87 (d, 2H), 7.80 (d, 1H), 7.6 (m, 8H), 7.42 (s, 1H), 6.8 (m, 10H), 6.59 (d, 1H), 6.14 (s, 1H), 5.60 (s, 1H), 5.21 (br, 1H), 4.28 (t, 2H), 3.57 (m, 2H), 1.96 (s, 3H).

Elementary analysis Calcd: C, 58.17; H, 4.03; N, 6.78. Found: C, 57.78; H, 4.02; N, 6.72.

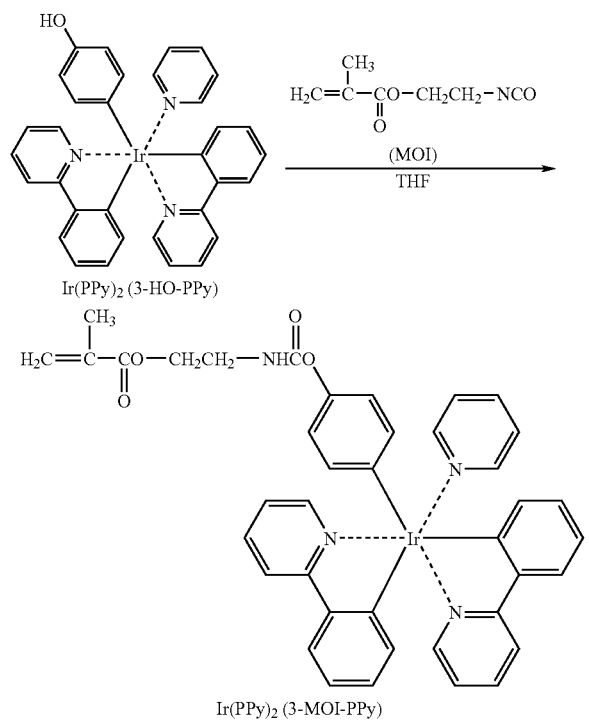

EXAMPLE 27

Synthesis of a Polymerizable Compound Ir(4-MA-PPy)$_2$(PPy)

(1) 2-(4-Methoxyphenyl)pyridine (4-MeO-PPy) was synthesized by a conventional method.

That is, as shown in the Reaction Scheme below, (4-methoxyphenyl)magnesium bromide was synthesized from 22.4 g (120 mmol) of 4-bromoanisole by a conventional method by using 3.4 g of magnesium (Mg) in dry tetrahydrofuran (THF) under argon stream and added slowly into a solution of 15.8 g (100 mmol) of 2-bromopyridine and 1.8 g of (1,2-bis(diphenylphosphino)ethane)dichloronickel (II) (Ni(dppe)Cl$_2$) in dry THF and the mixture was refluxed for 1 hour. After adding 250 ml of an aqueous solution of 5% hydrochloric acid to the reaction mixture, the reaction mixture was washed with chloroform. The water layer was neutralized with an aqueous solution of sodium hydrogen carbonate and the objective compound was extracted with chloroform and the organic layer was distilled off under reduced pressure. The distillate immediately solidified at room temperature to obtain 15.1 g (81.5 mmol) of 2-(4-methoxy-phenyl)pyridine (4-MeO-PPy) as white solid. Identification was performed by elementary analysis of C, H and N and $^1$H-NMR.

$^1$H-NMR (CDCl$_3$, ppm): δ 8.65 (d, 1H), 7.95 (d, 2H), 7.71 (t, 1H), 7.66 (d, 1H), 7.16 (t, 1H), 7.00 (d, 2H), 3.86 (s, 3H).

Elementary analysis Calcd: C, 77.81; H, 5.99; N, 7.56. Found: C, 77.52; H, 6.10; N, 7.40.

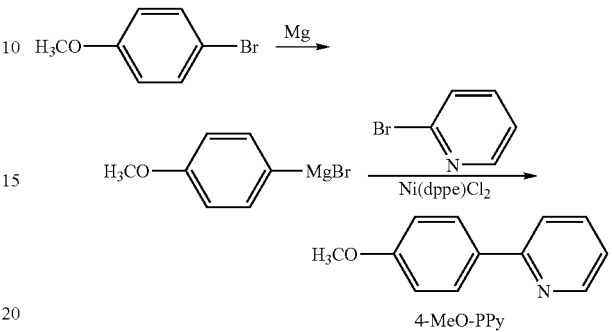

(2) The methoxy group of 4-MeO-PPy was hydrolyzed by a conventional method.

That is, as shown in Reaction Scheme below, 15.0 g (80.1 mmol) of 4-MeO-PPy was dissolved in concentrated hydrochloric acid and stirred in a sealed vessel at 130° C. for 4 hours. After completion of the reaction, the reaction mixture was neutralized with an aqueous solution of sodium hydrogen carbonate and the objective compound was extracted with chloroform. Crystallization of the extract from a chloroform/hexane solution afforded 10.0 g (58.5 mmol) of 2-(4-hydroxyphenyl)pyridine (4-HO-PPy) as colorless crystal. Identification was performed by elementary analysis of C, H and N, and $^1$H-NMR.

$^1$H-NMR (CDCl$_3$, ppm): δ 8.63 (d, 1H), 7.82 (d, 2H), 7.74 (t, 1H), 7.65 (d, 1H), 7.20 (t, 1H), 6.85 (d, 2H).

Elementary analysis Calcd: C, 77.17; H, 5.30; N, 8.18. Found: C, 76.91; H, 5.39; N, 8.02.

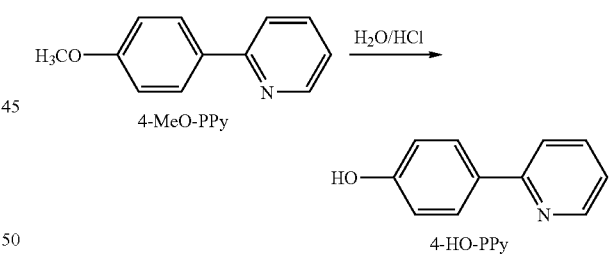

(3) 4-HO-PPy was allowed to react with sodium hexachloroiridate n-hydrate (Na$_3$IrCl$_6$.nH$_2$O) by a conventional method to synthesize di(μ-chloro)tetrakis(2-(4-hydroxyphenyl)pyridine) diiridium (III) ([Ir(4-HO-PPy)$_2$Cl]$_2$).

That is, as shown in the Reaction Scheme below, 10.0 g of Na$_3$IrCl$_6$.nH$_2$O was dissolved in 400 ml of a 3:1 mixed solvent of 2-ethoxyethanol and water and argon gas was blown therein for 30 minutes. Then 8.6 g (5.2 mmol) of 4-HO-PPy was added and dissolved in the solution under argon stream, followed by reflux for 5 hours. After completion of the reaction, the solvent was distilled off and recrystallization of the residue from ethanol afforded 5.88 g (5.18 mmol) of [Ir(4-HO-PPy)$_2$Cl]$_2$ as reddish brown crystal. Identification was performed by elementary analysis of C, H and N and $^1$H-NMR.

$^1$H-NMR (DMSO-d$_6$, ppm): δ 9.66 (d, 2H), 9.38 (d, 2H), 7.95 (m, 8H), 7.61 (d, 2H), 7.54 (d, 2H), 7.38 (t, 2H), 7.26 (t, 2H), 6.33 (d, 2H), 6.28 (d, 2H), 5.67 (s, 2H), 5.12 (s, 2H).

Elementary analysis Calcd: C, 46.52; H, 2.84; N, 4.93. Found: C, 46.33; H, 2.51; N, 4.76.

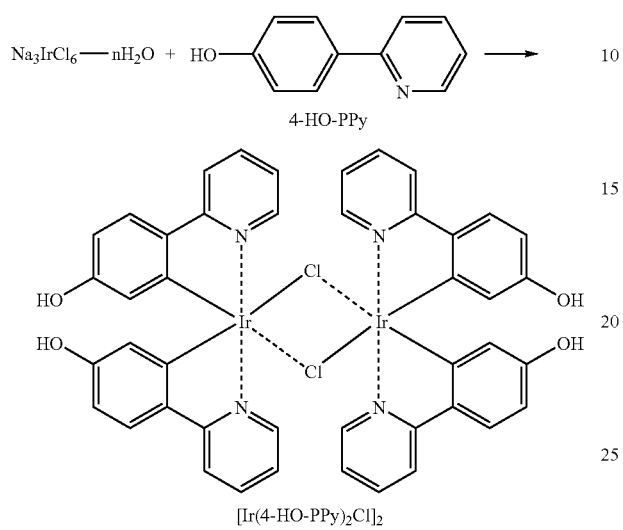

[Ir(4-HO-PPy)$_2$Cl]$_2$ (4) [Ir(4-HO-PPy)$_2$Cl]$_2$ was allowed to react with 2-phenylpyridine (PPy) in the presence of silver (I) trifluoromethanesulfonate (AgCF$_3$SO$_3$) by a conventional method.

That is, as shown in the Reaction Scheme below, 1.98 g of AgCF$_3$SO$_3$ was added to a suspension of 3.98 g (3.5 mmol) of [Ir(4-HO-PPy)$_2$Cl]$_2$ and 15.5 g (10.0 mmol) of PPy in dry toluene and the mixture was refluxed for 6 hours. Purification of the reaction mixture using a silica gel column followed by distilling off the solvent afforded 2.20 g (3.2 mmol) of bis(2-(4-hydroxyphenyl)pyridine)(2-phenylpyridine)iridium (III) (Ir(4-HO-PPy)$_2$(PPy)) as yellow powder. Identification was performed by elementary analysis of C, H and N and $^1$H-NMR.

$^1$H-NMR (CDCl$_{31}$ ppm): δ 7.88 (d, 1H), 7.78 (d, 2H), 7.6 (m, 9H), 6.85 (m, 8H), 6.64 (d, 2H).

Elementary analysis Calcd: C, 57.71; H, 3.52; N, 6.12. Found: C, 57.46; H, 3.49; N, 5.99.

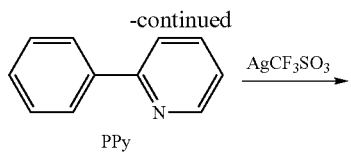

PPy

Ir(4-HO-PPy)$_2$(PPy)

(5) As shown in the Reaction Scheme below, 0.50 g (4.8 mmol) of methacryloyl chloride was added to a solution of 1.37 g (2.0 mmol) of Ir(4-HO-PPy)$_2$(PPy) and 0.81 g (8.0 mmol) of triethylamine as a base in dry THF under argon stream and the mixture was allowed to react at 20° C. for 5 hours. Triethylamine hydrochloride was filtered off from the reaction mixture and purification of the filtrate using a silica gel column followed by distilling of the solvent afforded 1.55 g (1.88 mmol) of bis(2-(4-methacryloyloxyphenyl)pyridine) (2-phenylpyridine) iridium (III) (Ir(4-MA-PPy)$_2$(PPy)). Identification was performed by elementary analysis of C, H and N and $^1$H-NMR.

$^1$H-NMR (CDCl$_{31}$ ppm): δ 7.87 (d, 1H), 7.78 (d, 2H), 7.6 (m, 9H), 6.8 (m, 8H), 6.59 (s, 2H), 6.35 (s, 2H), 5.74 (s, 2H), 2.08 (s, 6H).

Elementary analysis Calcd: C, 59.84; H, 3.92; N, 5.11. Found: C, 59.95; H, 3.82; N, 5.04.

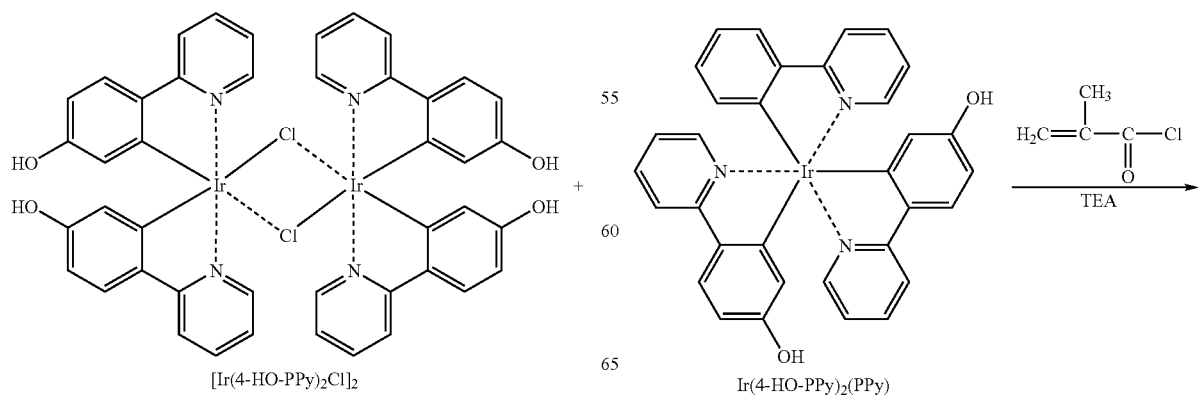

[Ir(4-HO-PPy)$_2$Cl]$_2$

Ir(4-HO-PPy)$_2$(PPy)

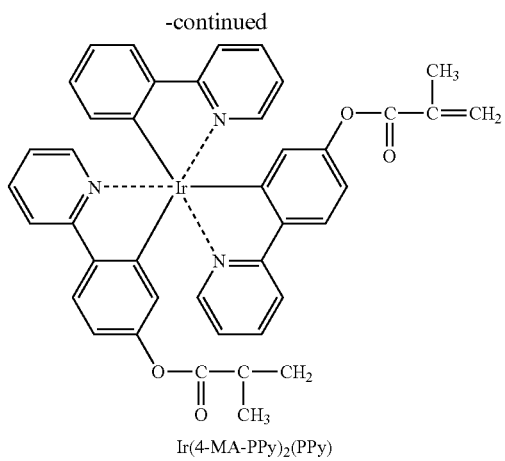

Ir(4-MA-PPy)₂(PPy)

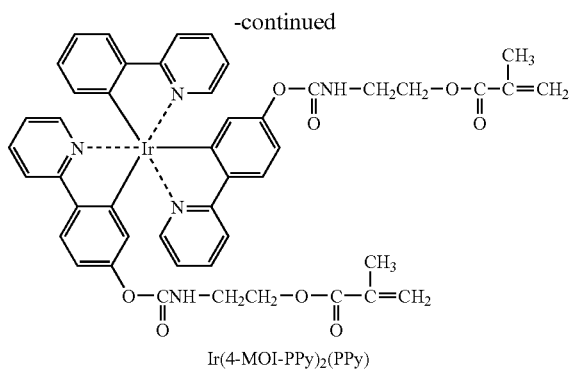

Ir(4-MOI-PPy)₂(PPy)

EXAMPLE 28

Synthesis of a Polymerizable Compound Ir(4-MOI-PPy)₂(PPy)

As shown in the Reaction Scheme below, 0.75 g (4.83 mmol) of 2-methacryloyloxyethyl isocyanate (Trade name "Karenz MOI", manufactured by Showa Denko K. K., hereinafter sometimes referred to as "MOI") was added to a solution of 1.37 g (2.0 mmol) of Ir(4-HO-PPy)₂(PPy) synthesized in the same manner as in Example 27, 18 mg of 2,6-di-tert-butyl-4-methylphenol (BHT), and 26 mg of dibutyltin (IV) dilaurate (DBTL) in dry THF under argon stream and the mixture was allowed to react at 50° C. for 1 hour. Purification of the reaction mixture using a silica gel column followed by distilling off the solvent afforded 1.68 g (1.68 mmol) of bis(2-(4-((2-methacryloyloxyethyl) carbamoyloxy)phenyl) pyridine) (2-phenylpyridine) iridium (III) (Ir(4-MOI-PPy)₂ (PPy)). Identification was performed by elementary analysis of C, H and N and ¹H-NMR.

¹H-NMR (CDCl₃, ppm): δ 7.85 (d, 1H), 7.81 (d, 2H), 7.6 (m, 9H), 6.8 (m, 8H), 6.58 (d, 2H), 6.12 (s, 2H), 5.60 (s, 2H), 5.21 (br, 2H), 4.28 (t, 4H), 3.58 (m, 4H), 1.96 (s, 6H).

Elementary analysis Calcd: C, 56.62; H, 4.25; N, 7.02. Found: C, 56.38; H, 4.02; N, 6.72.

EXAMPLE 29

Synthesis of Ir(3-MA-PPy) (PPy)₂ Polymer

In a reactor were charged 1.11 g (1.5 mmol) of Ir(3-MA-PPy) (PPy)₂ complex synthesized in Example 25, 0.010 g (0.061 mmol) of 2,2'-azobis(isobutyronitrile) (AIBN), and 10 ml of butyl acetate and the atmosphere was exchanged with nitrogen. Thereafter, the mixture was allowed to react at 80° C. for 10 hours (cf. Reaction Scheme below). After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 0.92 g of the objective Ir(3-MA-PPy)(PPy)₂ polymer as powder. The elementary analysis of C, H, N of the obtained polymer indicated that the polymer had the same composition as Ir(3-MA-PPy)(PPy)₂. The weight average molecular weight of the polymer was 12,000 in terms of polystyrene (GPC measurement, eluent: THF).

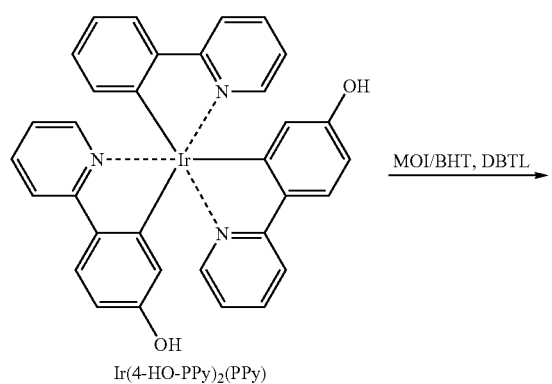

Ir(4-HO-PPy)₂(PPy)  →  MOI/BHT, DBTL

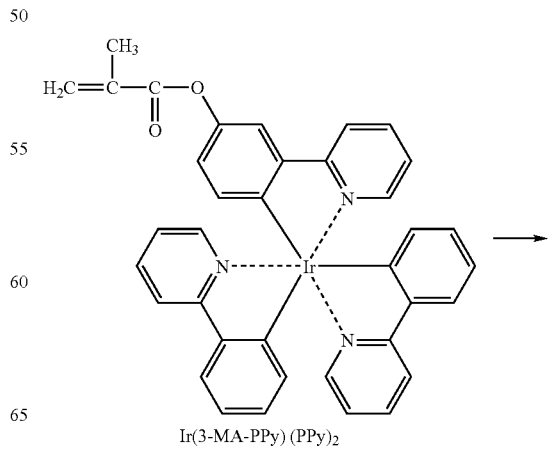

Ir(3-MA-PPy) (PPy)₂  →

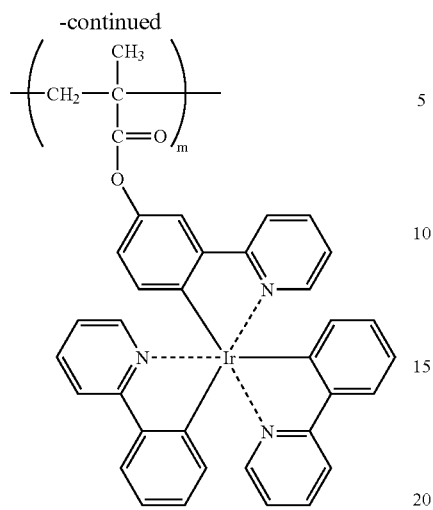

EXAMPLE 30

Synthesis of Ir(3-MOI-PPy)(PPy)$_2$ Polymer

In a reactor were charged 1.11 g (1.5 mmol) of Ir(3-MOI-PPy) (PPy)$_2$ complex synthesized in Example 26, 0.010 g (0.061 mmol) of 2,2'-azobis(isobutyronitrile) (AIBN), and 10 ml of butyl acetate and the atmosphere was exchanged with nitrogen. Thereafter, the mixture was allowed to react at 80° C. for 10 hours (cf. Reaction Scheme below). After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 1.02 g of the objective Ir(3-MOI-PPy)(PPy)$_2$ polymer as powder. The elementary analysis of C, H, N and Ir of the obtained polymer indicated that the polymer had substantially the same composition as Ir(3-MOI-PPy)(PPy)$_2$. The weight average molecular weight of the polymer was 20,000 in terms of polystyrene (GPC measurement, eluent: THF).

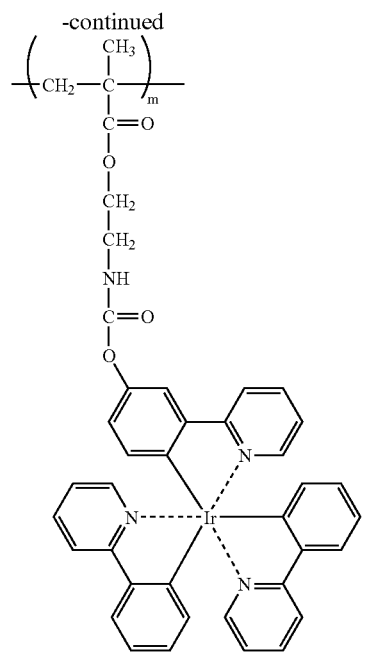

EXAMPLE 31

Synthesis of Ir(3-MA-PPy)(3-PrCO-PPy)$_2$ Polymer

In a reactor were charged 2.22 g (2.5 mmol) of Ir(3-MA-PPy) (3-PrCO-PPy)$_2$ complex synthesized in Example 1, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 1.85 g of the objective Ir(3-MA-PPy)(3-PrCO-PPy)$_2$ polymer as powder. The elementary analysis of C, H, N of the obtained polymer indicated that the polymer had the same composition as Ir(3-MA-PPy)(3-PrCO-PPy)$_2$. The weight average molecular weight of the polymer was 8,000 in terms of polystyrene (GPC measurement, eluent: THF).

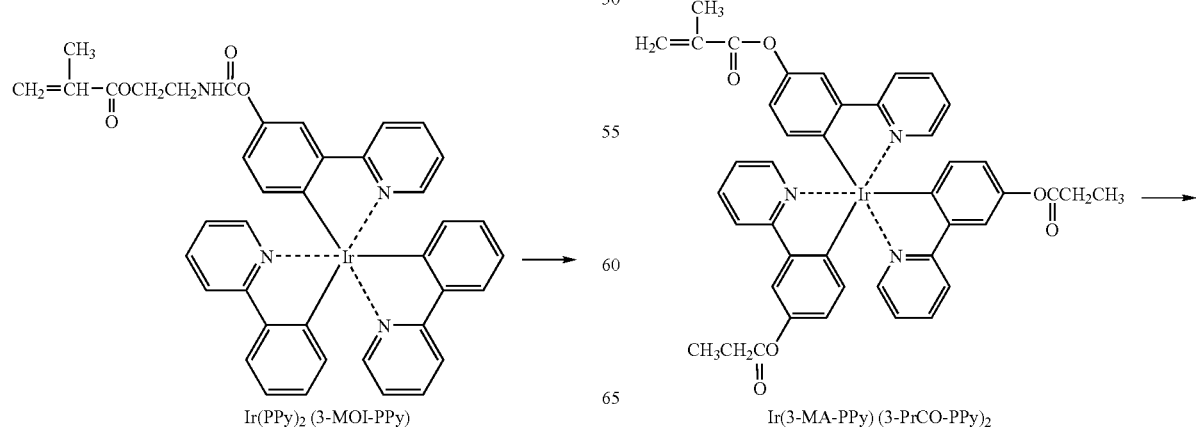

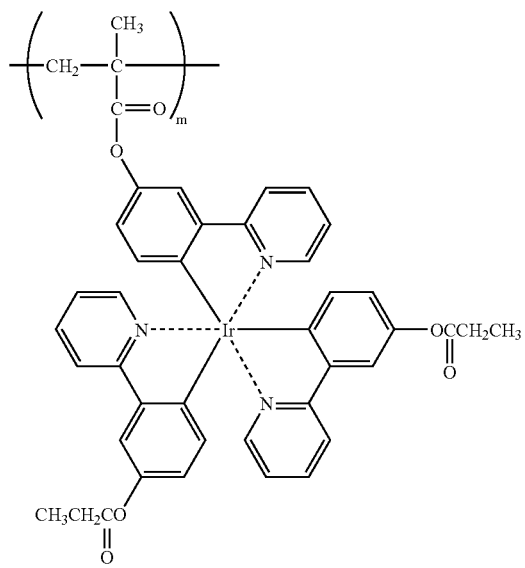

EXAMPLE 32

Synthesis of Ir(3-MA-PPy)$_3$ Polymer

In a reactor were charged 2.28 g (2.5 mmol) of the Ir(3-MA-PPy)$_3$ complex synthesized in Example 12, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). As a result an insoluble polymer precipitated. The polymer was recovered by filtration, washed with 100 ml of chloroform and then with 100 ml of methanol, and dried under vacuum to obtain 2.10 g of the objective Ir(3-MA-PPy)$_3$ polymer as powder. Elementary analysis of C, H and N of the obtained polymer supported for its having substantially identical composition with that of Ir(3-MA-PPy)$_3$. The polymer was deemed to have a crosslinked structure and was insoluble in most of common organic solvents so that it was impossible to measure its molecular weight by GPC.

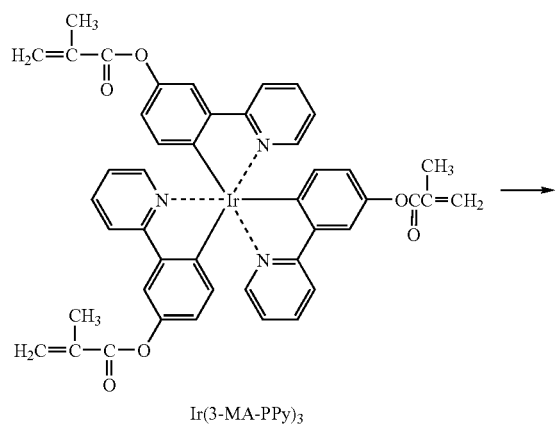

Ir(3-MA-PPy)$_3$

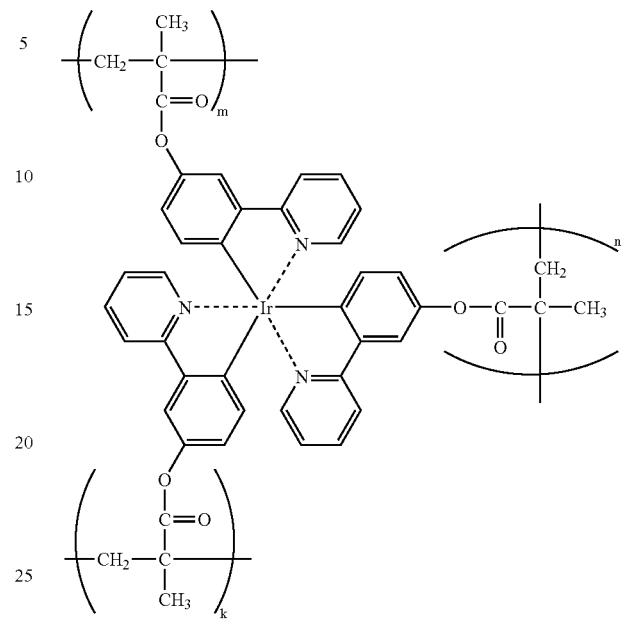

EXAMPLE 33

Synthesis of Ir(3-MOI-PPy) (3-PrCO-PPy)$_2$ Polymer

In a reactor were charged 2.43 g (2.5 mmol) of Ir(3-MOI-PPy)(3-PrCO-PPy)$_2$ complex synthesized in Example 3, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). After completion of the reaction, the reaction mixture was dripped into acetone to perform reprecipitation and the resultant polymer was recovered by filtration. A procedure of reprecipitation by dripping a chloroform solution of the recovered polymer into methanol was further repeated 2 times to purify the polymer, which was then recovered and dried in vacuum to afford 2.05 g of the objective Ir(3-MOI-PPy) (3-PrCO-PPy)$_2$ polymer as powder. The elementary analysis of C, H, N of the obtained polymer supported for its having substantially the same composition as that of Ir(3-MOI-PPy)(3-PrCO-PPy)$_2$. The weight average molecular weight of the polymer was 18,000 in terms of polystyrene (GPC measurement, eluent: THF).

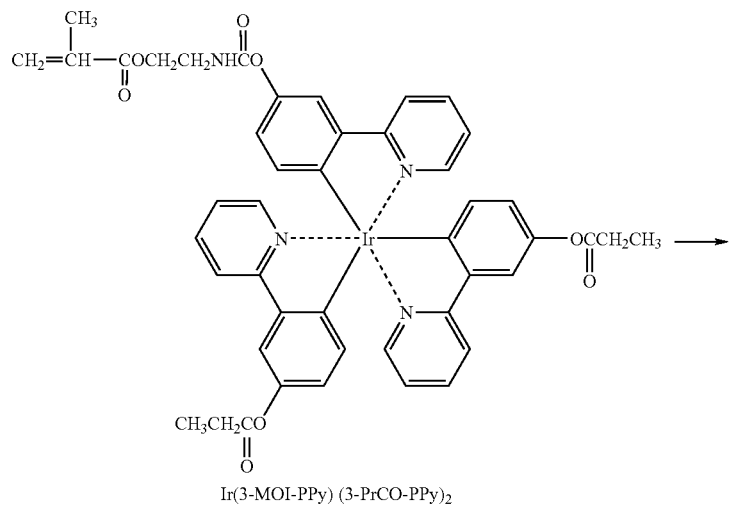

Ir(3-MOI-PPy) (3-PrCO-PPy)₂

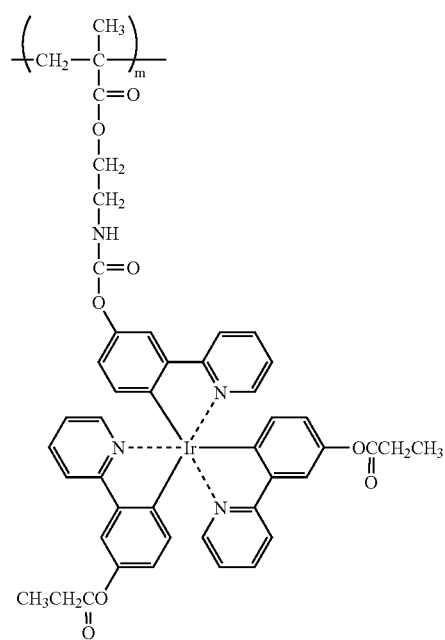

EXAMPLE 34

Synthesis of Ir(3-MOI-PPy)₂(3-PrCO-PPy) Polymer

In a reactor were charged 2.46 g (2.5 mmol) of Ir(3-MOI-PPy)₂(3-PrCO-PPy) complex synthesized in Example 13, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). As a result an insoluble polymer precipitated. The polymer was recovered by filtration, washed with 100 ml of chloroform and then with 100 ml of methanol, and dried under vacuum to obtain 2.21 g of the objective Ir(3-MOI-PPy)₂(3-PrCO-PPy) polymer as powder. Elementary analysis of C, H and N of the obtained polymer supported for its having substantially the same composition as that of Ir(3-MOI-PPy)₂(3-PrCO-PPy). The polymer was deemed to have a crosslinked structure and was insoluble in most of common organic solvents so that it was impossible to measure its molecular weight by GPC.

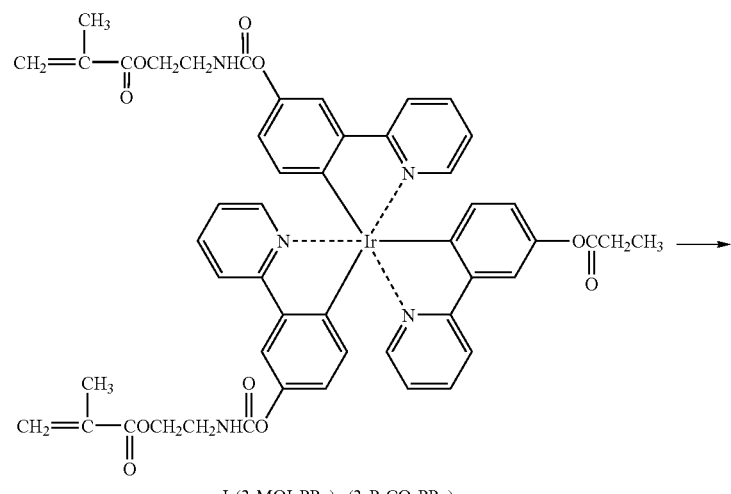
Ir(3-MOI-PPy)₂(3-PrCO-PPy)
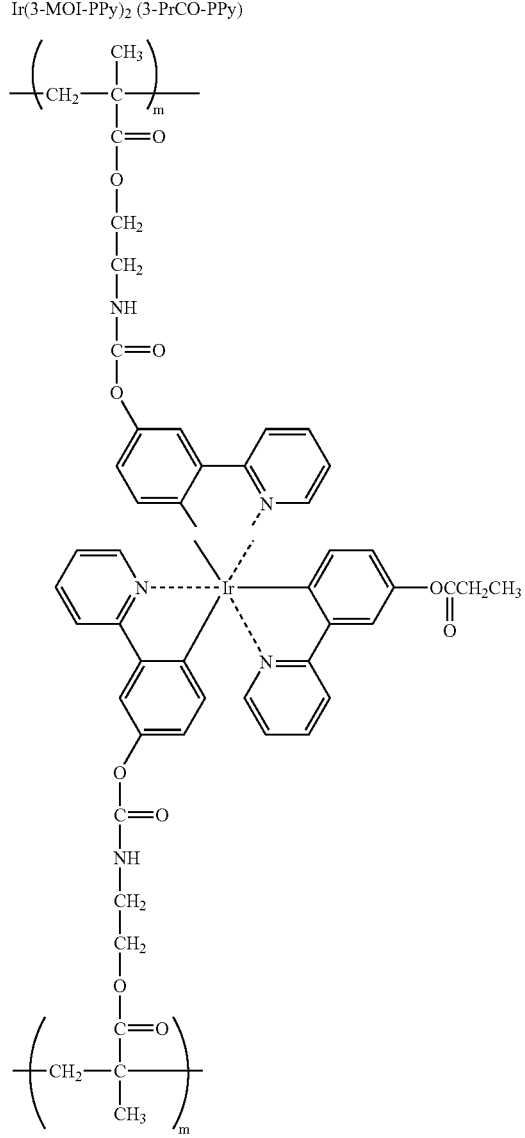

EXAMPLE 35

Synthesis of Ir(3-MA-PPy) (3-PrCO-PPy)$_2$/Ir(3-MA-PPy)$_3$ Copolymer

In a reactor were charged 1.11 g (1.25 mmol) of Ir(3-MA-PPy) (3-PrCO-PPy)$_2$ complex synthesized in Example 1, 1.14 g (1.25 mmol) of Ir(3-MA-PPy)$_3$ complex synthesized in Example 12, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). As a result an insoluble polymer precipitated. The polymer was recovered by filtration, washed with 100 ml of chloroform and then with 100 ml of methanol, and dried under vacuum to obtain 2.05 g of the objective Ir(3-MA-PPy) (3-PrCO-PPy)$_2$/Ir(3-MA-PPy)$_3$ copolymer as powder. Elementary analysis of C, H and N of the obtained copolymer supported for the polymerization of Ir(3-MA-PPy)(3-PrCO-PPy)$_2$ with Ir(3-MA-PPy)$_3$ in a molar ratio of 1:1. The copolymer was deemed to have a crosslinked structure and was insoluble in most of common organic solvents so that it was impossible to measure its molecular weight by GPC.

EXAMPLE 36

Synthesis of Ir(3-MOI-PPy) (3-PrCO-PPy)$_2$/Ir(3-MOI-PPy)$_2$(3-PrCO-PPy) Copolymer In a reactor were charged. 1.21 g (1.25 mmol) of Ir(3-MOI-PPy) (3-PrCO-PPy)$_2$ complex synthesized in Example 3, 1.23 g (1.25 mmol) of Ir(3-MOI-PPy)$_2$(3-PrCO-PPy) complex synthesized in Example 13, 0.010 g (0.061 mmol) of 2,2'-azobis(isobutyronitrile) (AIBN), and 30 ml of butyl acetate and the atmosphere was exchanged with nitrogen. Thereafter, the mixture was allowed to react at 80° C. for 10 hours (cf. Reaction Scheme below). As a result an insoluble polymer precipitated. The polymer was recovered by filtration, washed with 100 ml of chloroform and then with 100 ml of methanol, and dried under vacuum to obtain 2.18 g of the objective Ir(3-MOI-PPy) (3-PrCO-PPy)$_2$/Ir(3-MOI-PPy)$_2$ (3-PrCO-PPy) copolymer as powder. Elementary analysis of C, H and N of the obtained copolymer supported for the polymerization of Ir(3-MOI-PPy) (3-PrCO-PPy)$_2$ with Ir(3-MOI-PPy)$_2$(3-PrCO-PPy) in a molar ratio of 1:1. The copolymer was deemed to have a crosslinked structure and was insoluble in most of common organic solvents so that it was impossible to measure its molecular weight by GPC.

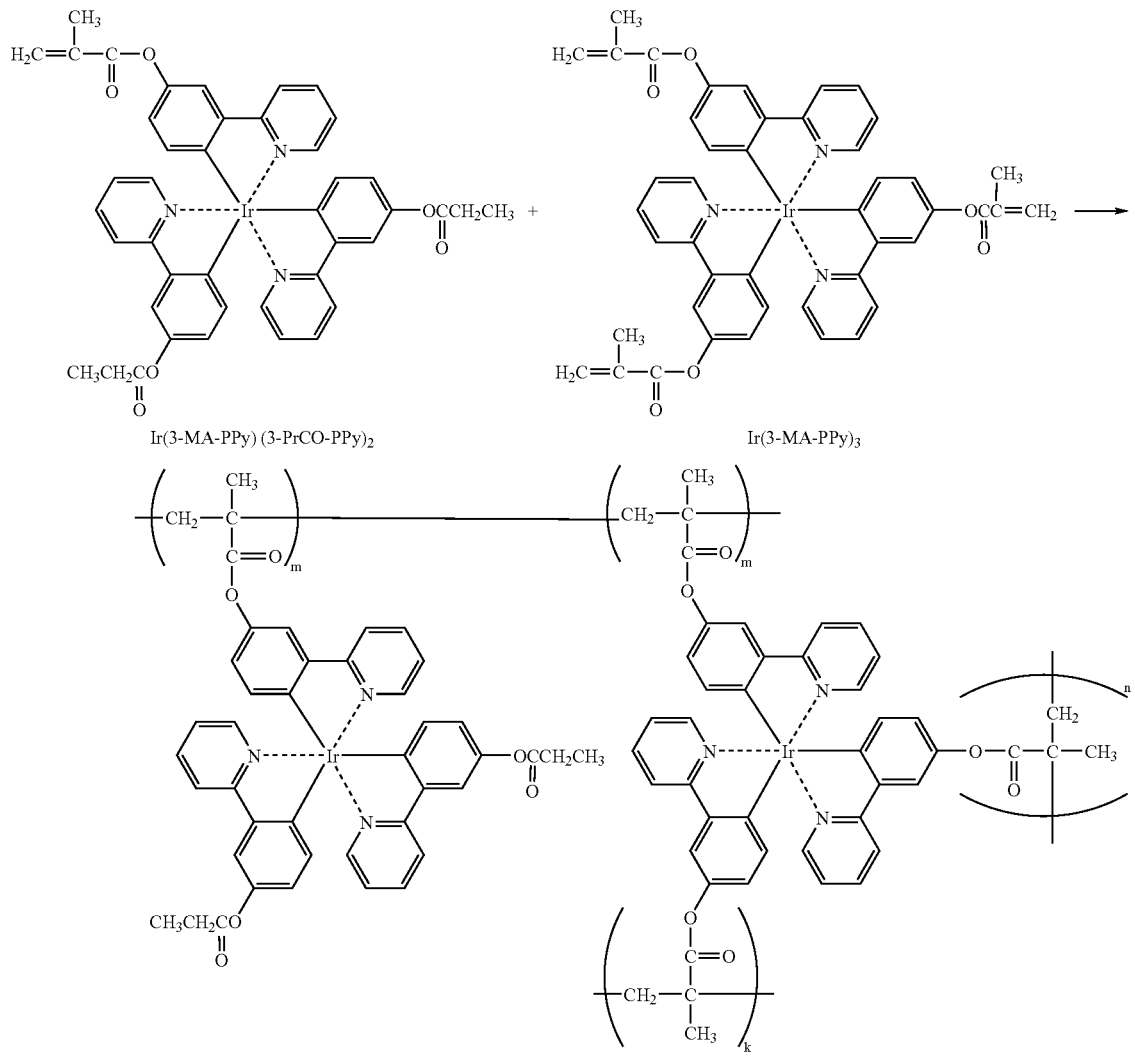

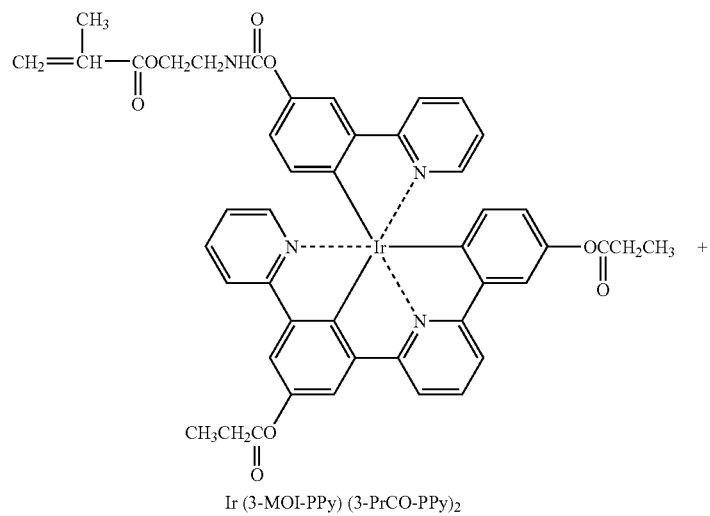
Ir (3-MOI-PPy) (3-PrCO-PPy)₂
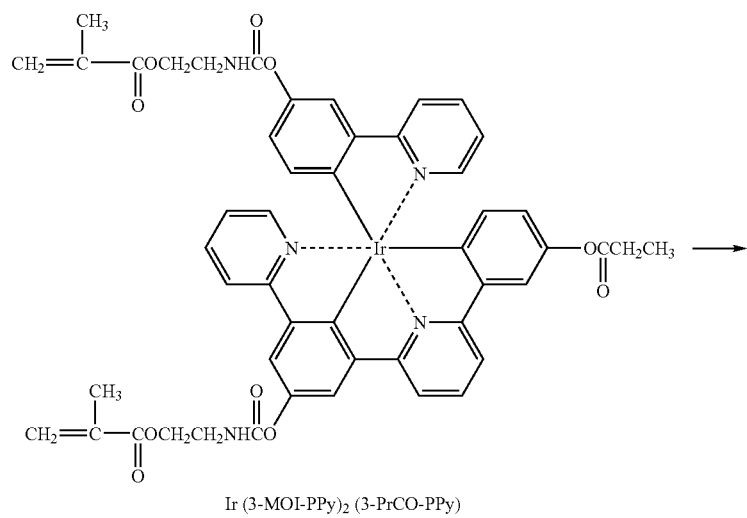
Ir (3-MOI-PPy)₂ (3-PrCO-PPy)
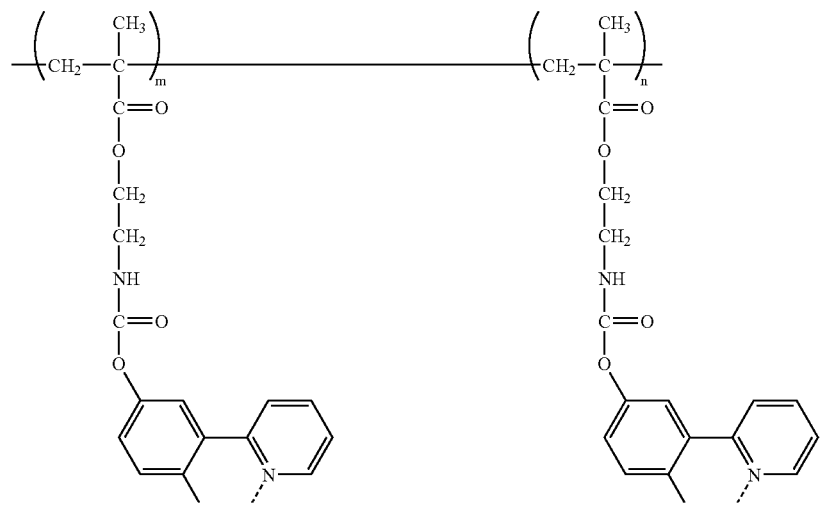

-continued

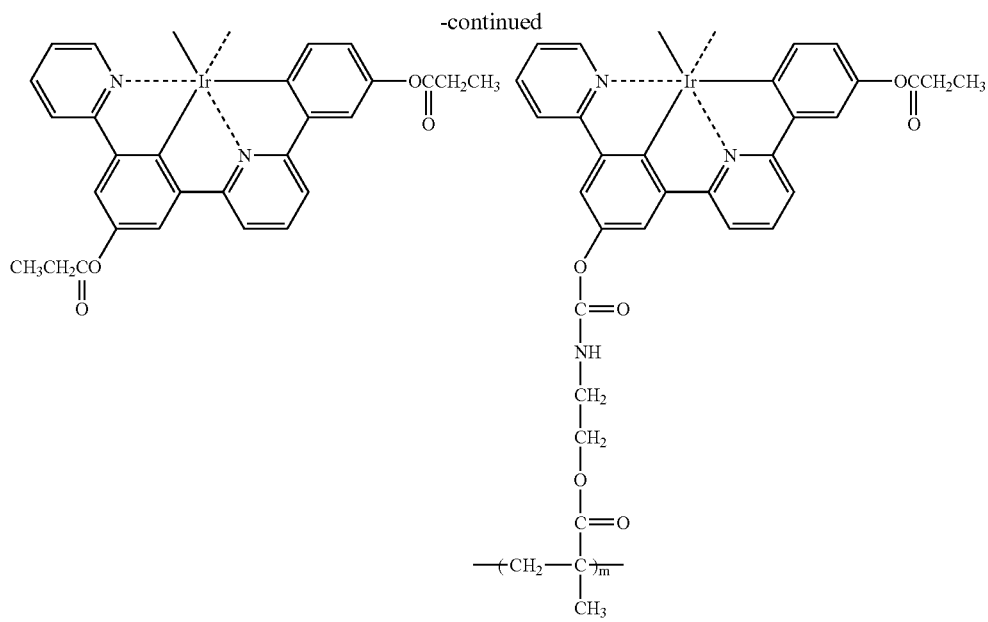

EXAMPLE 37

Synthesis of a Polymerizable Compound (8-nonen-2, 4-dionato) bis(2-phenylpyridine) Iridium (III) (Hereinafter Abbreviated as Ir(PPy)$_2$(1-Bu-acac))

As shown in the Reaction Scheme below, di(μ-chloro)tetrakis(2-phenylpyridine) diiridium (III) (hereinafter abbreviated as [Ir(PPy)$_2$Cl]$_2$) synthesized by a conventional method and 8-nonen-2,4-dione synthesized by the known method (H. Gerlach et al., Helv. Chim. Acta, 60, 638 (1977)) were allowed to react to synthesize Ir(PPy)$_2$ (1-Bu-acac).

That is, 261 mg (0.24 mmol) of [Ir(PPy)$_2$Cl]$_2$ was suspended in 30 ml of nitrogen-purged methanol and 87 mg (0.56 mmol) of 8-nonen-2,4-dione and 76 mg (0.75 mmol) of triethylamine were added thereto, and the obtained mixture was heated under reflux in an oil bath for 3 hours. The obtained pale yellow reaction mixture was cooled to room temperature and concentrated by using a rotary evaporator. Then, 200 ml of dilute hydrochloric acid solution and 50 ml of chloroform were added to the reaction mixture and the obtained mixture was stirred vigorously. The chloroform layer was separated and dried over magnesium sulfate and the solvent was distilled off under reduced pressure. The obtained yellow residue was dissolved in dichloromethane and the solution was subjected to silica gel column chromatography to separate a pale yellow main product. A solution of the product was concentrated under reduced pressure and then a small amount of hexane was added thereto, followed by cooling to −20° C. to obtain 270 mg (0.41 mmol) of the objective Ir(PPy)$_2$(1-Bu-acac) as pale yellow crystal (yield: 85%). Identification was performed by elementary analysis of C, H and N and $^1$H-NMR.

$^1$H-NMR (CDCl$_3$, ppm): δ 8.49 (d, J=5.7 Hz, 2H, PPy), 7.83 (t, J=7.8 Hz, 2H, PPy), 7.70 (m, 2H, PPy), 7.54 (t, J=6.8 Hz, 2H, PPy), 7.10 (m, 2H, PPy), 6.80 (t, J=7.3 Hz, 2H, PPy), 6.68 (m, 2H, PPy), 6.35 (d, J=6.2 Hz, 1H, PPy), 6.25 (d, J=6.2 Hz, 1H, PPy), 5.61 (m, 1H, —CH=CH$_2$), 5.19 (s, 1H, diketonate-methine), 4.86 (m, 2H, —CH=CH$_2$), 1.99 (t, J=7.3 Hz, 2H, methylene), 1.79 (s, 3H, CH$_3$), 1.72 (m, 2H, methylene), 1.38 (m, 2H, methylene).

Elementary analysis Calcd: C, 56.95; H, 4.47; N, 4.28. (C$_{31}$H$_{29}$IrN$_2$O$_2$) Found: C, 55.84; H, 4.32; N, 3.97.

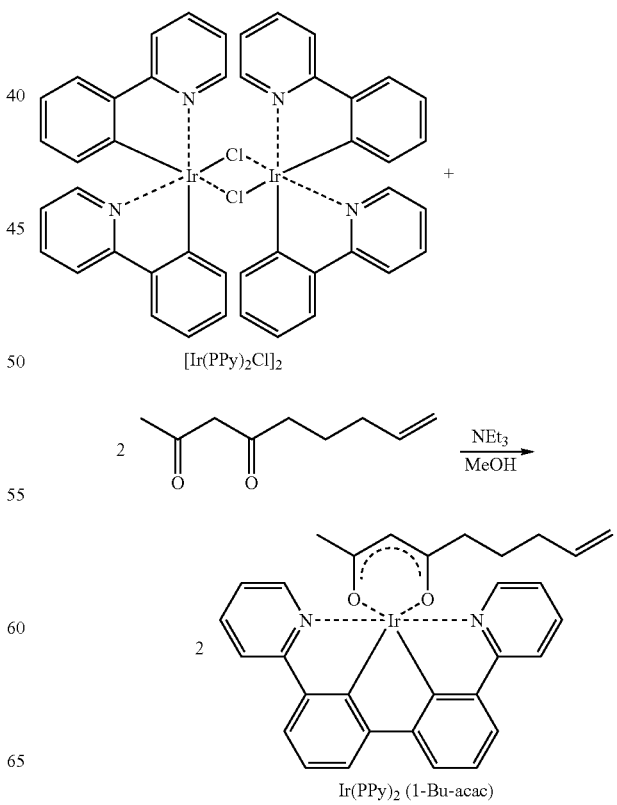

EXAMPLE 38

Synthesis of a Polymerizable Compound [6-(4-vinylphenyl)-2,4-hexanedionato]bis(2-phenylpyridine) iridium (III) (Hereinafter Abbreviated as Ir(PPy)$_2$[1-(St-Me)-acac])

(1) As shown in the Reaction Scheme below, acetylacetone and 4-vinylbenzyl chloride were allowed to react to synthesize 6-(4-vinylphenyl)-2,4-hexanedione That is, 1.23 g (60% in oil) (31 mmol) of sodium hydride was weighed in a nitrogen atmosphere and 60 ml of dry tetrahydrofuran (hereinafter abbreviated as THF) was added thereto and the mixture was cooled to 0° C. in an ice bath. To the suspension was dripped a mixed solution of 2.5 g 124 mmol) of acetylacetone and 1 ml of hexamethyl phosphoric triamide to produce colorless precipitate. After stirring the mixture at 0° C. for 10 minutes, 17.5 ml (28 mmol) of a hexane solution (1.6 M) of n-butyllithium was dripped therein to dissolve the precipitate and the mixture was further stirred at 0° C. for 20 minutes. To the obtained pale yellow solution was dripped 4.0 g (26 mmol) of 4-vinylbenzyl chloride and the reaction mixture was warmed back to room temperature and stirred for 20 minutes. Then, dilute hydrochloric acid was added thereto to render the water layer acidic. The organic layer was washed with saturated sodium chloride solution and dried over magnesium sulfate, and the solvent was distilled off by using a rotary evaporator. The obtained reaction mixture was charged in a silica gel column and developed with a mixed solvent of hexane/dichloromethane (1:1 (by volume)) to separate a main product. Distilling off the solvent from the obtained solution afforded 3.0 g (14 mmol) of the objective 6-(4-vinylphenyl)-2,4-hexanedione as a brown liquid. Yield was 56%. Identification was performed by elementary analysis of C and H, and $^1$H-NMR.

$^1$H-NMR (CDCl$_3$, ppm):

enol; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.46 (s, 1H, diketonate-methine), 5.20 (d, J=11.1 Hz, 1H, vinylic), 2.91 (t, J=5.7 Hz, 2H, methylene), 2.58 (t, J=7.3 Hz, 2H, methylene), 2.03 (s, 3H, methyl).

keto; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.20 (d, J=11.1 Hz, 1H, vinylic), 3.53 (s, 2H, C(=O)CH$_2$C(=O)), 2.89 (m, 4H, ethylene), 2.19 (s, 3H, methyl). enol:keto=6:1.

Elementary analysis Calcd: C, 77.75; H, 7.46. (C$_{14}$H$_9$O$_2$) Found: C, 77.49; H, 7.52.

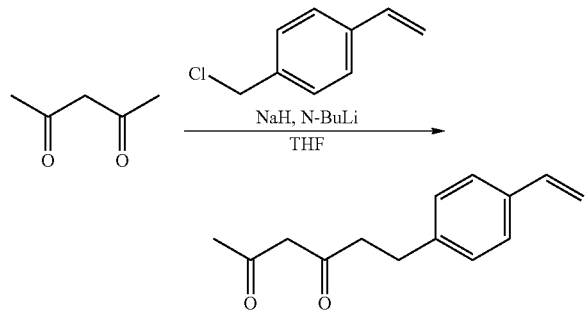

(2) As shown in the Reaction Scheme below, 6-(4-vinylphenyl)-2,4-hexanedione thus obtained and [Ir(PPy)$_2$Cl]$_2$ synthesized by a conventional method were allowed to react to synthesize Ir(PPy) 2 [1-(St-Me)-acac].

That is, to a solution of 342 mg (0.32 mmol) of [Ir(PPy)$_2$Cl]$_2$, 158 mg (1.5 mmol) of sodium carbonate and 5 mg (0.023 mmol) of 2,6-di-tert-butyl-4-methylphenol in 5 ml of N,N-dimethylformamide (hereinafter, abbreviated as DMF) was added 210 mg (0.97 mmol) of 6-(4-vinylphenyl)-2,4-hexanedione and the mixture was heated at 65° C. with stirring. Then, the reaction mixture was cooled to room temperature and dilute hydrochloric acid solution was added thereto, followed by extracting a component having a pale yellow color with chloroform. After distilling off the solvent by using a rotary evaporator, the residue was dissolved in a small amount of dichloromethane and subjected to silica gel column chromatography (eluent: dichloromethane) to separate a yellow main product. The solution was concentrated to dryness under reduced pressure and dichloromethane/hexane mixed solvent was added to the residue to perform recrystallization at −20° C., which afforded 354 mg (0.49 mmol) of the objective Ir(PPy)$_2$[1-(St-Me)-acac] as pale yellow crystal. Yield: 78%. Identification was performed by elementary analysis of C, H and N and $^1$H-NMR.

$^1$H-NMR (CDCl$_3$, ppm): δ 8.47 (d, J=5.7 Hz, 1H, PPy), 8.21 (d, J=5.7 Hz, 1H, PPy), 7.9-7.5 (m, 6H, PPy), 7.18 (d, J=8.1 Hz, 2H, stylyl-aromatic), 7.00 (m, 2H, PPy), 6.89 (d, J=8.1 Hz, 2H, stylyl-aromatic), 6.75 (m, 5H, PPy and vinylic), 6.28 (t, J==7.3 Hz, 2H, PPy), 7.67 (d, J=17.6 Hz, 1H, vinylic), 5.19 (d, J=9.5 Hz, 1H, vinylic), 5.17 (s, 1H, diketonate-methine), 2.60 (t, J=7.3 Hz, 2H, ethylene), 2.36 (m, 2H, ethylene), 1.75 (s, 3H, methyl).

Elementary analysis Calcd: C, 60.40; H, 4.36; N, 3.91. (C$_{36}$H$_{31}$IrN$_2$O$_2$) Found: C, 61.35; H, 4.34; N, 3.83.

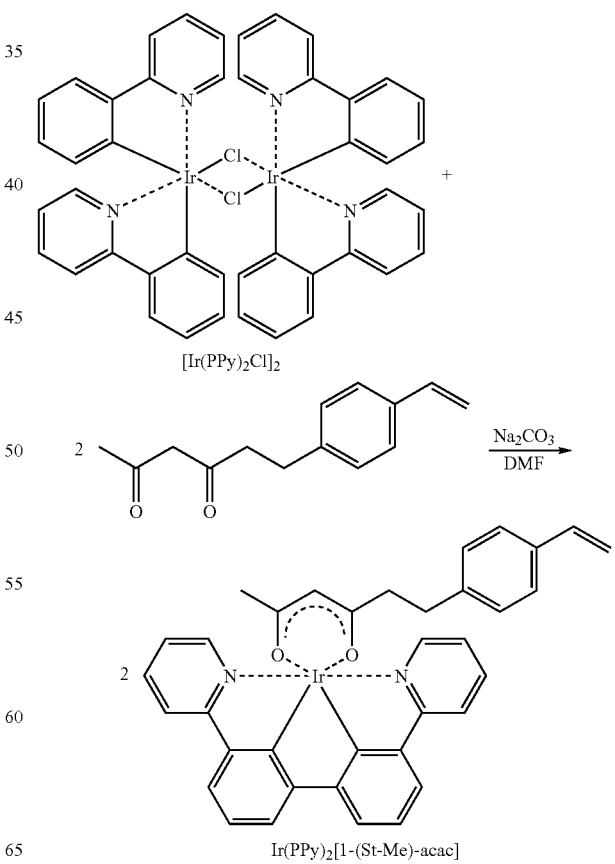

EXAMPLE 39

Synthesis of a Polymerizable Compound (9-acryloyloxy-2,4-nonanedionato)bis(2-phenylpyridine)iridium (III) (Hereinafter Abbreviated as Ir(PPy)₂[1-(A-Bu)-acac])

(1) As shown in the Reaction Scheme below, (9-hydroxy-2,4-nonanedionato)bis(2-phenylpyridine)iridium (III) (hereinafter abbreviated as Ir(PPy)₂[1-(OH-Bu)-acac]) was synthesized by a conventional method.

That is, to a solution of 167 mg (0.276 mmol) of Ir(PPy)₂(1-Bu-acac) synthesized in the same manner as in Example 37 in 10 ml of THF was dripped 1.0 ml (0.5 mmol) of 0.5M THF solution of 9-borabicyclo[3.3.1]nonane (hereinafter abbreviated as 9-BBN) and the solution was heated under reflux for 25 minutes. Then, to the reaction mixture were added 0.2 ml (0.60 mmol) of a 3M aqueous NaOH solution and 0.060 ml (0.62 mmol) of a 35% H₂O₂ solution in the order cited, and the mixture was stirred at room temperature for 12 hours. Then, 20 ml of water was added thereto and the mixture was concentrated by using a rotary evaporator. After adding chloroform and well shaking, the organic layer was concentrated to dryness under reduced pressure. The obtained yellow solid was dissolved in a small amount of dichloromethane and the solution was charged in a silica gel column followed by flowing dichloromethane therethrough to remove eluted impurities. Subsequently, flowing a dichloromethane/ethyl acetate mixed solvent of 1:1 (by volume ratio) resulted in elution of a pale yellow complex, which was recovered and dried under reduced pressure, followed by recrystallization of the residue from dichloromethane/hexane mixed solution at −20° C. to obtain 23 mg (0.034 mmol) of Ir(PPy)₂[1-(OH-Bu)-acac] as pale yellow solid. Yield: 13%. Identification was performed by elementary analysis of C, H and N and ¹H-NMR.

¹H-NMR (CDCl₃, ppm): 8.50 (d, J=5.9 Hz, 2H, PPy), 7.82 (t, J=7.0 Hz, 2H, PPy), 7.72 (t, J=7.3 Hz, 2H, PPy), 7.55 (t, J=7.0 Hz, 2H, PPy), 7.12 (t, J=5.9 Hz, 2H, PPy), 6.81 (t, J=7.6 Hz, 2H, PPy), 6.69 (t, J=7.3 Hz, 2H, PPy), 6.31 (d, J=5.9 Hz, 1H, PPy), 6.26 (d, J=5.9 Hz, 1H, PPy), 5.19 (s, 1H, diketonate-methine), 3.44 (t, J=7.0 Hz, 2H, CH₂OH), 1.98 (t, J=7.0 Hz, 2H, methylene), 1.79 (s, 3H, methyl), 1.34 (m, 4H, methylene), 1.05 (m, 2H, methylene).

Elementary analysis Calcd: C, 55.42; H, 4.65; N, 4.17. (C₃₁H₃₁IrN₂O₃) Found: C, 55.76; H, 4.71; N, 4.19.

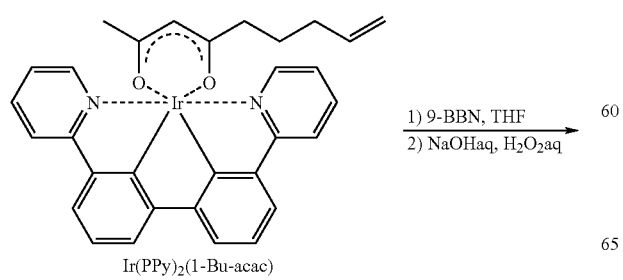

Ir(PPy)₂(1-Bu-acac)

1) 9-BBN, THF
2) NaOHaq, H₂O₂aq

-continued

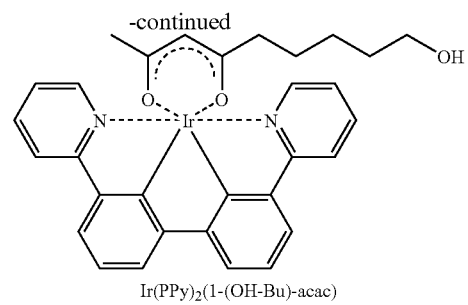

Ir(PPy)₂(1-(OH-Bu)-acac)

(2) As shown in the Reaction Scheme below, Ir(PPy)₂[1-(OH-Bu)-acac] and acryloyl chloride were allowed to react to synthesize Ir(PPy)₂[1-(A-Bu)-acac].

That is, to a solution of 95 mg (0.14 mmol) of Ir(PPy)₂[1-(OH-Bu)-acac] in 10 ml of dichloromethane was added 0.10 ml (0.72 mmol) of triethylamine. To this solution was added 0.060 ml (0.74 mmol) of acryloyl chloride and the mixture was stirred at room temperature for 30 minutes. Then, after adding 1 ml of methanol to the mixture, the solvent was distilled under reduced pressure and the residue was passed through a silica gel column (eluent: dichloromethane) and an initially eluted yellow solution was separated and concentrated to dryness under reduced pressure. Recrystallization of the residue from dichloromethane/hexane mixed solvent at −20° C. afforded 99 mg (0.14 mmol) of the objective Ir(PPy)₂[1-(A-Bu)-acac] as pale yellow solid. Yield: 96%. Identification was performed by elementary analysis of C, H and N and ¹H-NMR.

¹H-NMR (CDCl₃, ppm): δ 8.50 (d, J=5.9 Hz, 2H, PPy), 7.80 (m, 4H, PPy), 7.51 (t, J=7.3 Hz, 2H, PPy), 7.18 (t, J=5.9 Hz, 2H, PPy), 6.84 (t, J=7.3 Hz, 2H, PPy), 6.70 (t, J=7.6 Hz, 2H, PPy), 6.25 (m, 3H, PPy+vinylic), 6.12 (dd, J=15.6, 9.3 Hz, 1H, vinylic), 5.75 (d, J=9.3 Hz, 1H, vinylic), 5.17 (s, 1H, diketonate-methine), 4.05 (t, J=7.0 Hz, 2H, —COOCH₂—), 1.84 (t, J=7.0 Hz, 2H, methylene), 1.80 (s, 3H, methyl), 1.34 (m, 4H, methylene), 1.06 (m, 2H, methylene).

Elementary analysis Calcd: C, 56.26; H, 4.58; N, 3.86. (C₃₄H₃₃IrN₂O₄) Found: C, 56.55; H, 4.53; N, 3.60.

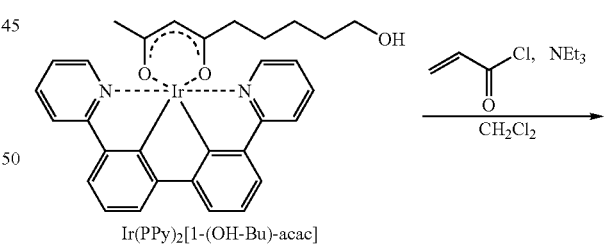

Ir(PPy)₂[1-(OH-Bu)-acac]

Cl, NEt₃

CH₂Cl₂

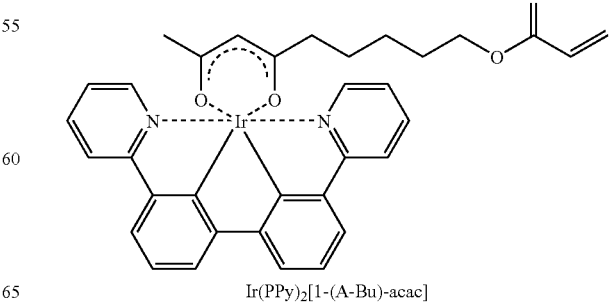

Ir(PPy)₂[1-(A-Bu)-acac]

EXAMPLE 40

Synthesis of a Polymerizable Compound {1-[4-(2-methacryloyloxy)ethylcarbamoyloxyphenyl]-3-phenyl-1,3-propane-dionato]bis(2-phenylpyridine) iridium (III) (Hereinafter Abbreviated as Ir(PPy)$_2$ (MOI-Ph-acac))

(1) As shown in the Reaction Scheme below, di(1-chloro) tetrakis(2-phenylpyridine) diiridium (III) ([Ir(PPy)$_2$Cl]$_2$) synthesized by a conventional method and p-hydroxy-dibenzoylmethane synthesized by referencing the known method (M. Cushman et al., Tetrahedron Lett., 31, 6497 (1990)) were allowed to react to synthesize [1-(4-hydroxyphenyl)-3-phenyl-1,3-propane-dionato]bis(2-phenylpyridine)iridium (III) (hereinafter abbreviated as Ir(PPy)$_2$(OH-Ph-acac)).

That is, 112 mg (0.10 mmol) of [Ir(PPy)$_2$Cl]$_2$, 64 mg (0.60 mmol) of sodium carbonate and 76 mg (0.32 mmol) of p-hydroxydibenzoylmethane were dissolved in 10 ml of DMF and the solution was heated at 60° C. for 0.5 hour with stirring. The obtained reaction mixture was poured into 100 ml of dilute hydrochloric acid solution and the iridium complex was extracted with chloroform. The chloroform was distilled off by using a rotary evaporator and the residue was dissolved in a small amount of dichloromethane and charged in a silica gel column. Development with a mixed solvent of dichloromethane/acetone of 30:10 (by volume ratio) resulted in elution of a component having an orange color, which was recovered and concentrated to dryness under reduced pressure. The obtained solid was dissolved in a small amount of diethyl ether and hexane was added thereto. The precipitate was collected by filtration and dried under reduced pressure to obtain 111 mg (0.15 mmol) of the objective Ir(PPy)$_2$(OH-Ph-acac) as orange solid. Yield: 72%. Identification was performed by elementary analysis of C, H and N and $^1$H-NMR.

$^1$H-NMR (CDCl$_3$, ppm): δ 8.58 (d, 2H, PPy), 7.9-6.7 (m, 21H, PPy+phenyl), 6.52 (s, 1H, diketonate-methine), 6.37 (d, 2H, PPy), 4.91 (s, 1H, OH).

Elementary analysis Calcd: C, 60.07; H, 3.68; N, 3.79. (C$_{31}$H$_{27}$IrN$_2$O$_3$) Found: C, 60.77; H, 3.75; N, 3.62.

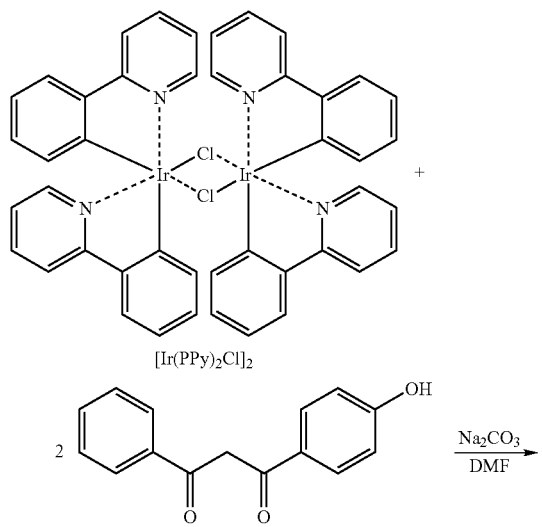

[Ir(PPy)$_2$Cl]$_2$

Na$_2$CO$_3$ / DMF

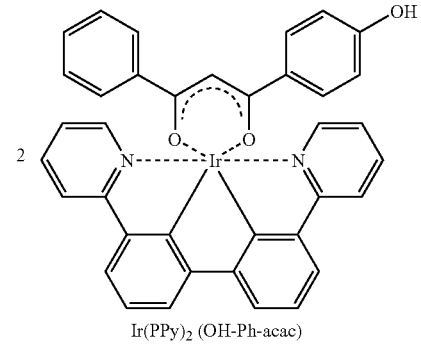

Ir(PPy)$_2$ (OH-Ph-acac)

(2) As shown in the Reaction Scheme below, the obtained Ir(PPy)$_2$(OH-Ph-acac) and 2-methacryloyloxyethyl isocyanate (Trade name "Karenz MOI", manufactured by Showa Denko K. K., hereinafter sometimes referred to as "MOI") were allowed to react to synthesize Ir(PPy)$_2$(MOI-Ph-acac).

That is, to a solution of 110 mg (0.15 mmol) of Ir(PPy)$_2$ (OH-Ph-acac) in 50 ml of toluene were added 5 mg (0.023 mmol) of 2,6-di-tert-butyl-4-methylphenol (hereinafter abbreviated as BHT), 32 mg (0.051 mmol) of dibutyltin (IV) dilaurate (hereinafter abbreviated as DBTL) and 121 mg (0.78 mmol) of MOI and the mixture was heated at 70° C. for 6 hours with stirring. The obtained reaction mixture was air-cooled to room temperature and charged in a silica gel column, followed by development of the column with a mixed solvent of dichloromethane/acetone of 20:1 (by volume ratio), resulting in elution of an orange-colored compound. The solution containing the compound was concentrated to dryness under reduced pressure by using a rotary evaporator and the obtained solid was dissolved in a small amount of dichloromethane. Slowly adding hexane to the dichloromethane solution resulted in deposition of an orange-colored precipitate, which was collected by filtration and dried under reduced pressure to obtain 100 mg (0.11 mmol) of the objective Ir(PPy)$_2$(MOI-Ph-acac) as orange-colored solid. Yield: 75%. Identification was performed by elementary analysis of C, H and N and $^1$H-NMR.

$^1$H-NMR (CDCl$_3$, ppm): δ 8.60 (d, 2H, PPy), 7.9-6.7 (m, 21H, PPy and phenyl), 6.56 (s, 1H, diketonate-methine), 6.39 (d, 2H, PPy), 6.18 (s, 1H, olefinic), 5.65 (s, 1H, olefinic), 5.29 (s, 1H, NH), 4.31 (t, 2H, ethylene), 3.59 (t, 2H, ethylene), 2.00 (s, 3H, methyl).

Elementary analysis Calcd: C, 59.05; H, 4.05; N, 4.70. (C$_{44}$H$_{31}$IrN$_3$O$_6$) Found: C, 59.79; H, 4.05; N, 4.64.

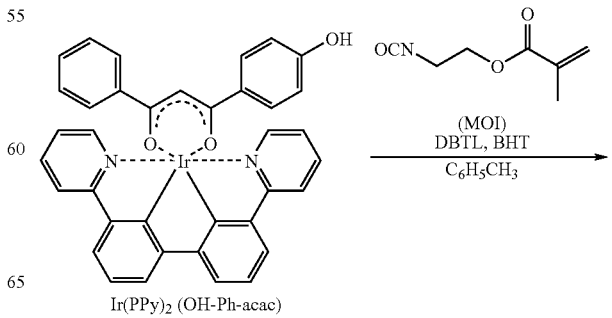

Ir(PPy)$_2$ (OH-Ph-acac)

(MOI) DBTL, BHT / C$_6$H$_5$CH$_3$

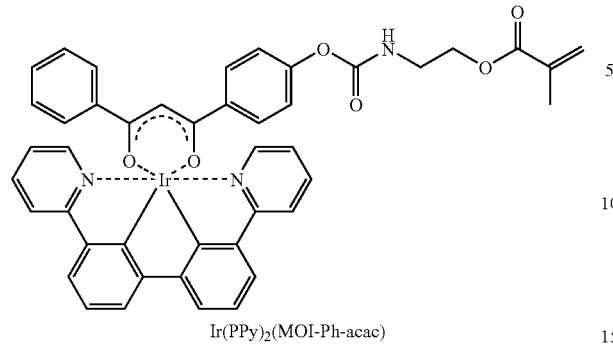

Ir(PPy)₂(MOI-Ph-acac)

EXAMPLE 41

Synthesis of a Polymerizable Compound [6-(4-methacryloyloxyphenyl)-2,4-hexanedionato]bis(2-phenylpyridine)iridium (III) (Hereinafter Abbreviated as Ir(PPy)₂[1-(MA-Ph-Me)-acac])

(1) As shown in the Reaction Scheme below, acetylacetone and 4-benzyloxybenzyl iodide synthesized by the known method (C. Cativiela, et al., J. Org. Chem., 60, 3074 (1995)) were allowed to react to synthesize 6-(4-benzyloxyphenyl)-2,4-hexanedione.

That is, 0.30 g (60% in oil) (7.5 mmol) of sodium hydride was weighed in a nitrogen atmosphere and 20 ml of THF was added thereto and the mixture was cooled to 0° C. in an ice bath. To the suspension was dripped a mixed solution of 0.75 g (7.5 mmol) of acetylacetone and 0.5 ml of hexamethyl phosphoric triamide to produce colorless precipitate. After stirring the mixture at 0° C. for 10 minutes, 4.6 ml (7.5 mmol) of a hexane solution (1.6 M) of n-butyllithium was dripped therein to dissolve the precipitate and the mixture was further stirred at 0° C. for 20 minutes. To the obtained pale yellow transparent solution was dripped a solution of 2.28 g (7.0 mmol) of 4-benzyloxybenzyl iodide in 10 ml of THF. After stirring the reaction mixture at room temperature for 1 hour, it was cooled again to 0° C. Then, dilute hydrochloric acid was added thereto to neutralize it. After washing the organic layer with a saturated aqueous solution of sodium chloride, the solvent was distilled off by using a rotary evaporator. The residue was passed through a silica gel column (eluent: a mixed solvent of dichloromethane/hexane of 1:1 (by volume ratio)) to separate a main product. Separation of this and concentration to dryness under reduced pressure afforded 1.31 g (4.4 mmol) of the objective 6-(4-benzyloxyphenyl)-2,4-hexanedione as pale yellow solid. Yield: 63%. Identification was performed by elementary analysis of C and H, and ¹H-NMR.

¹H-NMR (CDCl₃, ppm):

enol: δ 7.5-6.8 (m, 9H, aromatic), 5.46 (s, 1H, enol-methine), 5.04 (s, 2H, —O—CH₂—), 2.88 (t, J=7.6 Hz, 2H, ethylene), 2.55 (t, J=8.4 Hz, 2H, ethylene), 2.04 (s, 3H, methyl).

keto; δ 7.5-6.8 (m, 9H, aromatic), 5.04 (s, 2H, —O—CH₂—), 3.53 (s, 2H, C(=O)CH₂C(=O)), 2.84 (m, 4H, ethylene), 2.19 (s, 3H, methyl).

enol:keto=5:1.

Elementary analysis Calcd: C, 77.00; H, 6.86. (C₁₉H₂₀O₃) Found: C, 77.46; H, 6.77.

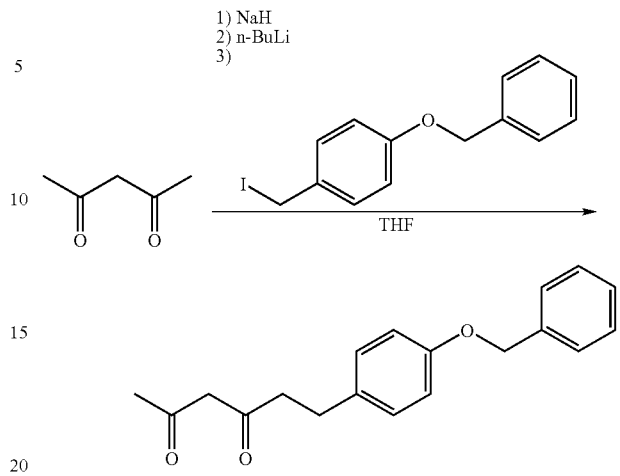

(2) As shown in the Reaction Scheme below, the obtained 6-(4-benzyloxyphenyl)-2,4-hexanedione was hydrogenated to produce 6-(4-hydroxyphenyl)-2,4-hexanedione.

That is, 1.5 g of Pd-activated carbon (10%) was weighed in a nitrogen atmosphere and 20 ml of dichloromethane and 1.31 g (4.4 mmol) of 6-(4-benzyloxyphenyl)-2,4-hexanedione were added thereto. The atmosphere in the reaction system was exchanged with hydrogen at 1 atm and stirred at room temperature for 11 hours. The obtained reaction mixture was filtered to remove insoluble matter and the solvent was distilled off under reduced pressure. The residue was charged in a silica gel column and developed first with dichloromethane to remove byproducts. Subsequently, a solution containing a compound eluted from the column with a mixed solvent of 1:1 (by volume ratio) acetone/hexane was concentrated to dryness under reduced pressure to obtain 0.70 g (3.4 mmol) of the objective 6-(4-hydroxyphenyl)-2,4-hexanedione as pale yellow solid. Yield: 77%. Identification was performed by elementary analysis of C and H, and ¹H-NMR.

¹H-NMR (CDCl₃, ppm):

enol: δ 7.04 (d, J=8.4 Hz, 2H, aromatic), 6.65 (d, J=8.4 Hz, 2H, aromatic), 5.55 (br, 1H, OH), 5.47 (s, 1H, enol-methine), 2.86 (t, J=7.3 Hz, 2H, ethylene), 2.55 (t, J=7.3 Hz, 2H, ethylene), 2.04 (s, 3H, methyl).

keto: δ 7.04 (d, J=8.4 Hz, 2H, aromatic), 6.65 (d, J=8.4 Hz, 2H, aromatic), 5.55 (br, 1H, OH), 3.55 (s, 2H, C(=O)CH₂C(=O)), 2.83 (m, 4H, ethylene), 2.19 (s, 3H, methyl).

enol:keto=5:1.

Elementary analysis Calcd: C, 69.88; H, 6.84. (C₁₂H₁₄O₃) Found: C, 69.67; H, 6.79.

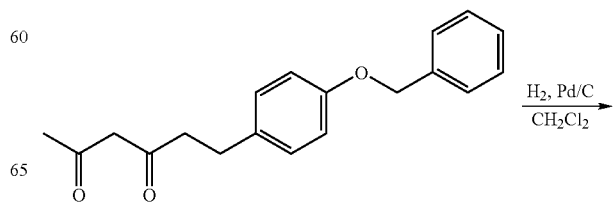

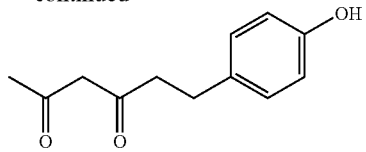

(3) As shown in the Reaction Scheme below, the obtained 6-(4-hydroxyphenyl)-2,4-hexanedione was allowed to react with di(μ-chloro)tetrakis(2-phenylpyridine) diiridium (III) ([Ir(PPy)$_2$Cl]$_2$) synthesized by a conventional method to synthesize [6-(4-hydroxyphenyl)-2,4-hexanedionato]bis(2-phenylpyridine)iridium (III) (hereinafter abbreviated as Ir(PPy)$_2$[1-(OH-Ph-Me)-acac]).

That is, to a mixture of 71 mg (0.066 mmol) of [Ir(PPy)$_2$Cl]$_2$ and 47 mg (0.44 mmol) of sodium carbonate was added a solution of 41 mg (0.20 mmol) of 6-(4-hydroxyphenyl)-2,4-hexanedione in 5 ml of DMF and the mixture was heated at 65° C. for 1 hour with stirring. To the reaction mixture was added dilute hydrochloric acid and chloroform and the mixture was well shaken. The separated organic layer was dried over magnesium sulfate and the solvent was distilled off under reduced pressure. The residue was passed through a silica gel column (eluent: a mixed solvent of 1:1 (by volume ratio) hexane/ethyl acetate) and a solution having a pale yellow color that eluted next to a small amount of pale yellow byproduct was recovered and concentrated to dryness under reduced pressure. The obtained solid was dissolved in a small amount of dichloromethane. Addition of hexane to the solution and cooling it to −20° C. afforded 86 mg (0.12 mmol) of the objective Ir(PPy)$_2$[1-(OH-Ph-Me)acac] as pale yellow solid. Yield: 92%. Identification was performed by elementary analysis of C, H and N and $^1$H-NMR.

$^1$H-NMR (CDCl$_3$, ppm): δ 8.48 (d, J=6.2 Hz, 1H, PPy), 8.23 (d, J=5.9 Hz, 1H, PPy), 7.9-7.6 (m, 4H, PPy), 7.53 (t, J=7.3 Hz, 2H, PPy), 7.11 (t, J=7.0 Hz, 1H, PPy), 6.99 (t, J=7.0 Hz, 1H, PPy), 6.8-6.4 (m, 8H, PPy+C$_6$H$_4$OH), 6.27 (t, J=8.1 Hz, 2H, PPy), 5.18 (s, 1H, diketonate-methine), 5.10 (br, 1H, OH), 2.54 (t, J=7.0 Hz, 2H, methylene), 2.31 (m, 2H, methylene), 1.75 (s, 3H, methyl).

Elementary analysis Calcd: C, 57.86; H, 4.14; N, 3.97. (C$_{34}$H$_{29}$IrN$_2$O$_3$) Found: C, 58.03; H, 4.11; N, 3.86.

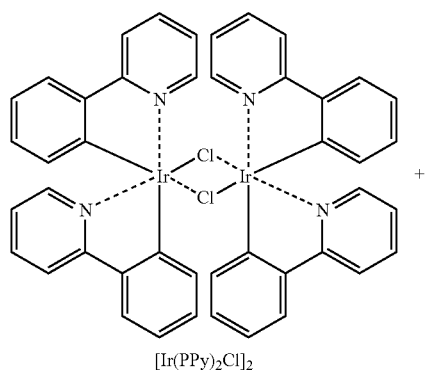

[Ir(PPy)$_2$Cl]$_2$

+

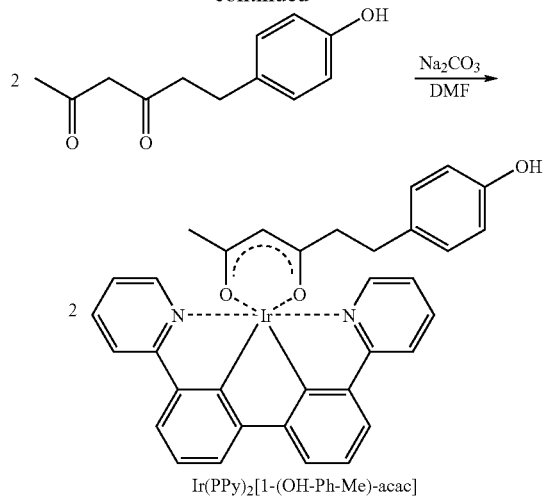

Ir(PPy)$_2$[1-(OH-Ph-Me)-acac]

(4) As shown in the Reaction Scheme below, the Ir(PPy)$_2$[1-(OH-Ph-Me)acac] was allowed to react with methacryloyl chloride to synthesize Ir(PPy)$_2$[1-(MA-Ph-Me)acac].

That is, in a nitrogen atmosphere, 169 mg (0.24 mmol) of Ir(PPy)$_2$[1-(OH-Ph-Me)acac] was dissolved in 10 ml of dichloromethane and 0.30 ml (2.2 mmol) of triethylamine was added to the solution. Addition of 0.060 ml (0.61 mmol) of methacryloyl chloride to the obtained solution rapidly produced a product. After further adding a small amount of methanol to the solution, the solvent was distilled off under reduced pressure. The residue was passed through a silica gel column with using a mixed solvent of hexane/dichloromethane/acetone (10:10:1 (by volume ratio)) to separate a main product having a yellow color. After distilling off the solvent under reduced pressure, recrystallization of the residue from a mixed solvent of dichloromethane/hexane afforded 141 mg (0.18 mmol) of the objective Ir(PPy)$_2$[1-(MA-Ph-Me)acac] as yellow solid. Yield: 76%. Identification was performed by elementary analysis of C, H and N and $^1$H-NMR.

$^1$H-NMR (CDCl$_3$, ppm): δ 8.48 (d, J=5.1 Hz, 1H, PPy), 8.27 (d, J=5.9 Hz, 1H, PPy), 7.9-7.5 (m, 6H, PPy), 7.12 (t, J=7.0 Hz, 1H, PPy), 7.04 (t, J=−7.0 Hz, 1H, PPy), 6.9-6.6 (m, 8H, aromatic), 6.33 (s, 1H, olefinic), 6.27 (d, J=7.6 Hz, 2H, PPy), 5.74 (s, 1H, olefinic), 5.17 (s, 1H, diketonate-methine), 2.61 (t, J=7.0 Hz, 2H, ethylene), 2.34 (m, 2H, ethylene), 2.07 (s, 3H, methacryl-methyl), 1.76 (s, 3H, diketonate-methyl).

Elementary analysis Calcd: C, 58.98; H, 4.30; N, 3.62. (C$_{31}$H$_{33}$IrN$_2$O$_4$) Found: C, 58.69; H, 4.17; N, 3.81.

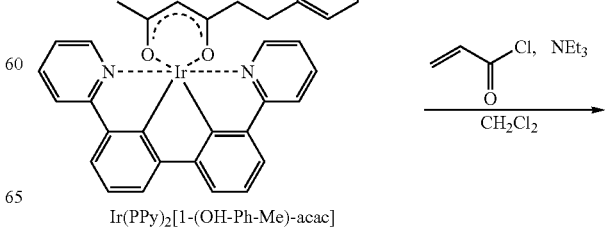

Ir(PPy)$_2$[1-(OH-Ph-Me)-acac]

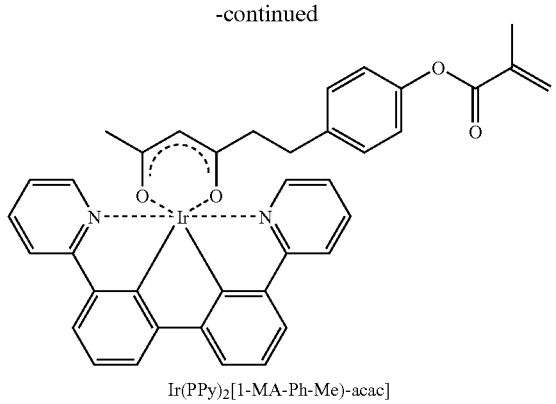

Ir(PPy)₂[1-MA-Ph-Me)-acac]

EXAMPLE 42

Synthesis of a Polymerizable Compound (1-methacryloyloxy-2,4-pentanedionato)bis(2-phenylpyridine)iridium (III) (Hereinafter Abbreviated as Ir(PPy)₂(1-MA-acac))

(1) As shown in the Reaction Scheme below, di(1-chloro) tetrakis(2-phenylpyridine) diiridium (III) ([Ir(PPy)₂Cl]₂) synthesized by a conventional method and (1-tert-butyldimethylsilyloxy)-2,4-pentanedione synthesized by referencing the known method (EP Patent No. 0514217) were allowed to react to synthesize (1-hydroxy-2,4-pentanedionato)bis(2-phenyl-pyridine)iridium (III) (hereinafter abbreviated as Ir(PPy)₂(1-OH-acac)).

That is, to a solution of 492 mg (0.46 mmol) of [Ir(PPy)₂Cl]₂ and 139 mg (1.31 mmol) of sodium carbonate in 10 ml of DMF was added 321 mg (1.39 mmol) of 1-(tert-butyldimethylsilyloxy)-2,4-pentandione (1-TBDMSO-2,4-pentadione) and the mixture was heated at 70° C. for 1 hour with stirring. The reaction mixture was cooled to room temperature and 100 ml of a saturated aqueous solution of ammonium chloride and 50 ml of chloroform were added thereto, and well shaken. The organic layer was dried over magnesium sulfate and the solvent was distilled off under reduced pressure. The residue was passed through a silica gel column with dichloromethane as an eluent to obtain a yellow solution. This solution was concentrated to dryness under reduced pressure to obtain yellow solid, which was dissolved in 20 ml of THF and 0.46 ml (0.46 mmol) of a 1.0 M THF solution of tetra-n-butylammonium fluoride (hereinafter abbreviated as Bu"₄NF) was dripped thereto while vigorously stirring the solution. The reaction mixture was stirred at room temperature for 0.5 hour and then the solvent was distilled off under reduced pressure. The residue was passed through a silica gel column (eluent: a mixed solvent of hexane/dichloromethane/acetone (1:3:1 (by volume ratio)) and the eluted yellow-colored main product was recovered and dried under reduced pressure. Recrystallization of the obtained crude product from a mixed solvent of dichloromethane/hexane afforded 389 mg (0.63 mmol) of the objective Ir(PPy)₂(1-OH-acac) as yellow solid. Yield: 69%. Identification was performed by elementary analysis of C, H and N and ¹H-NMR.

¹H-NMR (CDCl₃, ppm): δ 8.48 (d, J=5.7 Hz, 1H, PPy), 8.42 (d, J=5.7 Hz, 1H, PPy), 7.86 (m, 2H, PPy), 7.74 (t, J=7.6 Hz, 2H, PPy), 7.54 (t, J=5.9 Hz, 2H, PPy), 7.14 (t, J=5.9 Hz, 2H, PPy), 6.82 (t, J=7.3 Hz, 2H, PPy), 6.69 (m, 2H, PPy), 6.28 (d, J=6.8 Hz, 1H, PPy), 6.23 (d, J=6.5 Hz, 1H, PPy), 5.17 (s, 1H, diketonate-methine), 3.88 (dd, J=8.1, 5.4 Hz, 1H, —CHH'—O—), 3.78 (dd, J=8.1, 4.3 Hz, 1H, —CHH'—O—), 3.10 (t, J=4.6 Hz, 1H, OH), 1.82 (s, 3H, methyl).

Elementary analysis Calcd: C, 52.67; H, 3.77; N, 4.55. (C₂₇H₂₃IrN₂O₃) Found: C, 52.45; H, 3.68; N, 4.79.

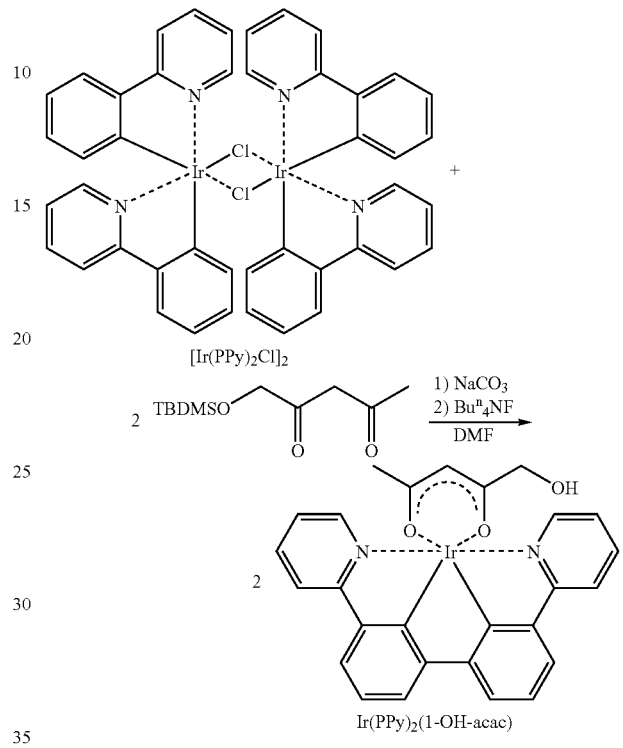

(2) As shown in the Reaction Scheme below, the obtained Ir(PPy)₂(1-OH-acac) and methacryloyl chloride were allowed to react to synthesize Ir(PPy)₂ (1-MA-acac).

That is, to a solution of 200 mg (0.32 mmol) of Ir(PPy)₂ (1-OH-acac) in 15 ml of dichloromethane were added 0.25 ml (1.8 mmol) of triethylamine and 0.20 ml (2.0 mmol) of methacryloyl chloride and the mixture was stirred at room temperature for 1 hour. Then, the reaction mixture was washed with 20 ml of an aqueous solution of sodium carbonate and the solvent was distilled off under reduced pressure. The residue was dissolved again in dichloromethane and the solution was charged to the upper part of a silica gel column and developed with a mixed solvent of hexane/dichloromethane/acetone of 2:4:1 (by volume ratio). The yellow solution initially obtained was recovered and dried under reduced pressure to obtain 165 mg (0.24 mmol) of the objective Ir(PPy)₂ (1-MA-acac) as yellow solid. Yield: 74%. Identification was performed by elementary analysis of C, H and N and ¹H-NMR.

¹H-NMR (CDCl₃, ppm): δ8.53 (d, J=5.7 Hz, 1H, PPy), 8.48 (d, J=5.4 Hz, 1H, PPy), 7.84 (d, J=7.8 Hz, 2H, PPy), 7.73 (t, J=7.0 Hz, 2H, PPy), 7.53 (t, J=6.8 Hz, 2H, PPy), 5.14 (m, 2H, PPy), 6.79 (m, 2H, PPy), 6.69 (m, 2H, PPy), 6.29 (d, J=7.6 Hz, 1H, PPy), 6.23 (d, J=7.6 Hz, 1H, PPy), 6.04 (s, 1H, olefinic), 5.51 (s, 1H, olefinic), 5.31 (s, 1H, diketonate-methine), 4.38 (d, J=15.4 Hz, 1H, —CHH'—OC(=O)—), 4.27 (d, J=14.9 Hz, 1H, —CHH'—OC(=O)—), 1.87 (s, 3H, methacryl-methyl), 1.82 (s, 3H, diketonate-methyl).

Elementary analysis Calcd: C, 54.45; H, 3.98; N, 4.10. (C₃₁H₂₇IrN₂O₄) Found: C, 54.18; H, 3.96; N, 4.33.

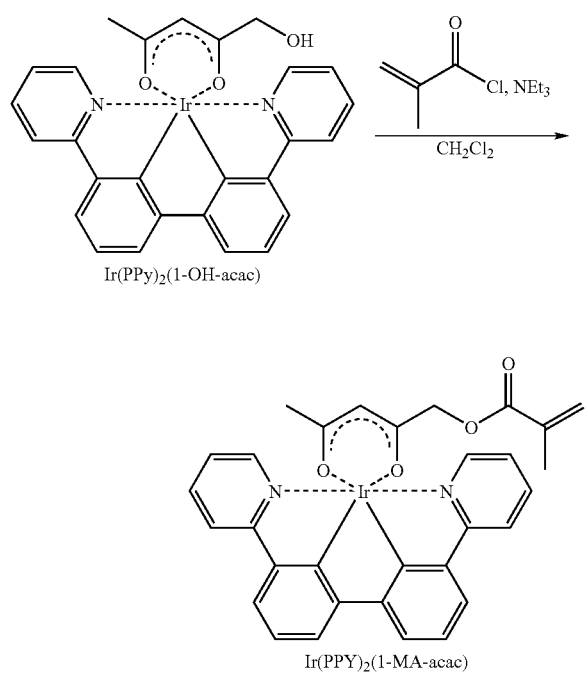

Ir(PPy)₂(1-OH-acac)

Ir(PPY)₂(1-MA-acac)

EXAMPLE 43

Synthesis of a Polymerizable Compound [6-(4-vinylphenyl)-2,4-hexanedionato]bis(2-(2,4-difluorophenyl)pyridine)iridium (III) (Hereinafter Abbreviated as Ir(2,4-F-PPy)₂[1-(St-Me)-acac])

(1) As shown in the Reaction Scheme below, 2-(2,4-difluorophenyl)pyridine was synthesized by a conventional method.

That is, under argon stream, 8.69 g (55.0 mmol) of 2-bromopyridine was dissolved in 200 ml of dry tetrahydrofuran and cooled to −78° C. To this was dripped 38.7 ml (61.9 mmol) of a 1.6 M hexane solution of n-butyllithium over 30 minutes. After completion of the dripping, further a solution of 7.5 g (55.0 mmol) of zinc chloride in 50 ml of dry tetrahydrofuran was dripped over 30 minutes. After completion of the dripping, the temperature of the mixture was slowly elevated to 0° C. and 9.65 g (55.0 mmol) of 1-bromo-2,4-difluorobenzene and 2.31 g (2.0 mmol) of tetrakis(triphenylphosphine)palladium (0) were added thereto. The mixture was stirred for 6 hours under reflux and then 200 ml of saturated saline was added to the reaction mixture, followed by extraction of the reaction mixture with diethyl ether. After drying the extract, concentration and purification by column chromatography (silica gel; chloroform/hexane (1/1: volume ratio)) afforded 6.00 g (31.4 mmol) of 2-(2,4-difluorophenyl) pyridine as colorless transparent oil. Yield: 63%. Identification was performed by elementary analysis of ¹H-NMR and elementary analysis of C, H and N.

¹H-NMR (CDCl₃, ppm): δ 8.71 (d, 1H, J=4.6 Hz), 8.00 (td, 1H, J=8.9, 6.5 Hz), 7.8-7.7 (m, 2H), 7.3-7.2 (overlapped with CHCl₃, 1H), 7.1-6.8 (m, 2H).

Elementary analysis Calcd: C, 69.11; H, 3.69; N, 7.33. Found: C, 68.98; H, 3.80; N, 7.31.

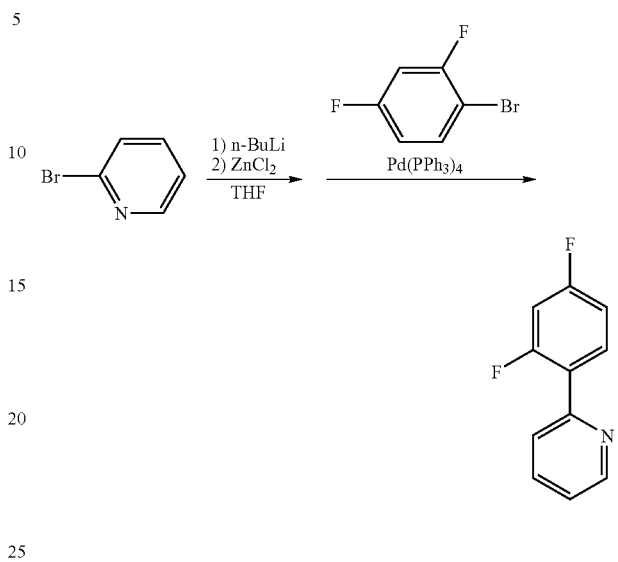

(2) As shown in the Reaction Scheme below, the obtained 2-(2,4-difluorophenyl)pyridine was allowed to react with sodium hexachloroiridate n-hydrate by a conventional method to synthesize di(μ-chloro)tetrakis[2-(2,4-difluorophenyl)pyridine)diiridium (III) (hereinafter abbreviated as [Ir(2,4-F-PPy)₂Cl]₂).

That is, 0.96 g (5.0 mmol) of 2-(2,4-difluorophenyl)pyridine and 1.00 g of sodium hexachloroiridate n-hydrate were dissolved in 40 ml of a 3:1 mixed solvent of 2-ethoxyethanol and water (by volume ratio) and argon gas was blown therein for 30 minutes and the mixture was stirred for 5 hours under reflux. The formed precipitate was collected by filtration and washed with ethanol and then with a small amount of acetone, followed by drying in vacuum for 5 hours to obtain 0.79 g (0.65 mmol) of the objective [Ir(2,4-F-PPy)₂Cl]₂ as yellow powder. Yield: 86%. Identification was performed by ¹H-NMR and elementary analysis of C, H and N.

¹H-NMR (CDCl₃, ppm): δ 9.12 (d, 4H, J=5.7 Hz), 8.31 (d, 4H, J=8.6 Hz), 7.83 (dd, 4H, J=7.6, 7.6 Hz), 6.82 (dd, 4H, J=7.3, 7.3 Hz), 6.34 (ddd, 4H, J=11.6, 10.0, 2.4 Hz), 5.29 (dd, 4H, J=9.5, 2.4 Hz).

Elementary analysis Calcd: C, 43.46; H, 1.99; N, 4.61. Found: C, 43.39; H, 2.03; N, 4.55.

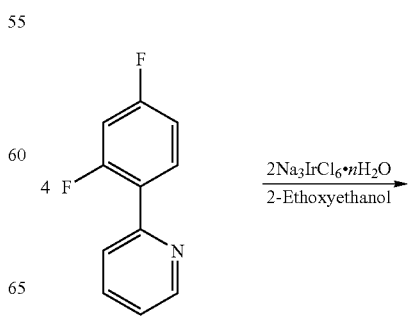

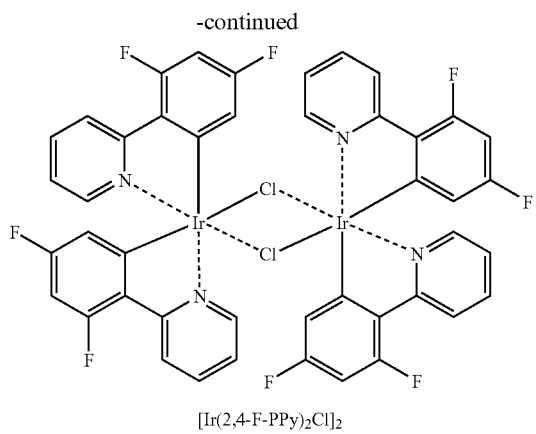

[Ir(2,4-F-PPy)₂Cl]₂

(3) As shown in the Reaction Scheme below, [Ir(2,4-F-PPy)₂Cl]₂ and 6-(4-vinylphenyl)-2,4-hexanedione were allowed to react to synthesize Ir(2,4-F-PPy)[1-(St-Me)-acac].

That is, 243 mg (0.20 mmol) of [Ir(2,4-F-PPy)₂Cl]₂, 212 mg (2.00 mmol) of sodium carbonate, and 1.3 mg of 2,6-di-tertbutyl-4-methylphenol, and 130 mg (0.60 mmol) of 6-(4-vinylphenyl)-2,4-hexanedione synthesized in the same manner as in Example 38 were dissolved in 20 ml of DMF under argon stream and stirred at 80° C. for 2 hours and then water was added to the reaction mixture, followed by extraction with chloroform. After drying the extract, concentration and purification by column chromatography (silica gel; chloroform), followed by recrystallization from a chloroform/hexane solution afforded 261 mg (0.33 mmol) of Ir(2,4-F-PPy) [1-(St-Me)-acac] as yellow crystal. Yield: 83%. Identification was performed by elementary analysis of C, H and N and ¹H-NMR.

¹H-NMR (CDCl₃, ppm): δ 8.39 (d, 1H, J=5.7 Hz), 8.3-8.2 (m, 2H), 8.04 (d, 1H, J=5.7 Hz), 7.8-7.7 (m, 2H), 7.19 (d, 2H, J=7.8 Hz), 7.15 (dd, 1H, J=6.6, 6.6 Hz), 6.97 (dd, 1H, J=6.6, 6.6 Hz), 6.89 (d, 2H, J=7.8 Hz), 6.67 (dd, 1H, J=17.6, 10.8 Hz), 6.4-6.2 (m, 2H), 5.7-5.6 (m, 3H), 5.22 (s, 1H), 5.21 (d, 1H, J=11.1 Hz), 2.62 (t, 2H, J=7.0 Hz), 2.39 (m, 2H), 1.78 (s, 3H).

Elementary analysis Calcd: C, 54.88; H, 3.45; N, 3.56. Found: C, 54.82; H, 3.50; N, 3.49.

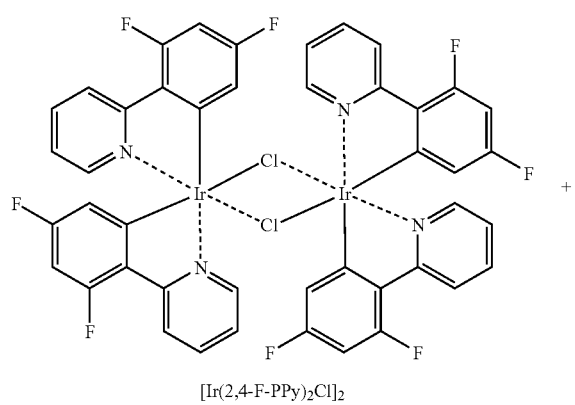

[Ir(2,4-F-PPy)₂Cl]₂

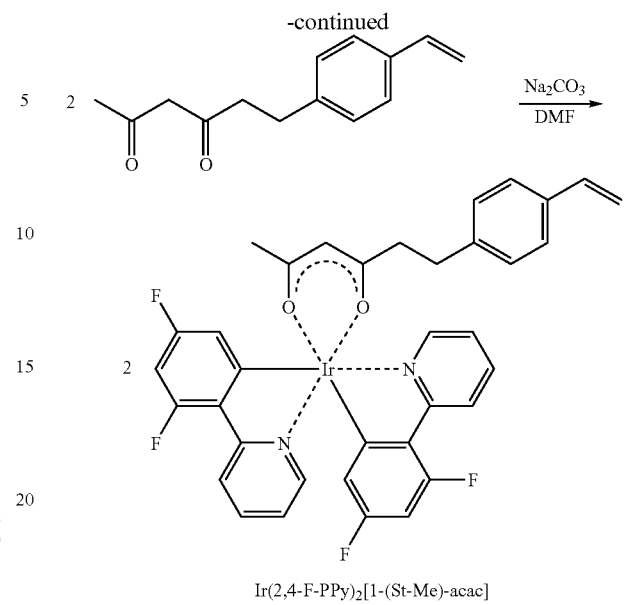

Ir(2,4-F-PPy)₂[1-(St-Me)-acac]

EXAMPLE 44

Synthesis of a Polymerizable Compound {3-[4-(2-methacryloyloxyethyl)carbamoyloxyphenylmethyl]-2,4-pentane-dionato}bis(2-phenylpyridine)iridium (III) (Hereinafter Abbreviated as Ir(PPy)₂[3-(MOI-Ph-Me)acac])

(1) As shown in the Reaction Scheme below, di(1-chloro)tetrakis(2-phenylpyridine) diiridium (III) ([Ir(PPy)₂Cl]₂) and 3-(4-hydroxyphenylmethyl)-2,4-pentanedione synthesized by conventional methods were allowed to react to synthesize [3-(4-hydroxyphenylmethyl)-2,4-pentanedionato]bis(2-phenylpyridine)iridium (III) (hereinafter abbreviated as Ir(PPy)₂[3-(OH-Ph-Me)-acac]).

That is, 56 mg (0.052 mmol) of [Ir(PPy)₂Cl]₂ and 44 mg (0.42 mmol) of sodium carbonate were dissolved in 5 ml of DMF. To this solution was added a solution of 30 mg (0.15 mmol) of 3-(4-hydroxyphenylmethyl)-2,4-pentanedione synthesized by the known method (C. Cativiela, et al., J. Org. Chem., 60, 3074 (1995)) in 5 ml of DMF and the mixture was heated at 80° C. for 1.5 hours with stirring. Then to the reaction mixture cooled to room temperature were added dilute hydrochloric acid and chloroform and the mixture was well shaken. The organic layer was separated and the solvent was distilled off by using a rotary evaporator and the residue was passed through a silica gel column with a mixed solvent of hexane/ethyl acetate of 1:1 (by volume ratio) as an eluent to separate a band of a main product. Distilling off the solvent from the obtained pale yellow solution and recrystallization of the residue from a mixed solution of dichloromethane/hexane afforded 34 mg (0.048 mmol) of Ir(PPy)₂[3-(OH-Ph-Me)-acac] as pale yellow solid. Yield: 46%. Identification was performed by elementary analysis of C, H and N and ¹H-NMR.

¹H-NMR (CDCl₃, ppm): δ 8.58 (d, J=5.9 Hz, 2H, PPy), 7.84 (d, J=7.8 Hz, 2H, PPy), 7.73 (t, J=6.5 Hz, 2H, PPy), 7.55 (d, J=7.6 Hz, 2H, PPy), 7.1-6.6 (m, 10H, aromatic), 6.27 (d, J=7.6 Hz, 2H, PPy), 4.86 (br-s, 1H, OH), 3.62 (s, 2H, benzyl), 1.80 (s, 6H, methyl).

Elementary analysis Calcd: C, 57.86; H, 4.14; N, 3.97. ($C_{34}H_{29}IrN_2O_3$) Found: C, 57.97; H, 4.22; N, 4.15.

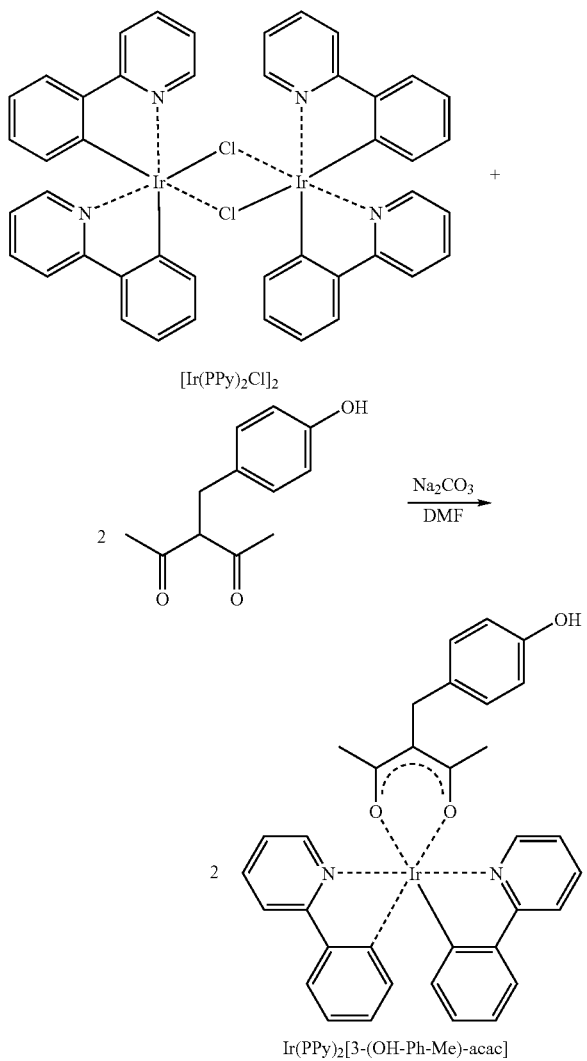

(2) As shown in the Reaction Scheme below, the obtained Ir(PPy)$_2$[3-(OH-Ph-Me)-acac] and 2-methacryloyloxyethyl isocyanate (Trade name "Karenz MOI", manufactured by Showa Denko K. K., hereinafter sometimes referred to as "MOI") were allowed to react to synthesize Ir(PPy)$_2$[3-(MOI-Ph-Me)-acac].

That is, a solution of 71 mg (0.10 mmol) of Ir(PPy)$_2$[3-(OH-Ph-Me)-acac], 3 mg (0.014 mmol) of 2,6-di-tert-butyl-4-methylphenol, 27 mg (0.12 mmol) of dibutyltin (IV) dilaurate and 55 mg (0.35 mmol) of MOI in 10 ml of THF was heated at 70° C. for 2 hours with stirring. The obtained reaction mixture was concentrated to dryness under reduced pressure by using a rotary evaporator and the residue was passed through a silica gel column with a mixed solvent of hexane/ethyl acetate of 1:1 (by volume ratio) as an eluent. The pale yellow solution eluted next to the initially eluted pale yellow byproduct was recovered and concentrated to dryness under reduced pressure. The obtained solid was dissolved in a small amount of dichloromethane and hexane was added thereto to form precipitate, which was collected by filtration and dried under reduced pressure to obtain 59 mg (0.069 mmol) of the objective Ir(PPy)$_2$[3-(MOI-Ph-Me)-acac] as pale yellow solid. Yield: 68%. Identification was performed by elementary analysis of C, H and N and $^1$H-NMR.

$^1$H-NMR (CDCl$_3$, ppm): δ 8.58 (d, J=5.9 Hz, 2H, PPy), 7.88 (d, J=7.8 Hz, 2H, PPy), 7.76 (t, J=6.5 Hz, 2H, PPy), 7.57 (d, J=7.6 Hz, 2H, PPy), 7.2-6.6 (m, 10H, aromatic), 6.27 (d, J=7.6 Hz, 2H, PPy), 6.16 (s, 1H, olefinic), 5.63 (s, 1H, olefinic), 5.31 (br-s, 1H, NH), 4.31 (m, 2H, ethylene), 3.69 (s, 2H, benzyl), 3.59 (m, 2H, ethylene), 1.98 (s, 3H, methacryl-methyl), 1.80 (s, 6H, diketonate-methyl).

Elementary analysis Calcd: C, 57.20; H, 4.45; N, 4.88. ($C_{41}H_{38}IrN_3O_6$) Found: C, 57.36; H, 4.43; N, 4.91.

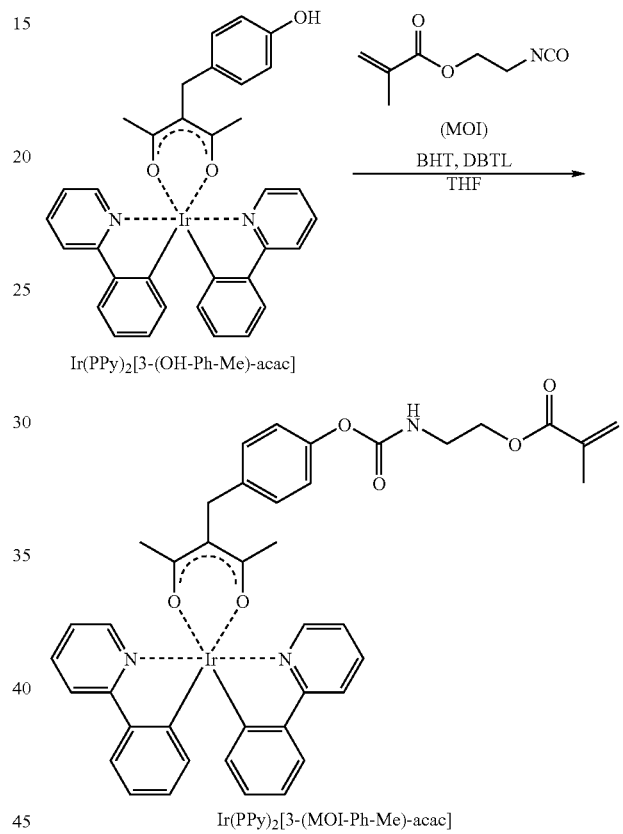

EXAMPLE 45

Synthesis of a Polymerizable Compound bis(2-(2,4-difluorophenyl)pyridinato)(3-methacryloyloxypicolinato) Iridium (III) (Hereinafter Abbreviated as Ir(2, 4-F-PPy)$_2$(3-MA-pic)).

(1) As shown in the Reaction Scheme below, bis(2-(2,4-difluorophenyl)pyridinato)(3-hydroxypicolinato) Iridium (III) (hereinafter abbreviated as Ir(2,4-F-PPy)$_2$(3-OH-pic)) was synthesized.

That is, 10 ml of dry N,N-dimethylformamide (DMF) was added to 121.6 mg (0.1 mmol) of [Ir(2,4-F-PPy)$_2$Cl]$_2$) prepared in the same manner as in Example 43(1) and (2), 41.7 mg (0.3 mmol) of 3-hydroxypicolinic acid, and 106.0 mg (1.0 mmol) of sodium carbonate under argon stream and the mixture was stirred at 80° C. for 2 hours. After adding 50 ml of water, the reaction mixture was extracted with ethyl acetate. After drying the obtained solution over magnesium sulfate, it was concentrated and purified by column chromatography (silica gel, methanol:chloroform=3:97 (by volume ratio)). Recrystallization from hexane/chloroform afforded 101.0 mg of Ir(2,4-F-PPy)$_2$(3-OH-pic) as yellow crystal. Yield: 71%. Identification was performed by elementary analysis of C, H and N and $^1$H-NMR.

$^1$H-NMR (DMSO-d$_6$, ppm): δ 13.6 (br, 1H), 8.50 (d, 1H, J=5.9 Hz), 8.25 (d, 2H, J=11.1 Hz), 8.1-8.0 (m, 2H), 7.69 (d, 1H, J=5.7 Hz), 7.62 (d, 1H, J=8.1 Hz), 7.53 (d, 1H, J=4.6 Hz), 7.50 (d, 1H, J=5.7 Hz), 7.36 (t, 1H, J=4.5 Hz), 7.24 (d, 1H, J=5.1 Hz), 6.9-6.7 (m, 2H), 5.66 (dd, 1H, J=8.6, 2.4 Hz), 5.48 (dd, 1H, J=8.6, 2.4 Hz).

Elementary analysis Calcd: C, 47.32; H, 2.27; N, 5.91. Found: C, 47.29; H, 2.33; N, 5.86.

Recrystallization of the purified product from hexane/chloroform afforded 63.1 mg of Ir(2,4-F-PPy)$_2$(3-MA-pic) as yellow crystal. Yield: 81%. Identification was performed by $^1$H-NMR and elementary analysis of C, H and N.

$^1$H-NMR (DMSO-d$_6$, ppm): δ 8.51 (d, 1H, J=5.4 Hz), 8.3-8.2 (m, 2H), 8.1-7.9 (m, 3H), 7.8-7.6 (m, 3H), 7.52 (dd, 1H, J=6.6, 6.6 Hz), 7.35 (dd, 1H, J=6.6, 6.6 Hz), 6.9-6.7 (m, 2H), 6.26 (s, 1H), 5.88 (s, 1H), 5.68 (dd, 1H, J=8.4, 2.4 Hz), 5.44 (dd, 1H, J=8.4, 2.4 Hz), 2.00 (s, 3H).

Elementary analysis Calcd: C, 49.36; H, 2.59; N, 5.40. Found: C, 49.33; H, 2.60; N, 5.41.

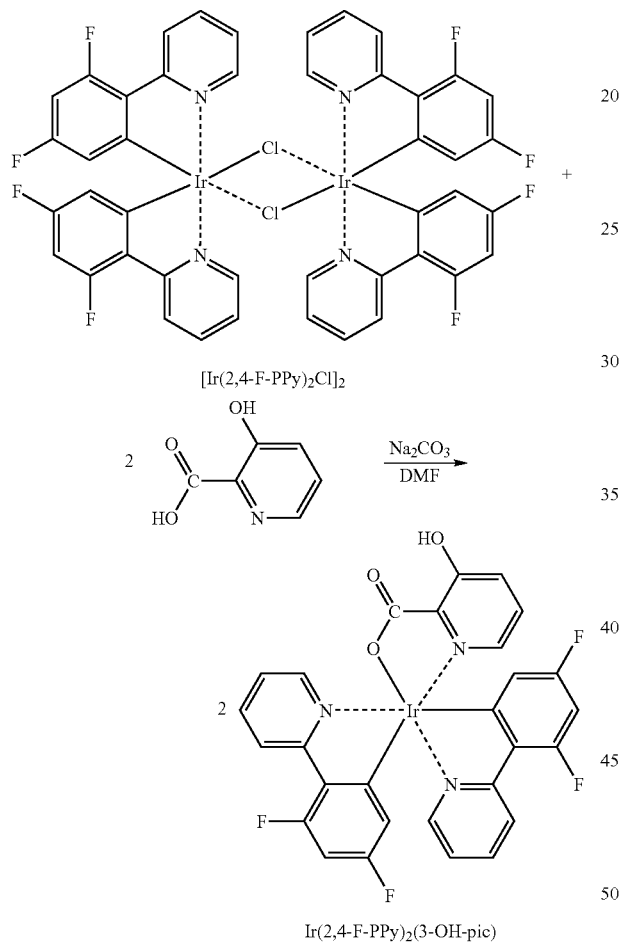

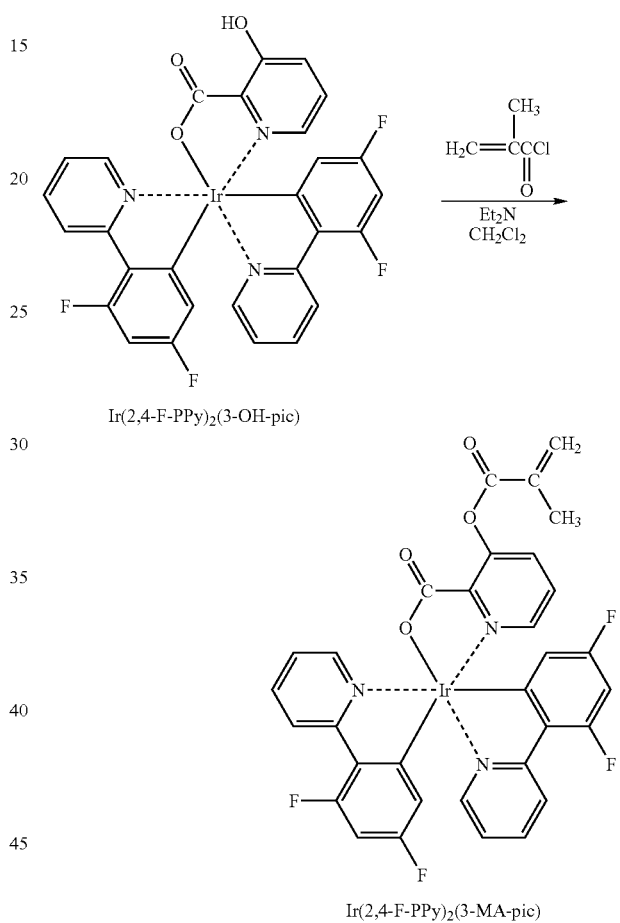

(2) As shown in the Reaction Scheme below, Ir(2,4-F—PPy)$_2$ (3-MA-pic) was synthesized.

That is, 71.1 mg (0.10 mmol) of Ir(2,4-F—PPy)$_2$(3-OH-pic) and 0.2 mg of 2,6-di-t-butyl-4-methylphenol were dissolved in 10 ml of dry dichloromethane under argon stream and 101.2 mg (1.0 mmol) of triethylamine, and 52.3 mg (0.50 mmol) of methacryloyl chloride were added to the solution, followed by stirring the mixture at room temperature for 2 hours. To the reaction mixture was added 50 ml of water and then the reaction mixture was extracted with chloroform. After drying the obtained solution over magnesium sulfate, it was concentrated and purified by column chromatography (silica gel, methanol:chloroform=1:24 (by volume ratio)).

EXAMPLE 46

Synthesis of a Polymerizable Compound bis(2-(2,4-difluorophenyl)pyridinato)(5-methacryloyloxymethylpicolinato) Iridium (III) (Hereinafter Abbreviated as Ir(2,4-F-PPy)$_2$ (5-CH$_2$MA-pic)).

(1) As shown in the Reaction Scheme below, bis(2-(2,4-difluorophenyl)pyridinato)(5-(hydroxymethyl)picolinato) Iridium (III) (hereinafter abbreviated as Ir(2,4-F-PPy)$_2$(5-CH$_2$OH-pic)) was synthesized.

That is, 10 ml of dry N,N-dimethylformamide (DMF) was added to 121.6 mg (0.1 mmol) of [Ir(2,4-F-PPy)$_2$Cl]$_2$), 45.9 mg (0.3 mmol) of 5-hydroxymethylpicolinic acid, and 106.0 mg (1.0 mmol) of sodium carbonate under argon stream and the mixture was stirred at 80° C. for 2 hours. After adding 50 ml of water, the reaction mixture was extracted with ethyl acetate. After drying the obtained solution over magnesium sulfate, it was concentrated and purified by column chromatography (silica gel, methanol chloroform=1:19 (by volume ratio)). Recrystallization from hexane/chloroform afforded 108.7 mg of Ir(2,4-F-PPy)$_2$(5-CH$_2$OH-pic) as yellow crystal. Yield: 75%. Identification was performed by $^1$H-NMR and elementary analysis of C, H and N.

$^1$H-NMR (DMSO-d$_6$, ppm): δ 8.54 (d, 1H, J=4.6 Hz), 8.3-8.2 (m, 2H), 8.1-8.0 (m, 4H), 7.70 (s, 1H), 7.61 (d, 1H, J=4.9 Hz), 7.49 (dd, 1H, J=6.6 Hz, 6.6 Hz), 7.32 (dd, 1H, J=6.6 Hz, 6.6 Hz), 6.9-6.7 (m, 2H), 5.71 (dd, 1H, J=8.9 Hz, 2.4 Hz), 5.46 (dd, 1H, J=8.5 Hz, 2.3 Hz), 5.42 (t, 1H, J=4.6 Hz), 4.49 (d, 2H, J=4.6 Hz).

Elementary analysis Calcd: C, 48.06; H, 2.50; N, 5.80. Found: C, 48.05; H, 2.54; N, 5.86.

roform afforded 70.6 mg of Ir(2,4-F-PPy)$_2$(5-CH$_2$MA-pic) as yellow crystal. Yield: 89%. Identification was performed by $^1$H-NMR and elementary analysis of C, H and N.

$^1$H-NMR (DMSO-d$_6$, ppm): δ 8.53 (d, 1H, J=5.1 Hz), 8.28 (d, 1H, J=8.4 Hz), 8.22 (d, 1H, J=8.6 Hz), 8.1-8.0 (m, 4H), 7.70 (s, 1H), 7.66 (d, 1H, J=4.9 Hz), 7.48 (dd, 1H, J=6.5 Hz, 6.5 Hz), 7.31 (dd, 1H, J=6.5 Hz, 6.5 Hz), 6.9-6.7 (m, 2H), 5.84 (s, 1H), 5.7-5.6 (m, 2H), 5.47 (dd, 1H, J=8.8 Hz, 2.6 Hz), 5.24 (d, 2H, J=2.7 Hz), 1.78 (s, 3H).

Elementary analysis Calcd: C, 50.00; H, 2.80; N, 5.30. Found: C, 49.92; H, 2.87; N, 5.28.

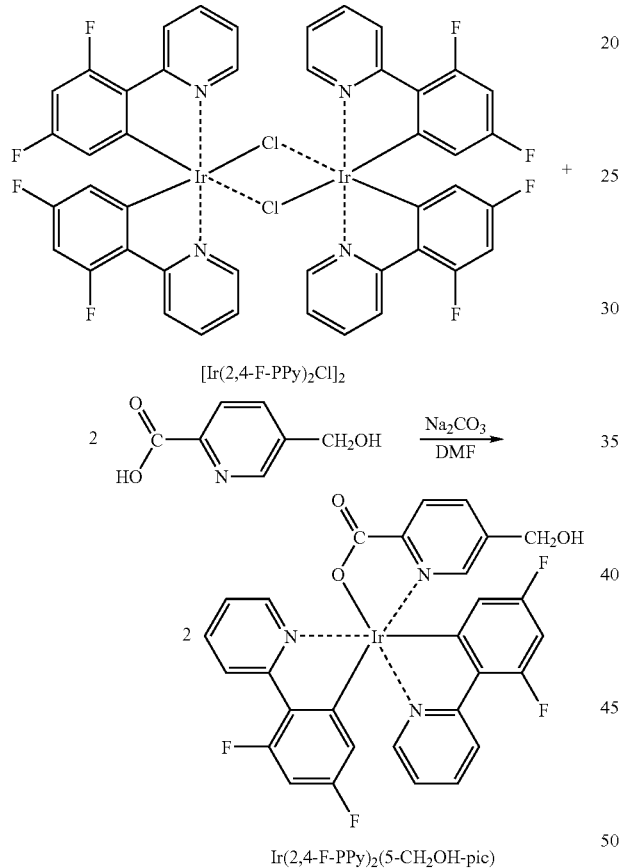

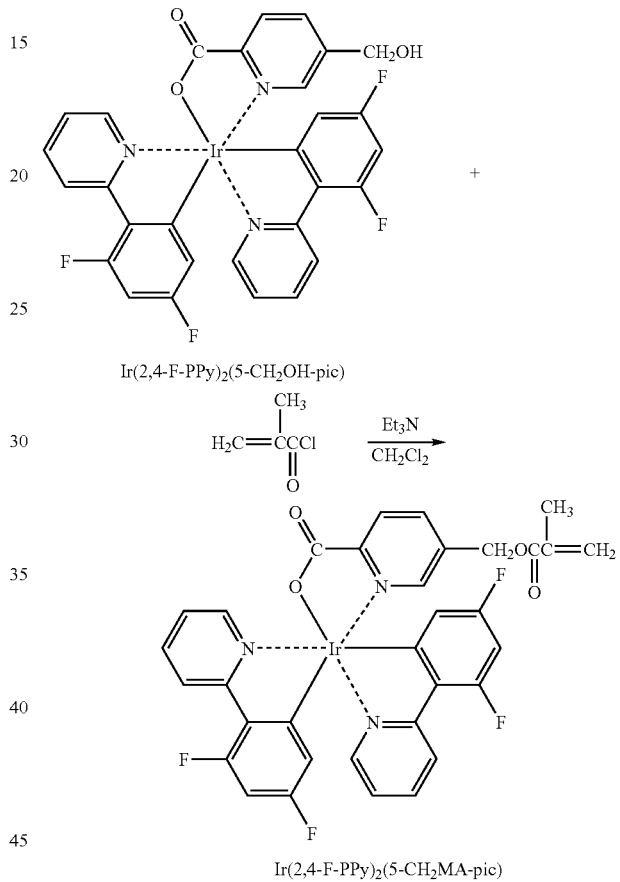

(2) As shown in the Reaction Scheme below, Ir(2,4-F-PPy)$_2$(5-CH$_2$MA-pic) was synthesized.

That is, 72.5 mg (0.1 mmol) of Ir(2,4-F-PPy)$_2$(5-CH$_2$OH-pic) and 0.2 mg of 2,6-di-t-butyl-4-methylphenol were dissolved in 10 ml of dry dichloromethane under argon stream and 101.2 mg (1.0 mmol) of triethylamine, and 52.3 mg (0.5 mmol) of methacryloyl chloride were added to the solution, followed by stirring, the mixture at room temperature for 2 hours. To the reaction mixture was added 50 ml of water and then the reaction mixture was extracted with chloroform. After drying the obtained solution over magnesium sulfate, it was concentrated and purified by column chromatography (silica gel, methanol:chloroform=3:97 (by volume ratio)). Recrystallization of the purified product from hexane/chlo-

EXAMPLE 47

Synthesis of a Polymerizable Compound bis(2-(2,4-difluorophenyl)pyridinato)(5-(2-(methacryloyloxy)ethyl-carbamoyloxymethyl)picolinato) Iridium (III) (Hereinafter Abbreviated as Ir(2,4-F-PPy)$_2$(5-CH$_2$MOI-pic)).

As shown in the Reaction Scheme below, Ir(2,4-F-PPy)$_2$(5-CH$_2$MOI-pic) was synthesized.

That is, 72.5 mg (0.1 mmol) of Ir(2,4-F-PPy)$_2$(5-CH$_2$OH-pic) as the intermediate in Example 46, 0.2 mg of 2,6-di-t-butyl-4-methylphenol (BHT) and 1.3 mg of dibutyltin (IV) dilaurate (DBTL) were dissolved in 10 ml of dry tetrahydrofuran. To this was added 31.0 mg (0.2 mmol) of 2-methacryloyloxyethyl isocyanate (Trade name "Karenz MOI", manufactured by Showa Denko K.K., hereinafter sometimes referred to as "MOI") and the mixture was stirred at 50° C. for 1 hour. To the reaction mixture was added 50 ml of water and then the reaction mixture was extracted with chloroform. After drying the obtained solution over magnesium sulfate, it was concentrated and purified by column chromatography (silica gel, methanol:chloroform=3:97 (by volume ratio)). Recrystallization of the purified product from hexane/chloroform afforded 76.4 mg of Ir(2,4-F-PPy)$_2$(5-CH$_2$MOI-pic) as yellow crystal. Yield: 87%. Identification was performed by $^1$H-NMR and elementary analysis of C, H and N.

$^1$H-NMR (DMSO-d$_6$, ppm): δ 8.53 (d, 1H, J=5.1 Hz), 8.32 (dd, 2H, J=8.0, 1.8 Hz), 8.25 (d, 1H, J=8.9 Hz), 8.22 (d, 1H, J=9.2 Hz), 8.1-8.0 (m, 3H), 7.60 (d, 1H, J=4.6 Hz), 7.51 (dd, 1H, J=6.5, 6.5 Hz), 7.35 (dd, 1H, J=6.5, 6.5 Hz), 6.9-6.7 (m, 2H), 6.10 (s, 1H), 5.87 (s, 1H), 5.71 (dd, 1H, J=8.4, 2.2 Hz), 5.46 (dd, 1H, J=8.8, 2.6 Hz), 4.90 (s, 2H), 4.23 (t, 2H, J=1.9 Hz), 3.47 (m, 2H), 1.90 (s, 3H).

Elementary analysis Calcd: C, 50.62; H, 3.33; N, 6.38. Found: C, 50.59; H, 3.35; N, 6.32.

That is, 10 ml of dry N,N-dimethylformamide was added to 243.2 mg (0.2 mmol) of Ir[(2,4-F-PPy)$_2$Cl]$_2$, 100.3 mg (0.6 mmol) of 2,5-pyridinedicarboxylic acid, and 212.0 mg (2.0 mmol) of sodium carbonate and the mixture was stirred at 80° C. for 2 hours. To the reaction mixture was added 50 ml of 1 N hydrochloric acid to precipitate the product, which was filtered. This was dissolved in a small amount of chloroform and purified using column chromatography (silica gel, methanol:chloroform=1:4). Further, reprecipitation of the purified product from hexane/ethanol afforded 204.0 mg of Ir(2,4-F-PPy)$_2$(5-COOH-pic) as yellow crystal. Yield: 69%. Identification was performed by $^1$H-NMR and elementary analysis of C, H and N.

$^1$H-NMR (DMSO-d$_6$, ppm): δ 10.7 (s, 1H), 8.53 (d, 1H, J=5.1 Hz), 8.37 (dd, 2H, J=8.0, 1.8 Hz), 8.28 (d, 1H, J=8.9 Hz), 8.25 (d, 1H, J=9.2 Hz), 8.1-8.0 (m, 3H), 7.59 (d, 1H, J=4.6 Hz), 7.47 (dd, 1H, J=6.5, 6.5 Hz), 7.32 (dd, 1H, J=6.5, 6.5 Hz), 6.9-6.7 (m, 2H), 5.70 (dd, 1H, J=8.4, 2.2 Hz), 5.48 (dd, 1H, J=8.8, 2.6 Hz).

Elementary analysis Calcd: C, 47.15; H, 2.18; N, 5.69. Found: C, 47.10; H, 2.28; N, 5.66.

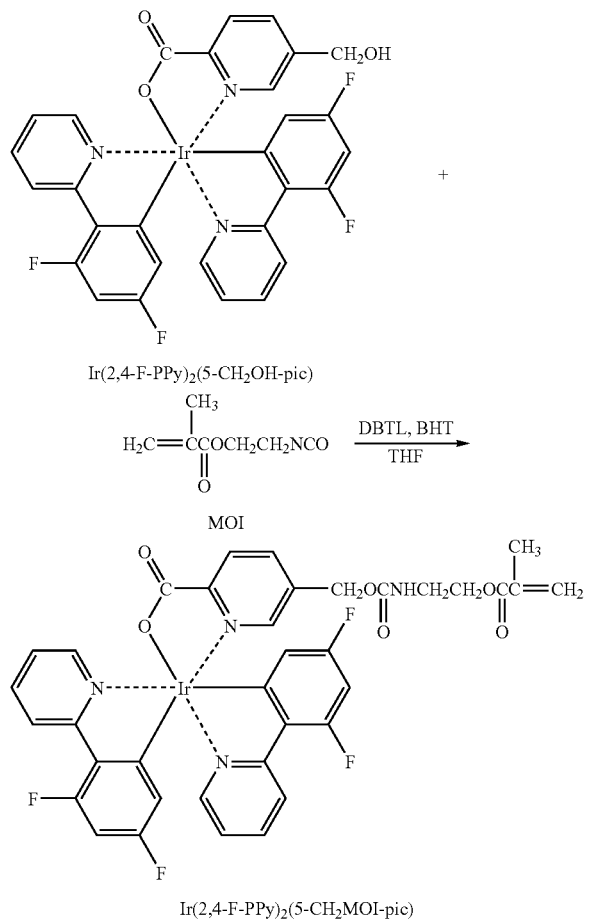

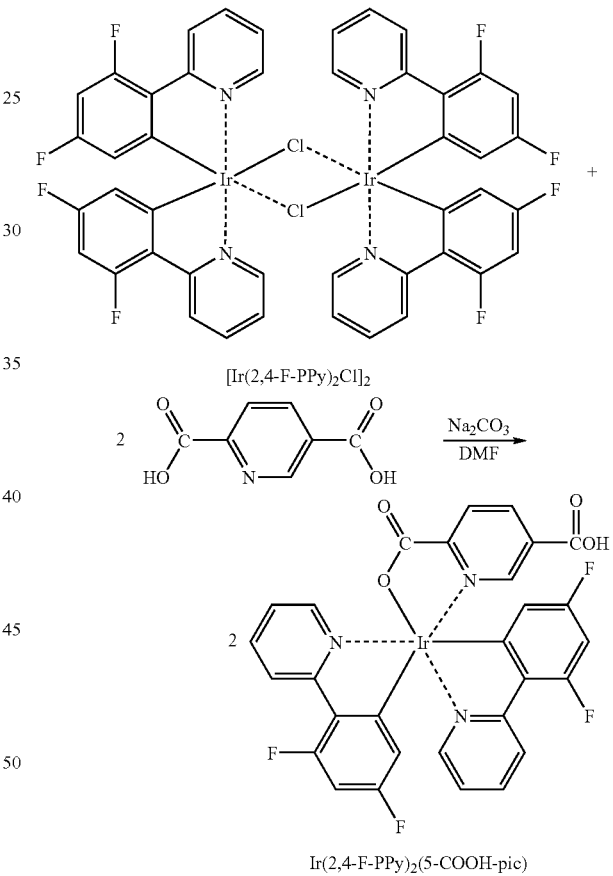

EXAMPLE 48

Synthesis of a Polymerizable Compound bis(2-(2,4-difluorophenyl)pyridinato) (5-(2-(methacryloyloxy) ethoxycarbonyl)picolinato) Iridium (III) (Hereinafter Abbreviated as Ir (2,4-F-PPy)$_2$(5-COHEMA-pic)).

(1) As shown in the Reaction Scheme below, bis(2-(2,4-difluorophenyl)pyridinato) (5-carboxypicolinato) Iridium (III) (hereinafter abbreviated as Ir(2,4-F-PPy)$_2$(5-COOH-pic)) was synthesized.

(2) As shown in the Reaction Scheme below, Ir(2,4-F-PPy)$_2$ (5-COHEMA-pic) was synthesized.

That is, 73.9 mg (0.1 mmol) of Ir(2,4-F-PPy)$_2$(5-COOH-pic), 52.5 mg (0.2 mmol) of triphenylphoshine (PPh$_3$), 19.5 mg (0.15 mmol) of 2-hydroxyethyl methacrylate were dissolved in 10 ml of dry THF under argon stream and 65.3 mg (0.15 mmol) of a 40% toluene solution of diethyl azodicarboxylate (DEAD) was dripped thereto at −20° C. The mixture was left to stand as it was while the temperature was elevated to room temperature and the mixture was stirred for 2 hours. After completion of the reaction, the solvent was distilled off and the reaction mixture was concentrated to dryness. Then the residue was dissolved in a small amount of chloroform and purified using column chromatography (silica gel, methanol chloroform=1:19 (by volume ratio)). Recrystallization of the purified product from hexane/chloroform afforded 61.5 mg of Ir(2,4-F-PPy)$_2$(5-COHEMA-pic) as yellow crystal. Yield: 72%. Identification was performed by $^1$H-NMR and elementary analysis of C, H and N.

$^1$H-NMR (DMSO-d$_6$, ppm): δ 8.54 (d, 1H, J=5.1 Hz), 8.37 (dd, 2H, J=8.0, 1.8 Hz), 8.31 (d, 1H, J=8.9 Hz), 8.27 (d, 1H, J=9.2 Hz), 8.1-8.0 (m, 3H), 7.57 (d, 1H, J=4.6 Hz), 7.46 (dd, 1H, J=6.5, 6.5 Hz), 7.32 (dd, 1H, J=6.5, 6.5 Hz), 6.9-6.7 (m, 2H), 6.10 (s, 1H), 5.87 (s, 1H), 5.71 (dd, 1H, J=8.4, 2.2 Hz), 5.51 (dd, 1H, J=8.8, 2.6 Hz), 4.64 (t, 2H, J=2.0 Hz), 4.55 (t, 2H, J=2.0 Hz), 1.93 (s, 3H).

Elementary analysis Calcd: C, 49.41; H, 2.84; N, 4.94. Found: C, 49.38; H, 2.88; N, 4.95.

under argon stream and 30.5 mg (0.2 mmol) of 4-vinylbenzyl chloride was further added thereto. The mixture was stirred at 80° C. for 4 hours. To the reaction mixture was added 50 ml of water to precipitate the product, which was collected by filtration and purified by column chromatography (silica gel, methanol:chloroform=3:97 (by volume ratio)). Recrystallization of the purified product from hexane/chloroform afforded 24.0 mg of Ir(2,4-F-PPy)$_2$(3-ST-pic) as yellow crystal. Yield: 58%. Identification was performed by $^1$H-NMR and elementary analysis of C, H and N.

$^1$H-NMR (DMSO-d$_6$, ppm): δ 8.59 (d, 1H, J=5.1 Hz), 8.3-8.2 (m, 2H), 8.1-8.0 (m, 2H), 7.9 (d, 1H, J=8.6 Hz), 7.67 (d, 1H, J=5.1 Hz), 7.6-7.3 (m, 7H), 6.9-6.7 (m, 3H), 5.85 (d, 1H, J=17.8 Hz), 5.67 (dd, 1H, J=8.9, 2.4 Hz), 5.45 (dd, 1H, J=8.9, 2.4 Hz), 5.29 (s, 2H), 5.27 (d, 1H, J=11.1 Hz).

Elementary analysis Calcd: C, 53.75; H, 2.93; N, 5.08. Found: C, 53.71; H, 2.90; N, 5.03.

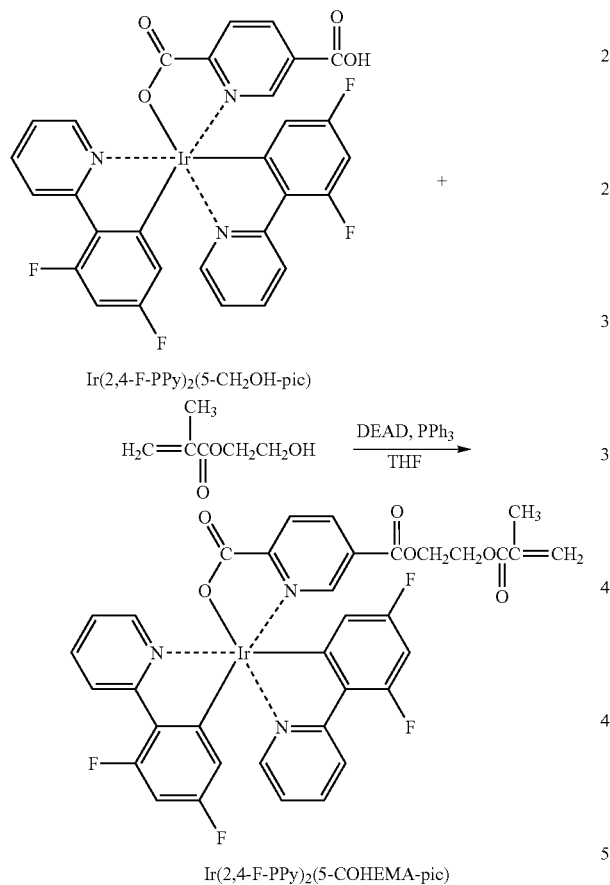

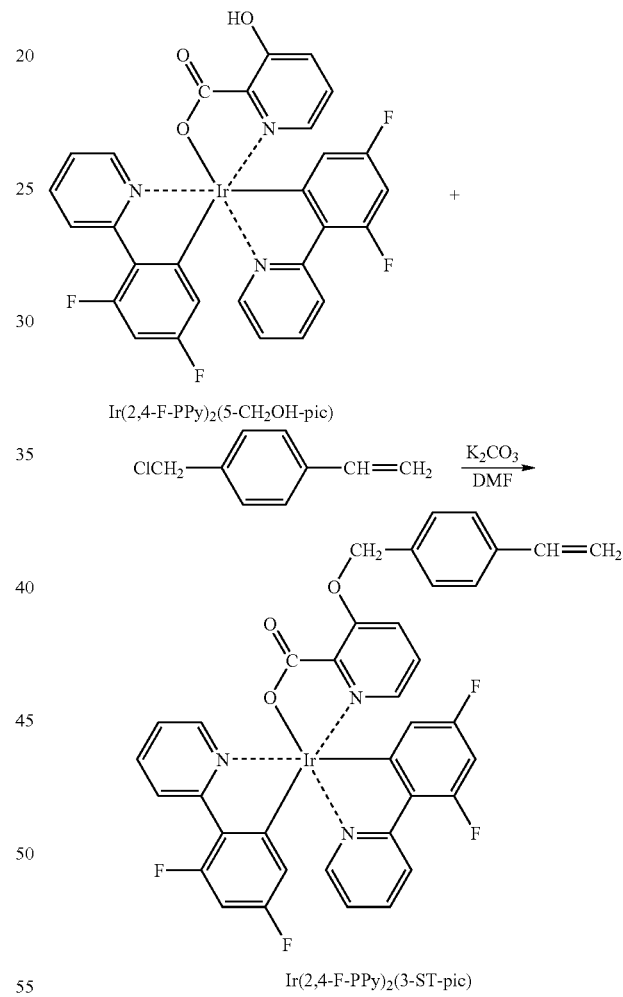

EXAMPLE 49

Synthesis of a Polymerizable Compound bis(2-(2,4-difluorophenyl)pyridinato) (3-(4-(vinylphenyl)methoxy-picolinato) Iridium (III) (Hereinafter Abbreviated as Ir(2,4-F-PPy)$_2$(3-ST-pic)).

As shown in the Reaction Scheme below, Ir(2,4-F-PPy)$_2$(3-ST-pic) was synthesized.

That is, 5 ml of dry N,N-dimethylformamide was added to 35.5 mg (0.05 mmol) of Ir(2,4-F-PPy)$_2$(3-OH-pic) as the intermediate in Example 45, 69.1 mg (0.5 mmol) of potassium carbonate, and 0.1 mg of 2,6-di-t-butyl-4-methylphenol

EXAMPLE 50

Synthesis of a Polymerizable Compound bis(2-phenylpyridinato) (3-methacryloyloxypicolinato) Iridium (III) (Hereinafter Abbreviated as Ir(PPy)$_2$(3-MA-pic))

(1) As shown in the Reaction Scheme below, bis(2-phenylpyridinato) (3-hydroxypicolinato) Iridium (III) (hereinafter abbreviated as Ir(PPy)$_2$(3-OH-pic)) was synthesized.

That is, 10 ml of dry N,N-dimethylformamide (DMF) was added to 107.2 mg (0.1 mmol) of di(μ-chloro)tetrakis(2-phenylpyridine) diiridium (III) (hereinafter abbreviated as [Ir(PPy)$_2$Cl]$_2$) synthesized by a conventional method, 41.7 mg (0.3 mmol) of 3-hydroxypicolinic acid, and 106.0 mg (1.0 mmol) of sodium carbonate under argon stream and the mixture was stirred at 80° C. for 2 hours. After adding 50 ml of water, the reaction mixture was extracted with chloroform. After drying the obtained solution over magnesium sulfate, it was concentrated and purified by column chromatography (silica gel, methanol:chloroform=1:19 (by volume ratio)). Recrystallization from hexane/chloroform afforded 106.0 mg of Ir(PPy)$_2$(3-OH-pic) as yellow crystal. Yield: 83%. Identification was performed by $^1$H-NMR and elementary analysis of C, H and N.

$^1$H-NMR (DMSO-d$_6$, ppm): δ 8.46 (d, 1H, J=4.9 Hz), 8.23 (d, 1H, J=8.1 Hz), 8.20 (d, 1H, J=8.6 Hz), 8.0-7.9 (m, 2H), 7.80 (m, 2H), 7.60 (dd, 1H, J=5.9, 5.9 Hz), 7.55 (d, 1H, J=1.4 Hz), 7.47 (dd, 1H, J=8.5, 5.0 Hz), 7.40 (dd, 1H, J=5.9, 5.9 Hz), 7.26 (dd, 1H, J=5.9, 5.9 Hz), 7.16 (dd, 1H, J=4.9, 1.4 Hz), 6.90 (dd, 1H, J=7.6, 7.6 Hz), 6.87 (dd, 1H, J=7.6, 7.6 Hz), 6.8-6.7 (m, 2H), 6.20 (d, 1H, J=7.6 Hz), 6.05 (d, 1H, J=7.6 Hz).

Elementary analysis Calcd: C, 52.65; H, 3.16; N, 6.58. Found: C, 52.62; H, 3.21; N, 6.57.

(2) As shown in the Reaction Scheme below, Ir(PPy)$_2$(3-MA-pic) was synthesized.

That is, 31.9 mg (0.05 mmol) of Ir(PPy)$_2$(3-OH-pic) and 0.1 mg of 2,6-di-t-butyl-4-methylphenol were dissolved in 5 ml of dry dichloromethane under argon stream and 50.6 mg (0.5 mmol) of triethylamine, and 26.1 mg (0.25 mmol) of methacryloyl chloride were added to the solution, followed by stirring the mixture at room temperature for 2 hours. To the reaction mixture was added 50 ml of water and then the reaction mixture was extracted with chloroform. After drying the obtained solution over magnesium sulfate, it was concentrated and purified by column chromatography (silica gel, methanol:chloroform=1:19 (by volume ratio)). Recrystallization of the purified product from hexane/chloroform afforded 23.0 mg of Ir(PPy)$_2$(3-MA-pic) as yellow crystal. Yield: 65%. Identification was performed by $^1$H-NMR and elementary analysis of C, H and N.

$^1$H-NMR (DMSO-d$_6$, ppm): δ 8.50 (d, 1H, J=5.7 Hz), 8.23 (d, 1H, J=4.9 Hz), 8.21 (d, 1H, J=5.7 Hz), 8.0-7.9 (m, 3H), 7.81 (t, 2H, J=8.9 Hz), 7.7-7.5 (m, 3H), 7.42 (dd, 1H, J=6.6, 6.6 Hz), 7.25 (dd, 1H, J=6.3, 6.3 Hz), 6.91 (dd, 1H, J=7.6, 7.6 Hz), 6.86 (dd, 1H, J=7.6, 7.6 Hz), 6.25 (s, 1H), 6.22 (d, 1H, J=7.8 Hz), 6.01 (d, 1H, J=7.3 Hz), 5.87 (s, 1H), 2.01 (s, 3H).

Elementary analysis Calcd: C, 54.38; H, 3.42; N, 5.95. Found: C, 54.29; H, 3.51; N, 5.94.

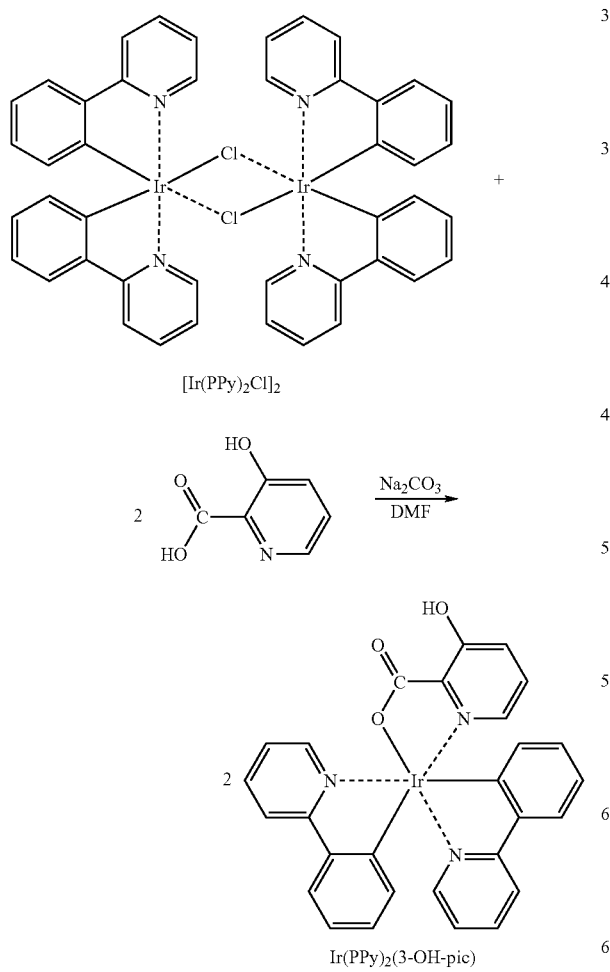

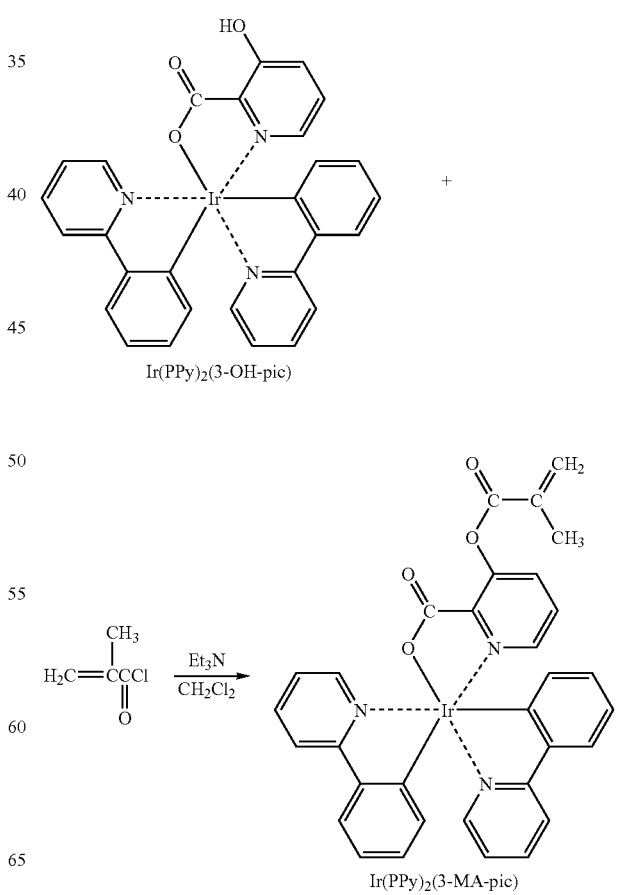

EXAMPLE 51

Synthesis of N-vinylcarbazole/Ir(2,4-F-PPy)$_2$(3-MA-pic) Copolymer (Hereinafter, Abbreviated as VCz-co-Ir(2,4-F-PPy)$_2$ (3-MA-pic))

The titled copolymer was synthesized as a light emitting material containing Ir(2,4-f-PPy)$_2$(3-MA-pic) as a unit having the function of luminescence and N-vinylcarbazole as a unit having the function of hole transportation.

966 mg (5.0 mmol) of N-vinylcarbazole, 38.9 mg (0.05 mmol) of Ir(2,4-f-PPy)$_2$(3-MA-pic), and 8.2 mg (0.05 mmol) of AIBN were dissolved in 25 ml of dry toluene and argon was blown into the obtained solution for 1 hour. This solution was warmed up to 80° C. to initiate polymerization reaction and the reaction mixture was stirred as it was for 8 hours. After cooling, the reaction mixture was dripped into 250 ml of methanol to precipitate a polymer, which was recovered by filtration. Further, the recovered polymer was dissolved in 25 mol of chloroform. This solution was purified by dripping it into 250 ml of methanol to reprecipitate the polymer and dried in vacuum at 60° C. for 12 hours to obtain 673 mg of the objective compound VCz-co-Ir(2,4-F-PPy)$_2$(3-MA-pic). Table 5 shows yields, results of GPC measurements, and Ir complex contents measured by ICP elementary analyses.

EXAMPLES 52 TO 56

Copolymers were synthesized in the same manner as in Example 51 except that the polymerizable compounds prepared in Examples 46 to 50, respectively, were used in place of Ir(2,4-F-PPy)$_2$(3-MA-pic). Table 5 shows yields, results of GPC measurements, and Ir complex contents measured by ICP elementary analyses.

First, poly(3,4-ethylenedioxythiophene)/polystyrene-sulfonic acid (manufactured by Bayer AG, trade name "Baytron P") was coated on the ITO (anode) of the above-mentioned ITO-substrate by a spin coating method under the conditions of 3,500 rpm and a coating time of 40 seconds and dried in a vacuum drier at 60° C. for 2 hours to form an anode buffer layer. The obtained anode buffer layer had a film thickness of about 50 nm.

Then, a coating solution for forming a layer containing a light emitting material and an electron transporting material was prepared. 21.0 mg of the light emitting material shown in Table 6 and 9.0 mg of 2-(4-biphenyl)-5-(4-tert-butylphenyl)-1,3,4-oxadiazole (PBD) (manufactured by Tokyo Kasei Kogyo Co., Ltd.) as an electron transporting material were dissolved in 2970 mg of chloroform (manufactured by Wako Pure Chemical Industries, Ltd., reagent grade) and the obtained solution was filtered through a filter having a pore size of 0.2 µm to prepare a coating solution.

Further, the obtained coating solution was coated on the anode buffer layer by a spin coating method under the conditions of 3,000 rpm and a coating time of 30 seconds and dried at room temperature (25° C.) for 30 minutes to form a layer containing a light emitting material and an electron transporting material. The obtained layer had a film thickness of about 100 nm.

Then, the substrate having formed thereon a layer containing a light emitting material and an electron transporting material was placed in a vapor deposition apparatus and silver and magnesium were codeposited in a weight ratio of 1:10 to form two cathodes in the form of stripes of 3 mm in width so as to cross the direction of length of the anodes at right angles. The obtained cathodes had a film thickness of about 50 nm.

TABLE 5

| Example | Polymer | Recovery (%) | GPC Measurement | | | Ir Complex Content (mol %) |
| --- | --- | --- | --- | --- | --- | --- |
| | | | Mn | Mw | Mw/Mn | |
| 51 | VCz-co-Ir(2,4-F-PPy)$_2$(3-MA-pic) | 67 | 4500 | 12800 | 2.84 | 1.07 |
| 52 | VCz-co-Ir(2,4-F-PPy)$_2$(5-CH$_2$MA-pic) | 79 | 4300 | 13600 | 3.16 | 1.04 |
| 53 | VCz-co-Ir(2,4-F-PPy)$_2$(5-CH$_2$MOI-pic) | 63 | 5100 | 14800 | 2.90 | 1.02 |
| 54 | VCz-co-Ir(2,4-F-PPy)$_2$(5-COHEMA-pic) | 61 | 4100 | 13700 | 3.34 | 0.98 |
| 55 | VCz-co-Ir(2,4-F-PPy)$_2$(3-ST-pic) | 72 | 4600 | 11400 | 2.48 | 1.04 |
| 56 | VCz-co-Ir(PPy)$_2$(3-MA-pic) | 74 | 4400 | 13000 | 2.95 | 1.01 |

Mn: Number average molecular weight
Mw: Weight average molecular weight

EXAMPLES 57 TO 62

Fabrication and Evaluation of Organic Light Emitting Devices

Organic light emitting devices were fabricated by using ITO-substrate (manufactured by Nippo Electric Co., Ltd.) which is 25 mm×25 mm glass substrates provided on one side thereof with two ITO (indium tin oxide) electrodes serving as anodes, each being 4 mm in width formed in the form of stripes.

Finally, in an argon atmosphere, lead wires (wiring) were attached to the anodes and cathodes to fabricate four organic light emitting devices of 4 mm (length)×3 mm (width). Voltage was applied to the above-mentioned organic EL devices by using a programmable direct voltage/current source TR6143 manufactured by Advantest Corporation to cause luminescence and the luminance was measured by using a luminance meter BM-8 manufactured by Topcon Corporation. As a result, the luminescence starting voltage and initial luminance at 20V as shown in Table 6 were obtained (average of four devices for each light emitting material).

TABLE 6

| Example | Light Emitting Material Polymer | Example | Luminescence Starting voltage (V) | 20 V Initial Luminance (cd/m$^2$) |
|---|---|---|---|---|
| 57 | VCz-co-Ir(2,4-F-PPy)$_2$(3-MA-pic) | 54 | 8 | 790 |
| 58 | VCz-co-Ir(2,4-F-PPy)$_2$(5-CH$_2$MA-pic) | 55 | 8 | 500 |
| 59 | VCz-co-Ir(2,4-F-PPy)$_2$(5-CH$_2$MOI-pic) | 56 | 9 | 640 |
| 60 | VCz-co-Ir(2,4-F-PPy)$_2$(5-COHEMA-pic) | 57 | 8 | 740 |
| 61 | VCz-co-Ir(2,4-F-PPy)$_2$(3-ST-pic) | 58 | 9 | 800 |
| 62 | VCz-co-Ir(PPy)$_2$(3-MA-pic) | 59 | 8 | 910 |

EXAMPLE 63

Synthesis of a Polymerizable Compound [6-(4-vinylphenyl)-2,4-hexanedionato] bis[2-(2-pyridyl)benzothienyl) iridium (III) (Hereinafter Abbreviated as Ir(btp)$_2$[1-(StMe)-acac])

As shown in the Reaction Scheme below, 6-(4-vinylbiphenyl)-2,4-hexanedione prepared in the same manner as in Example 38(1) and di(μ-chloro)tetrakis(2-(2-pyridyl)benzothienyl) diiridium (III) (hereinafter abbreviated as [Ir(btp)$_2$Cl]$_2$) synthesized by a conventional method (cf., e.g., S. Lamansky, et al., Inorganic Chemistry, 40, 1704 (2001)) were allowed to react to synthesize Ir(btp)$_2$[1-(StMe)-acac)].

That is, to a suspension of 253 mg (0.20 mmol) of [Ir(btp)$_2$Cl]$_2$ in 10 ml of N,N-dimethylformamide (hereinafter abbreviated as DMF) were added 161 mg (0.74 mmol) of 6-(4-vinylphenyl)-2,4-hexanedione, 64 mg of sodium carbonate and 1.9 mg (0.0086 mmol) of 2,6-di-tert-butyl-4-methylphenol (hereinafter abbreviated as BHT), and the mixture was heated at 80° C. for 1 hour with stirring. To the reaction mixture were added 100 ml of water and 50 ml of chloroform and the obtained mixture was well shaken. The organic layer was dried over magnesium sulfate and then concentrated to dryness under reduced pressure by using a rotary evaporator. Then, the crude product was purified through a silica gel column with dichloromethane as an eluent to obtain a reddish brown solution. The solution was concentrated under reduced pressure and hexane was added thereto followed by recrystallization at −20° C. to obtain 153 mg (0.18 mg) of the objective Ir(btp)$_2$[1-(StMe)-acac] as reddish brown solid. Yield: 47%. Identification was performed by elementary analysis of C, H and N and $^1$H-NMR.

$^1$H-NMR (CDCl$_3$, ppm): δ 8.40 (d, J=5.4 Hz, 1H, btp), 7.97 (d, J=5.4 Hz, 1H, btp), 7.65 (m, 6H, btp), 7.1-6.7 (m, 10H, aromatic), 6.63 (dd, J=17.8, 11.1 Hz, 1H, vinylic), 6.24 (d, J=8.1 Hz, 1H, btp), 6.16 (d, J=7.8 Hz, 1H, btp), 5.65 (d, J=17.8 Hz, 1H, vinylic), 5.22 (s, 1H, diketonate-methine), 5.18 (d, J=11.1 Hz, 1H, vinylic), 2.56 (m, 2H, ethylene), 2.37 (m, 2H, ethylene), 1.75 (s, 3H, methyl).

Elementary analysis Calcd: C, 58.02; H, 3.77; N, 3.38. (C$_{40}$H$_{31}$IrN$_2$O$_2$S$_2$) Found: C, 57.79; H, 3.81; N, 3.55.

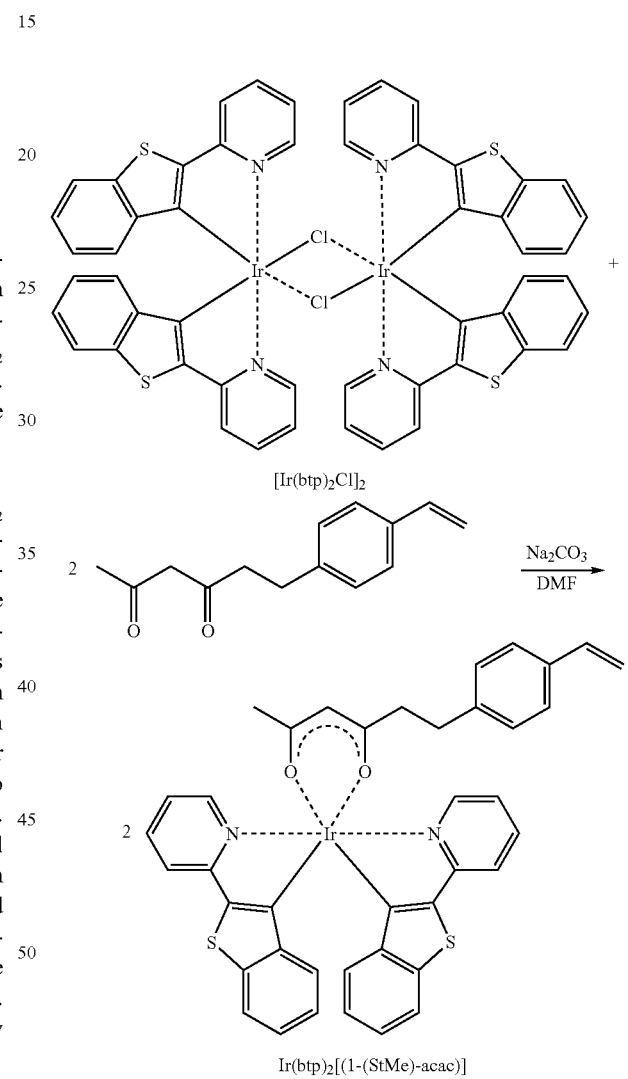

EXAMPLE 64

Synthesis of a Polymerizable Compound [6-(4-methacryloyloxyphenyl)-2,4-hexanedionato] bis[2-(2-pyridyl)benzothienyl] iridium (III) (hereinafter abbreviated as Ir(btp)$_2$[1-(MA-Ph-Me)-acac])

(1) As shown in the Reaction Scheme below, 6-(4-hydroxyphenyl)-2,4-hexanedione prepared in the same manner as in Example 41(1) and (2) and [Ir(btp)$_2$Cl]$_2$ synthesized by a conventional method were allowed to react to synthesize Ir(btp)$_2$[1-(OH-Ph-Me)-acac)].

That is, 245 mg (0.19 mmol) of [Ir(btp)$_2$Cl]$_2$ and 111 mg (1.06 mmol) of sodium carbonate were dissolved in a solution of 141 mg (0.680 mmol) of 6-(4-hydroxyphenyl)-2,4-hexanedione in 10 ml of DMF and the mixture was heated at 80° C. for 1.5 hours with stirring. To the reaction mixture cooled to room temperature were added chloroform and an aqueous solution of ammonium chloride, and the obtained mixture was well shaken. The organic layer was dried over magnesium sulfate and then the solvent was distilled off by using a rotary evaporator. The residue was passed through a silica gel column (eluent: hexane/dichloromethane/acetone=5/10/1 (by volume ratio)) and a band containing a main product having a reddish brown color was separated and concentrated to dryness under reduced pressure to obtain 215 mg (0.26 mmol) of the objective Ir(btp) 2 [1-(OH-Ph-Me)-acac)] as reddish brown solid. Yield: 70%. Identification was performed by elementary analysis of C, H and N and $^1$H-NMR.

$^1$H-NMR (CDCl$_{31}$ ppm): δ 8.40 (d, J=5.4 Hz, 1H, btp), 8.06 (d, J=5.4 Hz, 1H, btp), 7.63 (m, 6H, btp), 7.04 (m, 3H, btp), 6.81 (m, 3H, btp), 6.66 (d, J=8.4 Hz, 2H, —C$_6$H$_4$—OH), 6.38 (d, J=8.4 Hz, 2H, —C$_6$H$_4$—OH), 5.22 (s, 1H, diketonate-methine), 5.20 (br, 1H, OH), 2.48 (m, 2H, methylene), 2.31 (m, 2H, methylene), 1.75 (s, 3H, methyl).

Elementary analysis Calcd: C, 55.80; H, 3.57; N, 3.42. (C$_3$H$_{29}$IrN$_2$O$_3$S$_2$) Found: C, 56.19; H, 3.57; N, 3.31.

(2) As shown in the Reaction Scheme below, the obtained Ir(btp)$_2$[1-(OH-Ph-Me)-acac] and methacryloyl chloride were allowed to react to synthesize Ir(btp)$_2$[1-(MA-Ph-Me)-acac].

That is, to a solution of 248 mg (0.32 mmol) of Ir(btp)$_2$[1-(OH-Ph-Me)-acac] in 20 ml of dry dichloromethane were added 0.25 ml (1.8 mmol) of triethylamine and 0.20 ml (2.0 mmol) of methacryloyl chloride, and the mixture was stirred at room temperature for 1 hour. Then, the reaction mixture was washed with 20 ml of an aqueous solution of sodium carbonate and the solvent was distilled off under reduced pressure. The residue was purified by column chromatography (eluent: a mixed solvent of hexane/dichloromethane/acetone of 2:4:1 (by volume ratio)) and the reddish brown solution that was first eluted was separated and dried under reduced pressure to obtain 180 mg (0.20 mmol) of the objective Ir(btp)$_2$[1-(MA-Ph-Me)-acac] as reddish brown solid. Yield: 64%. Identification was performed by elementary analysis of C, H and N and $^1$H-NMR.

$^1$H-NMR (CDCl$_{31}$ ppm): δ8.42 (d, J=5.4 Hz, 1H, btp), 8.10 (d, J=5.4 Hz, 1H, btp), 7.65 (m, 6H, btp), 7.1-6.7 (m, 10H, aromatic), 6.40 (d, J=8.1 Hz, 1H, btp), 6.27 (d, J=8.1 Hz, 1H, btp), 6.12 (s, 1H, olefinic), 5.71 (s, 1H, olefinic), 5.19 (s, 1H, diketonate-methine), 2.51 (m, 2H, C$_2$H$_4$), 2.39 (m, 2H, C$_2$H$_4$), 1.89 (s, 3H, methacryl-methyl), 1.80 (s, 3H, diketonate-methyl).

Elementary analysis Calcd: C, 56.93; H, 3.75; N, 3.16. (C$_{42}$H$_{33}$IrN$_2$O$_4$S$_2$) Found: C, 57.09; H, 3.77; N, 4.18.

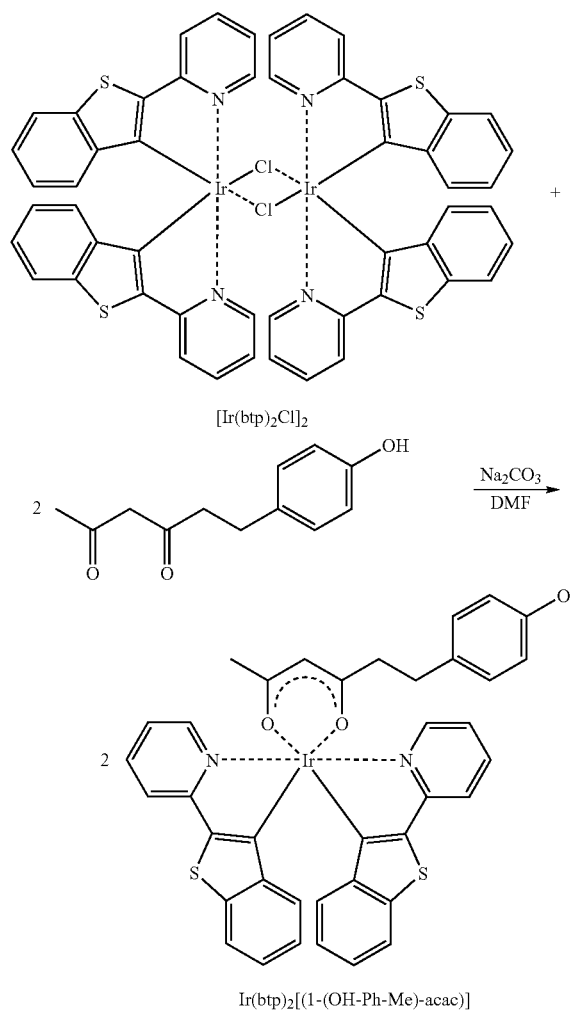

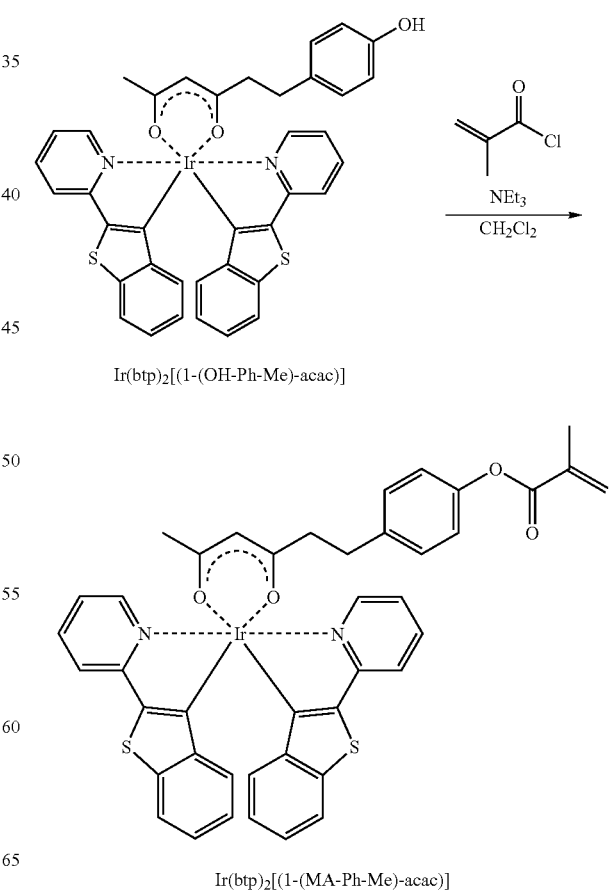

EXAMPLE 65

Synthesis of a Polymerizable Compound {6-[4-(2-methacryloyloxy)ethylcarbamoyloxyphenyl]-2,4-hexanedionato}bis[2-(2-pyridyl)benzothienyl]iridium (III) (hereinafter abbreviated as Ir(btp)$_2$[1-(MOI-Ph-Me)-acac])

As shown in the Reaction Scheme below, Ir(btp)$_2$[1-(OH-Ph-Me)-acac] obtained in Example 64 and 2-methacryloyloxyethyl isocyanate (Trade name "Karenz MOI", manufactured by Showa Denko K. K., hereinafter sometimes referred to as "MOI") were allowed to react to synthesize Ir(btp)$_2$[1-(MOI-Ph-Me)-acac].

That is, to a solution of 215 mg (0.26 mmol) of Ir(btp)$_2$[1-(OH-Ph-Me)-acac] in 10 ml of THF were added 4.0 mg (0.18 mmol) of BHT, 35 mg of dibutyltin (IV) dilaurate (hereinafter abbreviated as DBTL) and 401 mg (2.58 mmol) of MOI, and the mixture was heated for 3 hours under reflux in a hot water bath. Then, the reaction mixture cooled to room temperature was dried under reduced pressure and the residue was purified through a silica gel column (eluent: a mixed solvent of hexane/dichloromethane/acetone of 5:10:1 (by volume ratio)). A band containing a main product having a reddish brown color that eluted first was separated and concentrated to dryness under reduced pressure to obtain 223 mg (0.23 mmol) of the objective Ir(btp)$_2$[1-(MOI-Ph-Me)-acac)] as reddish brown solid. Yield: 87%. Identification was performed by elementary analysis of C, H and N and $^1$H-NMR.

$^1$H-NMR (CDCl$_3$, ppm): δ8.40 (d, J=5.7 Hz, 1H, btp), 8.12 (d, J=5.1 Hz, 1H, btp), 7.65 (m, 6H, btp), 7.1-6.7 (m, 10H, aromatic), 6.25 (d, J=8.4 Hz, 1H, btp), 6.20 (d, J=8.1 Hz, 1H, btp), 6.16 (s, 1H, olefinic), 5.63 (s, 1H, olefinic), 5.26 (br-s, 1H, NH), 5.21 (s, 1H, diketonate-methine), 4.31 (t, J=5.4 Hz, 2H, N—C$_2$H$_4$-o), 3.59 (t, J=5.4 Hz, 2H, N—C$_2$H$_4$—O), 2.55 (m, 2H, C—C$_2$H$_4$—C), 2.34 (m, 2H, C—C$_2$H$_4$—C), 1.98 (s, 3H, methacryl-methyl), 1.76 (s, 3H, diketonate-methyl).

Elementary analysis Calcd: C, 55.54; H, 3.94; N, 4.32. (C$_{45}$H$_{38}$IrN$_3$O$_6$S$_2$) Found: C, 55.13; H, 3.89; N, 4.58.

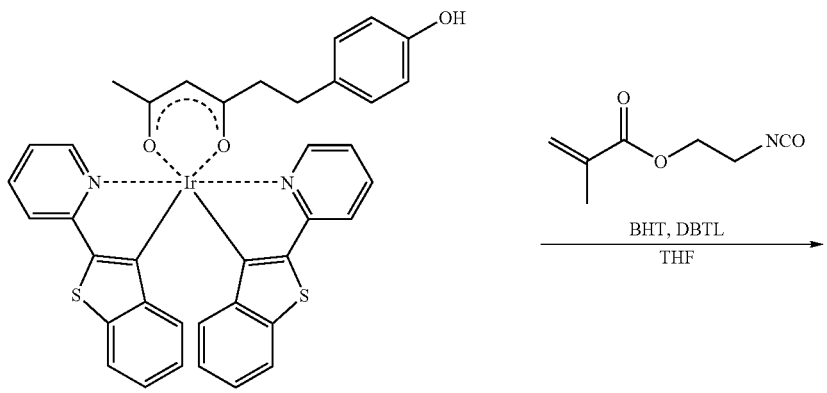

Ir(btp)$_2$[(1-(OH-Ph-Me)-acac)]

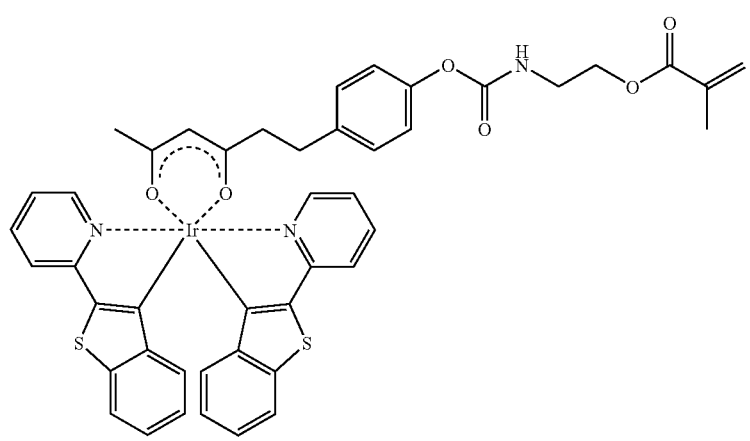

Ir(btp)$_2$[(1-(MOI-Ph-Me)-acac)]

EXAMPLE 66

Synthesis of a Polymerizable Compound [1-(2-methacryloyloxy)ethylcarbamoyloxy-2,4-pentanedionato]bis[2-(2-pyridyl)benzothienyl] iridium (III) (Hereinafter Abbreviated as Ir(btp)$_2$(1-MOI-acac)

(1) As shown in the Reaction Scheme below, [Ir(btp)$_2$Cl]$_2$ synthesized by a conventional method and (1-tert-butyldimethylsilyloxy)-2,4-pentanedione (1-TBDMSO-2,4-pentanedione) synthesized by referencing the known method (EP Patent No. 0514217) were allowed to react to synthesize Ir(btp)$_2$(1-OH-acac).

That is, 449 mg (0.35 mmol) of [Ir(btp)$_2$Cl]$_2$ and 137 mg (1.29 mmol) of sodium carbonate were dissolved in a solution of 310 mg (1.35 mmol) of 1-TBDMSO-2,4-pentanedione in 15 ml of DMF, and the mixture was heated at 80° C. for 1 hour with stirring. The obtained reaction mixture was cooled to room temperature and chloroform and dilute hydrochloric acid were added thereto, and well shaken. Subsequently, the organic layer was washed with water, and the solvent was distilled off under reduced pressure. The residue was purified by silica gel column chromatography (eluent: dichloromethane) and the compound having a reddish brown color that eluted first was separated and concentrated to dryness under reduced pressure. The obtained solid was dissolved in 10 ml of dry THF and 0.60 ml (0.60 mmol) of a 1.0 M THF solution of tetra-n-butylammonium fluoride (n-Bu$_4$NF) was dripped thereto while vigorously stirring the mixture. The solution was stirred at room temperature for 0.5 hour and then the solvent was distilled off under reduced pressure. The residue was purified by silica gel column chromatography (eluent: a mixed solvent of hexane/dichloromethane/acetone of 5:10:2 (by volume ratio)). Separation of a main product having a reddish brown color and drying it under reduced pressure afforded 360 mg (0.49 mmol) of the objective Ir(btp)$_2$(1-OH-acac) as reddish brown solid. Yield: 71%. Identification was performed by elementary analysis of C, H and N and $^1$H-NMR.

$^1$H-NMR (CDCl$_3$, ppm): δ 8.40 (d, J=5.4 Hz, 1H, btp), 8.35 (d, J=5.1 Hz, 1H, btp), 7.79 (m, 2H, btp), 7.63 (m, 4H, btp), 7.04 (m, 4H, btp), 6.81 (t, J=7.3 Hz, 2H, btp), 6.20 (t, J=6.8 Hz, 2H, btp), 5.24 (s, 1H, diketonate-methine), 3.89 (dd, J=8.1, 5.1 Hz, 1H, —CHH'—OH), 3.80 (dd, J=8.1, 5.1 Hz, 1H, —CHH'—OH), 2.92 (t, J=5.1 Hz, 1H, OH), 1.83 (s, 3H, diketonate-methyl).

Elementary analysis Calcd: C, 51.15; H, 3.18; N, 3.85. (C$_{33}$H$_{23}$IrN$_2$O$_3$S$_3$) Found: C, 51.41; H, 3.36; N, 3.49.

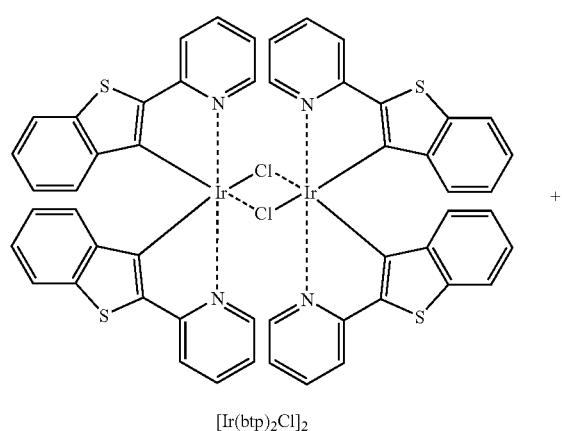

[Ir(btp)$_2$Cl]$_2$

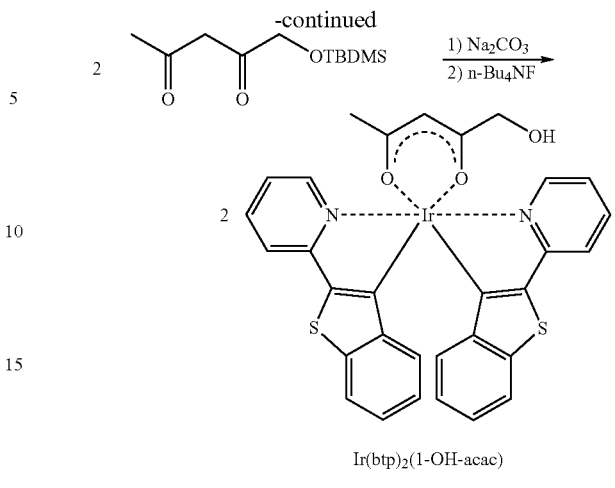

Ir(btp)$_2$(1-OH-acac)

(2) As shown in the Reaction Scheme below, Ir(btp)$_2$(1-OH-acac) was allowed to react with MOI by addition reaction to synthesize Ir(btp)$_2$(1-MOI-acac).

That is, 177 mg of Ir(btp)$_2$(1-OH-acac), 3.0 mg (0.086 mmol) of BHT and 20 mg (0.032 mmol) of DBTL were dissolved in 10 ml of THF and 100 mg (0.64 mmol) of MOI was added thereto. The obtained mixture was heated under reflux for 2 hours in an oil bath. Then, the reaction mixture cooled to room temperature was dried under reduced pressure and the residue was purified by silica gel column chromatography (eluent: a mixed solvent of hexane/dichloromethane/acetone of 10:20:3 (by volume ratio)). A main product having a reddish brown color that eluted second was separated and concentrated to dryness under reduced pressure. The solid was dissolved in a mixed solvent of dichloromethane/hexane and recrystallized therefrom at −20° C. to obtain 173 mg (0.20 mmol) of the objective Ir(btp) 2 (1-MOI-acac) as reddish brown needle crystal. Yield: 81%. Identification was performed by elementary analysis of C, H and N and $^1$H-NMR.

$^1$H-NMR (CDCl$_3$, ppm): δ 8.49 (d, J=5.7 Hz, 1H, btp), 8.40 (d, J=5.4 Hz, 1H, btp), 7.74 (m, 2H, btp), 7.61 (m, 4H, btp), 7.03 (m, 4H, btp), 6.80 (m, 2H, btp), 6.21 (m, 2H, btp), 6.06 (s, 1H, olefinic), 5.55 (s, 1H, olefinic), 5.31 (s, 1H, diketonate-methine), 4.92 (br-s, 1H, NH), 4.25 (s, 2H, N—C(=O)—O—CH$_2$—), 3.97 (m, 2H, N—CH$_2$—CH$_2$—O), 3.16 (m, 2H, N—CH$_2$—CH$_2$—O), 1.91 (s, 3H, CH$_3$C(=CH$_2$)—), 1.81 (s, 3H, diketonate-methyl).

Elementary analysis Calcd: C, 51.69; H, 3.65; N, 4.76. (C$_{38}$H$_{32}$IrN$_3$O$_6$S$_2$) Found: C, 51.88; H, 3.65; N, 4.51.

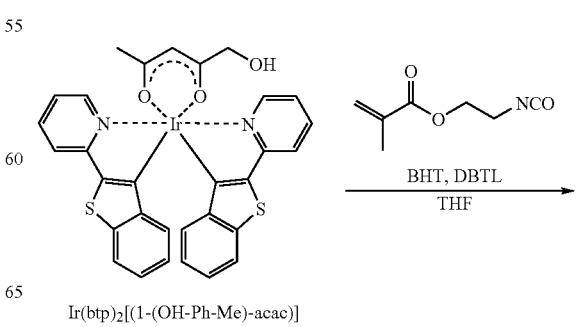

Ir(btp)$_2$[(1-(OH-Ph-Me)-acac)]

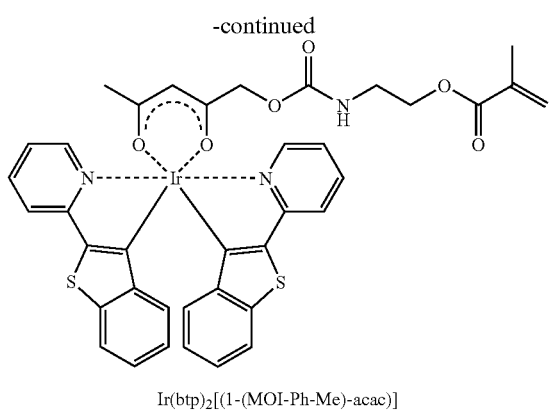

Ir(btp)₂[(1-(MOI-Ph-Me)-acac)]

EXAMPLE 67

Synthesis of N-vinylcarbazole/Ir(btp)₂[1-(StMe)-acac] Copolymer (Hereinafter, Abbreviated as VCz-co-Ir(btp)₂[1-(StMe)-acac])

The titled copolymer was synthesized as a light emitting material containing Ir(btp)₂[1-(StMe)-acac] as a unit having the function of luminescence and N-vinylcarbazole as a unit having the function of hole transportation.

1.55 g (8.0 mmol) of N-vinylcarbazole, 33 mg (0.04 mmol) of Ir(btp)₂[1-(StMe)-acac], and 13 mg (0.08 mmol) of AIBN were dissolved in 40 ml of dry toluene and argon was blown into the obtained solution for 1 hour. This solution was warmed up to 80° C. to initiate polymerization reaction and the reaction mixture was stirred as it was for 8 hours. After cooling, the reaction mixture was dripped into 250 ml of methanol to precipitate a polymer, which was recovered by filtration. Further, the recovered polymer was dissolved in 25 ml of chloroform. This solution was purified by dripping it into 250 ml of methanol to reprecipitate the polymer and dried in vacuum at 60° C. for 12 hours to obtain 1.11 g of the objective compound VCz-co-Ir(btp)₂[1-(StMe)-acac]. Table 7 shows yields, results of GPC measurements, and Ir complex contents measured by ICP elementary analyses.

EXAMPLES 68 TO 70

Copolymers were synthesized in the same manner as in Example 67 except that in place of [1-(StMe)-acac] the polymerizable compounds prepared in Examples 64 to 66, respectively, were used. Table 7 shows yields, results of GPC measurements, and Ir complex contents measured by ICP elementary analyses.

TABLE 7

| | | Recovery | GPC Measurement | | | Ir Complex Content |
|---|---|---|---|---|---|---|
| Example | Polymer | (%) | Mn | Mw | Mw/Mn | (mol %) |
| 67 | VCz-co-Ir(btp)₂[1-(StMe)acac] | 71 | 4500 | 10800 | 2.40 | 0.59 |
| 68 | VCz-co-Ir(btp)₂[1-(MA-Ph-Me)acac] | 73 | 4300 | 10700 | 2.52 | 0.81 |
| 69 | VCz-co-Ir(btp)₂[1-(MOI-Ph-Me)acac] | 58 | 4300 | 10900 | 2.55 | 0.89 |
| 70 | VCz-co-Ir(btp)₂(1-MOI-acac) | 72 | 4400 | 11800 | 2.66 | 0.61 |

Mn: Numer average molecular weight
Mw: Weight average molecular weight

EXAMPLES 71 TO 74

Fabrication and Evaluation of Organic Light Emitting Element

Organic light emitting devices were fabricated in the same manner as in Examples 57 to 62 except that the light emitting materials shown in Table 8 were used and their luminance was measured.

As a result, the luminescence starting voltage and initial luminance at 20V as shown in Table 8 were obtained (average of four devices for each light emitting material)

TABLE 8

| | Light Emitting Material | | Luminescence Starting voltage | 20 V Initial Luminance |
|---|---|---|---|---|
| Example | Polymer | Example | (V) | (cd/m²) |
| 71 | VCz-co-Ir(btp)₂[1-(StMe)acac] | 70 | 9 | 420 |
| 72 | VCz-co-Ir(btp)₂[1-(MA-Ph-Me)acac] | 71 | 9 | 400 |
| 73 | VCz-co-Ir(btp)₂[1-(MOI-Ph-Me)acac] | 72 | 9 | 360 |
| 74 | VCz-co-Ir(btp)₂(1-MOI-acac) | 73 | 9 | 390 |

EXAMPLE 75

Synthesis of a Polymerizable Compound bis(2-(4-methacryloyloxyphenyl)pyridinato) (acetylacetonato) Iridium (III) (Hereinafter Abbreviated as Ir(4-MA-PPy)$_2$(acac))

(1) As shown in the Reaction Scheme below, a binuclear complex of iridium, di(μ-chloro)tetrakis(2-(4-hydroxyphenyl)pyridine) diiridium (III) (hereinafter abbreviated as [Ir(4-HO-PPy)$_2$Cl]$_2$) was synthesized.

That is, 0.86 g (5.0 mmol) of 4-HO-PPy prepared in the same manner as in Example 27(1) and (2) and 1.00 g of sodium hexachloroiridate (III) hydrate were dissolved in 40 ml of a mixed solvent of 2-ethoxyethanol:water=3:1 (by volume ratio) and argon gas was blown into the obtained solution for 30 minutes. Thereafter, the solution was stirred under reflux for 6 hours. Then, the solvent was distilled off and the remaining solid was washed with distilled water and with chloroform, followed by drying in vacuum for 5 hours to obtain 0.63 g of [Ir (4-HO-PPy)$_2$Cl]$_2$ as yellow powder. Yield: 74%. Identification was performed by elementary analysis of C, H and N and $^1$H-NMR.

$^1$H-NMR (DMSO-d$_6$, ppm): δ 9.66 (d, 2H, J=5.9 Hz), 9.38 (d, 2H, J=5.7 Hz), 8.0-7.9 (m, 8H), 7.61 (d, 2H, J=8.1 Hz), 7.54 (d, 2H, J=8.4 Hz), 7.38 (dd, 2H, J=6.2, 6.2 Hz), 7.26 (dd, 2H, J=5.7, 5.7 Hz), 6.33 (dd, 2H, J=8.6, 2.4 Hz), 6.28 (dd, 2H, J=8.4, 2.4 Hz), 5.67 (d, 2H, J=2.2 Hz), 5.12 (d, 2H, J=2.4 Hz).

Elementary analysis Calcd: C, 46.52; H, 2.84; N, 4.93. Found: C, 46.66; H, 2.89; N, 4.90.

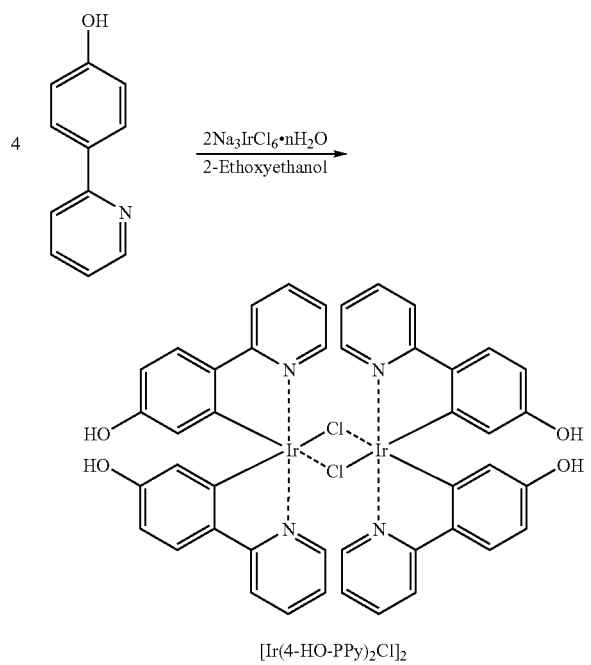

[Ir(4-HO-PPy)$_2$Cl]$_2$ (2) As shown in the Reaction Scheme below, bis(2-(4-hydroxyphenyl)pyridinato) (acetylacetonato) iridium (III) (hereinafter abbreviated as (Ir(4-HO-PPy)$_2$(acac)) was synthesized.

That is, 20 ml of dry N,N-dimethylformamide (hereinafter abbreviated as DMF) and 60.0 mg (0.6 mmol) of 2,4-pentanedione were added to 227.2 mg (0.2 mmol) of [Ir(4-HO-PPy)$_2$Cl]$_2$ and 212.0 mg (2.0 mmol) of sodium carbonate under argon stream and the mixture was stirred at 80° C. for 2 hours. After adding 50 ml of water, the reaction mixture was extracted with chloroform and washed with saturated saline and with distilled water. The organic layer was dried over magnesium sulfate and then concentrated and purified by column chromatography (silica gel, methanol:chloroform=5:95 by volume ratio). Further purification of the product by recrystallization from hexane/acetone afforded 152.0 mg of Ir(4-HO-PPy)$_2$(acac) as yellow crystal. Yield: 60%. Identification was performed by elementary analysis of C, H and N and $^1$H-NMR.

$^1$H-NMR (CDCl$_3$, ppm): δ 8.35 (d, 2H, J=5.7 Hz), 7.7-7.6 (m, 4H), δ 7.41 (d, 2H, J=10.6 Hz), 7.04 (ddd, 2H, J=5.8, 5.8, 2.4 Hz), 6.33 (dd, 2H, J=8.4, 2.4 Hz), 5.70 (d, 2H, J=2.7 Hz), 5.24 (s, 1H), 1.78 (s, 6H).

Elementary analysis Calcd: C, 51.34; H, 3.67; N, 4.43. Found: C, 51.31; H, 3.76; N, 4.40.

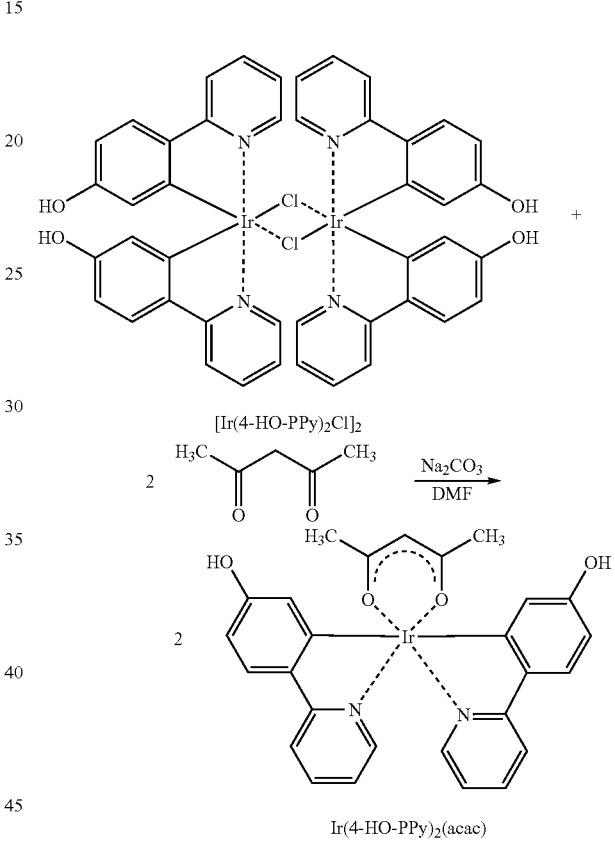

Ir(4-HO-PPy)$_2$(acac)

(3) As shown in the Reaction Scheme below, Ir(4-MA-PPy)$_2$(acac) was synthesized.

That is, 63.2 mg (0.1 mmol) of Ir(4-HO-PPy)$_2$(acac) and 0.1 mg of 2,6-di-tertbutyl-4-methylphenol (hereinafter abbreviated as BHT) were dissolved in 10 ml of dry THF under argon stream. To the solution were added 81.0 mg (0.8 mmol) of triethylamine and 41.8 mg (0.4 mmol) of methacryloyl chloride and the mixture was stirred at room temperature for 2 hours. 100 ml of water was added to the reaction mixture and the reaction mixture was extracted with chloroform. The extract was washed with saturated saline and with distilled water. The organic layer was dried over magnesium sulfate, concentrated and purified by column chromatography (silica gel, methanol:chloroform=2:98 by volume ratio). Recrystallization of the product from hexane/chloroform afforded 65.3 mg of Ir(4-MA-PPy)$_2$(acac) as yellow crystal. Yield: 85%. Identification was performed by elementary analysis of C, H and N and $^1$H-NMR.

$^1$H-NMR (DMSO-d$_6$, ppm): δ 8.38 (d, 2H, J=5.7 Hz), 8.15 (d, 2H, J=8.6 Hz), 7.95 (m, 2H), 7.78 (d, 2H, J=8.9 Hz), 7.39

(m, 2H), 6.61 (dd, 2H, J=8.4, 2.4 Hz), 6.09 (s, 2H), 5.76 (s, 2H), 5.71 (d, 2H, J=2.4 Hz), 5.27 (s, 1H), 1.86 (s, 3H), 1.73 (s, 3H).

Elementary analysis Calcd: C, 54.75; H, 4.07; N, 3.65. Found: C, 54.68; H, 4.13; N, 3.61.

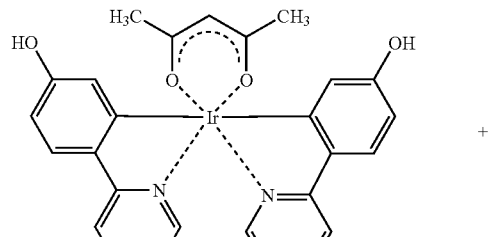

Ir(4-HO-PPy)$_2$(acac)

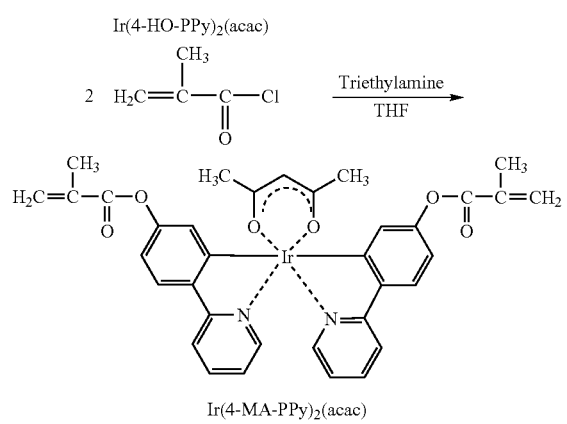

Ir(4-MA-PPy)$_2$(acac)

EXAMPLE 76

Synthesis of a Polymerizable Compound bis(2-(4-(2-methacryloyloxy)ethylcarbamoyloxy)phenyl)pyridinato) (acetylacetonato) Iridium (III) (Hereinafter Abbreviated as Ir(4-MOI-PPy)$_2$(acac))

As shown in the Reaction Scheme below, Ir (4-MOI-PPy)$_2$ (acac) was synthesized.

That is, 63.2 mg (0.1 mmol) of Ir(4-HO-PPy)$_2$(acac), the intermediate in Example 75, 0.2 mg of BHT and 1.3 mg of dibutyltin (IV) dilaurate (hereinafter abbreviated as DBTL) were dissolved in 10 ml of dry THF under argon stream. To this solution was further added 62.0 mg (0.4 mmol) of 2-methacryloyloxyethyl isocyanate (Trade name "Karenz MOI", manufactured by Showa Denko K. K., hereinafter sometimes referred to as "MOI") and the mixture was stirred at 50° C. for 1 hour. To the reaction mixture was added 50 ml of water and then the reaction mixture was extracted with chloroform. The extract was washed with saturated saline and with distilled water. After drying the organic layer over magnesium sulfate, it was concentrated and purified by column chromatography (silica gel, methanol:chloroform=5:95 (by volume ratio)). Recrystallization of the purified product from hexane/chloroform afforded 73.5 mg of Ir(4-MOI-PPy)$_2$ (acac) as yellow crystal. Yield: 78%. Identification was performed by $^1$H-NMR and elementary analysis of C, H and N.

$^1$H-NMR (DMSO-d$_6$, ppm): δ 8.37 (d, 2H, J=5.9 Hz), 8.1 (d, 2H, J=7.8 Hz), 7.93 (dd, 2H, J=8.0, 8.0 Hz), 7.70 (d, 2H, J=8.6 Hz), 7.64 (t, 2H), 7.4 (dd, 2H, J=6.3, 6.3 Hz), 6.56 (dd, 2H, J=8.2, 2.3 Hz), 6.02 (s, 2H), 5.7-5.6 (m, 4H), 5.26 (s, 1H), 4.06 (t, 4H, J=5.4 Hz), 3.3 (m, 4H, overlapped with H$_2$O), 1.85 (s, 6H), 1.73 (s, 6H).

Elementary analysis Calcd: C, 52.28; H, 4.39; N, 5.95. Found: C, 52.22; H, 4.47; N, 5.86.

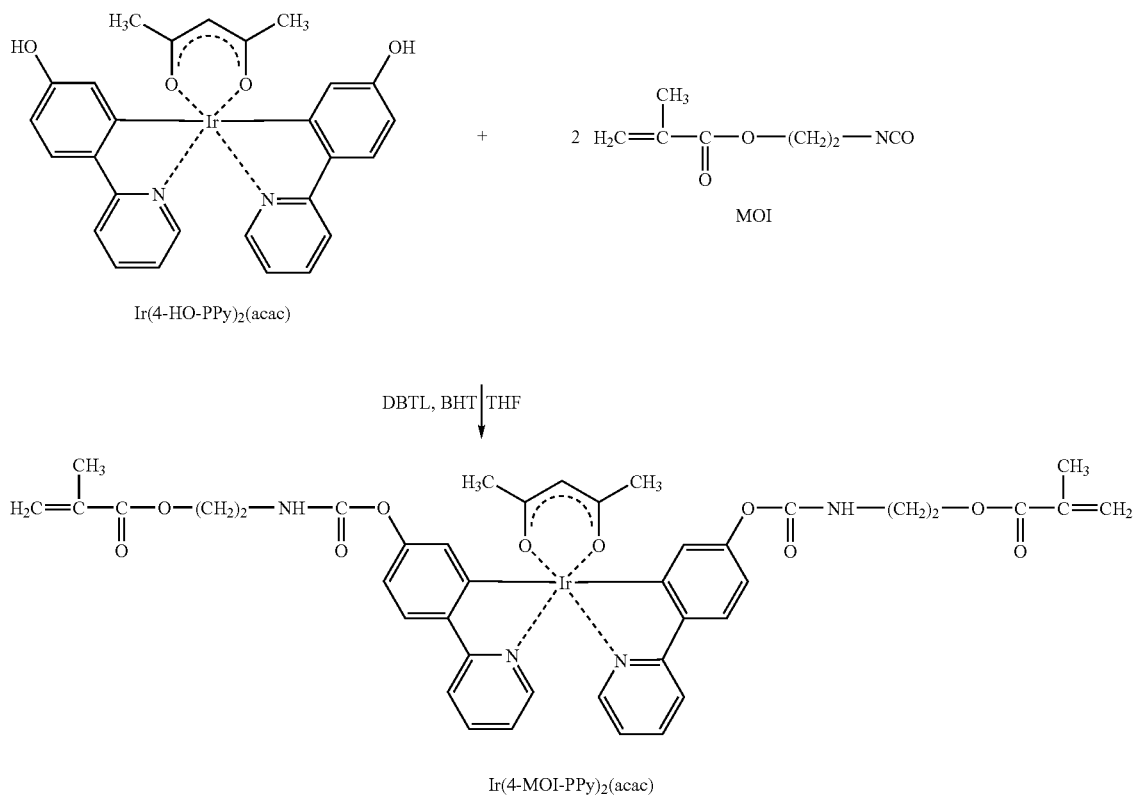

Ir(4-MOI-PPy)$_2$(acac)

EXAMPLE 77

Synthesis of a Polymerizable Compound bis(2-(4-(4-vinylbenzyloxy)phenyl)pyridinato) (acetylacetonato) Iridium (III) (Hereinafter Abbreviated as Ir(4-ST-PPy)$_2$(acac))

As shown in the Reaction Scheme below, Ir (4-ST-PPy)$_2$(acac) was synthesized.

That is, 63.2 mg (0.1 mmol) of Ir(4-HO-PPy)$_2$(acac), the intermediate in Example 75, 0.2 mg of BHT and 138.2 mg (1.0 mmol) of potassium carbonate were dissolved in 10 ml dry DMF under argon stream. To this solution was added 61.0 mg (0.4 mmol) of 4-vinylbenzyl chloride, and the mixture was stirred at 80° C. for 6 hours. To the reaction mixture was added 50 ml of water and the reaction mixture was extracted with chloroform. The extract was washed with saturated saline and with distilled water. After drying the organic layer over magnesium sulfate, it was concentrated and purified by column chromatography (silica gel, methanol:chloroform=5:95 (by volume ratio)). Recrystallization of the purified product from hexane/chloroform afforded 62.2 mg of Ir(4-ST-PPy)$_2$(acac) as yellow crystal. Yield: 72%. Identification was performed by $^1$H-NMR and elementary analysis of C, H and N.

$^1$H-NMR (DMSO-d$_6$, ppm) δ 8.37 (d, 2H, J=5.9 Hz), 8.13 (d, 2H, J=8.4 Hz), 8.0-7.9 (m, 2H), 7.75 (d, 2H, J=8.9 Hz), 7.5-7.3 (m, 10H), 6.73 (m, 2H), 6.59 (dd, 2H, J=8.2, 2.4 Hz), 5.88 (d, 2H, J=17.8 Hz), 5.73 (d, 2H, J=2.4 Hz), 5.3-5.2 (m, 7H), 1.78 (s, 3H).

Elementary analysis Calcd: C, 62.55; H, 4.55; N, 3.24. Found: C, 62.58; H, 4.65; N, 3.20.

EXAMPLE 78

Second Method for the Synthesis of a Polymerizable Compound Ir(4-MA-PPy)$_2$(acac)

(1) As shown in the Reaction Scheme below, 2-(4-methacryloyloxyphenyl)pyridine (hereinafter abbreviated as 4-MA-PPy) was synthesized.

That is, 3.42 g (20.0 mmol) of 4-HO-PPy, the intermediate in Example 75 was dissolved in 20 ml of dry dichloromethane under argon stream. To this solution was added 6.07 g (60.0 mmol) of triethylamine and 3.14 g (30.0 mmol) of methacryloyl chloride was dripped to the mixture over 1 hour and then the resultant mixture was stirred at room temperature for 2 hours. To the reaction mixture was added 100 ml of water and the mixture the reaction mixture was extracted with chloroform. The extract was washed with saturated saline and with water. After drying the organic layer over magnesium sulfate, it was concentrated and purified by column chromatography (silica gel, chloroform). Recrystallization of the purified product from hexane/chloroform afforded 4.16 g of 4-MA-PPy as colorless crystal. Yield: 87%. Identification was performed by $^1$H-NMR and elementary analysis of C, H and N.

$^1$H-NMR (CDCl$_3$, ppm): δ 8.63 (d, 1H, J=4.9 Hz), 7.98 (d, 2H, J=8.6 Hz), 7.5-7.6 (m, 2H), 7.2-7.1 (m, 3H), 6.01 (s, 1H), 5.53 (s 1H), 1.83 (s, 3H).

Elementary analysis Calcd: C, 75.30; H, 5.48; N, 5.85. Found: C, 75.26; H, 5.53; N, 5.79.

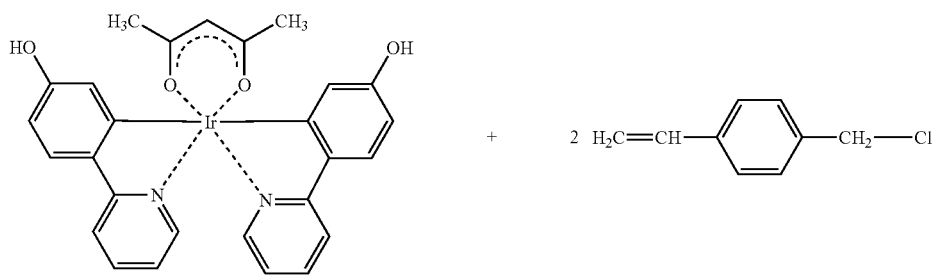

Ir(4-HO-PPy)$_2$(acac)

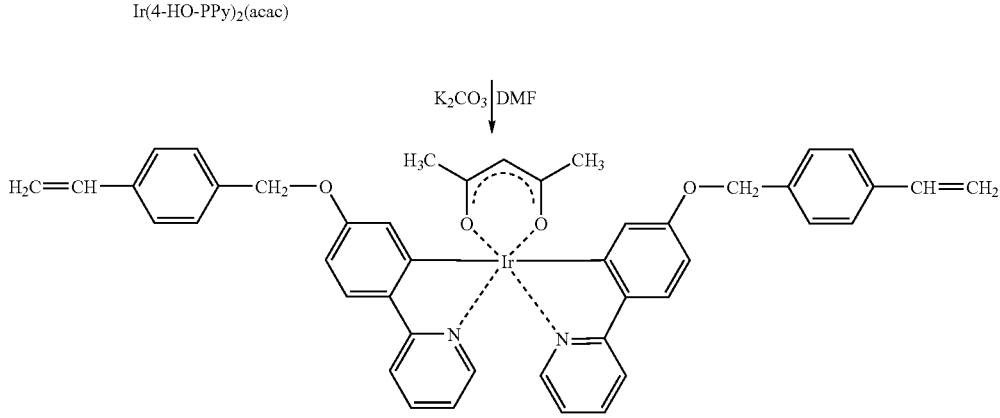

Ir(4-ST-PPy)$_2$(acac)

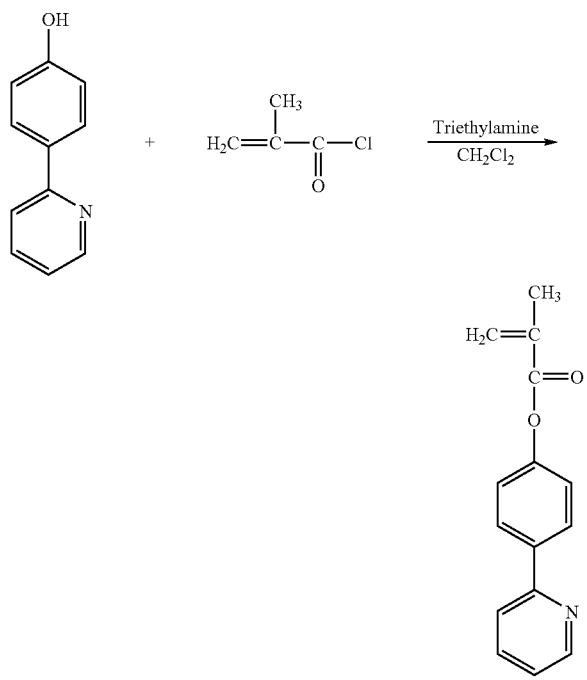

(2) As shown in the Reaction Scheme below, a binuclear complex of iridium, di(μ-chloro)tetrakis(2-(4-methacryloyloxyphenyl)pyridine) diiridium (III) (hereinafter abbreviated as [Ir(4-MA-PPy)$_2$Cl]$_2$) was synthesized.

That is, 1.20 g (5.0 mmol) of 4-MA-PPy and 1.00 g of sodium hexachloroiridate (III) hydrate were dissolved in 40 ml of a mixed solvent of 2-ethoxyethanol:water=3:1 (by volume ratio) and argon gas was blown into the obtained solution for 30 minutes. Thereafter, the solution was stirred under reflux for 6 hours. The precipitate formed was collected by filtration and washed with ethanol and with a small amount of acetone, followed by drying in vacuum for 5 hours to obtain 0.87 g of [Ir(4-MA-PPy)$_2$Cl]$_2$ as yellow powder. Yield: 82%. Identification was performed by $^1$H-NMR and elementary analysis of C, H and N.

$^1$H-NMR (DMSO-d$_6$, ppm): δ 9.64 (d, 2H, J=5.7 Hz), 9.37 (d, 2H, J=5.7 Hz), 8.2-8.1 (m, 4H), 7.75 (m, 4H), 7.6-7.5 (m, 8H), 6.56 (m, 4H), 5.87 (d, 2H, J=2.4 Hz), 5.38 (d, 2H, J=2.4 Hz), 6.09 (s, 2H), 6.03 (s, 2H), 5.79 (s, 2H), 5.74 (s, 2H), 1.89 (s, 6H), 1.87 (s, 6H).

Elementary analysis Calcd: C, 51.17; H, 3.44; N, 3.98. Found: C, 51.13; H, 3.51; N, 3.97.

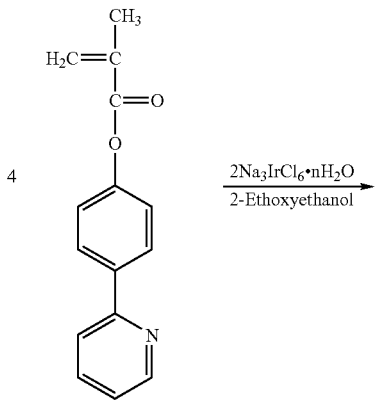

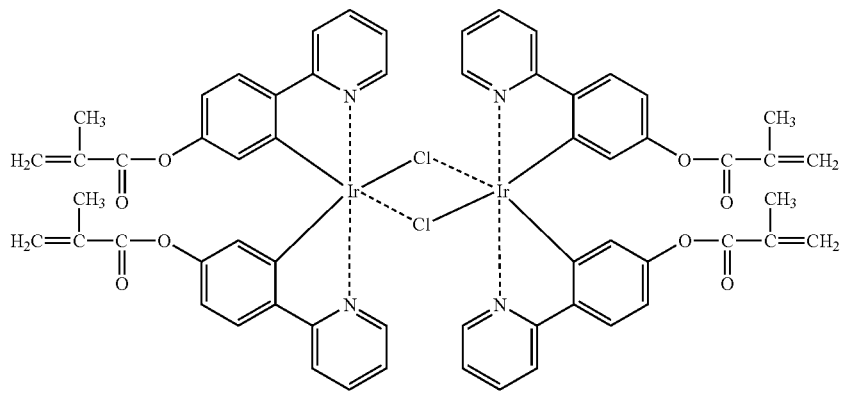

[Ir(4-MA-PPy)$_2$Cl]$_2$ (3) As shown in the Reaction Scheme below, Ir(4-MA-PPy)$_2$(acac) was synthesized.

That is, 20 ml of dry DMF and 60.0 mg (0.6 mmol) of 2,4-pentanedione were added to 281.7 mg (0.2 mmol) of [Ir(4-MA-PPy)$_2$Cl]$_2$ and 212.0 mg (2.0 mmol) of sodium carbonate. The mixture was stirred at 80° C. for 2 hours. After adding 100 ml of water to the reaction mixture, the reaction mixture was extracted with chloroform and the extract was washed with saturated saline and with distilled water. After drying the organic layer over magnesium sulfate, it was concentrated and purified by column chromatography (silica gel, methanol:chloroform=2:98 (by volume ratio)). Recrystallization of the purified product from hexane/chloroform afforded 221.1 mg of Ir(4-MA-PPy)$_2$(acac) as yellow crystal. Yield: 72%. Identification was performed by $^1$H-NMR and elementary analysis of C, H and N, which verified that this was identical with the compound synthesized in Example 75.

966 mg (5.0 mmol) of N-vinylcarbazole, 38.4 mg (0.05 mmol) of Ir(4-MA-PPy)$_2$(acac), and 8.2 mg (0.05 mmol) of AIBN were dissolved in 25 ml of dry toluene and argon was blown into the obtained solution for 1 hour. This solution was warmed up to 80° C. to initiate polymerization reaction and the reaction mixture was stirred as it was for 8 hours. After cooling, the reaction mixture was dripped into 250 ml of methanol to precipitate a polymer, which was recovered by filtration. Further, the recovered polymer was dissolved in 25 ml of chloroform. This solution was purified by dripping it into 250 ml of methanol to repreciptate the polymer and dried in vacuum at 60° C. for 12 hours to obtain 755 mg of the objective compound VCz-co-Ir(4-MA-PPy)$_2$(acac). Table 9 shows yields, results of GPC measurements, and Ir complex contents measured by ICP elementary analyses. Ir (4-MA-PPy)$_2$(acac), which was a bifunctional monomer, had a low degree of crosslinking so that produced no insoluble matter

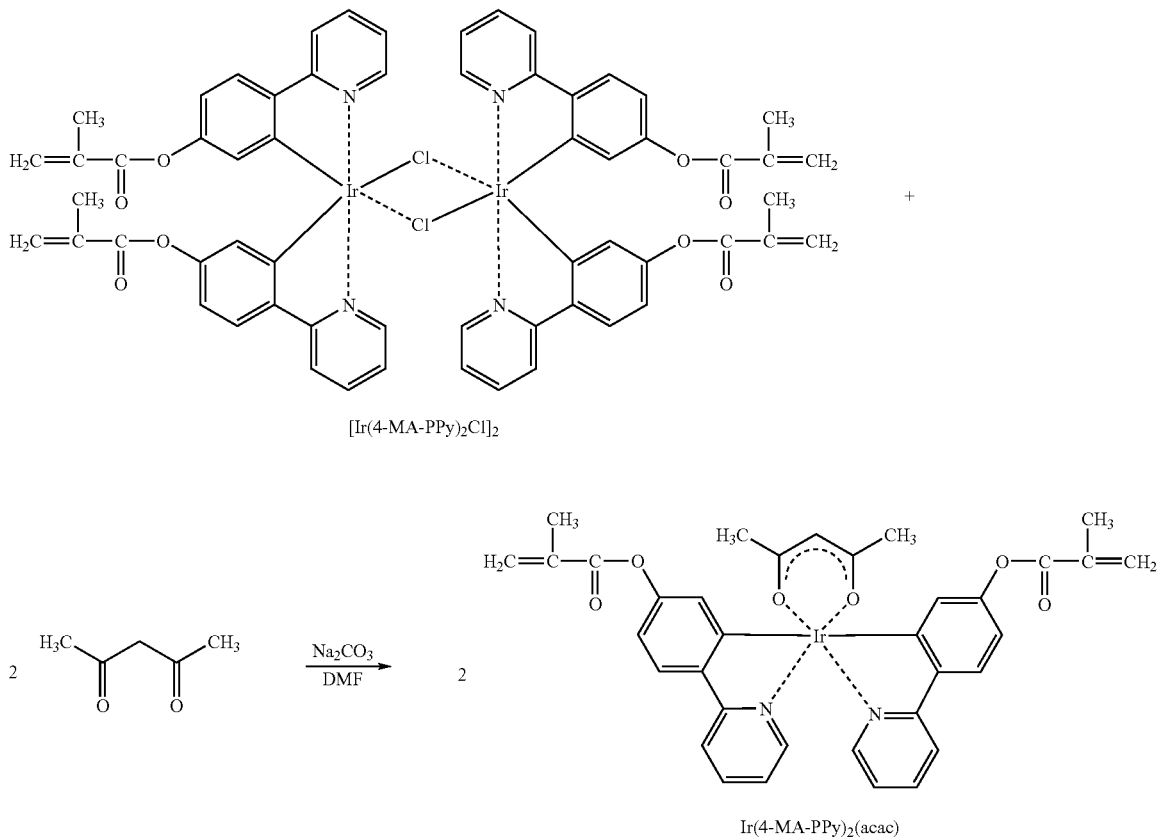

EXAMPLE 79

Synthesis of N-vinylcarbazole/Ir(4-MA-PPy)$_2$(acac) Copolymer (Hereinafter, Abbreviated as VCz-co-Ir(4-MA-PPy)$_2$(acac))

The titled copolymer was synthesized as a light emitting material containing Ir(4-MA-PPy)$_2$(acac) as a unit having the function of luminescence and N-vinylcarbazole as a unit having the function of hole transportation.

since its amount was very small as compared with the amount of N-vinylcarbazole.

EXAMPLES 80 TO 81

Copolymers were synthesized in the same manner as in Example 79 except that in place of Ir(4-MA-PPy)$_2$(acac), equivalent moles of the polymerizable compounds prepared in Examples 76 to 77, respectively, were used. Table 9 shows yields, results of GPC measurements, and Ir complex contents measured by ICP elementary analyses.

TABLE 9

| Example | Polymer | Recovery (%) | GPC Measurement Mn | Mw | Mw/Mn | Ir Complex Content (mol %) |
|---|---|---|---|---|---|---|
| 79 | VCz-co-Ir(4-MA-PPy)$_2$(acac) | 75 | 7100 | 29100 | 4.10 | 1.09 |
| 80 | VCz-co-Ir(4-MOI-PPy)$_2$(acac) | 72 | 6500 | 28300 | 4.35 | 1.07 |
| 81 | VCz-co-Ir(4-ST-PPy)$_2$(acac) | 77 | 6600 | 30600 | 4.64 | 1.06 |

Mn: Number average molecular weigth
Mw: Weight average molecular weight

EXAMPLES 82 TO 84

Fabrication and Evaluation of Organic Light Emitting Element

Organic light emitting devices were fabricated in the same manner as in Examples 57 to 62 except that the light emitting materials shown in Table 9 were used and their luminance was measured.

As a result, the luminescence starting voltage, initial luminance at 15 V, and luminance after 200 hours' continuous luminescence at a fixed voltage of 15 V as shown in Table 10 were obtained (as average values of four devices for each light emitting material).

COMPARATIVE EXAMPLE 4

Organic light emitting devices were fabricated in the same manner as in Examples 82 to 84 except that a coating solution was prepared by dissolving 19.5 mg of poly(N-vinylcarbazole) (manufactured by Tokyo Kasei Kogyo Co., Ltd.) as a hole transporting material, 1.5 mg of a compound of the formula

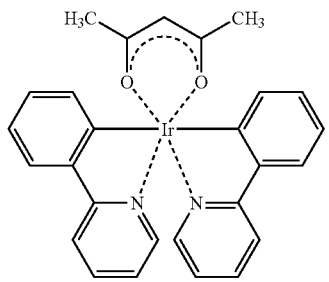

synthesized by the known method (S. Lamansky, et al., Inorganic Chemistry, 40, 1704 (2001)) as a light emitting material, and 9.0 mg of 2-(4-biphenyl)-5-(4-tert-butylphenyl)-1,3,4-oxadiazole (PBD) (manufactured by Tokyo Kasei Kogyo Co., Ltd.) were dissolved in 2970 mg of chloroform (manufactured by Wako Pure Chemical Industries, Ltd.) and the obtained solution was filtered through a filter having a pore size of 0.2 µm, and luminance of the devices was measured. As a result, the luminescence starting voltage, initial luminance at 15 V, and luminance after 200 hours' continuous luminescence at a fixed voltage of 15 V as shown in Table 10 were obtained (as average values of four devices for each light emitting material).

TABLE 10

| Example | Luminescence Starting Voltage (V) | 15 V Limunance (cd/m$^2$) Initial | After 200 Hours |
|---|---|---|---|
| 82 | 7 | 370 | 330 |
| 83 | 7 | 330 | 290 |
| 84 | 7 | 410 | 350 |
| Comparative Example 4 | 7 | 360 | 120 |

INDUSTRIAL APPLICABILITY

By using the polymer light emitting material of the present invention, energy in an excited triplet state can be efficiently converted to light emission or luminescence so that an organic light emitting device exhibiting high luminance and high durability can be provided.

Furthermore, by using non-crosslinking and/or crosslinking polymer light emitting material obtained by forming the polymerizable light emitting compound into a film, an organic light emitting device having good processability can be provided.

The polymerizable compounds of the formulae (C-1), (D-1), (E-1), (F-1) or (G-1) give rise to novel polymers containing an iridium complex part. By using such polymers as a light emitting materials for organic light emitting devices, organic light emitting devices that efficiently emit from an excited triplet state, are excellent in stability, can be designed so as to have a large area and hence are suitable for mass production can be provided.

The invention claimed is:

1. A polymer light-emitting material obtained by polymerizing a polymerizable composition containing at least one polymerizable light-emitting compound represented by the following formula (G-1):

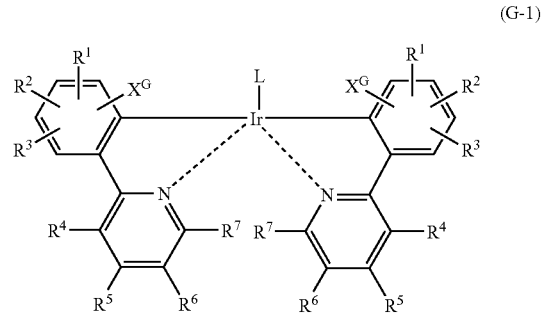

(G-1)

wherein L represents a monovalent anionic bidentate ligand; $X^G$ represents a substituent having a polymerizable functional group which is a group having a carbon-carbon double bond; and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

2. A polymer light-emitting material obtained by polymerizing a polymerizable composition containing at least one polymerizable light-emitting compound represented by the following formula (G-2):

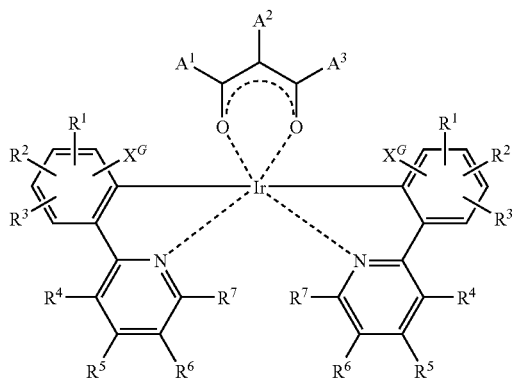

(G-2)

wherein $A^1$ to $A^3$ independently represent a hydrogen atom or an organic group having 1 to 20 carbon atoms which may have one or more heteroatoms; $X^G$ represents a substituent having a polymerizable functional group; and $R^1$ to $R^7$ independently represent a hydrogen atom, a halogen atom, a nitro group, an amino group, a sulfonic acid group, a sulfonic acid ester group, or an organic group having 1 to 20 carbon atoms which may have one or more heteroatoms.

3. The polymer light-emitting material according to claim 1, wherein the polymerizable light-emitting compound is a polymerizable compound represented by the following formula (G-3):

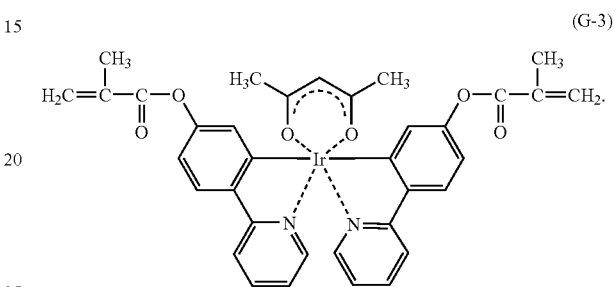

(G-3)

4. The polymer light-emitting material according to claim 1, wherein the polymerizable light-emitting compound is a polymerizable compound represented by the following formula (G-4):

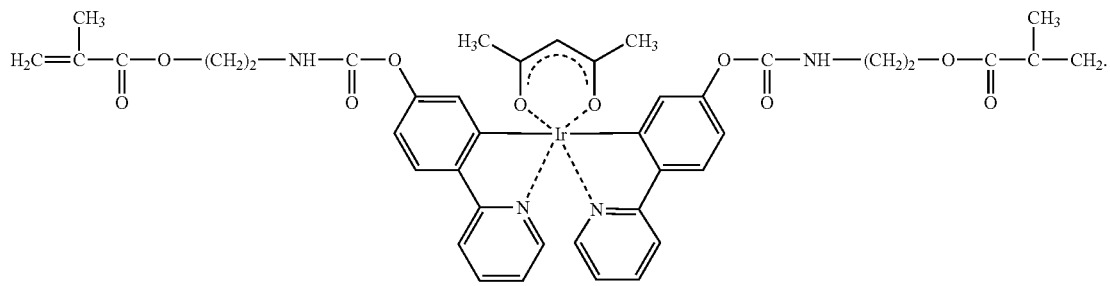

(G-4)

5. The polymer light-emitting material according to claim 1, wherein the polymerizable light-emitting compound is a polymerizable compound represented by the following formula (G-5):

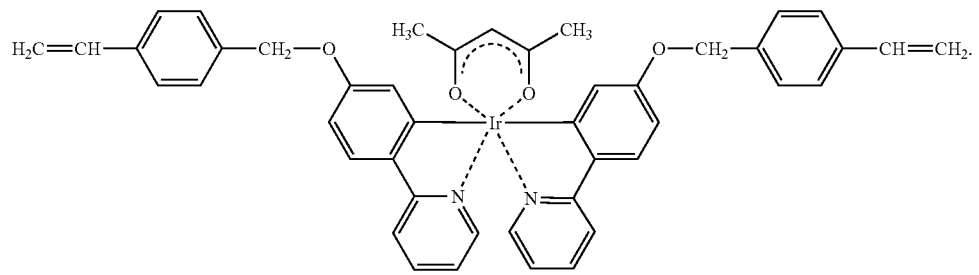

(G-5)

6. A layer containing a light-emitting material for organic light-emitting device, wherein a light-emitting material is a polymer light-emitting material described in claim 1.

7. The layer containing a light-emitting material for organic light-emitting device according to claim 6, wherein the polymer light-emitting material is obtained by forming a polymerizable composition containing at least one light-emitting compound into a film and then polymerizing it.

8. An organic light-emitting device comprising the polymer light-emitting material described in claim 1.

* * * * *